US011663000B2

(12) United States Patent
Song

(10) Patent No.: US 11,663,000 B2
(45) Date of Patent: May 30, 2023

(54) MULTIPLICATION AND ACCUMULATION(MAC) OPERATOR AND PROCESSING-IN-MEMORY (PIM) DEVICE INCLUDING THE MAC OPERATOR

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 144 days.

(21) Appl. No.: 17/146,101

(22) Filed: Jan. 11, 2021

(65) Prior Publication Data

US 2021/0208879 A1 Jul. 8, 2021

Related U.S. Application Data

(63) Continuation-in-part of application No. 17/027,276, filed on Sep. 21, 2020, now Pat. No. 11,513,733.

(Continued)

(30) Foreign Application Priority Data

Jan. 17, 2020 (KR) ........................ 10-2020-0006903

(51) Int. Cl.

| | |
|---|---|
| ***G06F 7/544*** | (2006.01) |
| ***H03M 7/24*** | (2006.01) |
| ***G06F 9/30*** | (2018.01) |

(52) U.S. Cl.

CPC .......... *G06F 9/3001* (2013.01); *G06F 7/5443* (2013.01); *H03M 7/24* (2013.01)

(58) Field of Classification Search

CPC ................. G06F 7/5443; G06F 9/3893; G06F 2207/3812; G06F 2207/382–3824; H03M 7/24

See application file for complete search history.

(56) References Cited

U.S. PATENT DOCUMENTS

| | | | |
|---|---|---|---|
| 8,719,322 | B2 | 5/2014 | Bishop |
| 10,042,639 | B2 | 8/2018 | Gopal et al. |

(Continued)

FOREIGN PATENT DOCUMENTS

| | | | |
|---|---|---|---|
| KR | 1020090014292 | A | 2/2009 |
| KR | 1020190079727 | A | 7/2019 |
| KR | 1020190139757 | A | 12/2019 |

OTHER PUBLICATIONS

Roldao Lopes, Antonio, and George A. Constantinides, "A fused hybrid floating-point and fixed-point dot-product for FPGAs", International symposium on applied reconfigurable computing, 2010 (Year: 2010).*

(Continued)

*Primary Examiner* — Matthew D Sandifer
(74) *Attorney, Agent, or Firm* — William Park & Associates Ltd.

(57) ABSTRACT

A MAC operator includes a plurality of multipliers configured to perform a multiplication operation on a floating-point format first data and a floating-point format second data to output a floating-point format multiplication result data, a plurality of floating-point-to-fixed-point converters configured to receive the floating-point format multiplication result data from each of the plurality of multipliers and convert into a fixed-point format multiplication result data to be output, and an adder tree configured to perform an addition operation on the fixed-point format multiplication result data that is output from the plurality of floating-point-to-fixed-point converters. If a first mantissa of the first data and a second mantissa of the second data are composed of 'M'-bit ('M' being a natural number), each of the plurality of multipliers is configured to perform the multiplication operation so that the fixed-point format multiplication result data includes a mantissa of 2*(M+1) bits.

27 Claims, 78 Drawing Sheets

Related U.S. Application Data

(60) Provisional application No. 62/959,604, filed on Jan. 10, 2020, provisional application No. 62/958,226, filed on Jan. 7, 2020.

(56) References Cited

U.S. PATENT DOCUMENTS

| | | | | |
|---|---|---|---|---|
| 10,558,428 | B2 * | 2/2020 | Rovers | H03M 7/24 |
| 2016/0248439 | A1 | 8/2016 | Tanaka | |
| 2018/0157464 | A1 * | 6/2018 | Lutz | G06F 9/30036 |
| 2019/0079727 | A1 | 3/2019 | Chen et al. | |
| 2020/0089472 | A1 * | 3/2020 | Pareek | G06F 7/49915 |
| 2020/0174749 | A1 | 6/2020 | Kang et al. | |
| 2020/0364031 | A1 | 11/2020 | Makino et al. | |
| 2020/0409661 | A1 * | 12/2020 | Brunie | G06F 7/49947 |
| 2021/0072986 | A1 | 3/2021 | Yudanov et al. | |
| 2021/0263993 | A1 * | 8/2021 | Urbanski | G06F 7/523 |

OTHER PUBLICATIONS

H. H. Saleh and E. E. Swartzlander, "A floating-point fused dot-product unit," 2008 IEEE International Conference on Computer Design, pp. 427-431, 2008 (Year: 2008).*

J. Sohn and E. E. Swartzlander, "A Fused Floating-Point Four-Term Dot Product Unit," in IEEE Transactions on Circuits and Systems I: Regular Papers, vol. 63, No. 3, pp. 370-378, 2016 (Year: 2016).*

* cited by examiner

FIG.49

| S (53) | ROUND UP SIGNAL (RDUP) | 2'S COMPLEMENT | RD[0] |
|---|---|---|---|
| NEGATIVE NUMBER ("1") | 0 | +1 | 1 |
| | 1 (+1) | | 0 |
| POSITIVE NUMBER ("0") | 0 | 0 | 0 |
| | 1 (+1) | | 1 |

FIG.59

| 16 BITS FLOATING-POINT DATA TYPE | SIGN | EXPONENT | MANTISSA | MRS[1:0] |
|---|---|---|---|---|
| FIRST DATA TYPE (FP16) | 1 BIT | 5 BITS | 10 BITS | 00 |
| SECOND DATA TYPE (OF16-1) | 1 BIT | 6 BITS | 9 BITS | 01 |
| THIRD DATA TYPE (OF16-2) | 1 BIT | 7 BITS | 8 BITS | 10 |
| FOURTH DATA TYPE (BF16) | 1 BIT | 8 BITS | 7 BITS | 11 |

MULTIPLICATION AND ACCUMULATION(MAC) OPERATOR AND PROCESSING-IN-MEMORY (PIM) DEVICE INCLUDING THE MAC OPERATOR

CROSS-REFERENCE TO RELATED APPLICATIONS

This is a continuation-in-part of U.S. patent application Ser. No. 17/027,276, filed on Sep. 21, 2020, which claims the priority of provisional application No. 62/958,226, filed on Jan. 7, 2020, and Korean Application No. 10-2020-0006903, filed on Jan. 17, 2020, which are incorporated herein by reference in their entirety. This application also claims the provisional application No. 62/959,604, filed on Jan. 10, 2020, which is incorporated herein by reference in its entirety.

BACKGROUND

1. Technical Field

Various embodiments of the present disclosure relate to processing-in-memory (PIM) systems and, more particularly, to PIM systems including a PIM device and a controller and methods of operating the PIM systems.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks with increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations internally, data processing speed in the neural network may be improved.

SUMMARY

A MAC operator according to an embodiment of the present disclosure includes a plurality of multipliers configured to perform a multiplication operation on a floating-point format first data by a floating-point format second data to output a floating-point format multiplication result data, a plurality of floating-point-to-fixed-point converters configured to receive the floating-point format multiplication result data from each of the plurality of multipliers and convert into a fixed-point format multiplication result data to be output, and an adder tree configured to perform an addition operation on the fixed-point format multiplication result data that is output from the plurality of floating-point-to-fixed-point converters. If a first mantissa of the first data and a second mantissa of the second data are composed of 'M'-bit ('M' is a natural number), each of the plurality of multipliers is configured to perform the multiplication operation so that the fixed-point format multiplication result data includes a mantissa of 2*'M+1' bits.

A processing-in-memory (PIM) system according to an embodiment of the present disclosure includes a data storage region and a MAC operator configured to perform a MAC arithmetic operation on a floating-point format first data and a floating-point format second data from the data storage region. The MAC operator includes a plurality of multipliers configured to perform a multiplication operation on the first data and the second data to output a floating-point format multiplication result data, a plurality of floating-point-to-fixed-point converters configured to receive the floating-point format multiplication result data from each of the plurality of multipliers and convert into a fixed-point format multiplication result data to be output, and an adder tree configured to perform an addition operation on the fixed-point format multiplication result data that is output from the plurality of floating-point-to-fixed-point converters. If a first mantissa of the first data and a second mantissa of the second data are composed of 'M'-bit ('M' is a natural number), each of the plurality of multipliers is configured to perform the multiplication operation so that the fixed-point format multiplication result data include a mantissa of 2*(M+1) bits.

A MAC operator according to an embodiment of the present disclosure includes a plurality of multipliers configured to perform a multiplication operation on a floating-point format first data by a floating-point format second data to output a floating-point format multiplication result data, and a plurality of floating-point-to-fixed-point converters configured to receive the floating-point format multiplication result data from each of the plurality of multipliers and convert into a fixed-point format multiplication result data to be output. If a first mantissa of the first data and a second mantissa of the second data are composed of 'M'-bit ('M' is a natural number), each of the plurality of multipliers is configured to perform the multiplication operation so that the fixed-point format multiplication result data includes a mantissa of 2*'M+1' bits.

BRIEF DESCRIPTION OF THE DRAWINGS

Certain features of the disclosed technology are illustrated in various embodiments with reference to the attached drawings.

FIG. 49 is a table illustrating an operation of the round bit generating circuit of FIG. 48.

FIG. 59 is a table illustrating four 16-bit floating-point data formats according to various embodiments of the present disclosure.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean a relative positional relationship, but not used to limit certain cases in which the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to PIM systems and methods of operating the PIM systems.

Figure 1:
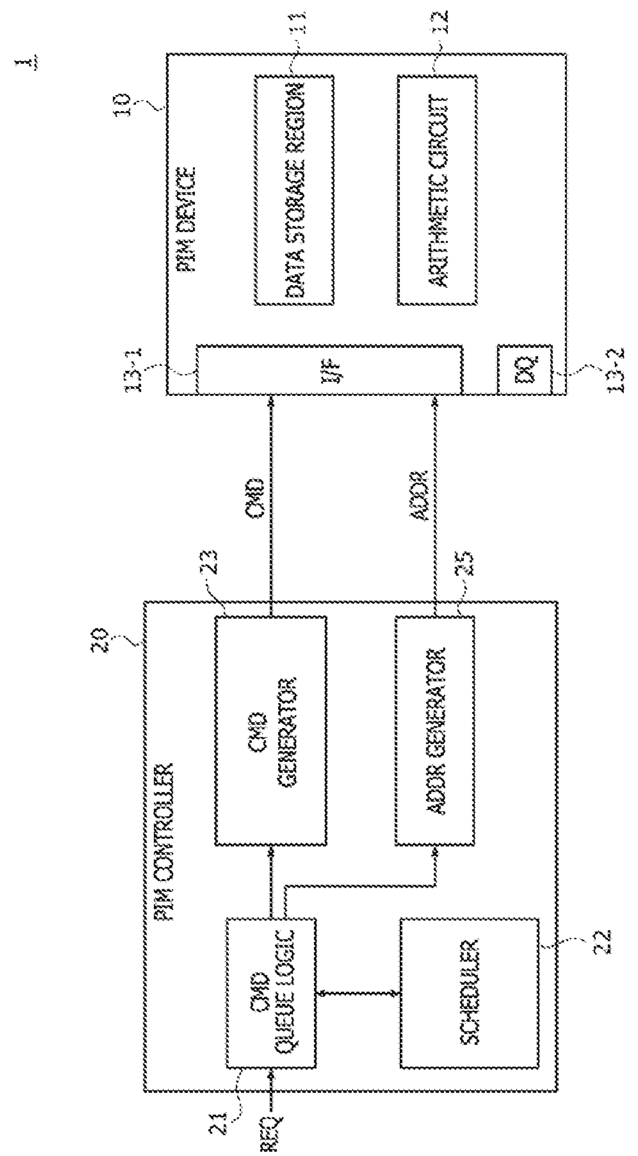
FIG. 1 is a block diagram illustrating a PIM system according to an embodiment of the present disclosure.

FIG. 1 is a block diagram illustrating a PIM system according to an embodiment of the present disclosure. As illustrated in FIG. 1, the PIM system 1 may include a PIM device 10 and a PIM controller 20. The PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2.

The interface 13-1 of the PIM device 10 may receive a command CMD and address ADDR from the PIM controller 20. The interface 13-1 may output the command CMD to the data storage region 11 or the arithmetic circuit 12 in the PIM device 10. The interface 13-1 may output the address ADDR to the data storage region 11 in the PIM device 10. The data I/O pad 13-2 of the PIM device 10 may function as a data communication terminal between a device external to the PIM device 10, for example the PIM controller 20, and the data storage region 11 included in the PIM device 10. The external device to the PIM device 10 may correspond to the PIM controller 20 of the PIM system 1 or a host located outside the PIM system 1. Accordingly, data that is output from the host or the PIM controller 20 may be inputted into the PIM device 10 through the data I/O pad 13-2.

The PIM controller 20 may control operations of the PIM device 10. In an embodiment, the PIM controller 20 may control the PIM device 10 such that the PIM device 10 operates in a memory mode or an arithmetic mode. In the event that the PIM controller 20 controls the PIM device 10 such that the PIM device 10 operates in the memory mode, the PIM device 10 may perform a data read operation or a data write operation for the data storage region 11. In the event that the PIM controller 20 controls the PIM device 10 such that the PIM device 10 operates in the arithmetic mode, the arithmetic circuit 12 of the PIM device 10 may receive first data and second data from the data storage region 11 to perform an arithmetic operation. In the event that the PIM controller 20 controls the PIM device 10 such that the PIM device 10 operates in the arithmetic mode, the PIM device 10 may also perform the data read operation and the data write operation for the data storage region 11 to execute the arithmetic operation. The arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The PIM controller 20 may be configured to include command queue logic 21, a scheduler 22, a command (CMD) generator 23, and an address (ADDR) generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The command queue stored in the command queue logic 21 may be transmitted to the command generator 23 according to a sequence determined by the scheduler 22. The command queue logic 21, and also the command queue logic 210 of FIGS. 2 and 20, may be implemented as hardware, software, or a combination of hardware and software. For example, the command queue logic 21 and/or 210 may be a command queue logic circuit operating in accordance with an algorithm and/or a processor executing command queue logic code.

The scheduler 22 may adjust a sequence of the command queue when the command queue stored in the command queue logic 21 is output from the command queue logic 21. In order to adjust the output sequence of the command queue stored in the command queue logic 21, the scheduler 22 may analyze the information on the storage status of the command queue provided by the command queue logic 21 and may readjust a process sequence of the command queue so that the command queue is processed according to a proper sequence.

The command generator 23 may receive the command queue related to the memory mode of the PIM device 10 and the MAC mode of the PIM device 10 from the command queue logic 21. The command generator 23 may decode the command queue to generate and output the command CMD. The command CMD may include a memory command for the memory mode or an arithmetic command for the arithmetic mode. The command CMD that is output from the command generator 23 may be transmitted to the PIM device 10.

The command generator 23 may be configured to generate and transmit the memory command to the PIM device 10 in the memory mode. The command generator 23 may be configured to generate and transmit a plurality of arithmetic commands to the PIM device 10 in the arithmetic mode. In one example, the command generator 23 may be configured to generate and output first to fifth arithmetic commands with predetermined time intervals in the arithmetic mode. The first arithmetic command may be a control signal for reading the first data out of the data storage region 11. The second arithmetic command may be a control signal for reading the second data out of the data storage region 11. The third arithmetic command may be a control signal for latching the first data in the arithmetic circuit 12. The fourth arithmetic command may be a control signal for latching the second data in the arithmetic circuit 12. And the fifth MAC command may be a control signal for latching arithmetic result data of the arithmetic circuit 12.

The address generator 25 may receive address information from the command queue logic 21 and generate the address ADDR for accessing a region in the data storage region 11. In an embodiment, the address ADDR may include a bank address, a row address, and a column address. The address ADDR that is output from the address generator 25 may be inputted to the data storage region 11 through the interface (I/F) 13-1.

Figure 2:
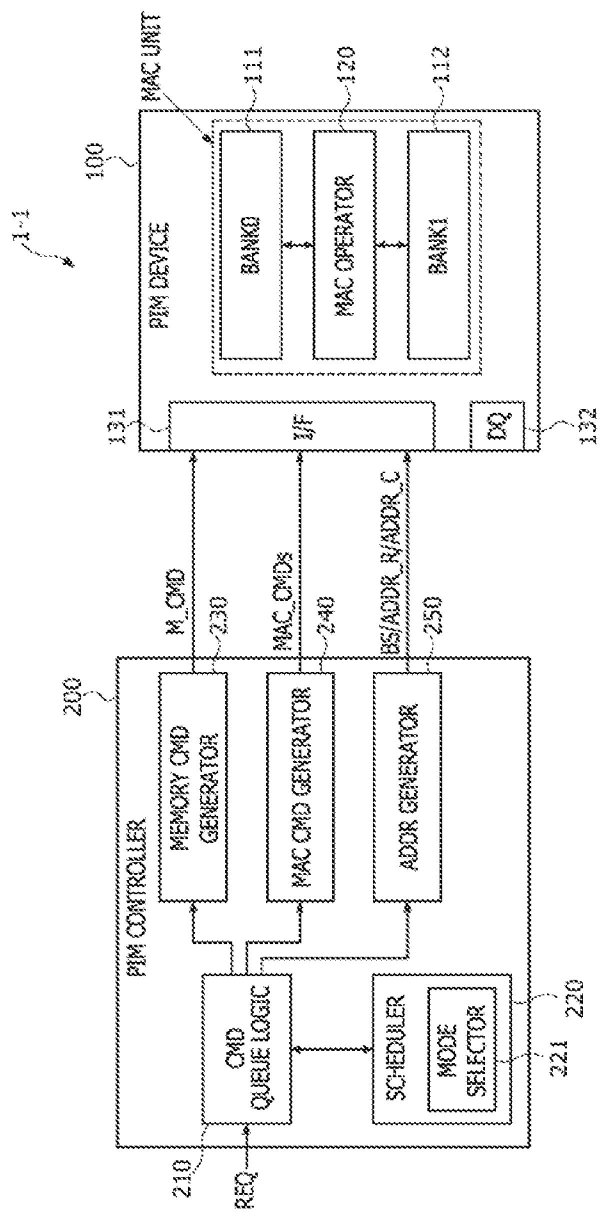
FIG. 2 is a block diagram illustrating a PIM system according to a first embodiment of the present disclosure.

FIG. 2 is a block diagram illustrating a PIM system 1-1 according to a first embodiment of the present disclosure. As illustrated in FIG. 2, the PIM system 1-1 may include a PIM device 100 and a PIM controller 200. The PIM device 100 may include a first memory bank (BANK0) 111, a second memory bank (BANK1) 112, a MAC operator 120, an interface (I/F) 131, and a data input/output (I/O) pad 132. For an embodiment, the MAC operator 120 represents a MAC operator circuit. The first memory bank (BANK0) 111, the second memory bank (BANK1) 112, and the MAC operator 120 included in the PIM device 100 may constitute one MAC unit. In another embodiment, the PIM device 100 may include a plurality of MAC units. The first memory bank (BANK0) 111 and the second memory bank (BANK1) 112 may represent a memory region for storing data, for example, a DRAM device. Each of the first memory bank (BANK0) 111 and the second memory bank (BANK1) 112 may be a component unit which is independently activated and may be configured to have the same data bus width as data I/O lines in the PIM device 100. In an embodiment, the first and second memory banks 111 and 112 may operate through interleaving such that an active operation of the first and second memory banks 111 and 112 is performed in parallel while another memory bank is selected. Each of the first and second memory banks 111 and 112 may include at least one cell array which includes memory unit cells located at cross points of a plurality of rows and a plurality of columns.

Although not shown in the drawings, a core circuit may be disposed adjacent to the first and second memory banks 111 and 112. The core circuit may include X-decoders XDECs and Y-decoders/IO circuits YDEC/IOs. An X-decoder XDEC may also be referred to as a word line decoder or a row decoder. The X-decoder XDEC may receive a row address ADD_R from the PIM controller 200 and may decode the row address ADD_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADDR_C from the PIM controller 200 and may decode the column address ADDR_C to select and enable at least one of the columns (i.e., bit lines) coupled to the selected memory bank. Each of the I/O circuits may include an I/O sense amplifier for sensing and amplifying a level of a read datum that is output from the corresponding memory bank during a read operation for the first and second memory banks 111 and 112. In addition, the I/O circuit may include a write driver for driving a write datum during a write operation for the first and second memory banks 111 and 112.

The interface 131 of the PIM device 100 may receive a memory command M_CMD, MAC commands MAC_CMDs, a bank selection signal BS, and the row/column addresses ADDR_R/ADDR_C from the PIM controller 200. The interface 131 may output the memory command M_CMD, together with the bank selection signal BS and the row/column addresses ADDR_R/ADDR_C, to the first memory bank 111 or the second memory bank 112. The interface 131 may output the MAC commands MAC_CMDs to the first memory bank 111, the second memory bank 112, and the MAC operator 120. In such a case, the interface 131 may output the bank selection signal BS and the row/column addresses ADDR_R/ADDR_C to both of the first memory bank 111 and the second memory bank 112. The data I/O pad 132 of the PIM device 100 may function as a data communication terminal between a device external to the PIM device 100 and the MAC unit (which includes the first and second memory banks 111 and 112 and the MAC operator 120) included in the PIM device 100. The external device to the PIM device 100 may correspond to the PIM controller 200 of the PIM system 1-1 or a host located outside the PIM system 1-1. Accordingly, data that is output from the host or the PIM controller 200 may be inputted into the PIM device 100 through the data I/O pad 132.

The PIM controller 200 may control operations of the PIM device 100. In an embodiment, the PIM controller 200 may control the PIM device 100 such that the PIM device 100 operates in a memory mode or a MAC mode. In the event that the PIM controller 200 controls the PIM device 100 such that the PIM device 100 operates in the memory mode, the PIM device 100 may perform a data read operation or a data write operation for the first memory bank 111 and the second memory bank 112. In the event that the PIM controller 200 controls the PIM device 100 such that the PIM device 100 operates in the MAC mode, the PIM device 100 may perform a MAC arithmetic operation for the MAC operator 120. In the event that the PIM controller 200 controls the PIM device 100 such that the PIM device 100 operates in the MAC mode, the PIM device 100 may also perform the data read operation and the data write operation for the first and second memory banks 111 and 112 to execute the MAC arithmetic operation.

The PIM controller 200 may be configured to include command queue logic 210, a scheduler 220, a memory command generator 230, a MAC command generator 240, and an address generator 250. The command queue logic 210 may receive a request REQ from an external device (e.g., a host of the PIM system 1-1) and store a command queue corresponding to the request REQ in the command queue logic 210. The command queue logic 210 may transmit information on a storage status of the command queue to the scheduler 220 whenever the command queue logic 210 stores the command queue. The command queue stored in the command queue logic 210 may be transmitted to the memory command generator 230 or the MAC command generator 240 according to a sequence determined by the scheduler 220. When the command queue that is output from the command queue logic 210 includes command information requesting an operation in the memory mode of the PIM device 100, the command queue logic 210 may transmit the command queue to the memory command generator 230. On the other hand, when the command queue that is output from the command queue logic 210 is command information requesting an operation in the MAC mode of the PIM device 100, the command queue logic 210 may transmit the command queue to the MAC command generator 240. Information on whether the command queue relates to the memory mode or the MAC mode may be provided by the scheduler 220.

The scheduler 220 may adjust a timing of the command queue when the command queue stored in the command queue logic 210 is output from the command queue logic 210. In order to adjust the output timing of the command queue stored in the command queue logic 210, the scheduler 220 may analyze the information on the storage status of the command queue provided by the command queue logic 210 and may readjust a process sequence of the command queue such that the command queue is processed according to a proper sequence. The scheduler 220 may output and transmit to the command queue logic 210 information on whether the command queue that is output from the command queue logic 210 relates to the memory mode of the PIM device 100 or relates to the MAC mode of the PIM device 100. In order to obtain the information on whether the command queue that is output from the command queue logic 210 relates to the memory mode or the MAC mode, the scheduler 220 may include a mode selector 221. The mode selector 221 may generate a mode selection signal with information on whether the command queue stored in the command queue logic 210 relates to the memory mode or the MAC mode, and the scheduler 220 may transmit the mode selection signal to the command queue logic 210.

The memory command generator 230 may receive the command queue related to the memory mode of the PIM device 100 from the command queue logic 210. The memory command generator 230 may decode the command queue to generate and output the memory command M_CMD. The memory command M_CMD that is output from the memory command generator 230 may be transmitted to the PIM device 100. In an embodiment, the memory command M_CMD may include a memory read command and a memory write command. When the memory read command is output from the memory command generator 230, the PIM device 100 may perform the data read operation for the first memory bank 111 or the second memory bank 112. Data which are read out of the PIM device 100 may be transmitted to an external device through the data I/O pad 132. The read data that is output from the PIM device 100 may be transmitted to a host through the PIM controller 200. When the memory write command is output from the memory command generator 230, the PIM device 100 may perform the data write operation for the first memory bank 111 or the second memory bank 112. In such a case, data to be written into the PIM device 100 may be transmitted from the host to the PIM device 100 through the PIM controller 200. The write data inputted to the PIM device 100 may be transmitted to the first memory bank 111 or the second memory bank 112 through the data I/O pad 132.

The MAC command generator 240 may receive the command queue related to the MAC mode of the PIM device 100 from the command queue logic 210. The MAC command generator 240 may decode the command queue to generate and output the MAC commands MAC_CMDs. The MAC commands MAC_CMDs that are output from the MAC command generator 240 may be transmitted to the PIM device 100. The data read operation for the first memory bank 111 and the second memory bank 112 of the PIM device 100 may be performed by the MAC commands MAC_CMDs that are output from the MAC command generator 240, and the MAC arithmetic operation of the MAC operator 120 may also be performed by the MAC commands MAC_CMDs that are output from the MAC command generator 240. The MAC commands MAC_CMDs and the MAC arithmetic operation of the PIM device 100 according to the MAC commands MAC_CMDs will be described in detail with reference to FIG. 3.

The address generator 250 may receive address information from the command queue logic 210. The address generator 250 may generate the bank selection signal BS for selecting one of the first and second memory banks 111 and 112 and may transmit the bank selection signal BS to the PIM device 100. In addition, the address generator 250 may generate the row address ADDR_R and the column address ADDR_C for accessing a region (e.g., memory cells) in the first or second memory bank 111 or 112 and may transmit the row address ADDR_R and the column address ADDR_C to the PIM device 100.

Figure 3:
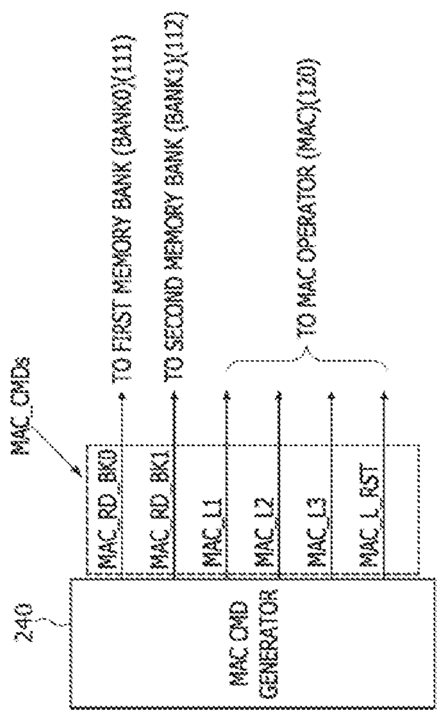
FIG. 3 illustrates MAC commands that are output from a MAC command generator of a PIM controller included in a PIM system according to a first embodiment of the present disclosure.

FIG. 3 illustrates the MAC commands MAC_CMDs that are output from the MAC command generator 240 included in the PIM system 1-1 according to the first embodiment of the present disclosure. As illustrated in FIG. 3, the MAC commands MAC_CMDs may include first to sixth MAC command signals. In an embodiment, the first MAC command signal may be a first MAC read signal MAC_RD_BK0, the second MAC command signal may be a second MAC read signal MAC_RD_BK1, the third MAC command signal may be a first MAC input latch signal MAC_L1, the fourth MAC command signal may be a second MAC input latch signal MAC_L2, the fifth MAC command signal may be a MAC output latch signal MAC_L3, and the sixth MAC command signal may be a MAC latch reset signal MAC_L_RST.

The first MAC read signal MAC_RD_BK0 may control an operation for reading first data (e.g., weight data) out of the first memory bank 111 to transmit the first data to the MAC operator 120. The second MAC read signal MAC_RD_BK1 may control an operation for reading second data (e.g., vector data) out of the second memory bank 112 to transmit the second data to the MAC operator 120. The first MAC input latch signal MAC_L1 may control an input latch operation of the weight data that is transmitted from the first memory bank 111 to the MAC operator 120. The second MAC input latch signal MAC_L2 may control an input latch operation of the vector data that is transmitted from the second memory bank 112 to the MAC operator 120. If the input latch operations of the weight data and the vector data are performed, the MAC operator 120 may perform the MAC arithmetic operation to generate MAC result data corresponding to the result of the MAC arithmetic operation. The MAC output latch signal MAC_L3 may control an output latch operation of the MAC result data generated by the MAC operator 120. And, the MAC latch reset signal MAC_L_RST may control an output operation of the MAC result data generated by the MAC operator 120 and a reset operation of an output latch included in the MAC operator 120.

The PIM system 1-1 according to the present embodiment may be configured to perform a deterministic MAC arithmetic operation. The term "deterministic MAC arithmetic operation" used in the present disclosure may be defined as the MAC arithmetic operation performed in the PIM system 1-1 during a predetermined fixed time. Thus, the MAC commands MAC_CMDs transmitted from the PIM controller 200 to the PIM device 100 may be sequentially generated with fixed time intervals. Accordingly, the PIM controller 200 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially output from the PIM controller 200 with fixed time intervals corresponding to the fixed latencies.

For example, the MAC command generator 240 is configured to output the first MAC command at a first point in time. The MAC command generator 240 is configured to output the second MAC command at a second point in time when a first latency elapses from the first point in time. The first latency is set as the time it takes to read the first data out of the first storage region based on the first MAC command and to output the first data to the MAC operator. The MAC command generator 240 is configured to output the third MAC command at a third point in time when a second latency elapses from the second point in time. The second latency is set as the time it takes to read the second data out of the second storage region based on the second MAC command and to output the second data to the MAC operator. The MAC command generator 240 is configured to output the fourth MAC command at a fourth point in time when a third latency elapses from the third point in time. The third latency is set as the time it takes to latch the first data in the MAC operator based on the third MAC command. The MAC command generator 240 is configured to output the fifth MAC command at a fifth point in time when a fourth latency elapses from the fourth point in time. The fourth latency is set as the time it takes to latch the second data in the MAC operator based on the fourth MAC command and to perform the MAC arithmetic operation of the first and second data which are latched in the MAC operator. The MAC command generator 240 is configured to output the sixth MAC command at a sixth point in time when a fifth latency elapses from the fifth point in time. The fifth latency is set as the time it takes to perform an output latch operation of MAC result data generated by the MAC arithmetic operation.

Figure 4:
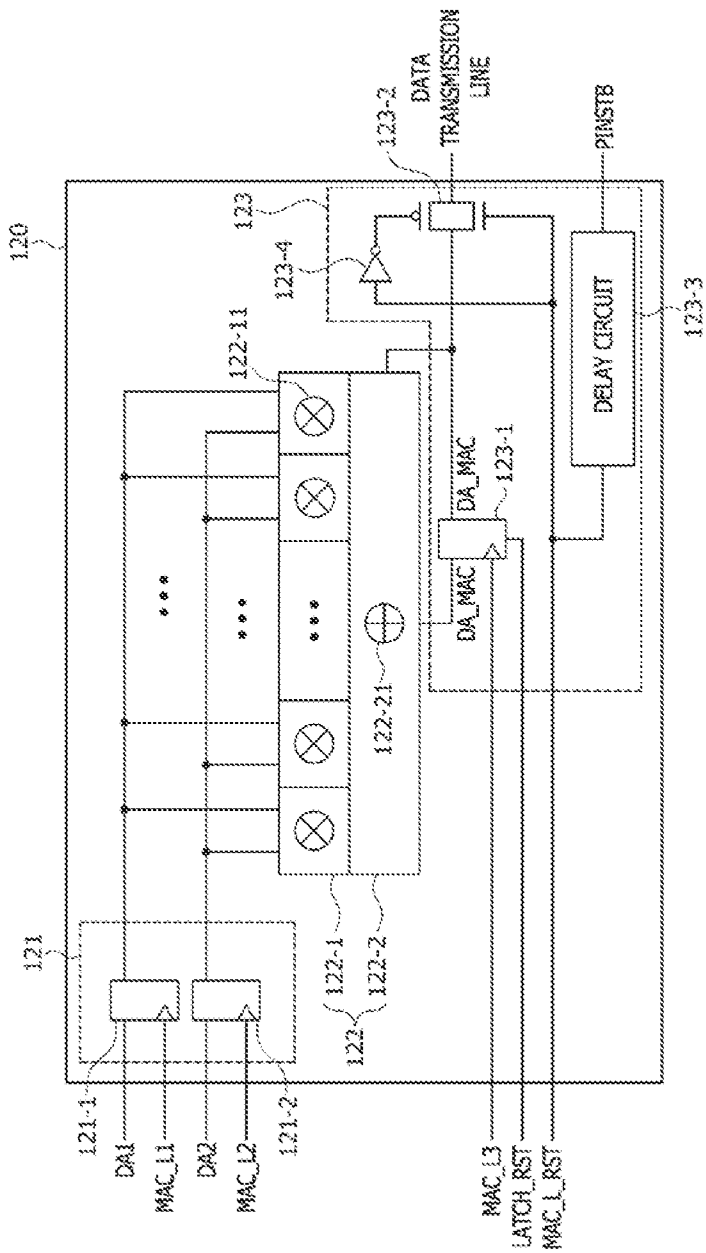
FIG. 4 is a block diagram illustrating an example of a configuration of a MAC operator of a PIM device included in a PIM system according to a first embodiment of the present disclosure.

FIG. 4 illustrates an example of the MAC operator 120 of the PIM device 100 included in the PIM system 1-1 according to the first embodiment of the present disclosure. Referring to FIG. 4, MAC operator 120 may be configured to include a data input circuit 121, a MAC circuit 122, and a data output circuit 123. The data input circuit 121 may include a first input latch 121-1 and a second input latch 121-2. The MAC circuit 122 may include a multiplication logic circuit 122-1 and an addition logic circuit 122-2. The data output circuit 123 may include an output latch 123-1, a transfer gate 123-2, a delay circuit 123-3, and an inverter 123-4. In an embodiment, the first input latch 121-1, the second input latch 121-2, and the output latch 123-1 may be realized by using flip-flops.

The data input circuit 121 of the MAC operator 120 may be synchronized with the first MAC input latch signal MAC_L1 to latch first data DA1 transferred from the first memory bank 111 to the MAC circuit 122 through an internal data transmission line. In addition, the data input circuit 121 of the MAC operator 120 may be synchronized with the second MAC input latch signal MAC_L2 to latch second data DA2 transferred from the second memory bank 112 to the MAC circuit 122 through another internal data transmission line. Because the first MAC input latch signal MAC_L1 and the second MAC input latch signal MAC_L2 are sequentially transmitted from the MAC command generator 240 of the PIM controller 200 to the MAC operator 120 of the PIM device 100 with a predetermined time interval, the second data DA2 may be inputted to the MAC circuit 122 of the MAC operator 120 after the first data DA1 is inputted to the MAC circuit 122 of the MAC operator 120.

The MAC circuit 122 may perform the MAC arithmetic operation of the first data DA1 and the second data DA2 inputted through the data input circuit 121. The multiplication logic circuit 122-1 of the MAC circuit 122 may include a plurality of multipliers 122-11. Each of the multipliers 122-11 may perform a multiplying calculation of the first data DA1 that is output from the first input latch 121-1 and the second data DA2 that is output from the second input latch 121-2 and may output the result of the multiplying calculation. Bit values constituting the first data DA1 may be separately inputted to the multipliers 122-11. Similarly, bit values constituting the second data DA2 may also be separately inputted to the multipliers 122-11. For example, if the first data DA1 is represented by an 'N'-bit binary stream, the second data DA2 is represented by an 'N'-bit binary stream, and the number of the multipliers 122-11 is 'M', then 'N/M'-bit portions of the first data DA1 and 'N/M'-bit portions of the second data DA2 may be inputted to each of the multipliers 122-11.

The addition logic circuit 122-2 of the MAC circuit 122 may include a plurality of adders 122-21. Although not shown in the drawings, the plurality of adders 122-21 may be disposed to provide a tree structure with a plurality of stages. Each of the adders 122-21 disposed at a first stage may receive two sets of multiplication result data from two of the multipliers 122-11 included in the multiplication logic circuit 122-1 and may perform an adding calculation of the two sets of multiplication result data to output the addition result data. Each of the adders 122-21 disposed at a second stage may receive two sets of addition result data from two of the adders 122-21 disposed at the first stage and may perform an adding calculation of the two sets of addition result data to output the addition result data. The adder 122-21 disposed at a last stage may receive two sets of addition result data from two adders 122-21 disposed at the previous stage and may perform an adding calculation of the two sets of addition result data to output the addition result data. Although not shown in the drawings, the addition logic circuit 122-2 may further include an additional adder for performing an accumulative adding calculation of MAC result data DA_MAC that is output from the adder 122-21 disposed at the last stage and previous MAC result data DA_MAC stored in the output latch 123-1 of the data output circuit 123.

The data output circuit 123 may output the MAC result data DA_MAC that is output from the MAC circuit 122 to a data transmission line. Specifically, the output latch 123-1 of the data output circuit 123 may be synchronized with the MAC output latch signal MAC_L3 to latch the MAC result data DA_MAC that is output from the MAC circuit 122 and to output the latched data of the MAC result data DA_MAC. The MAC result data DA_MAC that is output from the output latch 123-1 may be fed back to the MAC circuit 122 for the accumulative adding calculation. In addition, the MAC result data DA_MAC may be inputted to the transfer gate 123-2. The output latch 123-1 may be initialized if a latch reset signal LATCH_RST is inputted to the output latch 123-1. In such a case, all of data latched by the output latch 123-1 may be removed. In an embodiment, the latch reset signal LATCH_RST may be activated by generation of the MAC latch reset signal MAC_L_RST and may be inputted to the output latch 123-1.

The MAC latch reset signal MAC_L_RST that is output from the MAC command generator 240 may be inputted to the transfer gate 123-2, the delay circuit 123-3, and the inverter 123-4. The inverter 123-4 may inversely buffer the MAC latch reset signal MAC_L_RST to output the inversely buffered signal of the MAC latch reset signal MAC_L_RST to the transfer gate 123-2. The transfer gate 123-2 may transfer the MAC result data DA_MAC from the output latch 123-1 to the data transmission line in response to the MAC latch reset signal MAC_L_RST. The delay circuit 123-3 may delay the MAC latch reset signal MAC_L_RST by a certain time to generate and output a latch control signal PINSTB.

Figure 5:
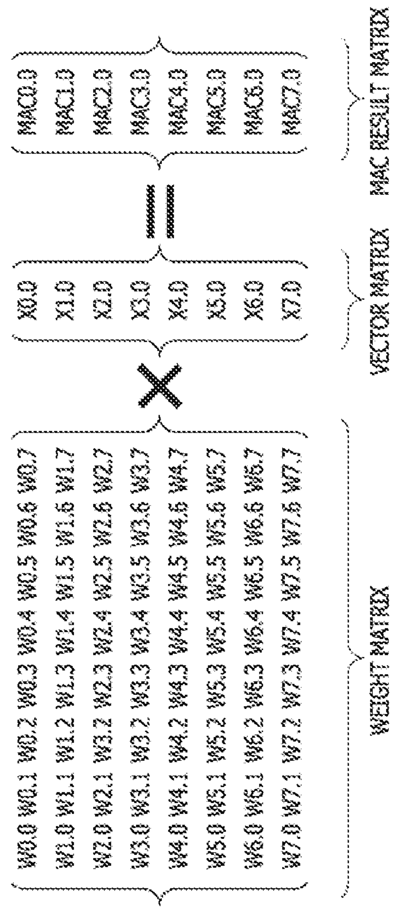
FIG. 5 illustrates an example of a MAC arithmetic operation performed in a PIM system according to a first embodiment of the present disclosure.

FIG. 5 illustrates an example of the MAC arithmetic operation performed in the PIM system 1-1 according to the first embodiment of the present disclosure. As illustrated in FIG. 5, the MAC arithmetic operation performed by the PIM system 1-1 may be executed though a matrix calculation. Specifically, the PIM device 100 may execute a matrix multiplying calculation of an 'M×N' weight matrix (e.g., '8×8' weight matrix) and a 'N×1' vector matrix (e.g., '8×1' vector matrix) according to control of the PIM controller 200 (where, 'M' and 'N' are natural numbers). Elements W0.0, . . . , and W7.7 constituting the weight matrix may correspond to the first data DA1 inputted to the MAC operator 120 from the first memory bank 111. Elements X0.0, . . . , and X7.0 constituting the vector matrix may correspond to the second data DA2 inputted to the MAC operator 120 from the second memory bank 112. Each of the elements W0.0, . . . , and W7.7 constituting the weight matrix may be represented by a binary stream with a plurality of bit values. In addition, each of the elements X0.0, . . . , and X7.0 constituting the vector matrix may also be represented by a binary stream with a plurality of bit values. The number of bits included in each of the elements W0.0, . . . , and W7.7 constituting the weight matrix may be equal to the number of bits included in each of the elements X0.0, . . . , and X7.0 constituting the vector matrix.

The matrix multiplying calculation of the weight matrix and the vector matrix may be appropriate for a multilayer perceptron-type neural network structure (hereinafter, referred to as an 'MLP-type neural network'). In general, the MLP-type neural network for executing deep learning may include an input layer, a plurality of hidden layers (e.g., at least three hidden layers), and an output layer. The matrix multiplying calculation (i.e., the MAC arithmetic operation) of the weight matrix and the vector matrix illustrated in FIG. 5 may be performed in one of the hidden layers. In a first hidden layer of the plurality of hidden layers, the MAC arithmetic operation may be performed by using vector data inputted to the first hidden layer. However, in each of second to last hidden layers among the plurality of hidden layers, the MAC arithmetic operation may be performed by using a calculation result of the previous hidden layer as the vector data.

Figure 6:
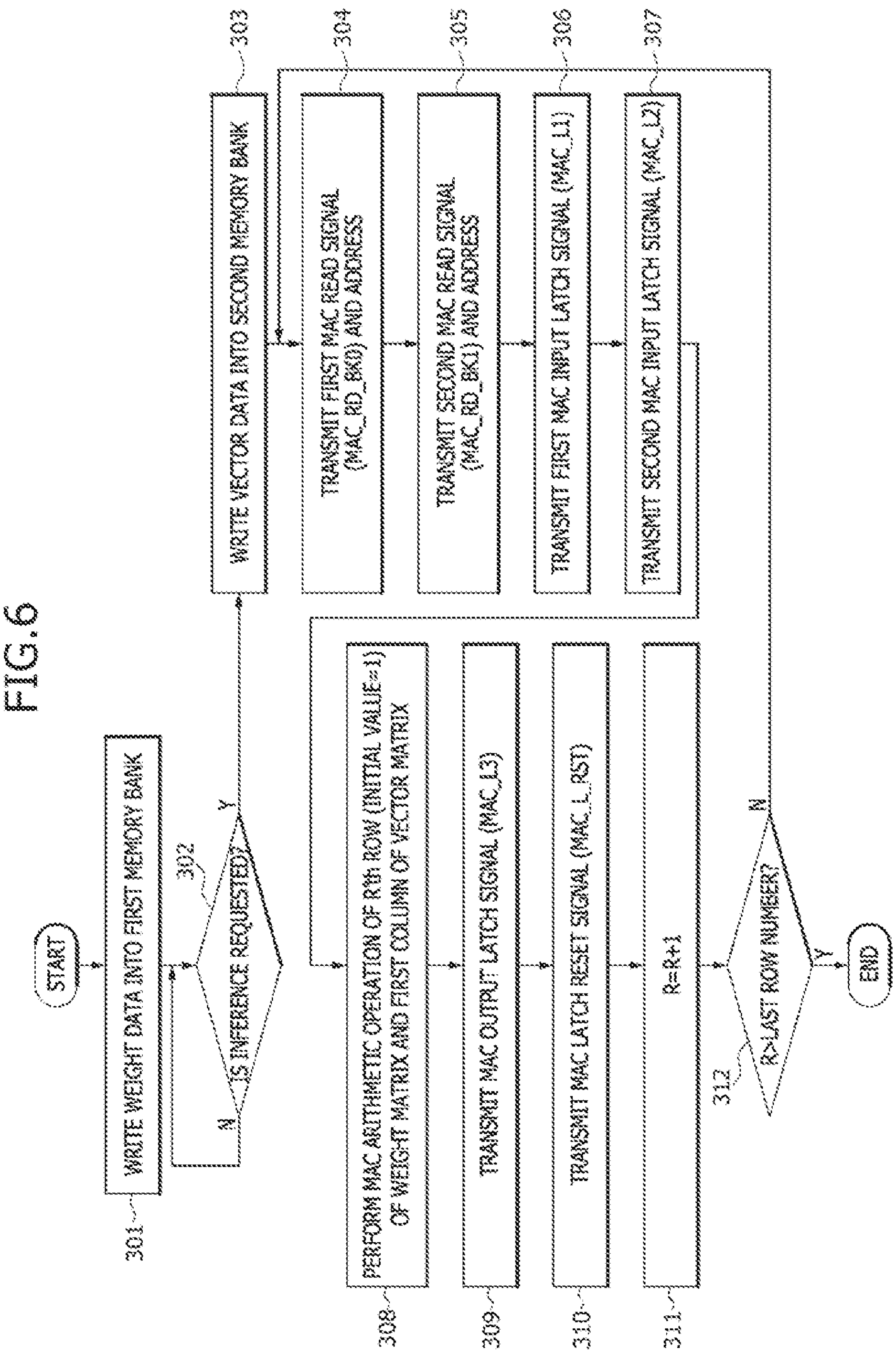
FIG. 6 is a flowchart illustrating processes of the MAC arithmetic operation illustrated in FIG. 5 in a PIM system according to a first embodiment of the present disclosure.

FIG. 6 is a flowchart illustrating processes of the MAC arithmetic operation described with reference to FIG. 5, which are performed in the PIM system 1-1 according to the first embodiment of the present disclosure. In addition, FIGS. 7 to 13 are block diagrams illustrating the processes of the MAC arithmetic operation illustrated in FIG. 5, which are performed in the PIM system 1-1 according to the first embodiment of the present disclosure. Referring to FIGS. 6 to 13, before the MAC arithmetic operation is performed, the first data (i.e., the weight data) may be written into the first memory bank 111 at a step 301. Thus, the weight data may be stored in the first memory bank 111 of the PIM device 100. In the present embodiment, it may be assumed that the weight data are the elements W0.0, . . . , and W7.7 constituting the weight matrix of FIG. 5. The integer before the decimal point is one less than a row number, and the integer after the decimal point is one less than a column number. Thus, for example, the weight W0.0 represents the element of the first row and the first column of the weight matrix.

At a step 302, whether an inference is requested may be determined. An inference request signal may be transmitted from an external device located outside of the PIM system 1-1 to the PIM controller 200 of the PIM system 1-1. An inference request, in some instances, may be based on user input. An inference request may initiate a calculation performed by the PIM system 1-1 to reach a determination based on input data. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 200 at the step 302, then the PIM controller 200 may write the vector data that is transmitted with the inference request signal into the second memory bank 112 at a step 303. Accordingly, the vector data may be stored in the second memory bank 112 of the PIM device 100.

Figure 7:
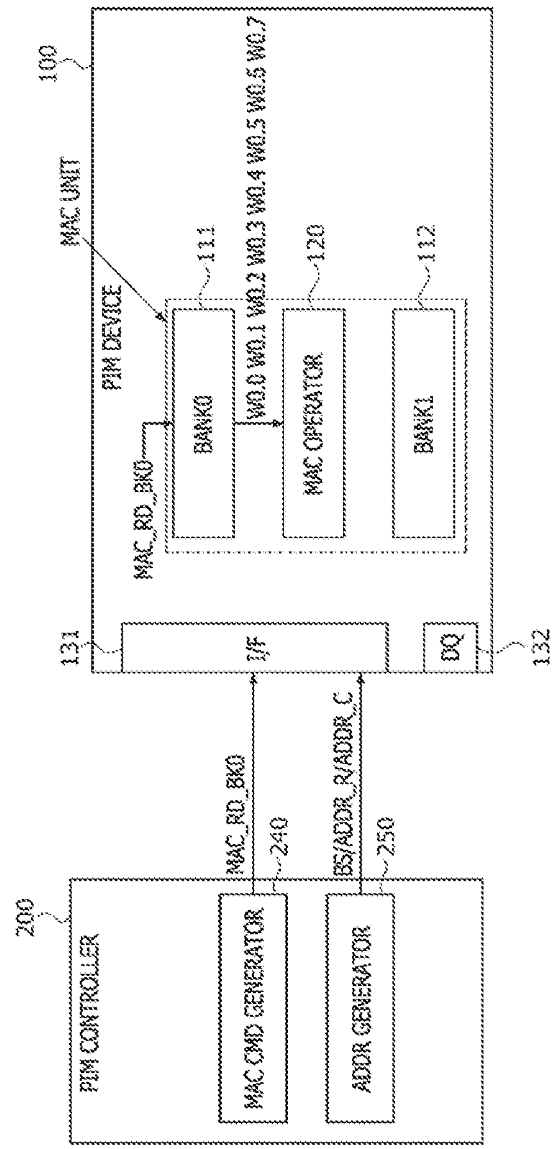
FIGS. 7 to 13 are block diagrams illustrating processes of the MAC arithmetic operation illustrated in FIG. 5 in a PIM system according to a first embodiment of the present disclosure.

At a step 304, the MAC command generator 240 of the PIM controller 200 may generate and transmit the first MAC read signal MAC_RD_BK0 to the PIM device 100, as illustrated in FIG. 7. In such a case, the address generator 250 of the PIM controller 200 may generate and transmit the bank selection signal BS and the row/column address ADDR_R/ADDR_C to the PIM device 100. The bank selection signal BS may be generated to select the first memory bank 111 of the first and second memory banks 111 and 112. Thus, the first MAC read signal MAC_RD_BK0 may control the data read operation for the first memory bank 111 of the PIM device 100. The first memory bank 111 may output and transmit the elements W0.0, . . . , and W0.7 in the first row of the weight matrix of the weight data stored in a region of the first memory bank 111, which is selected by the row/column address ADDR_R/ADDR_C, to the MAC operator 120 in response to the first MAC read signal MAC_RD_BK0. In an embodiment, the data transmission from the first memory bank 111 to the MAC operator 120 may be executed through a global input/output (hereinafter, referred to as 'GIO') line which is provided as a data transmission path in the PIM device 100. Alternatively, the data transmission from the first memory bank 111 to the MAC operator 120 may be executed through a first bank input/output (hereinafter, referred to as 'BIO') line which is provided specifically for data transmission between the first memory bank 111 and the MAC operator 120.

Figure 8:
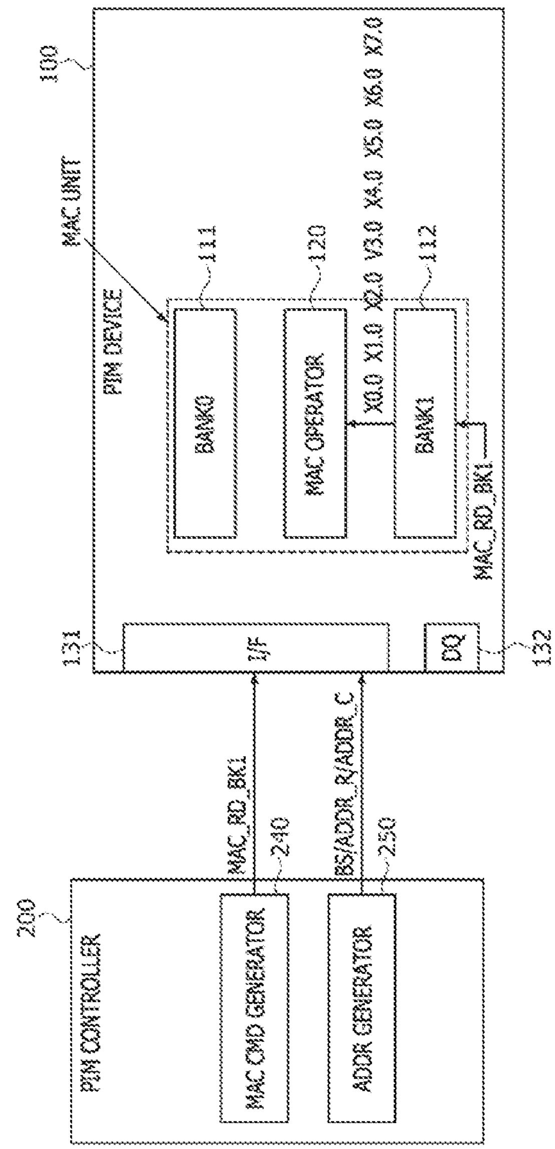

At a step 305, the MAC command generator 240 of the PIM controller 200 may generate and transmit the second MAC read signal MAC_RD_BK1 to the PIM device 100, as illustrated in FIG. 8. In such a case, the address generator 250 of the PIM controller 200 may generate and transmit the bank selection signal BS for selecting the second memory bank 112 and the row/column address ADDR_R/ADDR_C to the PIM device 100. The second MAC read signal MAC_RD_BK1 may control the data read operation for the second memory bank 112 of the PIM device 100. The second memory bank 112 may output and transmit the elements X0.0, . . . , and X7.0 in the first column of the vector matrix corresponding to the vector data stored in a region of the second memory bank 112, which is selected by the row/column address ADDR_R/ADDR_C, to the MAC operator 120 in response to the second MAC read signal MAC_RD_BK1. In an embodiment, the data transmission from the second memory bank 112 to the MAC operator 120 may be executed through the GIO line in the PIM device 100. Alternatively, the data transmission from the second memory bank 112 to the MAC operator 120 may be executed through a second BIO line which is provided specifically for data transmission between the second memory bank 112 and the MAC operator 120.

Figure 9:
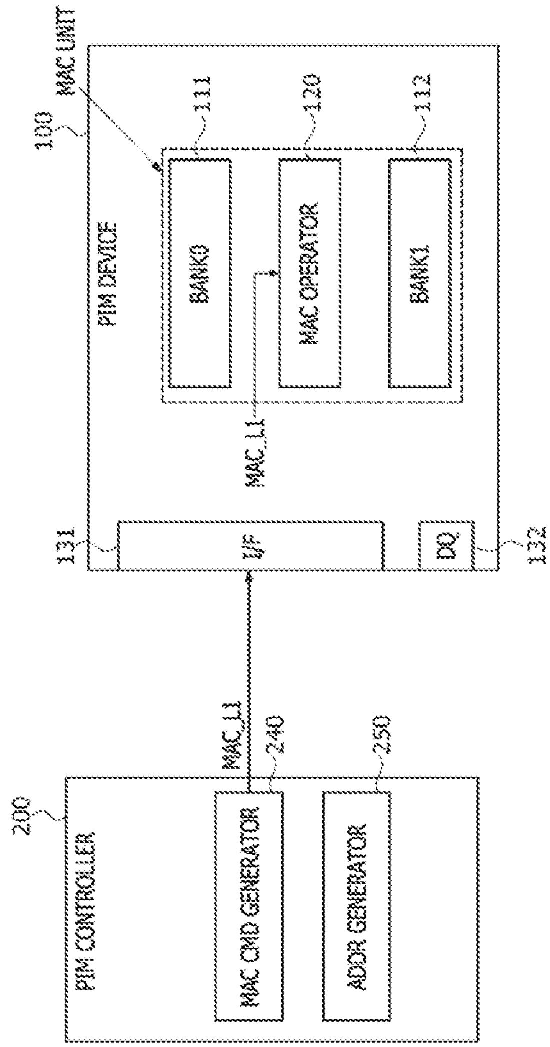
Figure 11:
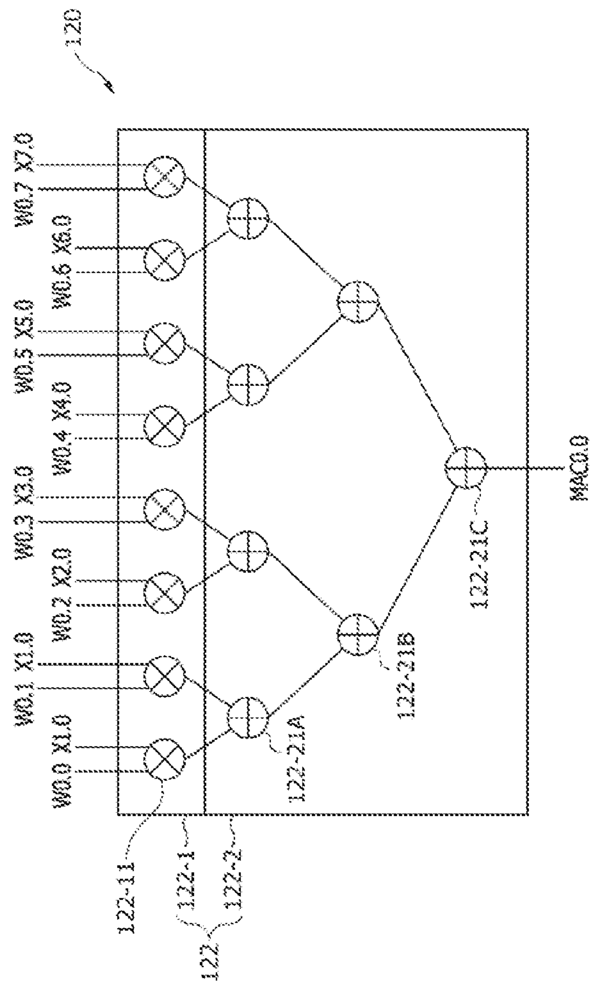

At a step 306, the MAC command generator 240 of the PIM controller 200 may generate and transmit the first MAC input latch signal MAC_L1 to the PIM device 100, as illustrated in FIG. 9. The first MAC input latch signal MAC_L1 may control the input latch operation of the first data for the MAC operator 120 of the PIM device 100. The elements W0.0, . . . , and W0.7 in the first row of the weight matrix may be inputted to the MAC circuit 122 of the MAC operator 120 by the input latch operation, as illustrated in FIG. 11. The MAC circuit 122 may include the plurality of multipliers 122-11 (e.g., eight multipliers 122-11), the number of which is equal to the number of columns of the weight matrix. In such a case, the elements W0.0, . . . , and W0.7 in the first row of the weight matrix may be inputted to the eight multipliers 122-11, respectively.

Figure 10:
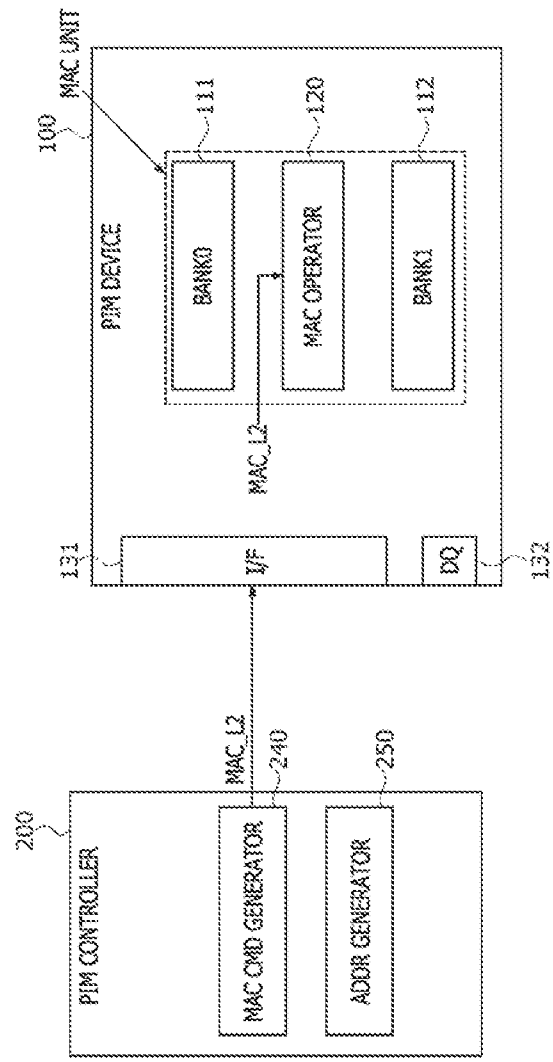

At a step 307, the MAC command generator 240 of the PIM controller 200 may generate and transmit the second MAC input latch signal MAC_L2 to the PIM device 100, as illustrated in FIG. 10. The second MAC input latch signal MAC_L2 may control the input latch operation of the second data for the MAC operator 120 of the PIM device 100. The elements X0.0, . . . , and X7.0 in the first column of the vector matrix may be inputted to the MAC circuit 122 of the MAC operator 120 by the input latch operation, as illustrated in FIG. 11. In such a case, the elements X0.0, . . . , and X7.0 in the first column of the vector matrix may be inputted to the eight multipliers 122-11, respectively.

At a step 308, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. For example, the scalar product is calculated of the Rth '1×N' row vector of the 'M×N' weight matrix and the 'N×1' vector matrix as an 'R×1' element of the 'M×1' MAC result matrix. For R=1, the scalar product of the first row of the weight matrix and the first column of the vector matrix shown in FIG. 5 is **W0.0*X0.0+W0.1*X1.0+W0.2*X2.0+W0.3*X3.0+W0.4*X4.0+W0.5*X5.0+W0.6*X6.0+W0.7*X7.0. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2, as illustrated in FIG. 11, may include four adders 122-21A disposed at a first stage, two adders 122-21B disposed at a second stage, and an adder 122-21**C disposed at a third stage.

Each of the adders 122-21A disposed at the first stage may receive output data of two of the multipliers 122-11 and may perform an adding calculation of the output data of the two multipliers 122-11 to output the result of the adding calculation. Each of the adders 122-21B disposed at the second stage may receive output data of two of the adders 122-21A disposed at the first stage and may perform an adding calculation of the output data of the two adders 122-21A to output the result of the adding calculation. The adder 122-21C disposed at the third stage may receive output data of two of the adders 122-21B disposed at the second stage and may perform an adding calculation of the output data of the two adders 122-21B to output the result of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to an element MAC0.0 located at a first row of an '8×1' MAC result matrix with eight elements of MAC0.0, . . . , and MAC7.0, as illustrated in FIG. 5. The output data MAC0.0 of the addition logic circuit 122-2 may be inputted to the output latch 123-1 disposed in the data output circuit 123 of the MAC operator 120, as described with reference to FIG. 4.

Figure 12:
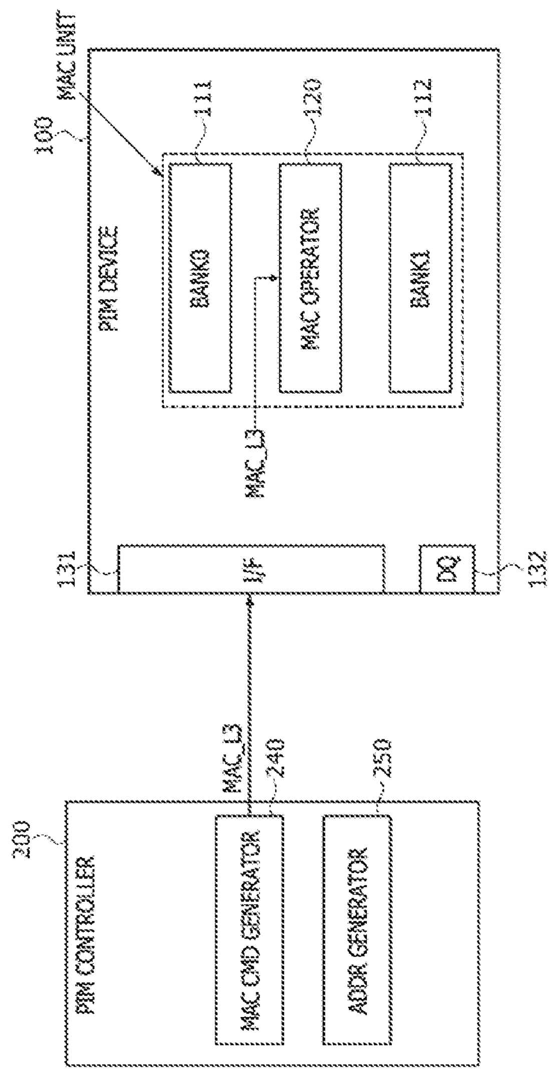

At a step 309, the MAC command generator 240 of the PIM controller 200 may generate and transmit the MAC output latch signal MAC_L3 to the PIM device 100, as illustrated in FIG. 12. The MAC output latch signal MAC_L3 may control the output latch operation of the MAC result data MAC0.0 performed by the MAC operator 120 of the PIM device 100. The MAC result data MAC0.0 inputted from the MAC circuit 122 of the MAC operator 120 may be output from the output latch 123-1 in synchronization with the MAC output latch signal MAC_L3, as described with reference to FIG. 4. The MAC result data MAC0.0 that is output from the output latch 123-1 may be inputted to the transfer gate 123-2 of the data output circuit 123.

Figure 13:
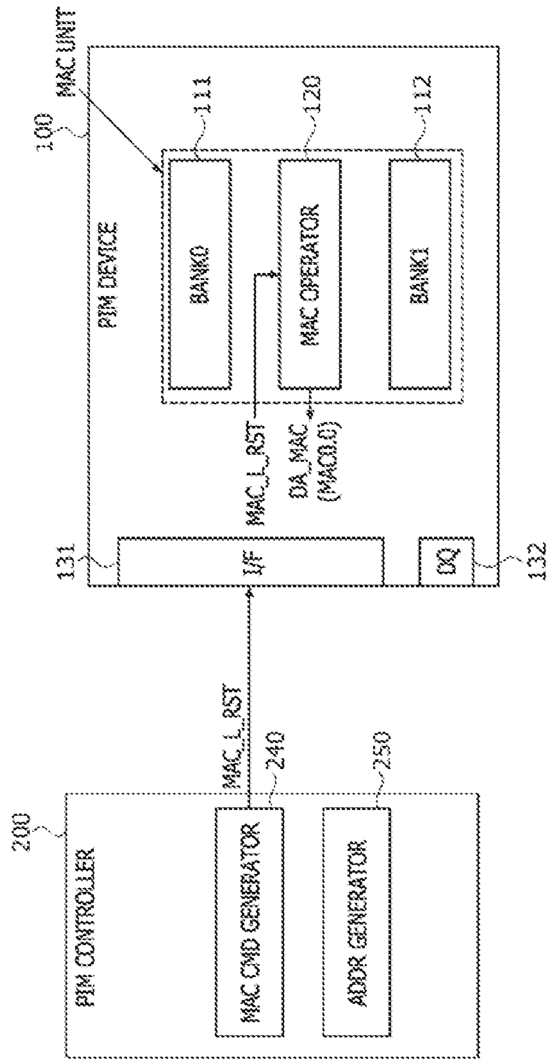

At a step 310, the MAC command generator 240 of the PIM controller 200 may generate and transmit the MAC latch reset signal MAC_L_RST to the PIM device 100, as illustrated in FIG. 13. The MAC latch reset signal MAC_L_RST may control an output operation of the MAC result data MAC0.0 generated by the MAC operator 120 and a reset operation of the output latch included in the MAC operator 120. As described with reference to FIG. 4, the transfer gate 123-2 receiving the MAC result data MAC0.0 from the output latch 123-1 of the MAC operator 120 may be synchronized with the MAC latch reset signal MAC_L_RST to output the MAC result data MAC0.0. In an embodiment, the MAC result data MAC0.0 that is output from the MAC operator 120 may be stored into the first memory bank 111 or the second memory bank 112 through the first BIO line or the second BIO line in the PIM device 100.

At a step 311, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 311. At a step 312, whether the row number changed at the step 311 is greater than the row number of the last row (i.e., the eighth row of the current example) of the weight matrix may be determined. Because the row number of the weight matrix is changed to '2' at the step 311, a process of the MAC arithmetic operation may be fed back to the step 304.

If the process of the MAC arithmetic operation is fed back to the step 304 from the step 312, then the same processes as described with reference to the steps 304 to 310 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 304 at the step 312, then the processes from the step 304 to the step 311 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 311, the MAC arithmetic operation may terminate because the row number of '9' is greater than the last row number of '8' at the step 312.

Figure 14:
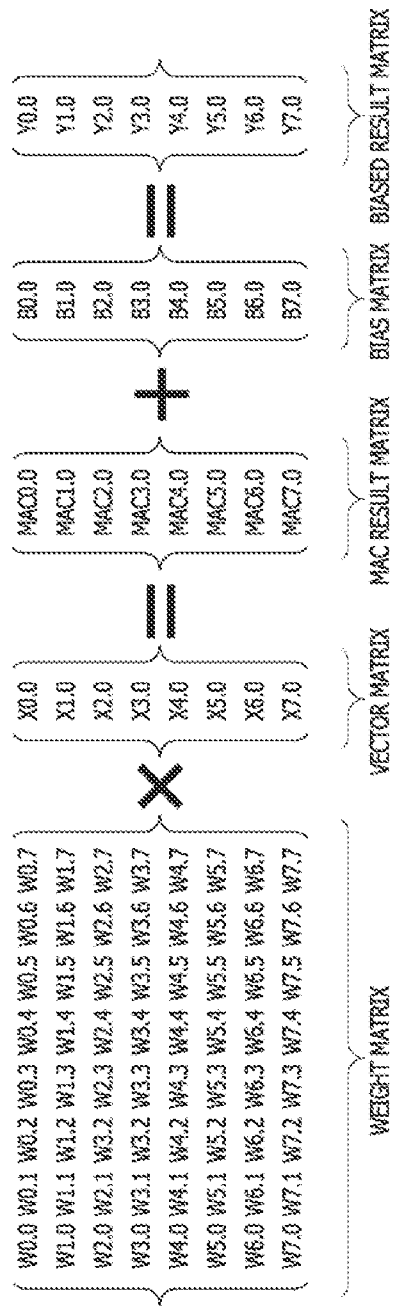
FIG. 14 illustrates another example of a MAC arithmetic operation performed in a PIM system according to a first embodiment of the present disclosure.

FIG. 14 illustrates another example of a MAC arithmetic operation performed in the PIM system 1-1 according to the first embodiment of the present disclosure. As illustrated in FIG. 14, the MAC arithmetic operation performed by the PIM system 1-1 may further include an adding calculation of the MAC result matrix and a bias matrix. Specifically, as described with reference to FIG. 5, the PIM device 100 may execute the matrix multiplying calculation of the '8×8' weight matrix and the '8×1' vector matrix according to control of the PIM controller 200. As a result of the matrix multiplying calculation of the '8×8' weight matrix and the '8×1' vector matrix, the '8×1' MAC result matrix with the eight elements MAC0.0, . . . , and MAC7.0 may be generated. The '8×1' MAC result matrix may be added to a '8×1' bias matrix. The '8×1' bias matrix may have elements B0.0, . . . , and B7.0 corresponding to bias data. The bias data may be set to reduce an error of the MAC result matrix. As a result of the adding calculation of the MAC result matrix and the bias matrix, a '8×1' biased result matrix with eight elements Y0.0, . . . , and Y7.0 may be generated.

Figure 15:
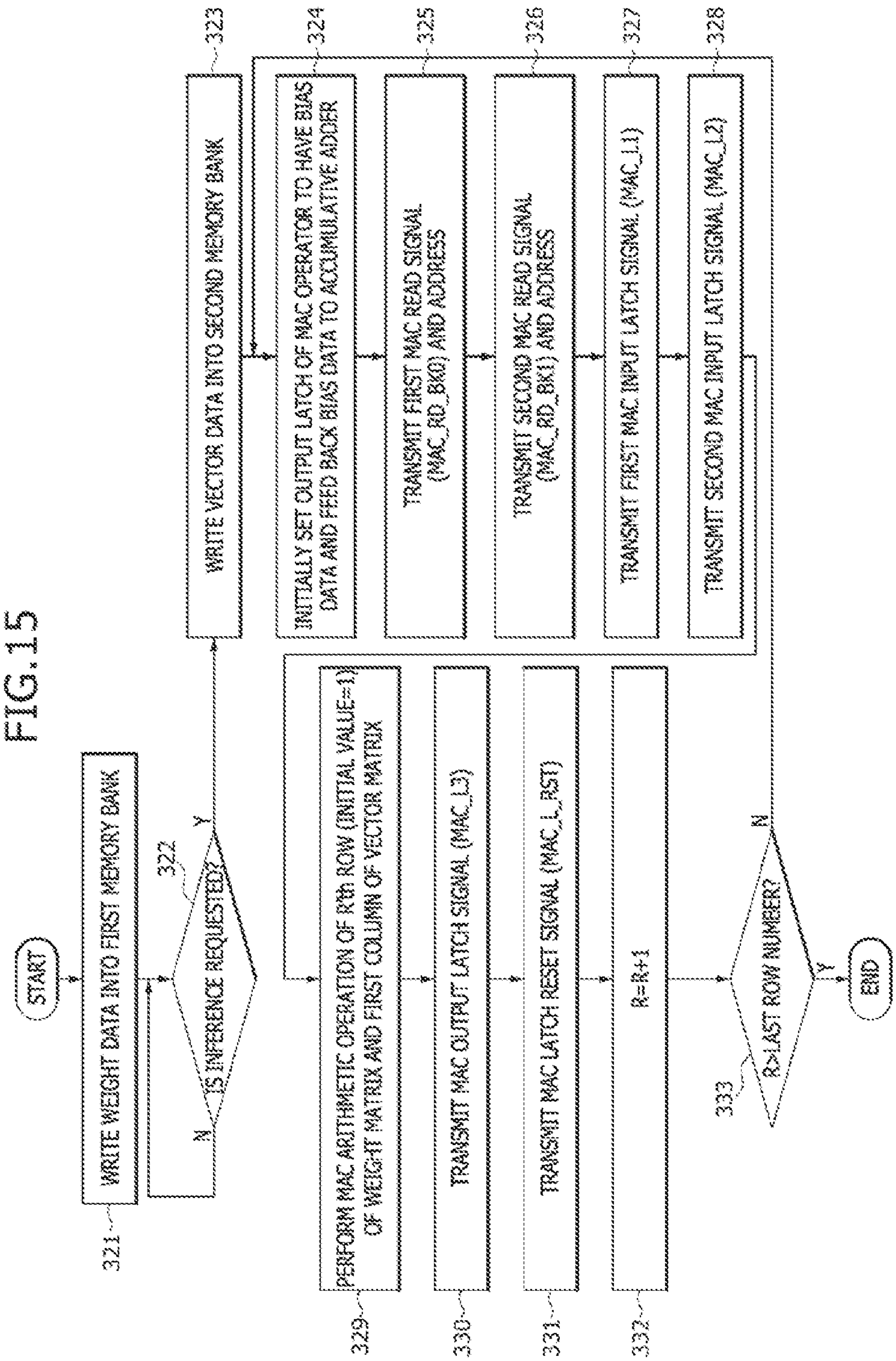
FIG. 15 is a flowchart illustrating processes of the MAC arithmetic operation illustrated in FIG. 14 in a PIM system according to a first embodiment of the present disclosure.
Figure 16:
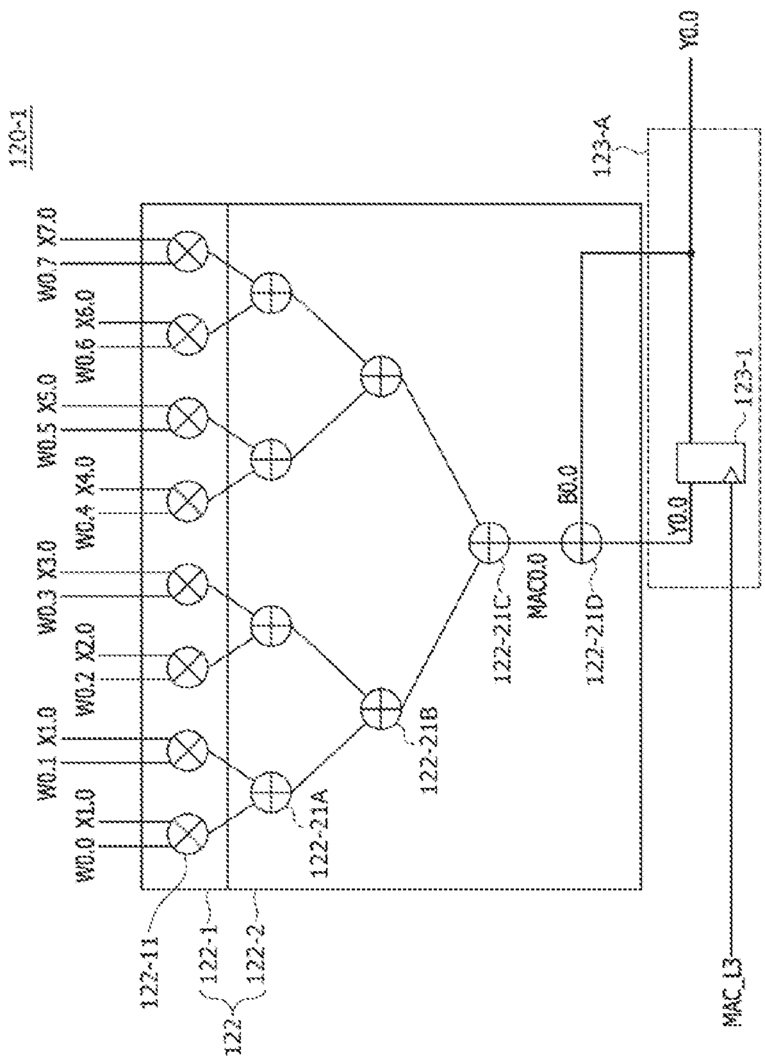
FIG. 16 illustrates an example of a configuration of a MAC operator for performing the MAC arithmetic operation of FIG. 14 in a PIM system according to a first embodiment of the present disclosure.

FIG. 15 is a flowchart illustrating processes of the MAC arithmetic operation described with reference to FIG. 14 in the PIM system 1-1 according to the first embodiment of the present disclosure. Moreover, FIG. 16 illustrates an example of a configuration of a MAC operator 120-1 for performing the MAC arithmetic operation of FIG. 14 in the PIM system 1-1 according to the first embodiment of the present disclosure. In FIG. 16, the same reference numerals or the same reference symbols as used in FIG. 4 denote the same elements, and the detailed descriptions of the same elements as indicated in the previous embodiment will be omitted hereinafter. Referring to FIG. 15, the first data (i.e., the weight data) may be written into the first memory bank 111 at a step 321 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 14.

At a step 322, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 200 at the step 322, the PIM controller 200 may write the vector data that is transmitted with the inference request signal into the second memory bank 112 at a step 323. Accordingly, the vector data may be stored in the second memory bank 112 of the PIM device 100.

At a step 324, the output latch of the MAC operator may be initially set to have the bias data and the initially set bias data may be fed back to an accumulative adder of the MAC operator. This process is executed to perform the matrix adding calculation of the MAC result matrix and the bias matrix, which is described with reference to FIG. 14. In other words, the output latch 123-1 in the data output circuit 123-A of the MAC operator (120-1) is set to have the bias data. Because the matrix multiplying calculation is executed for the first row of the weight matrix, the output latch 123-1 may be initially set to have the element B0.0 located at a cross point of the first row and the first column of the bias matrix as the bias data. The output latch 123-1 may output the bias data B0.0, and the bias data B0.0 that is output from the output latch 123-1 may be inputted to the accumulative adder 122-21D of the addition logic circuit 122-2, as illustrated in FIG. 16.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-1 of the PIM device 100. When a subsequent MAC arithmetic operation is performed, the accumulative adder 122-21D of the MAC operator 120-1 may add the MAC result data MAC0.0 that is output from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

In a step 325, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 325 may be executed in the same way as described with reference to FIG. 7. In a step 326, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 326 may be executed in the same way as described with reference to FIG. 8.

At a step 327, the MAC command generator 240 of the PIM controller 200 may generate and transmit the first MAC input latch signal MAC_L1 to the PIM device 100. The step 327 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 328, the MAC command generator 240 of the PIM controller 200 may generate and transmit the second MAC input latch signal MAC_L2 to the PIM device 100. The step 328 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 329, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 16. The accumulative adder 122-21D may add output data of the adder 122-21C to feedback data fed back from the output latch 123-1 to output the result of the adding calculation. The output data of the adder 122-21C may be the matrix multiplying result MAC0.0, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123 disposed in a data output circuit 123-A of the MAC operator 120-1.

At a step 330, the MAC command generator 240 of the PIM controller 200 may generate and transmit the MAC output latch signal MAC_L3 to the PIM device 100. The step 330 may be executed in the same way as described with reference to FIG. 12. The MAC output latch signal MAC_L3 may control the output latch operation of the MAC result data MAC0.0, which is performed by the MAC operator 120-1 of the PIM device 100. The biased result data Y0.0 transmitted from the MAC circuit 122 of the MAC operator 120 to the output latch 123-1 may be output from the output latch 123-1 in synchronization with the MAC output latch signal MAC_L3. The biased result data Y0.0 that is output from the output latch 123 may be inputted to the transfer gate 123-2.

At a step 331, the MAC command generator 240 of the PIM controller 200 may generate and transmit the MAC latch reset signal MAC_L_RST to the PIM device 100. The step 331 may be executed in the same way as described with reference to FIG. 13. The MAC latch reset signal MAC_L_RST may control an output operation of the biased result data Y0.0 generated by the MAC operator 120 and a reset operation of the output latch 123-1 included in the MAC operator 120. The transfer gate 123-2 receiving the biased result data Y0.0 from the output latch 123-1 of the data output circuit 123-A included in the MAC operator 120 may be synchronized with the MAC latch reset signal MAC_L_RST to output the biased result data Y0.0. In an embodiment, the biased result data Y0.0 that is output from the MAC operator 120 may be stored into the first memory bank 111 or the second memory bank 112 through the first BIO line or the second BIO line in the PIM device 100.

At a step 332, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 332. At a step 333, whether the row number changed at the step 332 is greater than the row number of the last row (i.e., the eighth row of the current example) of the weight matrix may be determined. Because the row number of the weight matrix is changed to '2' at the step 332, a process of the MAC arithmetic operation may be fed back to the step 324.

If the process of the MAC arithmetic operation is fed back to the step 324 from the step 333, then the same processes as described with reference to the steps 324 to 331 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix and the bias data B0.0 in the output latch 123-1 initially set at the step 324 may be changed into the bias data B1.0. If the process of the MAC arithmetic operation is fed back to the step 324 at the step 333, the processes from the step 324 to the step 332 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 332, the MAC arithmetic operation may terminate because the row number of '9' is greater than the last row number of '8' at the step 333.

Figure 17:
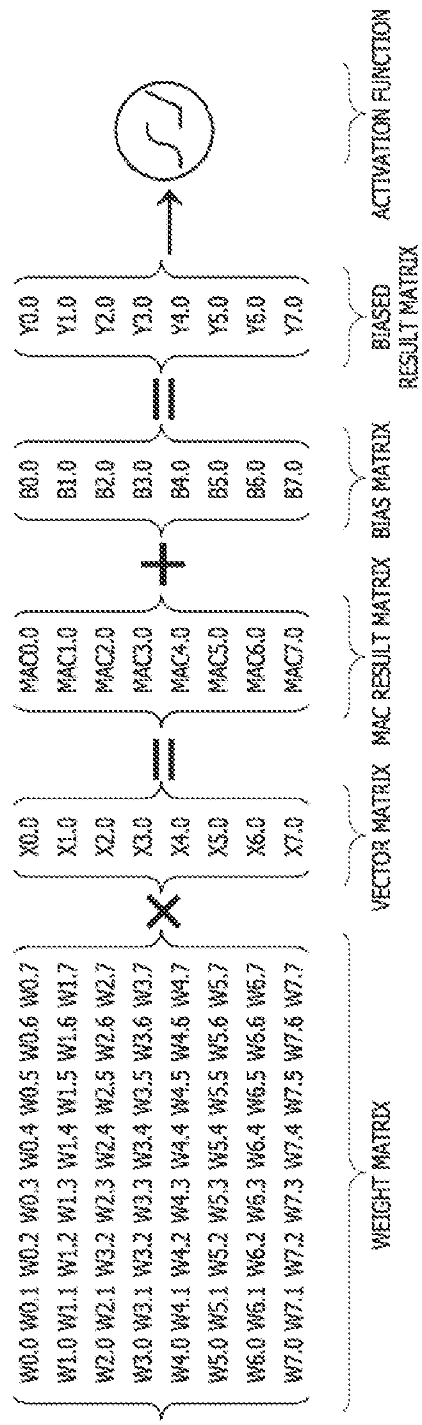
FIG. 17 illustrates yet another example of a MAC arithmetic operation performed in a PIM system according to a first embodiment of the present disclosure.

FIG. 17 illustrates yet another example of a MAC arithmetic operation performed in the PIM system 1-1 according to the first embodiment of the present disclosure. As illustrated in FIG. 17, the MAC arithmetic operation performed by the PIM system 1-1 may further include a process for applying the biased result matrix to an activation function. Specifically, as described with reference to FIG. 14, the PIM device 100 may execute the matrix multiplying calculation of the '8×8' weight matrix and the '8×1' vector matrix according to control of the PIM controller 200 to generate the MAC result matrix. In addition, the MAC result matrix may be added to the bias matrix to generate biased result matrix.

The biased result matrix may be applied to the activation function. The activation function means a function which is used to calculate a unique output value by comparing a MAC calculation value with a critical value in an MLP-type neural network. In an embodiment, the activation function may be a unipolar activation function which generates only positive output values or a bipolar activation function which generates negative output values as well as positive output values. In different embodiments, the activation function may include a sigmoid function, a hyperbolic tangent (Tanh) function, a rectified linear unit (ReLU) function, a leaky ReLU function, an identity function, and a maxout function.

Figure 18:
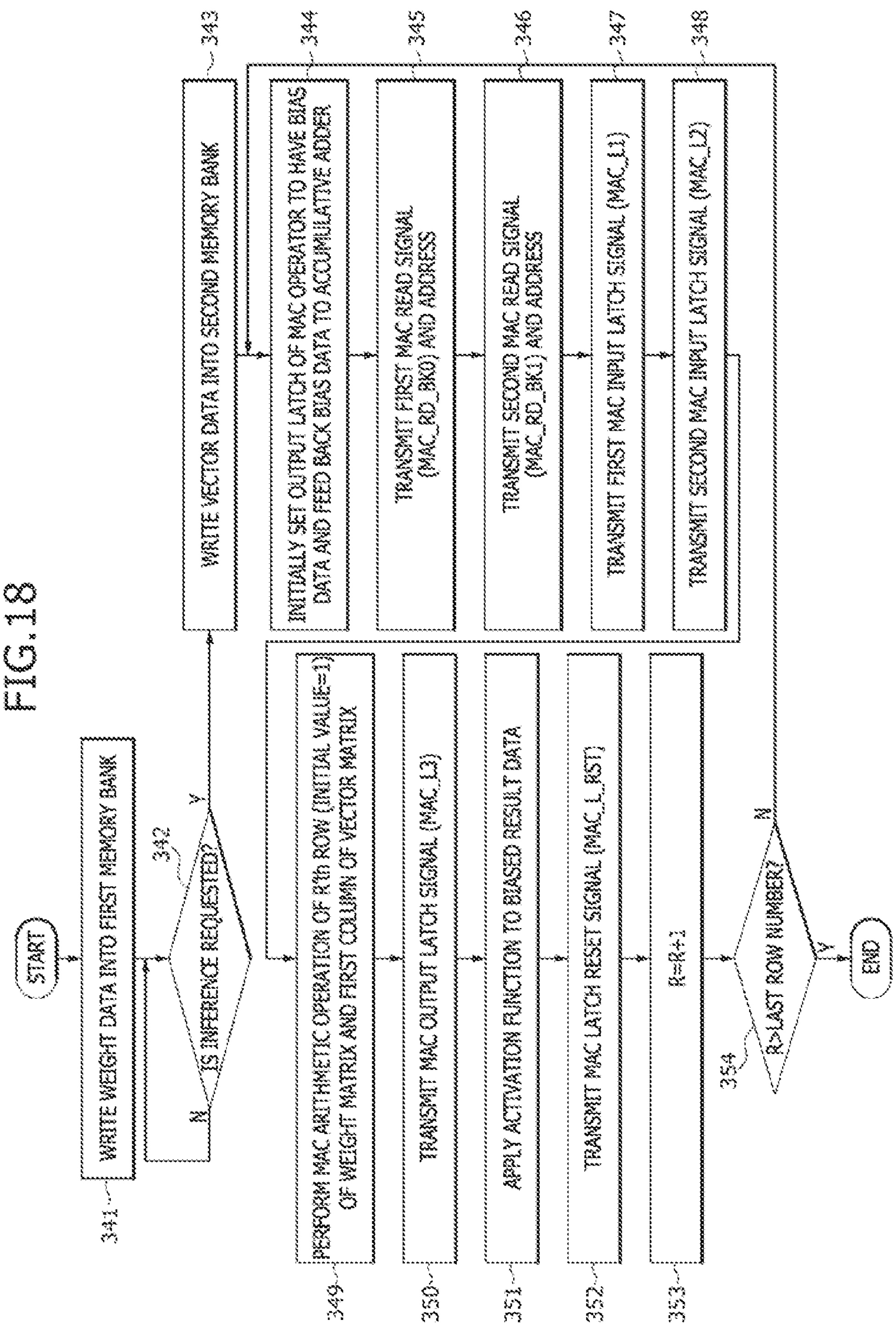
FIG. 18 is a flowchart illustrating processes of the MAC arithmetic operation illustrated in FIG. 17 in a PIM system according to a first embodiment of the present disclosure.
Figure 19:
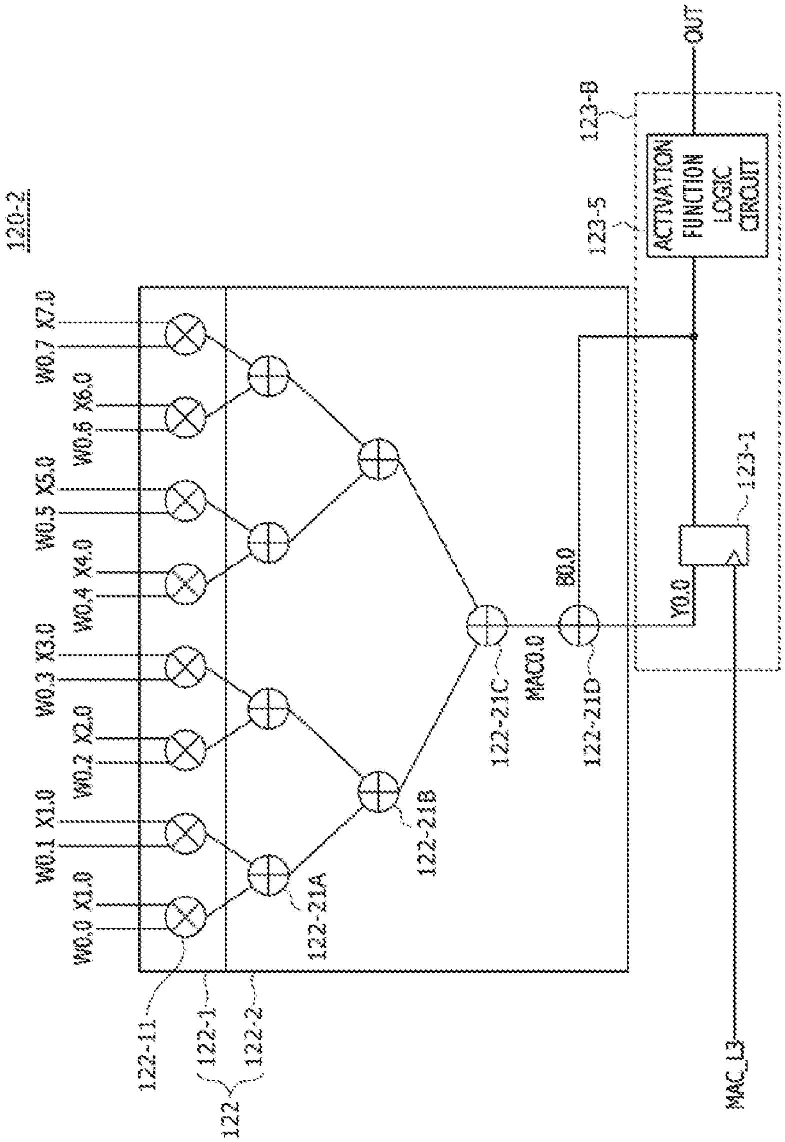
FIG. 19 illustrates an example of a configuration of a MAC operator for performing the MAC arithmetic operation of FIG. 17 in a PIM system according to a first embodiment of the present disclosure.

FIG. 18 is a flowchart illustrating processes of the MAC arithmetic operation described with reference to FIG. 17 in the PIM system 1-1 according to the first embodiment of the present disclosure. Moreover, FIG. 19 illustrates an example of a configuration of a MAC operator 120-2 for performing the MAC arithmetic operation of FIG. 17 in the PIM system 1-1 according to the first embodiment of the present disclosure. In FIG. 19, the same reference numerals or the same reference symbols as used in FIG. 4 denote the same elements, and the detailed descriptions of the same elements as mentioned in the previous embodiment will be omitted hereinafter. Referring to FIG. 18, the first data (i.e., the weight data) may be written into the first memory bank 111 at a step 341 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 17.

At a step 342, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., the data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 200 at the step 342, then the PIM controller 200 may write the vector data that is transmitted with the inference request signal into the second memory bank 112 at a step 343. Accordingly, the vector data may be stored in the second memory bank 112 of the PIM device 100.

At a step 344, an output latch of a MAC operator may be initially set to have bias data and the initially set bias data may be fed back to an accumulative adder of the MAC operator. This process is executed to perform the matrix adding calculation of the MAC result matrix and the bias matrix, which is described with reference to FIG. 17. That is, as illustrated in FIG. 19, the output latch 123-1 of the MAC operator (120-2 of FIG. 19) may be initially set to have the bias data of the bias matrix. Because the matrix multiplying calculation is executed for the first row of the weight matrix, the element B0.0 located at first row and the first column of the bias matrix may be initially set as the bias data in the output latch 123-1. The output latch 123-1 may output the bias data B0.0, and the bias data B0.0 that is output from the output latch 123-1 may be inputted to the accumulative adder 122-21D of the MAC operator 120-2.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-2 of the PIM device 100. When a subsequent MAC arithmetic operation is performed, the accumulative adder 122-21D of the MAC operator 120-2 may add the MAC result data MAC0.0 that is output from the adder 122-21C disposed at the last stage to the bias data B0.0 which is fed back from the output latch 123-1 to generate the biased result data Y0.0 and may output the biased result data Y0.0 to the output latch 123-1. As illustrated in FIG. 19, the biased result data Y0.0 may be transmitted from the output latch 123-1 to an activation function logic circuit 123-5 disposed in a data output circuit 123-B of the MAC operator 120-2 in synchronization with the MAC output latch signal MAC_L3 transmitted in a subsequent process.

In a step 345, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 345 may be executed in the same way as described with reference to FIG. 7. In a step 346, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 346 may be executed in the same way as described with reference to FIG. 8.

At a step 347, the MAC command generator 240 of the PIM controller 200 may generate and transmit the first MAC input latch signal MAC_L1 to the PIM device 100. The step 347 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 348, the MAC command generator 240 of the PIM controller 200 may generate and transmit the second MAC input latch signal MAC_L2 to the PIM device 100. The step 348 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 349, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 19. The accumulative adder 122-21D may add output data of the adder 122-21C to feedback data fed back from the output latch 123-1 to output the result of the adding calculation. The output data of the adder 122-21C may be the element MAC0.0 of the '8×1' MAC result matrix, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123-1 disposed in the data output circuit 123-A of the MAC operator 120.

At a step 350, the MAC command generator 240 of the PIM controller 200 may generate and transmit the MAC output latch signal MAC_L3 to the PIM device 100. The step 350 may be executed in the same way as described with reference to FIG. 12. The MAC output latch signal MAC_L3 may control the output latch operation of the output latch 123-1 included in the MAC operator 120 of the PIM device 100. The biased result data Y0.0 transmitted from the MAC circuit 122 of the MAC operator 120 to the output latch 123-1 may be output from the output latch 123-1 in synchronization with the MAC output latch signal MAC_L3. The biased result data Y0.0 that is output from the output latch 123-1 may be inputted to the activation function logic circuit 123-5. At a step 351, the activation function logic circuit 123-5 may apply an activation function to the biased result data Y0.0 to generate a final output value, and the final output value may be inputted to the transfer gate (123-2 of FIG. 4). This, for example, is the final output value for the current of R which is incremented in step 354.

At a step 352, the MAC command generator 240 of the PIM controller 200 may generate and transmit the MAC latch reset signal MAC_L_RST to the PIM device 100. The step 352 may be executed in the same way as described with reference to FIG. 13. The MAC latch reset signal MAC_L_RST may control an output operation of the final output value generated by the MAC operator 120 and a reset operation of the output latch 123-1 included in the MAC operator 120. The transfer gate 123-2 receiving the final output value from the activation function logic circuit 123-5 of the data output circuit 123-B included in the MAC operator 120 may be synchronized with the MAC latch reset signal MAC_L_RST to output the final output value. In an embodiment, the final output value that is output from the MAC operator 120 may be stored into the first memory bank 111 or the second memory bank 112 through the first BIO line or the second BIO line in the PIM device 100.

At a step 353, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 353. At a step 354, whether the row number changed at the step 353 is greater than the row number of the last row (i.e., the eighth row) of the weight matrix may be determined. Because the row number of the weight matrix is changed to '2' at the step 353, a process of the MAC arithmetic operation may be fed back to the step 344.

If the process of the MAC arithmetic operation is fed back to the step 344 from the step 354, the same processes as described with reference to the steps 344 to 354 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix, and the bias data B0.0 in the output latch 123-1 initially set at the step 344 may be changed to the bias data B1.0. If the process of the MAC arithmetic operation is fed back to the step 344 from the step 354, the processes from the step 344 to the step 354 may be iteratively performed until the MAC arithmetic operation is performed for all of the rows of the weight matrix with the vector matrix. For an embodiment, a plurality of final output values, namely, one final output value for each incremented value of R, represents an 'N×1' final result matrix. If the MAC arithmetic operation for the eighth row of the weight matrix terminates and the row number of the weight matrix changes from '8' to '9' at the step 354, the MAC arithmetic operation may terminate because the row number of '9' is greater than the last row number of '8' at the step 354.

Figure 20:
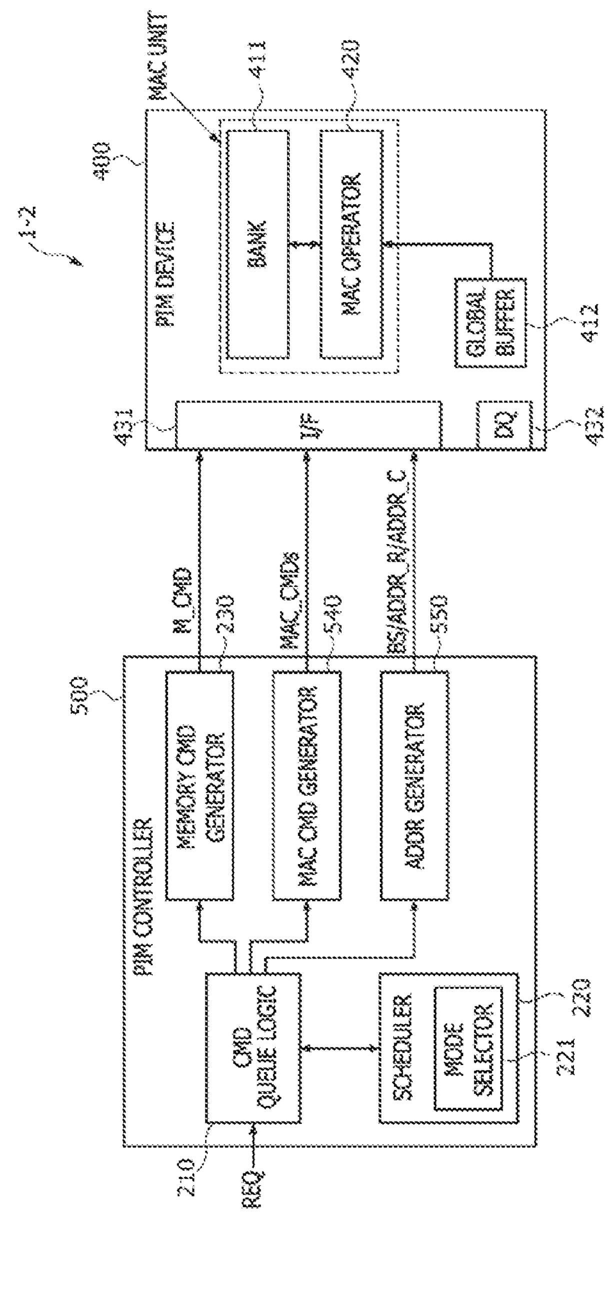
FIG. 20 is a block diagram illustrating a PIM system according to a second embodiment of the present disclosure.

FIG. 20 is a block diagram illustrating a PIM system 1-2 according to a second embodiment of the present disclosure. In FIG. 20, the same reference numerals or the same reference symbols as used in FIG. 2 denote the same elements. As illustrated in FIG. 20, the PIM system 1-2 may be configured to include a PIM device 400 and a PIM controller 500. The PIM device 400 may be configured to include a memory bank (BANK) 411 corresponding to a storage region, a global buffer 412, a MAC operator 420, an interface (I/F) 431, and a data input/output (I/O) pad 432. For an embodiment, the MAC operator 420 represents a MAC operator circuit. The memory bank (BANK) 411 and the MAC operator 420 included in the PIM device 400 may constitute one MAC unit. In another embodiment, the PIM device 400 may include a plurality of MAC units. The memory bank (BANK) 411 may represent a memory region for storing data, for example, a DRAM device. The global buffer 412 may also represent a memory region for storing data, for example, a DRAM device or an SRAM device. The memory bank (BANK) 411 may be a component unit which is independently activated and may be configured to have the same data bus width as data I/O lines in the PIM device 400. In an embodiment, the memory bank 411 may operate through interleaving such that an active operation of the memory bank 411 is performed in parallel while another memory bank is selected. The memory bank 411 may include at least one cell array which includes memory unit cells located at cross points of a plurality of rows and a plurality of columns.

Although not shown in the drawings, a core circuit may be disposed adjacent to the memory bank 411. The core circuit may include X-decoders XDECs and Y-decoders/IO circuits YDEC/IOs. An X-decoder XDEC may also be referred to as a word line decoder or a row decoder. The X-decoder XDEC may receive a row address ADDR_R from the PIM controller 500 and may decode the row address ADDR_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADD_C from the PIM controller 500 and may decode the column address ADD_C to select and enable at least one of the columns (i.e., bit lines) coupled to the selected memory bank. Each of the I/O circuits may include an I/O sense amplifier for sensing and amplifying a level of a read datum that is output from the corresponding memory bank during a read operation for the memory bank 411. In addition, the I/O circuit may include a write driver for driving a write datum during a write operation for the memory bank 411.

The MAC operator 420 of the PIM device 400 may have mostly the same configuration as the MAC operator 120 described with reference to FIG. 4. That is, the MAC operator 420 may be configured to include the data input circuit 121, the MAC circuit 122, and the data output circuit 123, as described with reference to FIG. 4. The data input circuit 121 may be configured to include the first input latch 121-1 and the second input latch 121-2. The MAC circuit 122 may be configured to include the multiplication logic circuit 122-1 and the addition logic circuit 122-2. The data output circuit 123 may be configured to include the output latch 123-1, the transfer gate 123-2, the delay circuit 123-3, and the inverter 123-4. In an embodiment, the first input latch 121-1, the second input latch 121-2, and the output latch 123-1 may be realized by using flip-flops.

The MAC operator 420 may be different from the MAC operator 120 in that a MAC input latch signal MAC_L1 is simultaneously inputted to both of clock terminals of the first and second input latches 121-1 and 121-2. As indicated in the following descriptions, the weight data and the vector data may be simultaneously transmitted to the MAC operator 420 of the PIM device 400 included in the PIM system 1-2 according to the present embodiment. That is, the first data DA1 (i.e., the weight data) and the second data DA2 (i.e., the vector data) may be simultaneously inputted to both of the first input latch 121-1 and the second input latch 121-2 constituting the data input circuit 121, respectively. Accordingly, it may be unnecessary to apply an extra control signal to the clock terminals of the first and second input latches 121-1 and 121-2, and thus the MAC input latch signal MAC_L1 may be simultaneously inputted to both of the clock terminals of the first and second input latches 121-1 and 121-2 included in the MAC operator 420.

In another embodiment, the MAC operator 420 may be realized to have the same configuration as the MAC operator 120-1 described with reference to FIG. 16 to perform the operation illustrated in FIG. 14. Even in such a case, the MAC operator 420 may have the same configuration as described with reference to FIG. 16 except that the MAC input latch signal MAC_L1 is simultaneously inputted to both of the clock terminals of the first and second input latches 121-1 and 121-2 constituting the data input circuit 121. In yet another embodiment, the MAC operator 420 may be realized to have the same configuration as the MAC operator 120-2 described with reference to FIG. 19 to perform the operation illustrated in FIG. 17. Even in such a case, the MAC operator 420 may have the same configuration as described with reference to FIG. 19 except that the MAC input latch signal MAC_L1 is simultaneously inputted to both of the clock terminals of the first and second input latches 121-1 and 121-2 constituting the data input circuit 121.

The interface 431 of the PIM device 400 may receive the memory command M_CMD, the MAC commands MAC_CMDs, the bank selection signal BS, and the row/column addresses ADDR_R/ADDR_C from the PIM controller 500. The interface 431 may output the memory command M_CMD, together with the bank selection signal BS and the row/column addresses ADDR_R/ADDR_C, to the memory bank 411. The interface 431 may output the MAC commands MAC_CMDs to the memory bank 411 and the MAC operator 420. In such a case, the interface 431 may output the bank selection signal BS and the row/column addresses ADDR_R/ADDR_C to the memory bank 411. The data I/O pad 432 of the PIM device 400 may function as a data communication terminal between a device external to the PIM device 400, the global buffer 412, and the MAC unit (which includes the memory bank 411 and the MAC operator 420) included in the PIM device 400. The external device to the PIM device 400 may correspond to the PIM controller 500 of the PIM system 1-2 or a host located outside the PIM system 1-2. Accordingly, data that is output from the host or the PIM controller 500 may be inputted into the PIM device 400 through the data I/O pad 432. In addition, data generated by the PIM device 400 may be transmitted to the external device to the PIM device 400 through the data I/O pad 432.

The PIM controller 500 may control operations of the PIM device 400. In an embodiment, the PIM controller 500 may control the PIM device 400 such that the PIM device 400 operates in the memory mode or the MAC mode. In the event that the PIM controller 500 controls the PIM device 500 such that the PIM device 400 operates in the memory mode, the PIM device 400 may perform a data read operation or a data write operation for the memory bank 411. In the event that the PIM controller 500 controls the PIM device 400 such that the PIM device 400 operates in the MAC mode, the PIM device 400 may perform the MAC arithmetic operation for the MAC operator 420. In the event that the PIM controller 500 controls the PIM device 400 such that the PIM device 400 operates in the MAC mode, the PIM device 400 may also perform the data read operation and the data write operation for the memory bank 411 and the global buffer 412 to execute the MAC arithmetic operation.

The PIM controller 500 may be configured to include the command queue logic 210, the scheduler 220, the memory command generator 230, a MAC command generator 540, and an address generator 550. The scheduler 220 may include the mode selector 221. The command queue logic 210 may receive the request REQ from an external device (e.g., a host of the PIM system 1-2) and store a command queue corresponding the request REQ in the command queue logic 210. The command queue stored in the command queue logic 210 may be transmitted to the memory command generator 230 or the MAC command generator 540 according to a sequence determined by the scheduler 220. The scheduler 220 may adjust a timing of the command queue when the command queue stored in the command queue logic 210 is output from the command queue logic 210. The scheduler 210 may include the mode selector 221 that generates a mode selection signal with information on whether command queue stored in the command queue logic 210 relates to the memory mode or the MAC mode. The memory command generator 230 may receive the command queue related to the memory mode of the PIM device 400 from the command queue logic 210 to generate and output the memory command M_CMD. The command queue logic 210, the scheduler 220, the mode selector 221, and the memory command generator 230 may have the same function as described with reference to FIG. 2.

The MAC command generator 540 may receive the command queue related to the MAC mode of the PIM device 400 from the command queue logic 210. The MAC command generator 540 may decode the command queue to generate and output the MAC commands MAC_CMDs. The MAC commands MAC_CMDs that are output from the MAC command generator 540 may be transmitted to the PIM device 400. The data read operation for the memory bank 411 of the PIM device 400 may be performed by the MAC commands MAC_CMDs that are output from the MAC command generator 540, and the MAC arithmetic operation of the MAC operator 420 may also be performed by the MAC commands MAC_CMDs that are output from the MAC command generator 540. The MAC commands MAC_CMDs and the MAC arithmetic operation of the PIM device 400 according to the MAC commands MAC_CMDs will be described in detail with reference to FIG. 21.

The address generator 550 may receive address information from the command queue logic 210. The address generator 550 may generate the bank selection signal BS for selecting a memory bank where, for example, the memory bank 411 represents multiple memory banks. The address generator 550 may transmit the bank selection signal BS to the PIM device 400. In addition, the address generator 550 may generate the row address ADDR_R and the column address ADDR_C for accessing a region (e.g., memory cells) in the memory bank 411 and may transmit the row address ADDR_R and the column address ADDR_C to the PIM device 400.

Figure 21:
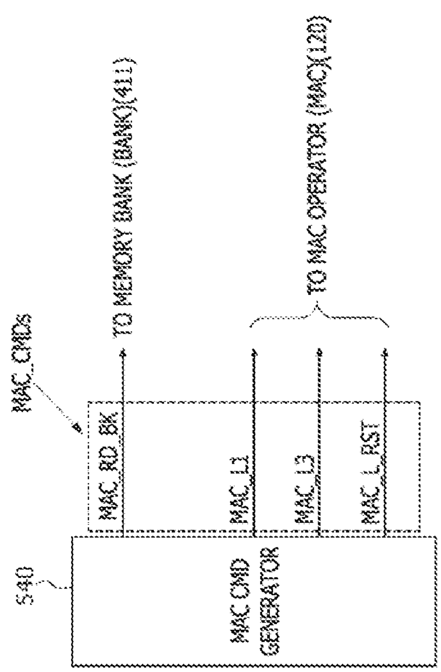
FIG. 21 illustrates MAC commands that are output from a MAC command generator of a PIM controller included in a PIM system according to a second embodiment of the present disclosure.

FIG. 21 illustrates the MAC commands MAC_CMDs that are output from the MAC command generator 540 included in the PIM system 1-2 according to the second embodiment of the present disclosure. As illustrated in FIG. 21, the MAC commands MAC_CMDs may include first to fourth MAC command signals. In an embodiment, the first MAC command signal may be a MAC read signal MAC_RD_BK, the second MAC command signal may be a MAC input latch signal MAC_L1, the third MAC command signal may be a MAC output latch signal MAC_L3, and the fourth MAC command signal may be a MAC latch reset signal MAC_L_RST.

The MAC read signal MAC_RD_BK may control an operation for reading the first data (e.g., the weight data) out of the memory bank 411 to transmit the first data to the MAC operator 420. The MAC input latch signal MAC_L1 may control an input latch operation of the weight data that is transmitted from the first memory bank 411 to the MAC operator 420. The MAC output latch signal MAC_L3 may control an output latch operation of the MAC result data generated by the MAC operator 420. And, the MAC latch reset signal MAC_L_RST may control an output operation of the MAC result data generated by the MAC operator 420 and a reset operation of an output latch included in the MAC operator 420.

The PIM system 1-2 according to the present embodiment may also be configured to perform the deterministic MAC arithmetic operation. Thus, the MAC commands MAC_CMDs transmitted from the PIM controller 500 to the PIM device 400 may be sequentially generated with fixed time intervals. Accordingly, the PIM controller 500 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially output from the PIM controller 500 with fixed time intervals corresponding to the fixed latencies.

Figure 22:
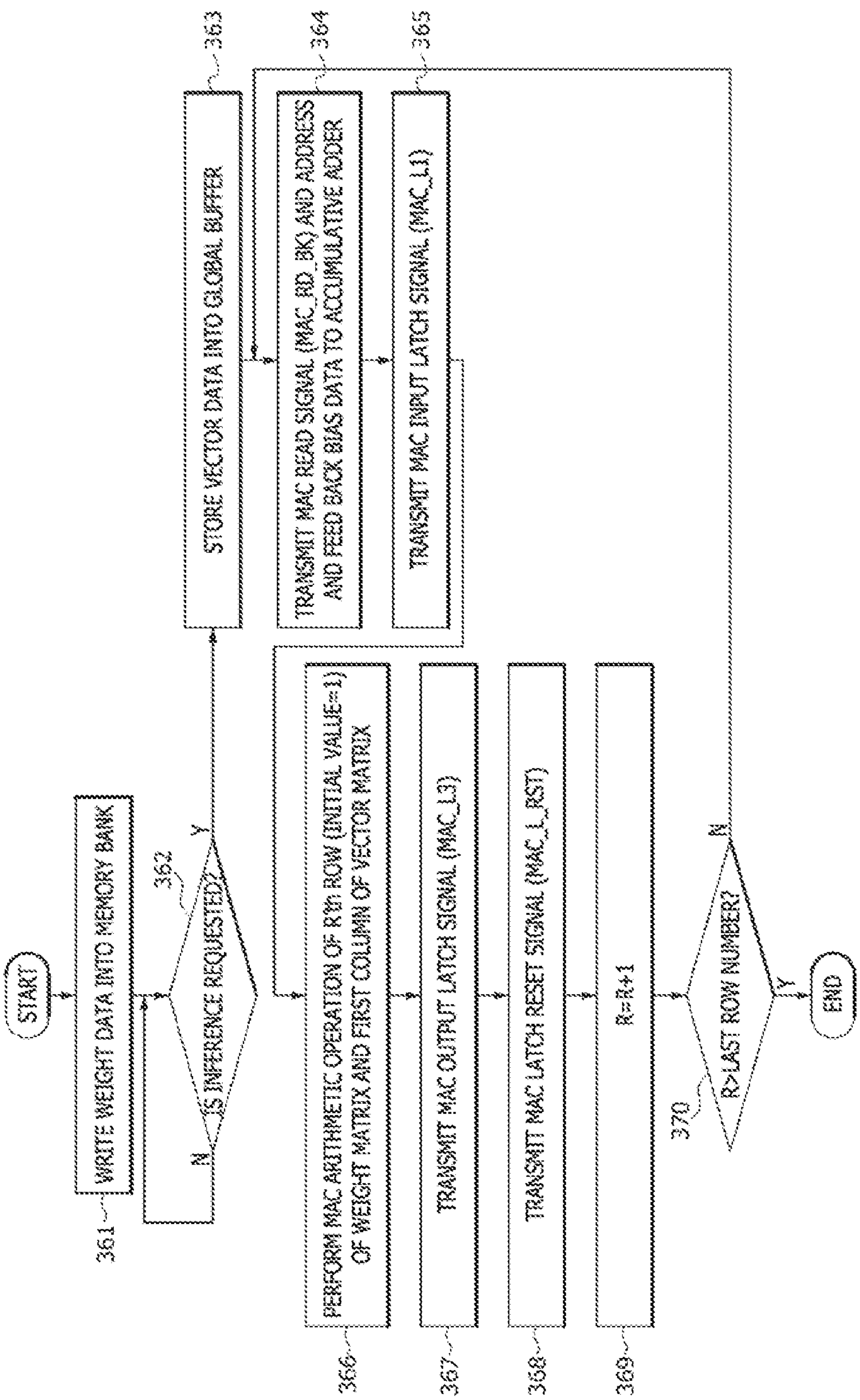
FIG. 22 is a flowchart illustrating processes of the MAC arithmetic operation illustrated in FIG. 5 in a PIM system according to a second embodiment of the present disclosure.

FIG. 22 is a flowchart illustrating processes of the MAC arithmetic operation described with reference to FIG. 5, which are performed in the PIM system 1-2 according to the second embodiment of the present disclosure. In addition, FIGS. 23 to 26 are block diagrams illustrating the processes of the MAC arithmetic operation illustrated in FIG. 5, which are performed in the PIM system 1-2 according to the second embodiment of the present disclosure. Referring to FIGS. 22 to 26, the first data (i.e., the weight data) may be written into the memory bank 411 at a step 361 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 5.

At a step 362, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 500 at the step 362, then the PIM controller 500 may write the vector data that is transmitted with the inference request signal into the global buffer 412 at a step 363. Accordingly, the vector data may be stored in the global buffer 412 of the PIM device 400.

Figure 23:
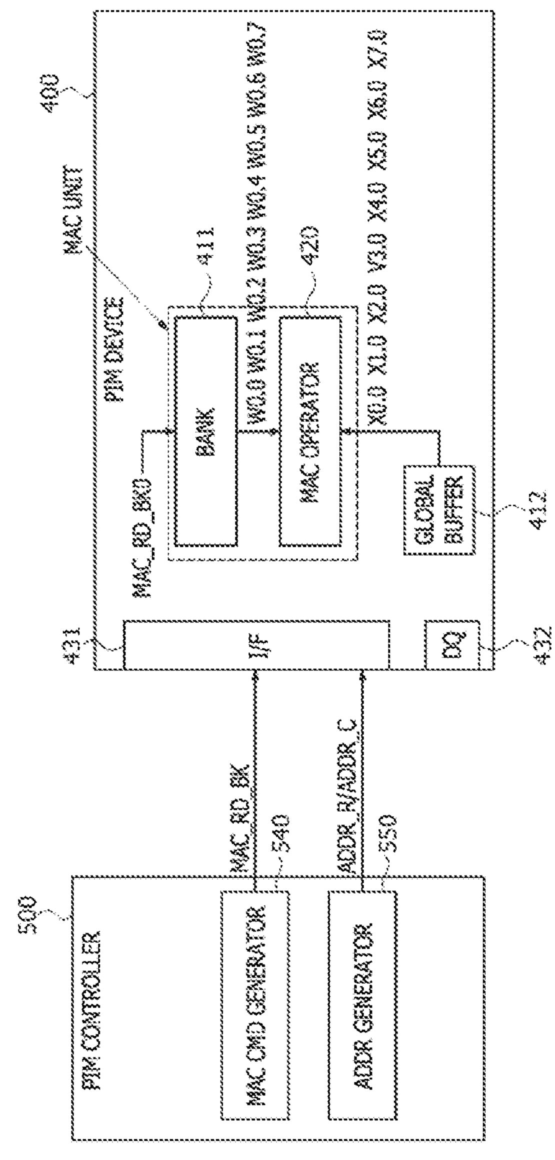
FIGS. 23 to 26 are block diagrams illustrating processes of the MAC arithmetic operation illustrated in FIG. 5 in a PIM system according to a second embodiment of the present disclosure.

At a step 364, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. Although not shown in the drawings, if a plurality of memory banks are disposed in the PIM device 400, the address generator 550 may transmit a bank selection signal for selecting the memory bank 411 among the plurality of memory banks as well as the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK that is output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

Figure 24:
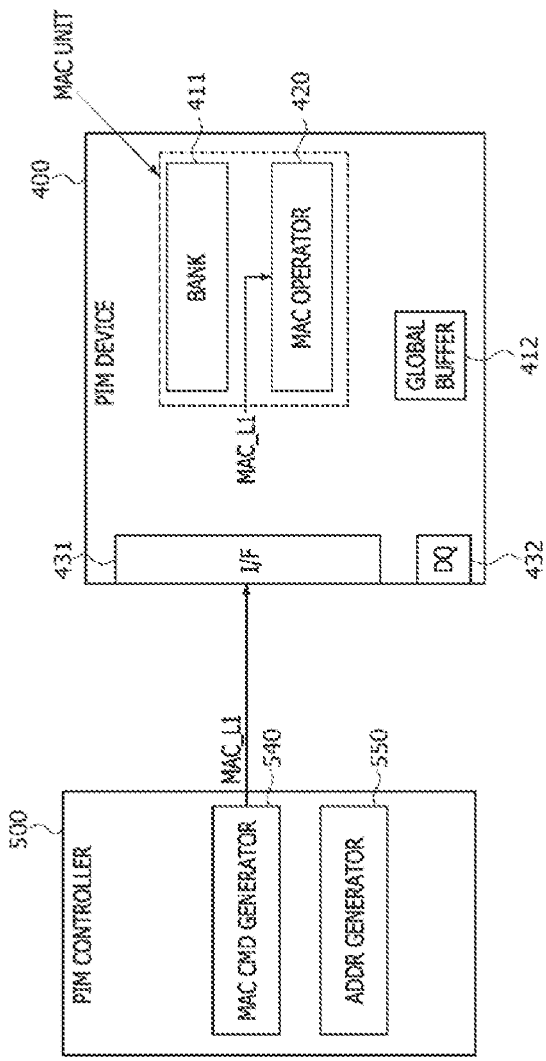

At a step 365, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 366, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, as described with reference to FIG. 4, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data from the multipliers 122-11 and may perform the adding calculation of the output data of the multipliers 122-11 to output the result data of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to the element MAC0.0 located at the first row of the '8×1' MAC result matrix with the eight elements of MAC0.0, . . . , and MAC7.0 illustrated in FIG. 5. The output data MAC0.0 of the addition logic circuit 122-2 may be inputted to the output latch 123-1 disposed in the data output circuit 123 of the MAC operator 420, as described with reference to FIG. 4.

Figure 25:
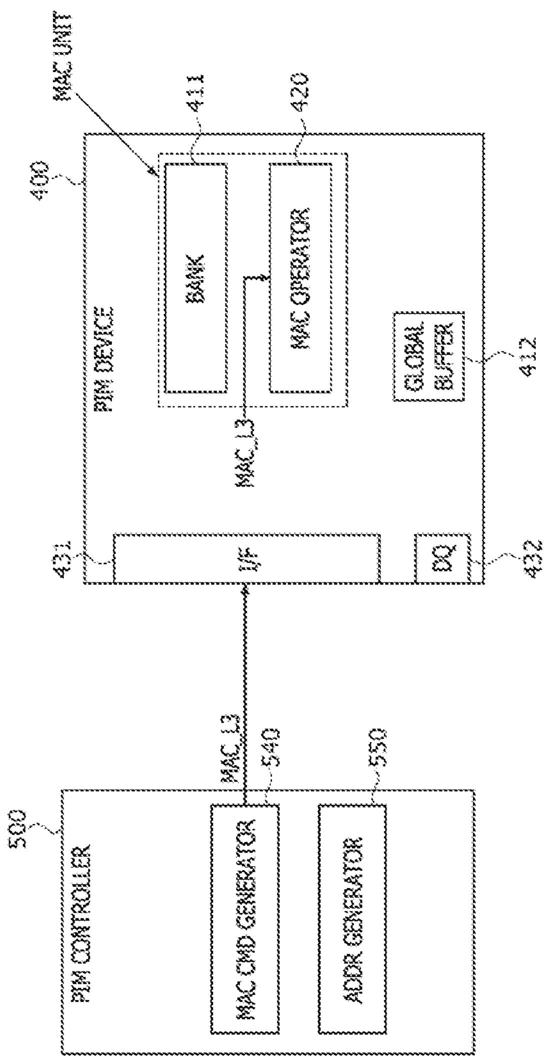

At a step 367, the MAC command generator 540 of the PIM controller 500 may generate and transmit the MAC output latch signal MAC_L3 to the PIM device 400, as illustrated in FIG. 25. The MAC output latch signal MAC_L3 may control the output latch operation of the MAC result data MAC0.0 performed by the MAC operator 420 of the PIM device 400. The MAC result data MAC0.0 transmitted from the MAC circuit 122 of the MAC operator 420 to the output latch 123-1 may be output from the output latch 123-1 by the output latch operation performed in synchronization with the MAC output latch signal MAC_L3, as described with reference to FIG. 4. The MAC result data MAC0.0 that is output from the output latch 123-1 may be inputted to the transfer gate 123-2 of the data output circuit 123.

Figure 26:
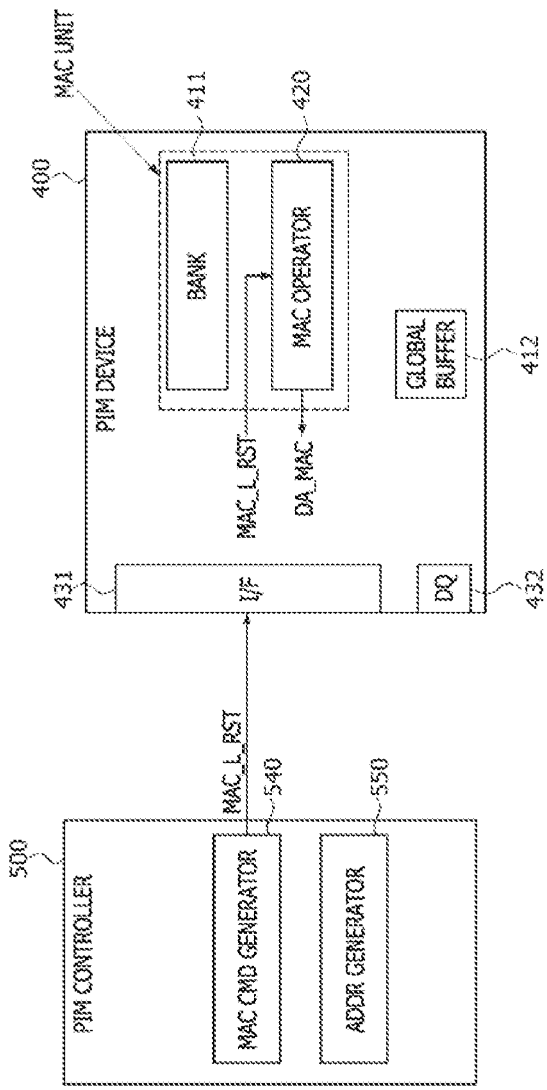

At a step 368, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the MAC result data MAC0.0 generated by the MAC operator 420 and a reset operation of the output latch 123-1 included in the MAC operator 420. As described with reference to FIG. 4, the transfer gate 123-2 receiving the MAC result data MAC0.0 from the output latch 123-1 of the MAC operator 420 may be synchronized with the MAC latch reset signal MAC_L_RST to output the MAC result data MAC0.0. In an embodiment, the MAC result data MAC0.0 that is output from the MAC operator 420 may be stored into the memory bank 411 through the BIO line in the PIM device 400.

At a step 369, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 369. At a step 370, whether the row number changed at the step 369 is greater than the row number of the last row (i.e., the eighth row) of the weight matrix may be determined. Because the row number of the weight matrix is changed to '2' at the step 370, a process of the MAC arithmetic operation may be fed back to the step 364.

If the process of the MAC arithmetic operation is fed back to the step 364 from the step 370, the same processes as described with reference to the steps 364 to 370 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 364 from the step 370, the processes from the step 364 to the step 370 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 369, the MAC arithmetic operation may terminate because the row number of '9' is greater than the last row number of '8' at the step 370.

Figure 27:
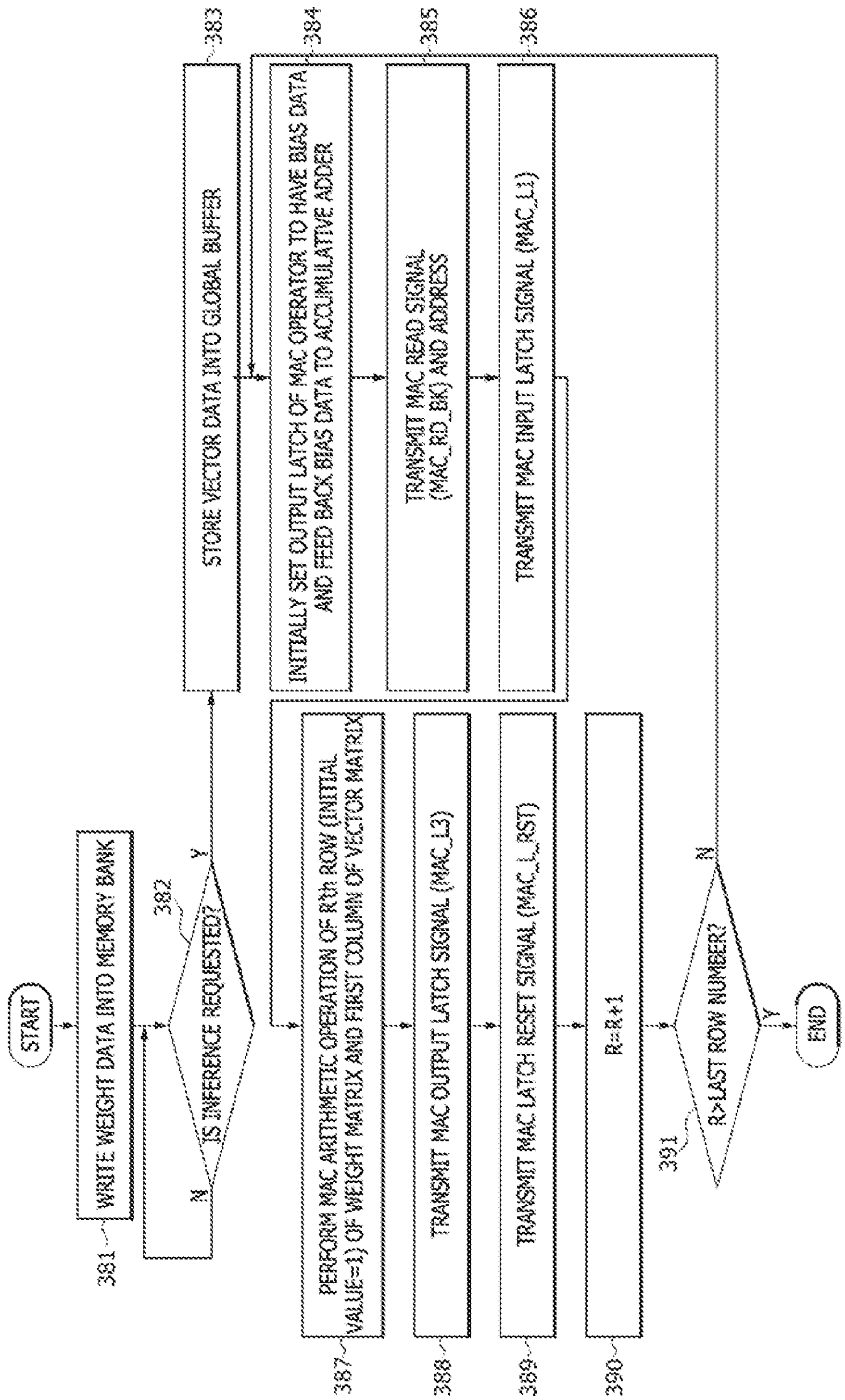
FIG. 27 is a flowchart illustrating processes of the MAC arithmetic operation illustrated in FIG. 14 in a PIM system according to a second embodiment of the present disclosure.

FIG. 27 is a flowchart illustrating processes of the MAC arithmetic operation described with reference to FIG. 14, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-1 illustrated in FIG. 16. Referring to FIGS. 20 and 27, the first data (i.e., the weight data) may be written into the memory bank 411 at a step 381 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 14.

At a step 382, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 500 at the step 382, then the PIM controller 500 may write the vector data that is transmitted with the inference request signal into the global buffer 412 at a step 383. Accordingly, the vector data may be stored in the global buffer 412 of the PIM device 400.

At a step 384, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 14. That is, as illustrated in FIG. 16, the output latch 123-1 of the data output circuit 123-A included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 that is output from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 that is output from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

At a step 385, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK that is output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 386, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 387, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., MAC result data) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 388, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 that is output from the output latch 123-1 may be inputted to the transfer gate 123-2 of the data output circuit 123-A.

At a step 389, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the biased result data Y0.0 generated by the MAC operator 420 and a reset operation of the output latch 123-1 included in the MAC operator 420. The transfer gate 123-2 receiving the biased result data Y0.0 from the output latch 123-1 of the MAC operator 420 may be synchronized with the MAC latch reset signal MAC_L_RST to output the biased result data Y0.0. In an embodiment, the biased result data Y0.0 that is output from the MAC operator 120 may be stored into the memory bank 411 through the BIO line in the PIM device 400.

At a step 390, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 390. At a step 391, whether the row number changed at the step 390 is greater than the row number of the last row (i.e., the eighth row) of the weight matrix may be determined. Because the row number of the weight matrix is changed to '2' at the step 390, a process of the MAC arithmetic operation may be fed back to the step 384.

If the process of the MAC arithmetic operation is fed back to the step 384 at the step 391, the same processes as described with reference to the steps 384 to 391 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 384 at the step 391, then the processes from the step 384 to the step 390 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 390, then the MAC arithmetic operation may terminate because the row number of '9' is greater than the last row number of '8' at the step 391.

Figure 28:
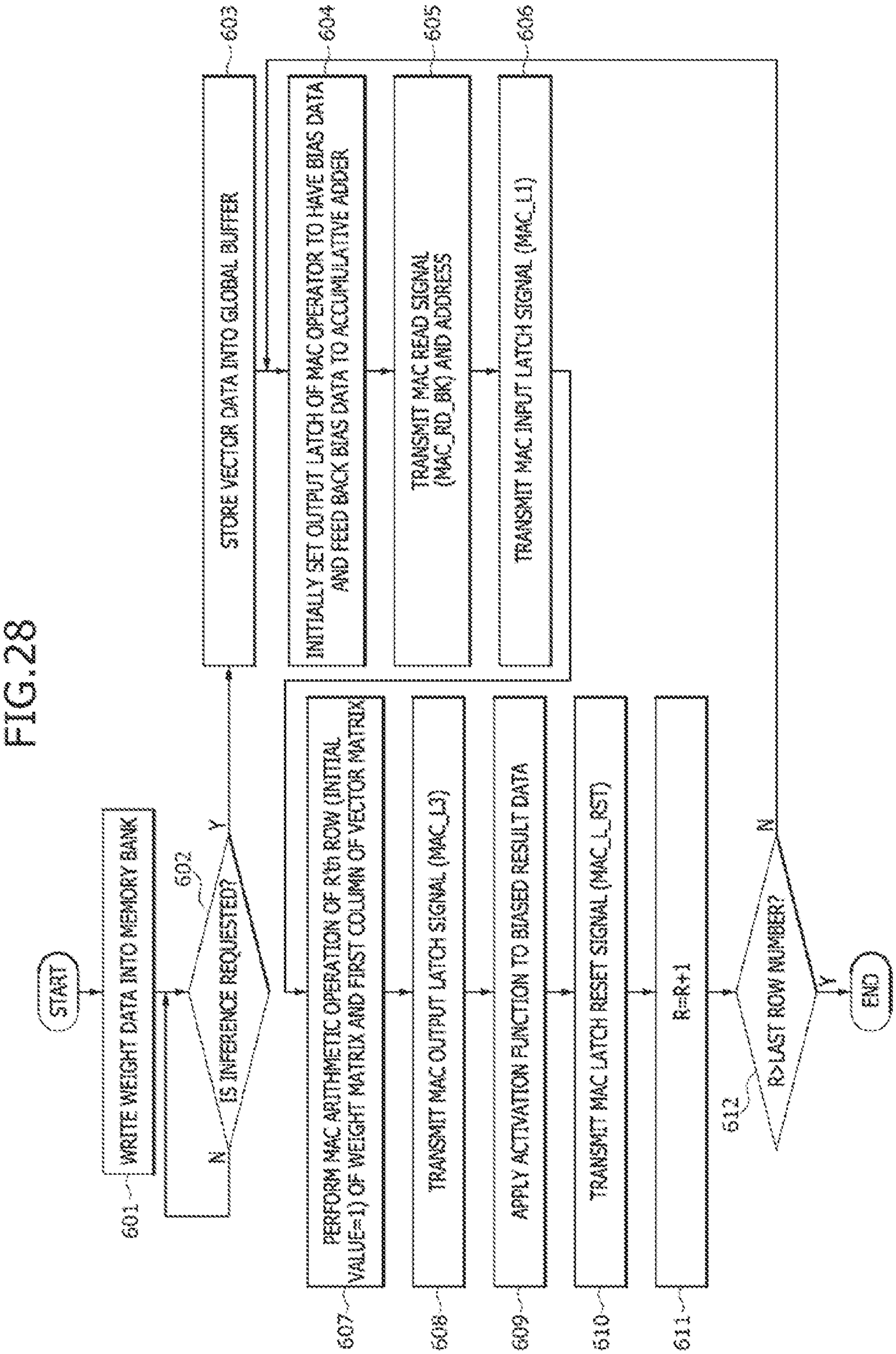
FIG. 28 is a flowchart illustrating processes of the MAC arithmetic operation illustrated in FIG. 17 in a PIM system according to a second embodiment of the present disclosure.

FIG. 28 is a flowchart illustrating processes of the MAC arithmetic operation described with reference to FIG. 17, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-2 illustrated in FIG. 19. Referring to FIGS. 19 and 28, the first data (i.e., the weight data) may be written into the memory bank 411 at a step 601 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 17.

At a step 602, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 500 at the step 602, then the PIM controller 500 may write the vector data that is transmitted with the inference request signal into the global buffer 412 at a step 603. Accordingly, the vector data may be stored in the global buffer 412 of the PIM device 400.

At a step 604, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 17. That is, as described with reference to FIG. 19, the output latch 123-1 of the data output circuit 123-B included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 that is output from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 that is output from the adder 122-21C disposed at the last stage of the addition logic circuit 122-2 to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

At a step 605, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK that is output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 606, the MAC command generator 540 of the PIM controller 500 may generate and transmit the MAC input latch signal MAC_L1 to the PIM device 400, as described with reference to FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 607, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., the MAC result data MAC0.0) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 608, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 that is output from the output latch 123-1 may be inputted to the activation function logic circuit 123-5, which is illustrated in FIG. 19. At a step 610, the activation function logic circuit 123-5 may apply an activation function to the biased result data Y0.0 to generate a final output value, and the final output value may be inputted to the transfer gate (123-2 of FIG. 4).

At a step 610, the MAC command generator 540 of the PIM controller 500 may generate and transmit the MAC latch reset signal MAC_L_RST to the PIM device 400, as described with reference to FIG. 26. The MAC latch reset signal MAC_L_RST may control an output operation of the final output value generated by the MAC operator 420 and a reset operation of the output latch 123-1 included in the MAC operator 420. The transfer gate 123-2 receiving the final output value from the activation function logic circuit 123-5 of the data output circuit 123-B included in the MAC operator 420 may be synchronized with the MAC latch reset signal MAC_L_RST to output the final output value. In an embodiment, the final output value that is output from the MAC operator 420 may be stored into the memory bank 411 through the BIO line in the PIM device 400.

At a step 611, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 611. At a step 612, whether the row number changed at the step 611 is greater than the row number of the last row (i.e., the eighth row) of the weight matrix may be determined. Because the row number of the weight matrix is changed to '2' at the step 611, a process of the MAC arithmetic operation may be fed back to the step 604.

If the process of the MAC arithmetic operation is fed back to the step 604 from the step 612, the same processes as described with reference to the steps 604 to 612 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix to generate the MAC result data (corresponding to the element MAC1.0 located in the second row of the MAC result matrix) and the bias data (corresponding to the element B1.0 located in the second row of the bias matrix). If the process of the MAC arithmetic operation is fed back to the step 604 from the step 612, the processes from the step 604 to the step 612 may be iteratively performed until the MAC arithmetic operation is performed for all of the rows (i.e., first to eighth rows) of the weight matrix with the vector matrix. If the MAC arithmetic operation for the eighth row of the weight matrix terminates and the row number of the weight matrix changes from '8' to '9' at the step 611, the MAC arithmetic operation may terminate because the row number of '9' is greater than the last row number of '8' at the step 612.

Figure 29:
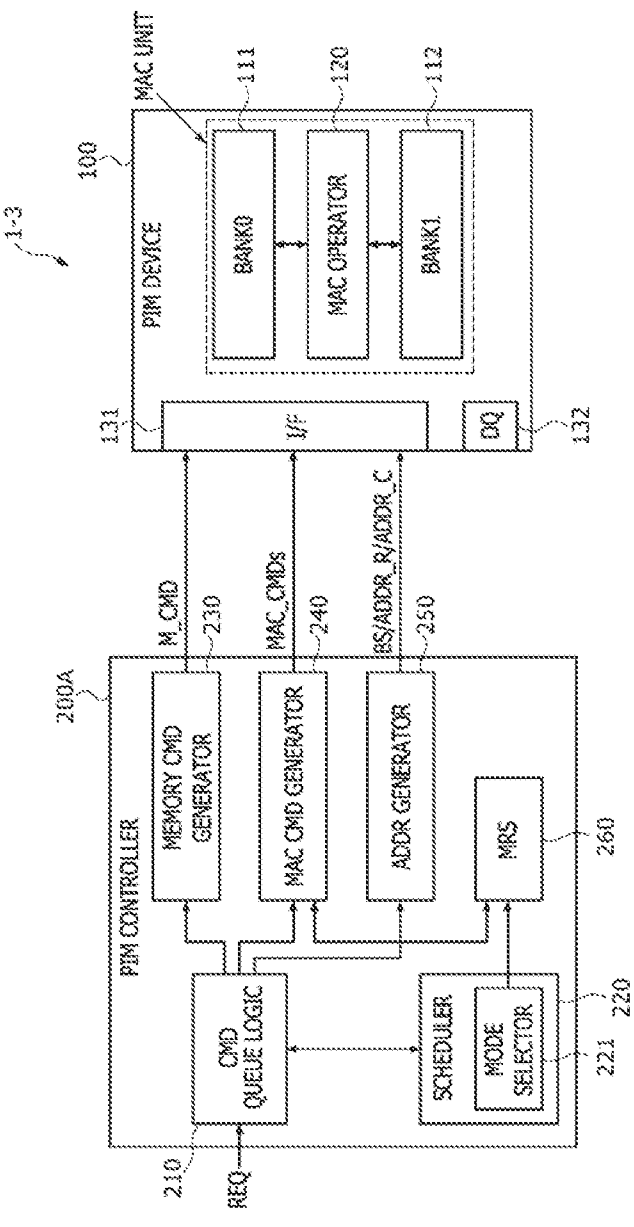
FIG. 29 is a block diagram illustrating a PIM system according to yet another embodiment of the present disclosure.

FIG. 29 is a block diagram illustrating a PIM system 1-3 according to a third embodiment of the present disclosure. As illustrated in FIG. 29, the PIM system 1-3 may have substantially the same configuration as the PIM system 1-1 illustrated in FIG. 2 except that a PIM controller 200A of the PIM system 1-3 further includes a mode register set (MRS) 260 as compared with the PIM controller 200 of the PIM system 1-1. Thus, the same explanation as described with reference to FIG. 2 will be omitted hereinafter. The mode register set 260 in the PIM controller 200A may receive an MRS signal instructing arrangement of various signals necessary for the MAC arithmetic operation of the PIM system 1-3. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 240. For an embodiment, the MRS 260 represents a MRS circuit.

In an embodiment, the MRS signal may include timing information on when the MAC commands MAC_CMDs are generated. In such a case, the deterministic operation of the PIM system 1-3 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the second memory bank 112 of the PIM device 100 by the inference request signal transmitted from an external device to the PIM controller 200A. Alternatively, the generation of the MRS signal in the MRS 260 may be executed after the vector data are stored in the second memory bank 112 of the PIM device 100 by the inference request signal transmitted from an external device to the PIM controller 200A.

Figure 30:
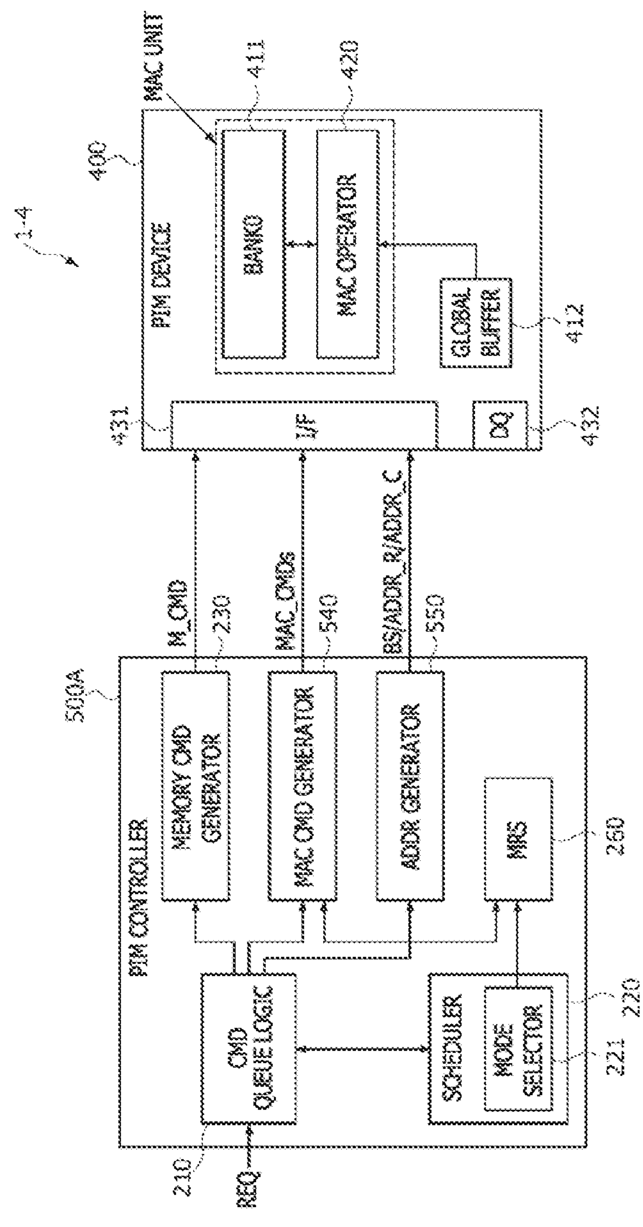
FIG. 30 is a block diagram illustrating a PIM system according to still another embodiment of the present disclosure.

FIG. 30 is a block diagram illustrating a PIM system 1-4 according to a fourth embodiment of the present disclosure. As illustrated in FIG. 30, the PIM system 1-4 may have substantially the same configuration as the PIM system 1-2 illustrated in FIG. 20 except that a PIM controller 500A of the PIM system 1-4 further includes the mode register set (MRS) 260 as compared with the PIM controller 500 of the PIM system 1-2. Thus, the same explanation as described with reference to FIG. 20 will be omitted hereinafter. The mode register set 260 in the PIM controller 500A may receive an MRS signal instructing arrangement of various signals necessary for the MAC arithmetic operation of the PIM system 1-4. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 540.

In an embodiment, the MRS signal may include timing information on when the MAC commands MAC_CMDs are generated. In such a case, the deterministic operation of the PIM system 1-4 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the global buffer 412 of the PIM device 400 by the inference request signal transmitted from an external device to the PIM controller 500A. Alternatively, the generation of the MRS signal in the MRS 260 may be executed after the vector data are stored in the global buffer 412 of the PIM device 400 by the inference request signal transmitted from an external device to the PIM controller 500A.

Figure 31:
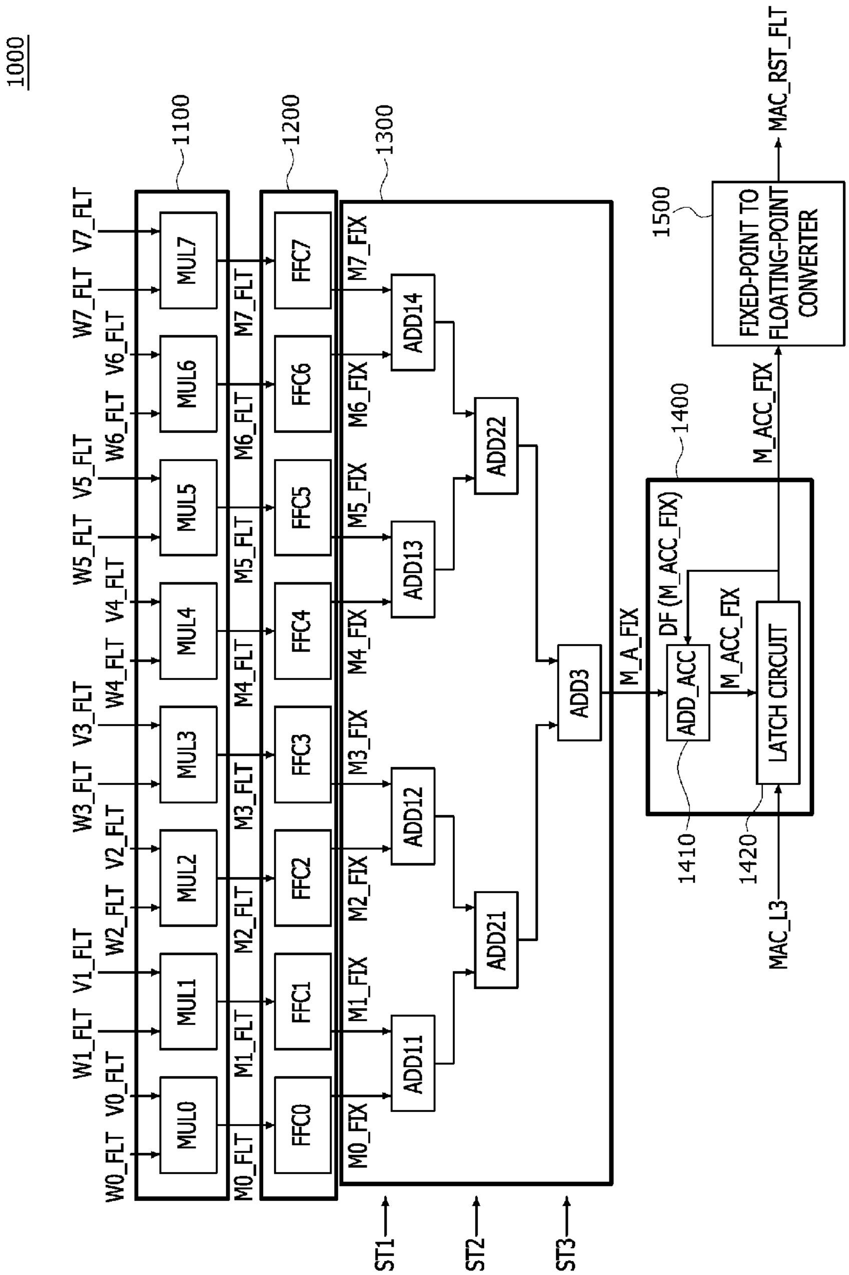
FIG. 31 illustrates a MAC operator according to an embodiment of the present disclosure.

FIG. 31 illustrates a MAC operator 1000 according to an embodiment of the present disclosure. The MAC operator 1000 according to the present embodiment may be applied to the PIM devices 10, 100, and 400, described with reference to FIGS. 1, 2, and 20. Referring to FIG. 31, the MAC operator 1000 of the present embodiment may include a multiplying circuit 1100, a floating-point-to-fixed-point converting circuit 1200, an adder tree 1300, an accumulator 1400, and a fixed-point-to-floating-point converter 1500. In the MAC operator 1000 according to the present embodiment, a floating-point operation may be performed in the multiplying circuit 1100, but a fixed-point operation may be performed in the adder tree 1300 and the accumulator 1400.

Specifically, the multiplying circuit 1100 may include a plurality of multipliers, for example, first to eighth multipliers MUL0-MUL7 arranged in parallel with each other. Here, the parallel arrangement may mean an arrangement structure in which data input/output and arithmetic operations are independently performed, and this may be applied in the same manner hereinafter. Each of the multipliers MUL0-MUL7 may receive weight data W0_FLT-W7_FLT and vector data V0_FLT-V7_FLT. Here, the weight data W0_FLT-W7_FLT may be some of the elements of the weight matrix described with reference to FIGS. 4, 14, and 17. In addition, the vector data V0_FLT-V7_FLT may be some of the elements of the vector matrix described with reference to FIGS. 4, 14, and 17.

Each of the multipliers MUL0-MUL7 may perform a multiplication operation on each of the weight data W0_FLT-W7_FLT and each of the vector data V0_FLT-V7_FLT to output multiplication result data M0_FLT-M7_FLT, respectively, as a result. In this embodiment, each of the weight data W0_FLT-W7_FLT and each of the vector data V0_FLT-V7_FLT may have a floating-point format. Accordingly, each of the multipliers MUL0-MUL7 may be configured to perform floating-point multiplication. Each of the multiplication result data M0_FLT-M7_FLT that is output from the multipliers MUL0-MUL7 may have a floating-point data format.

In the floating-point multiplication process, because a mantissas of input data are multiplied, the mantissa of data generated as a result of the multiplication may be composed of more bits than the mantissa of the input data. Accordingly, it is common to perform a normalization process in which a binary point is moved so that only '1' remains to the left of the binary point in the multiplication result data for a floating-point format data and so that the number of bits of the mantissa of the multiplication result data becomes equal to the number of bits of each of the mantissas of the input data. This normalization process may be performed in a normalizer.

In this embodiment, each of the multipliers MUL0-MUL7 may be configured to omit the normalization process. Accordingly, power consumption in the normalization process in the multipliers MUL0-MUL7 may be reduced. Hereinafter, a case where each of the weight data W0_FLT-W7_FLT and each of the vector data V0_FLT-V7_FLT has a mantissa of 'K' bits ('K' is a natural number) will be described as an example. In this case, in the case of the first multiplier MUL0, in the process of performing multiplication on the first weight data W0_FLT and the first vector data V0_FLT, multiplication may be performed on the mantissa of the first weight data W0_FLT of 'K+1' bits with an implied bit (or also called a "hidden bit") and the mantissa of the first vector data V0_FLT. The data generated as a result of the multiplication on the mantissas may constitute a mantissa of the first multiplication result data M0_FLT. As described above, as a normalization process is omitted, the mantissa of the multiplication result data M0_FLT that is output from the first multiplier MUL0 may have the number of '2*(K+1)' bits. Such an operation process in the first multiplier MUL0 may be equally applied to the remaining multipliers MUL1-MUL7.

The floating-point-to-fixed-point converting circuit 1200 may be configured by arranging a plurality of floating-point-to-fixed-point converters, for example, first to eighth floating-point-to-fixed-point converters FFC0-FFC7 in parallel with each other. The floating-point-to-fixed-point converters FFC0-FFC7 may receive a floating-point format multiplication result data M0_FLT-M7_FLT from the multipliers MUL0-MUL7, respectively. For example, the first floating-point-to-fixed-point converter FFC0 may receive the first multiplication result data M0_FLT from the first multiplier MUL0. The second floating-point-to-fixed-point converter FFC1 may receive the second multiplication result data M1_FLT from the second multiplier MUL1. Similarly, the eighth floating-point-to-fixed-point converter FFC7 may receive the eighth multiplication result data M7_FLT from the eighth multiplier MUL7.

Each of the floating-point-to-fixed-point converters FFC0-FFC7 may convert the data format of each of the floating-point format multiplication result data M0_FLT-M7_FLT into a fixed-point format to output a fixed-point format multiplication result data M0_FIX-M7_FIX. For example, the first floating-point-to-fixed-point converter FFC0 may convert the data format of the floating-point format first multiplication result data M0-FLT transmitted from the first multiplier MUL0 into a fixed-point format to output fixed-point format first multiplication result data M0_FIX. The second floating-point-to-fixed-point converter FFC1 may convert the data format of the floating-point format second multiplication result data M1_FLT transmitted from the second multiplier MUL1 into a fixed-point format to output fixed-point format second multiplication result data M1_FIX. Similarly, the eighth floating-point-to-fixed-point converter FFC7 may convert the data format of the floating-point format eighth multiplication result data M7_FLT transmitted from the eighth multiplier MUL7 into a fixed-point format to output the fixed-point format eighth multiplication result data M7_FIX.

The adder tree 1300 may perform adding operations on the floating-point format multiplication result data M0_FIX-M7_FIX that is output from the floating-point-to-fixed-point converters FFC0-FFC7. Because the multiplication result data M0_FIX-M7_FIX have fixed-point formats in which the position of a binary point is fixed, the adder tree 1300 may be configured as a fixed-point adder tree. Accordingly, overhead of energy and latency due to alignment, normalization, and rounding in the floating-point adder tree may be reduced, and circuit area may also be reduced.

The adder tree 1300 may be configured in a tree structure with a plurality of stages. Each of the plurality of stages may include at least one or more adders. In the present embodiment, the adder tree 1300 may have first to third stages ST1, ST2, and ST3. Four first adders ADD11-ADD14 may be disposed in parallel with each other in the uppermost stage of the adder tree 1300, that is, the first stage ST1. Two second adders ADD21-ADD22 may be disposed in parallel with each other in the second stage ST2 of the adder tree 1300. One third adder ADD3 may be disposed in the third stage ST3 which is the lowermost stage of the adder tree 1300.

When the adders constituting the adder tree 1300 are composed of half adders, the number of the adders of the first stage, which is the uppermost stage of the adder tree 1300, may be half of the number of the multipliers. The number of the adders in the second stage of the adder tree 1300 may be half of the number of the adders in the first stage. That is, the number of the adders of the lower stage may be half of the number of the adders of the upper stage directly adjacent thereto. The lowermost stage of the adder tree 1300 may be composed of one adder.

Each of the first adders ADD11-ADD14 of the first stage ST1 may perform an addition operation on the two floating-point format multiplication result data that is transmitted through the two floating-point-to-fixed-point converters FFCs to output fixed-point format result data. For example, the first adder ADD11 among the first adders ADD11-ADD14 may receive fixed-point format first multiplication result data M0_FIX and fixed-point format second multiplication result data M1_FIX from the first floating-point-to-fixed-point converter FFC0 and the second floating-point-to-fixed-point converter FFC1, respectively. The first adder ADD11 may perform an addition operation on the fixed-point format first multiplication result data M0_FIX and the fixed-point format second multiplication result data M1_FIX, and input an adding result to the second adder ADD21 of the second stage ST2. The remaining first adders ADD12-ADD14 may operate similarly.

Each of the second adders ADD21-ADD22 of the second stage ST2 may perform an addition operation on the output data of the two first adders of the first stage ST1, and output fixed-point format result data. For example, the second adder ADD21 may perform an addition operation on the output data that is output from the first adders ADD11-ADD12, and input an addition result data to the third adder ADD3 of the third stage ST3. Similarly, the second adder ADD22 may perform an addition operation on the output data that is output from the first adders ADD13-ADD14, and input an addition result to the third adder ADD3 of the third stage ST3. The third adder ADD3 of the third stage ST3 may perform an addition operation on the output data of the second adders ADD21-ADD22 of the second stage ST2, and output fixed-point format multiplication-addition data M_A_FIX as a result.

As described above, each of the first adders ADD11-ADD14 of the first stage ST1, which is the uppermost stage of the adder tree 1300, may receive fixed-point format data and perform an addition operation on the fixed-point format data. Accordingly, each of the adders ADD11-ADD14, ADD21-ADD22, and ADD3 constituting the adder tree 1300 may be configured for the fixed-point operation rather than the floating-point operation. The MAC operator 1000 according to the present embodiment performs MAC operations on weight data and vector data of a floating-point format, but the adders ADD11-ADD14, ADD21-ADD22, and ADD3 constituting the adder tree 1300 may be configured for the fixed-point operation, thereby reducing the circuit region compared to the case where the adder tree is composed of floating-point operation adders and improving the MAC operation performance.

The accumulator 1400 may include an accumulating adder 1410 and a latch circuit 1420. The accumulating adder 1410 may receive fixed-point format multiplication-addition data M_A_FIX that is output from the third adder ADD3 of the third stage ST3, which is the lowermost stage of the adder tree 1300. In addition, the accumulating adder 1410 may receive feedback data DF that is output from the latch circuit 1420. The accumulating adder 1410 may add the multiplication-addition data M_A_FIX and the feedback data DF to output fixed-point format multiplication-accumulation data M_ACC_FIX.

The latch circuit 1420 may latch the fixed-point format multiplication-accumulation data M_ACC_FIX that is output from the accumulating adder 1410. The latch circuit 1420 may output fixed-point format multiplication-accumulation data M_ACC_FIX in response to a first logic level, for example, a 'logic high' of the MAC output latch signal MAC_L3. The latch circuit 1420 may feedback the fixed-point format multiplication-accumulation data M_ACC_FIX as the feedback data DF to the accumulating adder 1410. Further, the latch circuit 1420 may transmit the fixed-point format multiplication-accumulation data M_ACC_FIX to the fixed-point-to-floating-point converter 1500.

The fixed-point-to-floating-point converter 1500 may receive the fixed-point format multiplication-addition data M_ACC_FIX from the latch circuit 1420 of the accumulator 1400. The fixed-point-to-floating-point converter 1500 may convert the fixed-point format multiplication-addition data M_ACC_FIX into the floating-point format data to output floating-point format MAC result data MAC_RST_FLT.

Figure 32:
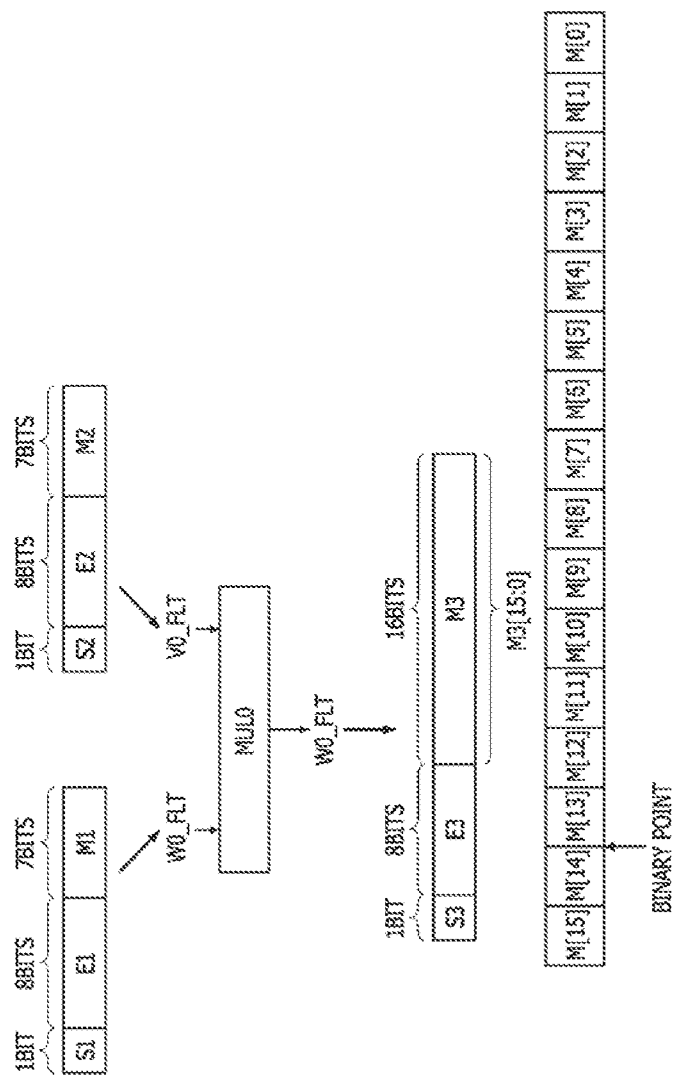
FIG. 32 illustrates an embodiment of data types of input data and output data of a first multiplier in the MAC operator of FIG. 31.

FIG. 32 illustrates an embodiment of data formats of input data and output data of the first multiplier in the MAC operator of FIG. 31. The following description may be equally applied to the remaining multipliers MUL1-MUL7 constituting the multiplying circuit 1100 in the MAC operator 1000 of FIG. 31. In the present embodiment, it is premised that the input data, that is, the first weight data W0_FLT and the first vector data V0_FLT are in 16-bit brain floating-point (BF16) type. However, this is only an example, and the types of the first weight data W0_FLT and the first vector data V0_FLT may be types other than the 16-bit brain floating-point (BF16) type, such as 16-bit floating-point (FP16) type, 32-bit floating-point (FP32) type, a 32-bit floating-point (FP32) type, or various other floating-point types.

Referring to FIG. 32, the floating-point format first weight data W0_FLT inputted to the first multiplier MUL0 may be composed of a 1-bit sign S1, an 8-bit exponent E1, and a 7-bit mantissa M1. Likewise, the floating-point format first vector inputted to the first multiplier MUL0 may be composed of a 1-bit sign S2, an 8-bit exponent E2, and a 7-bit mantissa M2. The first floating-point format multiplication result data M0_FLT that is output from the first multiplier MUL0 may be composed of a 1-bit sign S3, an 8-bit exponent E3, and a 16-bit mantissa M3. The mantissa M3 of the first multiplication result data M0_FLT may be generated by multiplication on the mantissa M1 of the first weight data W0_FLT and the mantissa M2 of the first vector data V0_FLT.

The multiplication on the mantissa M1 of the first weight data W0_FLT and the mantissa M2 of the first vector data V0_FLT may be performed while a 1-bit implied bit (or also referred to as a "hidden bit") is included in the mantissa M1 of the first weight data W0_FLT and the mantissa M2 of the first vector data V0_FLT. Accordingly, 16-bit data may be generated as a result of the multiplication on the mantissa M1 of the first weight data W0_FLT and the mantissa M2 of the first vector data V0_FLT. As described with reference to FIG. 31, because the first multiplier MUL0 omits the normalization process, the 16-bit data, which is the multiplication result of the mantissa M1 of the first weight data W0_FLT and the mantissa M2 of the first vector data V0_FLT, may be output from the first multiplier MUL0 as it is to form the mantissa M3 of the first multiplication result data M0_FLT. That is, the mantissa M3 of the first multiplication result data M0_FLT is not in a normalized format, and accordingly, the binary point in the mantissa bits M3[15:0] of the first multiplication result data M0_FLT may be positioned between the 14th bit M[13] and the 15th bit M[14]. That is, there may be two bits M[15:14] with an MSB prior to the binary point.

Figure 33:
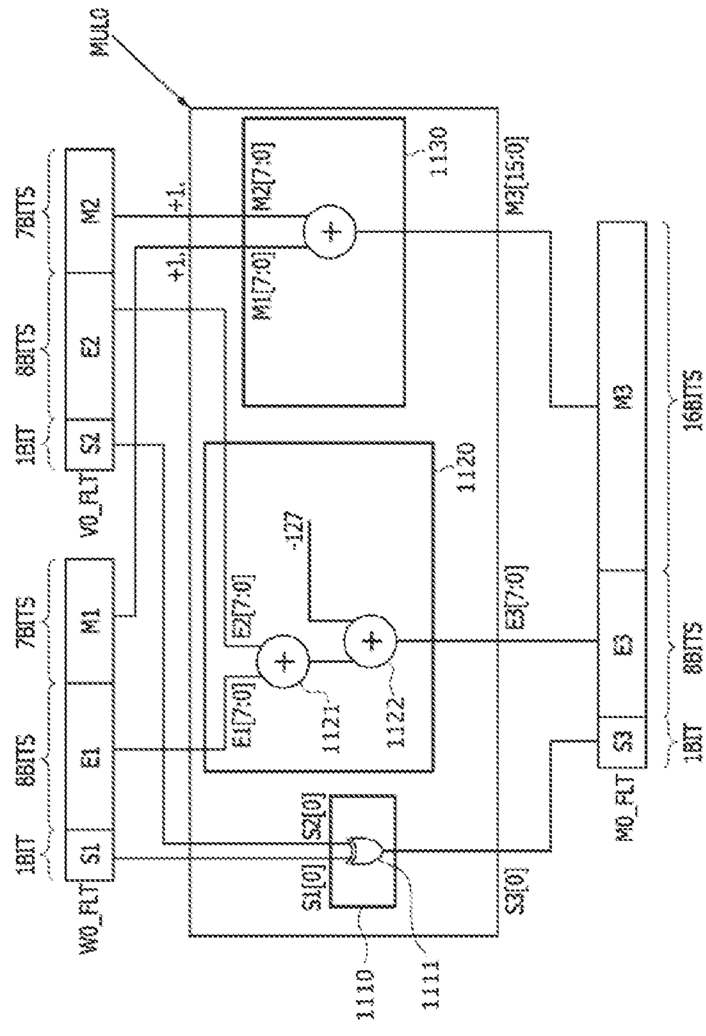
FIG. 33 illustrates an embodiment of the first multiplier of a multiplication circuit of FIG. 31.

FIG. 33 illustrates an embodiment of a configuration and an operation of the first multiplier MUL0 of the multiplying circuit 1100 of FIG. 31. In the present embodiment, it is premised that each of the first weight data W0_FLT and the first vector data V0_FLT has a 16-bit brain floating-point (BF16) type. Accordingly, as described with reference to FIG. 32, the floating-point format first weight data W0_FLT inputted to the first multiplier MUL0 may include a 1-bit sign S1, an 8-bit exponent E1, and a 7-bit mantissa M1. Similarly, the floating-point format first vector data V0_FLT inputted to the first multiplier MUL0 may include a 1-bit sign S2, an 8-bit exponent E2, and a 7-bit mantissa M2. The description of the configuration and operation of the first multiplier MUL0 according to the present embodiment may be equally applied to the remaining multipliers MUL1-MUL7 constituting the multiplying circuit 1100.

Referring to FIG. 33, the first multiplier MUL0 may include a sign processing circuit 1110, an exponent processing circuit 1120, and a mantissa processing circuit 1130. The sign processing circuit 1110 may include an exclusive OR (hereinafter, referred to as "XOR") gate 1111. The XOR gate 1111 may receive a sign bit S1[0] of the first weight data W0_FLT and a sign bit S2[0] of the first vector data V0_FLT. When only one of the sign bit S1[0] of the first weight data W0_FLT and the sign bit S2[0] of the first vector data V0_FLT represents '1' representing a negative number, the XOR gate 1111 may output '1' representing a positive number. On the other hand, when the sign bit S1[0] of the first weight data W0_FLT and the sign bit S2[0] of the first vector data V0_FLT all represent '0' representing a positive number, or all represent '1', the XOR gate 1111 may output '0' representing a negative number. The 1-bit output data S3[0] that is output from the XOR gate 1111 may constitute the sign S3 of the floating-point format first multiplication result data M0_FLT.

The exponent processing circuit 1120 may include a first exponent adder 1121 and a second exponent adder 1122. The first exponent adder 1121 may receive exponent bits E1[7:0] of the first weight data W0_FLT and exponent bits E2[7:0] of the first vector data V0_FLT. The first exponent adder 1121 may add the exponent bits E1[7:0] of the first weight data W0_FLT and the exponent bits E2[7:0] of the first vector data V0_FLT, and output addition result data. The exponent bits E1[7:0] of the first weight data W0_FLT and the exponent bits E2[7:0] of the first vector data V0_FLT may each include an added exponential bias value, for example, 127. Therefore, in order to obtain an exponent with the exponential bias value, the second exponent adder 1122 may perform an operation of subtracting an exponential bias value, for example 127, from the addition result data that is output from the first adder 1121, that is, addition on the addition result data and '−127'. The second exponent adder 1122 may output 8-bit data E[7:0] as the addition result data. The 8-bit data E[7:0] that is output from the second exponent adder 1122 may constitute the exponent E3 of the floating-point format first multiplication result data M0_FLT.

The mantissa processing circuit 1130 may include a mantissa multiplier 1131. The mantissa multiplier 1131 may receive the mantissa bits M1[7:0] of the first weight data W0_FLT and the mantissa bits M2[7:0] of the first vector data V0_FLT. The mantissa bits M1[7:0] of the first weight data W0_FLT may be inputted to the mantissa multiplier 1131 in in the format of '1.M1' by including an implicit bit '1.' to the bits (7 bits) of the mantissa M1 of the first weight data W0_FLT. Similarly, the mantissa bit M2[7:0] of the first vector data V0_FLT may also be inputted to the mantissa multiplier 1131 in the format of '1.M2' by including an implicit bit '1.' to the bits (7 bits) of the mantissa M2 of the first vector data V0_FLT. The mantissa multiplier 1131 may perform a multiplication operation on the mantissa bits M1[7:0] of the first weight data W0_FLT and the mantissa bits M2[7:0] of the first vector data V0_FLT. The mantissa multiplier 1131 may output 16-bit mantissa bits M3[15:0] as multiplication result data. The 16-bit mantissa bits 3M[15:0] that are output from the mantissa multiplier 1131 may constitute the mantissa M3 of the floating-point format first multiplication result data M0_FLT. The configuration of the mantissa M3 of the first multiplication result data M0_FLT may be the same as described with reference to FIG. 32.

Figure 34:
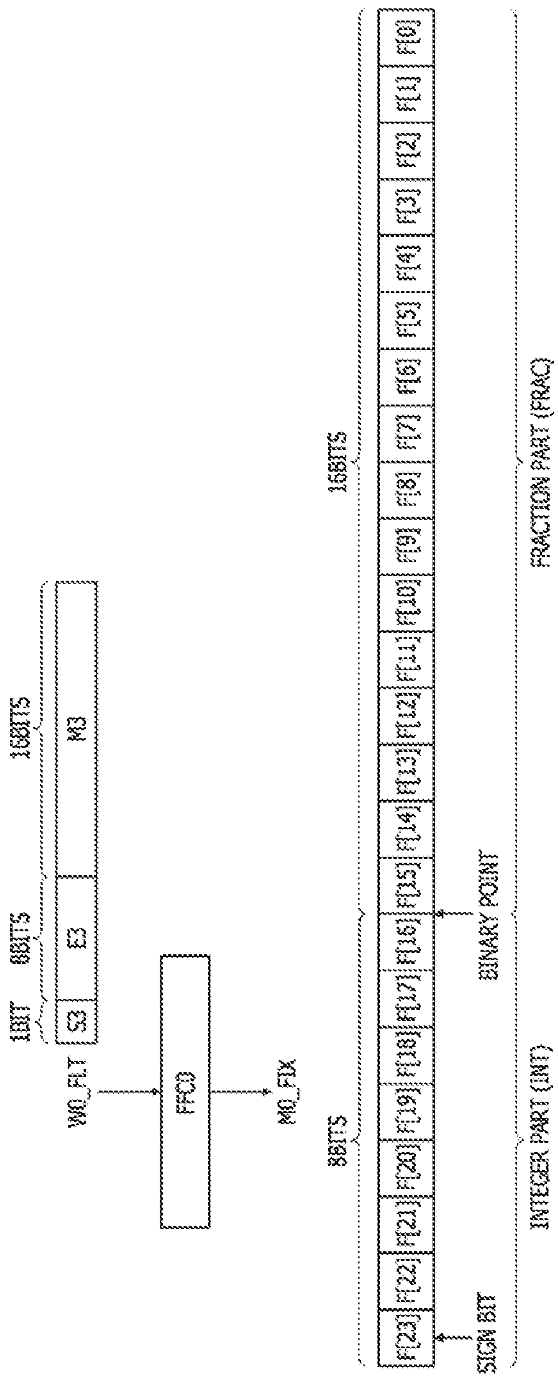
FIG. 34 illustrates an embodiment of data types of the input data and the output data of a first floating-point-to-fixed-point converter in the MAC operator of FIG. 31.

FIG. 34 illustrates an embodiment of data formats of input data and output data of a first floating-point-to-fixed-point converter FFC0 in the MAC operator 1000 of FIG. 31. The following description may be equally applied to each of the remaining second to eighth floating-point-to-fixed-point converters FFC1-FFC7 constituting the floating-point-to-fixed-point converting circuit 1200 in the MAC operator 1000 of FIG. 31.

Referring to FIG. 34, the first floating-point-to-fixed-point converter FFC0 may perform a data format conversion on the floating-point format first multiplication result data M0_FLT, and output the fixed-point format first multiplication result data M0_FIX. In the present embodiment, it is premised that the fixed-point format first multiplication result data M0_FIX is composed of an integer part INT of upper 8 bits and a fraction part FRAC of lower 16 bits. However, this is only an example, and the number of bits of the integer part INT and the number of bits of the fraction part FRAC may be variously set. A most significant bit (MSB) F[23] of the first fixed-point format multiplication result data M0_FIX may constitute a sign bit. In the fixed-point format first multiplication result data M0_FIX, the binary point may be positioned between the 17th bit F[16], which is the lowest order of the integer part INT, and the 16th bit F[15], which is the highest order of the fraction part FRAC.

Figure 35:
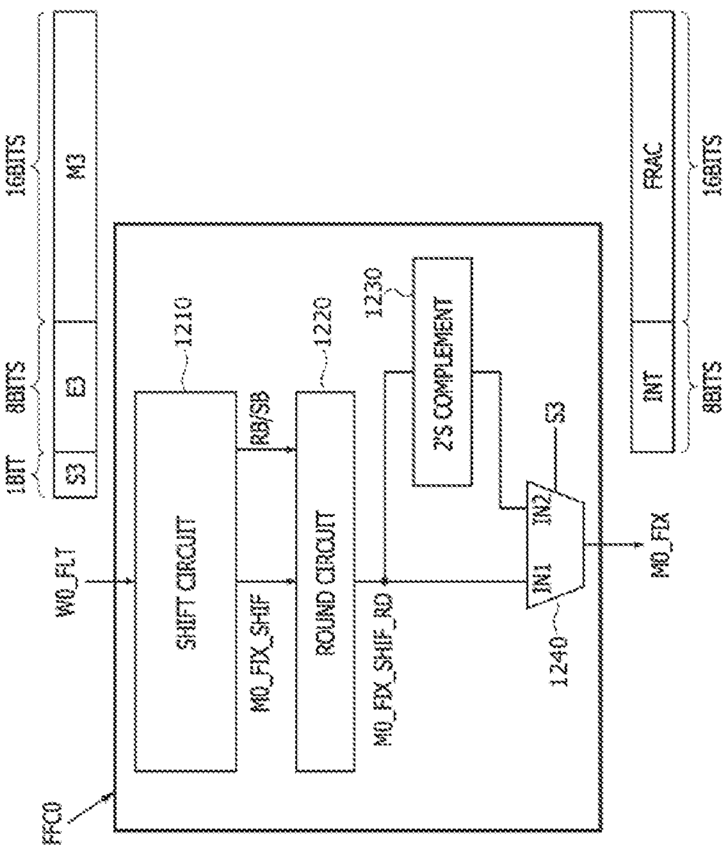
FIG. 35 illustrates an embodiment of the first floating-point-to-fixed-point converter of a floating-point-to-fixed-point converting circuit of FIG. 31.

FIG. 35 illustrates an embodiment of a first floating-point-to-fixed-point converter FFC0 of the floating-point-to-fixed-point converting circuit 1200 of FIG. 31. A description of the configuration and operation of the first floating-point-to-fixed-point converter FFC0 according to the present embodiment may be equally applied to the remaining floating-point-to-fixed-point converters FFC1-FFC7 constituting the floating-point-to-fixed-point converting circuit 1200.

Referring to FIG. 35, the first floating-point-to-fixed-point converter FFC0 may receive the floating-point format first multiplication result data M0_FLT that is output from the first multiplier MUL0, and output the fixed-point format first multiplication result data M0_FIX. The first floating-point-to-fixed-point converter FFC0 may include a shift circuit 1210, a round circuit 1220, a 2's complement circuit 1230, and a multiplexer 1240. The shift circuit 1210 may perform a shifting operation on the mantissa M3 of the floating-point format first multiplication result data M0_FLT. The shifting operation of the shift circuit 1210 may be performed by shifting the mantissa M3 of the floating-point format first multiplication result data M0_FLT to the left or right by the number of bits determined by the result of a subtraction on the exponent E3 of the floating-point format first multiplication result data M0_FLT and the bias value '127'. The shift circuit 1210 may output fixed-point format shifted first multiplication result data M0_FIX_SHIF. The shift circuit 1210 may also output a round bit RB and a sticky bit SB for rounding process in the round circuit 1220. The configuration and operation of the shift circuit 1210 will be described in more detail below.

The round circuit 1220 may perform rounding processing on the fixed-point format shifted first multiplication result data M0_FIX_SHIF transmitted from the shift circuit 1210, by using the round bit RB and the sticky bit SB that is output from the shift circuit 1210. The round processing in the round circuit 1220 may be performed in a number of ways that are already well known. In an embodiment, if the round bit RB is '0', the shifted first multiplication result data M0_FIX_SHIF might not be changed. On the other hand, if the round bit RB and the sticky bit SB are both '1', or the round bit RB is '1' and the sticky bit SB is '0' and a least significant bit (LSB) of the shifted first multiplication result data M0_FIX_SHIF is '1', the round circuit 1220 may perform round processing, that is, a '+1' operation on the LSB of the shifted first multiplication result data M0_FIX_SHIF. The round circuit 1220 may output fixed-point format shifted and rounded first multiplication result data M0_FIX_SHIF_RD. The shifted and rounded first multiplication result data M0_FIX_SHIF_RD may be the same as the shifted first multiplication result data M0_FIX_SHIF, or may be in a state in which a '+1' operation according to roundup is performed on the shifted first multiplication result data M0_FIX_SHIF.

The 2's complement circuit 1230 may receive the fixed-point format shifted and rounded first multiplication result data M0_FIX_SHIF_RD that is output from the round circuit 1220. The 2's complement circuit 1230 may output the 2's complement for the shifted and rounded first multiplication result data M0_FIX_SHIF_RD. As is well known, the 2's complement may be obtained by inverting each of the bit values of the shifted and rounded first multiplication result data M0_FIX_SHIF_RD, and performing a '+1' operation on the LSB of the inverted data.

The multiplexer 1240 may have a first input terminal IN1, a second input terminal IN2, and an output terminal. The multiplexer 1240 may receive the shifted and rounded first multiplication result data M0_FIX_SHIF_RD that is output from the round circuit 1220 through the first input terminal IN1. The multiplexer 1240 may receive the 2's complement of the shifted and rounded first multiplication result data M0_FIX_SHIF_RD that is output from the 2's complement circuit 1230 through the second input terminal IN2. The multiplexer 1240 may combine a selected input terminal of the first input terminal IN1 and the second input terminal IN2 with the output terminal according to the sign S3 of the floating-point format first multiplication result data M0_FLT. For example, if the sign S3 has a bit value of '0' representing a positive number, the multiplexer 1240 may output the shifted and rounded first multiplication result data M0_FIX_SHIF_RD inputted through the first input terminal IN1. If the sign S3 has a bit value of '1' representing a negative number, the multiplexer 1240 may output the 2's complement of the shifted and rounded first multiplication result data M0_FIX_SHIF_RD inputted through the second input terminal IN2. The data that is output from the multiplexer 1240 may constitute the fixed-point format first multiplication result data M0_FIX that is output from the first floating-point-to-fixed-point converter FFC0. The configuration of the fixed-point format first multiplication result data M0_FIX may be the same as described with reference to FIG. 34.

Figure 36:
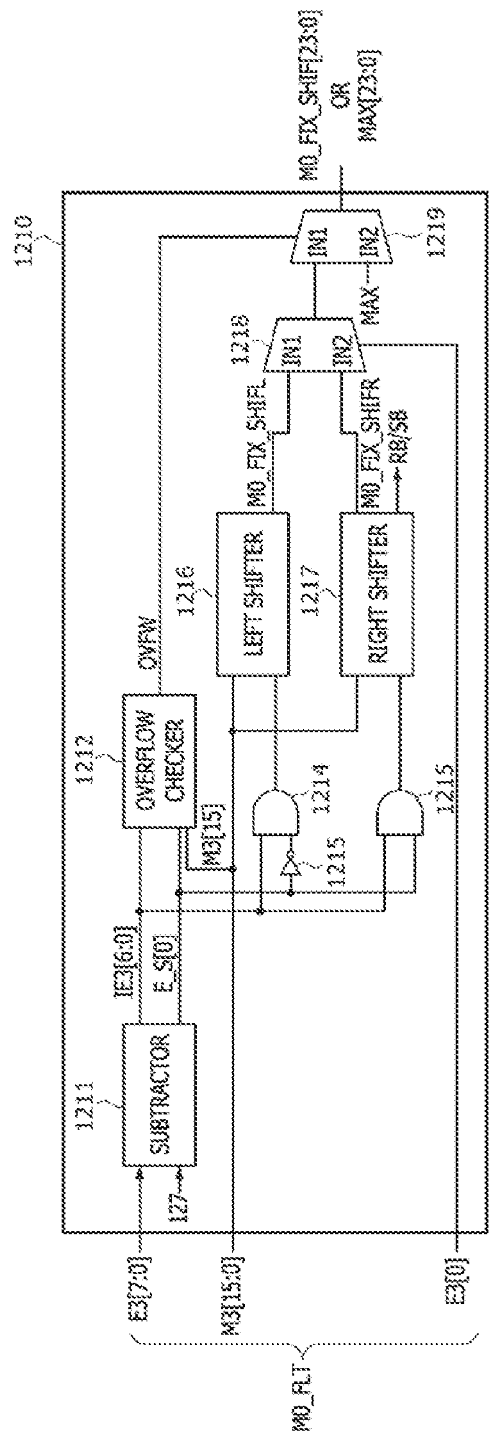
FIG. 36 illustrates an embodiment of a shift circuit of the first floating-point-to-fixed-point converter of FIG. 35.

FIG. 36 illustrates an embodiment of a configuration and an operation of the shift circuit 1210 of the first floating-point-to-fixed-point converter FFC0 of FIG. 35. Referring to FIG. 36, the shift circuit 1210 may include a subtractor 1211, an overflow checker 1212, an inverter 1213, a first AND gate 1214, a second AND gate 1215, a left shifter 1216, a right shifter 1217, a first multiplexer 1218, and a second multiplexer 1219.

The subtractor 1211 may receive an exponent bias value, for example '127' and exponent bits E3[7:0] of the floating-point format first multiplication result data M0_FLT. As described with reference to FIG. 33, an exponential bias value has been included in the exponent bits E3[7:0] of the floating-point format first multiplication result data M0_FLT that is output from the first multiplier MUL0. Accordingly, a real exponent value may be obtained by subtracting the bias value from the exponent bits E3[7:0]. The subtractor 1211 may perform subtraction on the exponent bits E3[7:0] of the floating-point format first multiplication result data M0_FLT and '127' to output 7-bit integer exponent bits IE[6:0] and 1-bit exponent sign bit E_S[0]. The integer exponent bits IE[6:0] may be bits generated as a result of subtracting '127' from the exponent bits E3[7:0]. The exponent sign bit E_S[0] may represent the sign of bits generated as a result of subtracting 127 from the exponent bit E3[7:0]. The exponent sign bit E_S[0] may correspond to the MSB of bits generated as a result of subtracting '127' from the exponent bits E3[7:0]. The exponent sign bit E_S[0] may have a bit value of '0' representing a positive number or a bit value of '1' representing a negative number. The integer exponent bits IE[6:0] may provide the number of bits to shift (hereinafter, referred to as "shift bits") the mantissa bits M3[15:0] of the floating point format first multiplication result data M0_FLT. In addition, the integer exponent bits IE[6:0] may be used together with the exponent sign bits E_S[0] to determine whether an overflow has occurred. The exponent sign bit E_S[0] may be used to determine whether the shifting operation for the mantissa bits M3[15:0] is performed to the left or right.

The overflow checker 1212 may determine whether an overflow has occurred by using the integer exponent bits IE[6:0] and exponent sign bits E_S[0] that are output and transmitted from the subtractor 1211, and the MSB M[15] of the mantissa bits M3[15:0] of the floating-point format first multiplication result data M0_FLT. If overflow has occurred, that is, when the result of shifting the mantissa bits M3[15:0] by the shift bit is out of a range of the fixed-point format, the overflow checker 1212 may output an overflow signal OVFW of, for example, '1'. On the other hand, if no overflow has occurred, that is, when the result of shifting the mantissa bits M3[15:0] by the shift bit does not exceed the range of the fixed-point format, the overflow checker 1212 may output an overflow signal OVFW of "0", for example. The overflow signal OVFW that is output from the overflow checker 1212 may be transmitted to a control terminal of the second multiplexer 1219. The overflow checker 1212 will be described in more detail below.

The inverter 1213 may invert and output the exponent sign bit E_S[0] that is output from the subtractor 1211. If the exponent sign bit E_S[0] is '0' representing a positive number, the inverter 1213 may output '1'. If the exponent sign bit E_S[0] is '1' representing a negative number, the inverter 1213 may output '0'. The output signal from the inverter 1213 may be transmitted to the first AND gate 1214.

The first AND gate 1214 may receive integer exponent bits IE[6:0] and an output signal of the inverter 1213, that is, a signal in which the exponent sign bit E_S[0] has been inverted, and perform an AND operation. The first AND gate 1214 may transmit a signal generated as a result of the AND operation to the left shifter 1216. The second AND gate 1215 may receive integer exponent bits IE[6:0] and an exponent sign bit E_S[0], and perform an AND operation. The second AND gate 1215 may transmit a signal generated as a result of the AND operation to the right shifter 1217.

Because the exponent sign bit E_S[0] has a value of one of '0' and '1' representing positive and negative numbers, respectively, one of the first AND gate 1214 and the second AND gate 1215 may output integer exponent bits IE[6:0], and the other may output a signal of '0'. For example, when the exponent sign bit E_S[0] is '0' representing a positive number, the first AND gate 1214 may transmit the integer exponent bits IE[6:0] to the left shifter 1216. On the other hand, the second AND gate 1215 may transmit a signal of '0' to the right shifter 1217. In this case, a shifting operation for the mantissa bits M3[15:0] of the floating-point format first multiplication result data M0_FLT may be performed by the left shifter 1216. When the exponent sign bit E_S[0] is '1' representing a negative number, the first AND gate 1214 may transmit a signal of '0' to the right shifter 1217. On the other hand, the second AND gate 1215 may transmit the integer exponent bits IE[6:0] to the right shifter 1217. In this case, the shifting operation for the mantissa bits M3[15:0] of the floating-point format first multiplication result data M0_FLT may be performed by the right shifter 1217.

When the exponent sign bit E_S[0] is '0' representing a positive number, the left shifter 1216 may receive mantissa bits M3[15:0] of the floating-point format first multiplication result data M0_FLT and integer exponent bits IE[6:0] from the first AND gate 1214. The left shifter 1216 may shift the mantissa bits M3[15:0] to the left by a shift bit determined by the integer exponent bits IE[6:0] to output fixed-point format left-shifted first multiplication result data M0_FIX_SHIFL. The fixed-point format left-shifted first multiplication result data M0_FIX_SHIFL that is output from the left shifter 1216 may be transmitted to the first input terminal IN1 of the first multiplexer 1218.

When the exponent sign bit E_S[0] is '1' representing a negative number, the right shifter 1217 may receive the mantissa bits M3[15:0] of the floating-point format first multiplication result data M0_FLT and the integer exponent bits IE[6:0] from the second AND gate 1215. The right shifter 1217 may shift the mantissa bits M3[15:0] to the right by a shift bit determined by the integer exponent bits IE[6:0] to output fixed-point format right-shifted first multiplication result data M0_FIX_SHIFR. The fixed-point format right-shifted first multiplication result data M0_FIX_SHIFR that is output from the right shifter 1217 may be transmitted to the second input terminal IN2 of the first multiplexer 1218. The right shifter 1217 may output a round bit RB and a sticky bit SB together for subsequent round processing during a right shift operation.

The first multiplexer 1218 may receive the fixed-point format left-shifted first multiplication result data M0_FIX_SHIFL and the fixed-point format right-shifted first multiplication result data M0_FIX_SHIFR through a first input terminal IN1 and a second input terminal IN2, respectively. The first multiplexer 1218 may receive a sign bit S3[0] of the floating-point format first multiplication result data M0_FLT through a control terminal. When the sign bit S3[0] is '0' representing a positive number, the first multiplexer 1218 may output the fixed-point format left-shifted first multiplication result data M0_FIX_SHIFL inputted through the first input terminal IN1. On the other hand, when the sign bit S3[0] is '1' representing a negative number, the first multiplexer 1218 may output the fixed-point format right-shifted first multiplication result data M0_FIX_SHIFR inputted through the second input terminal IN2.

The second multiplexer 1219 may receive the left-shifted first multiplication result data M0_FIX_SHIFL or the right-shifted first multiplication result data M0_FIX_SHIFR (hereinafter collectively referred to as "shifted first multiplication result data M0_FIX_SHIF") transmitted from the first multiplexer 1218 through a first input terminal IN1. The second multiplexer 1219 may receive a maximum value MAX through a second input terminal IN2. Here, the maximum value MAX may represent an absolute maximum value of a positive number or an absolute maximum value of a negative number that the fixed-point format first multiplication result data M0_FIX may have. The second multiplexer 1219 may receive the overflow signal OVFW that is output from the overflow checker 1212 through a control terminal. The second multiplexer 1219 may output the shifted first multiplication result data M0_FIX_SHIF inputted to the first input terminal IN1 in response to the overflow signal OVFW, or may selectively output the maximum value MAX inputted to the second input terminal IN2. For example, when an overflow signal OVFW of '0' is inputted, because no overflow has occurred, the second multiplexer 1218 may output the fixed-point format shifted first multiplication result data M0_FIX_SHIF[23:0]. On the other hand, when an overflow has occurred and an overflow signal OVFW of '1' is inputted, the second multiplexer 1218 may output the fixed-point format maximum value MAX[23:0].

Figure 37:
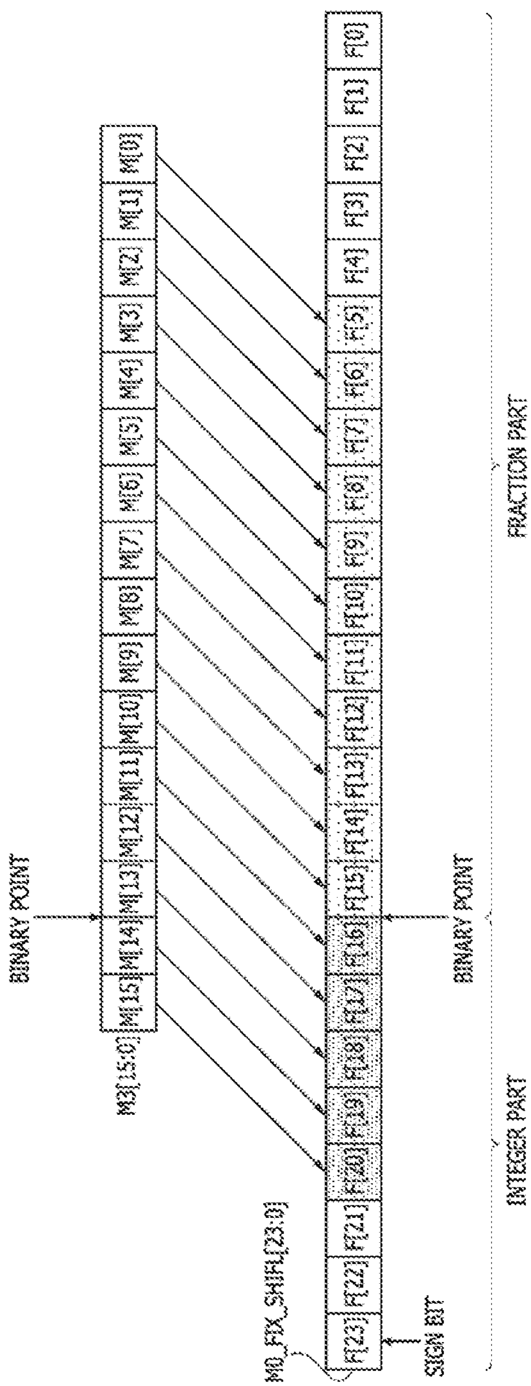
FIGS. 37 and 38 illustrate embodiments of a left shifting operation of a left shifter of a shift circuit of FIG. 36.
Figure 38:
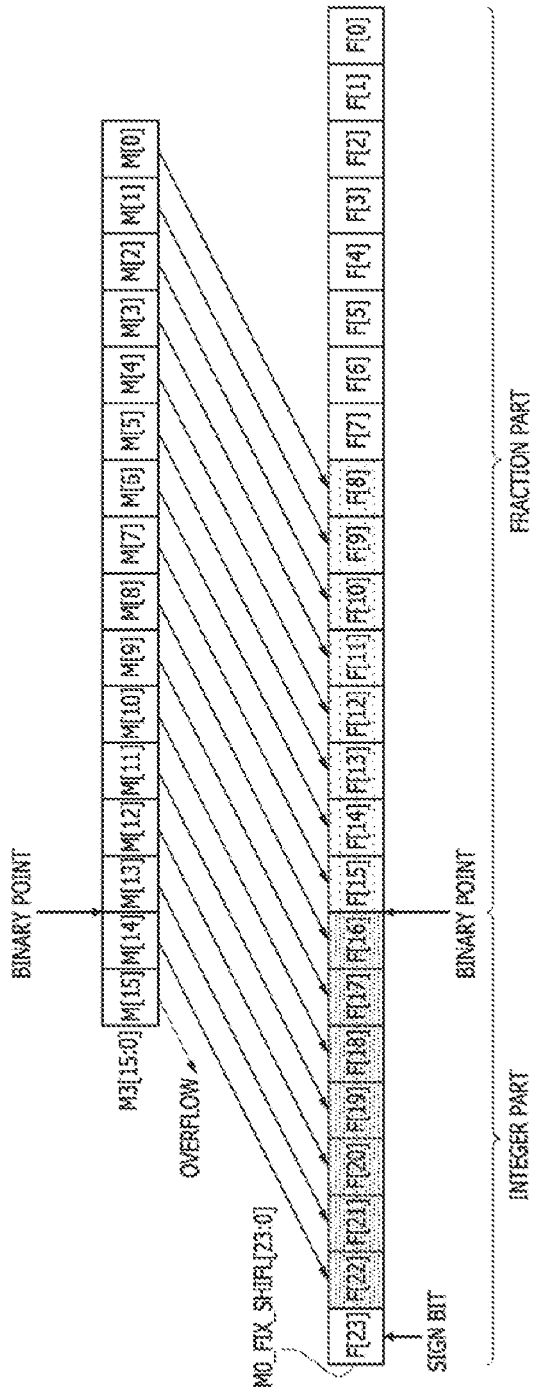

FIGS. 37 and 38 illustrate embodiments of a left shifting operation of the left shifter 1216 of the shift circuit 1210 of FIG. 36. As described with reference to FIG. 32, the mantissa bits M3[15:0] of the floating-point format first multiplication result data M0_FLT shifted by the left shifter 1216 may have a format in which normalization has not been performed. That is, in the mantissa bits M3[15:0], the binary point may be positioned between the 14th bit M[13] and the 15th bit M[14] among 16 bits M3[15:0]. The left-shifted first multiplication result data M0_FIX_SHIFL that is output from the left shifter 1216 may be composed of an 8-bit integer part F[23:16] and a 16-bit fraction part F[15:0]. The MSB F[23] thereof may correspond to the sign bit.

First, referring to FIG. 37, a case where the number of shift bits determined by the integer exponent bits IE3[6:0] is 3 will be described as an example. In this case, as indicated by arrows in FIG. 37, the left shifter 1216 may perform a shifting operation to the left by 3 bits on the mantissa bits M3[15:0] of the floating-point format first multiplication result data M0_FLT to generate fixed-point format left-shifted first multiplication result data bits M0_FIX_SHIFL [23:0]. The 5 bits of high order M[15:11] with an MSB M[15] of mantissa bits M3[15:0] may constitute the 5 bits of low order of the fixed-point format integer part F[20:16]. In addition, the 11 bits of a lower order M[10:0] with an LSB M[0] of the mantissa bits M3[15:0] of the floating-point format first multiplication result data M0_FLT may constitute the 11 bits of the high order of the fixed-point format fraction part F[15:5]. In this case, because all bits of the mantissa bits M3[15:0] are shifted within the range of the fixed-point format, overflow does not occur.

Next, referring to FIG. 38, a case where the number of shift bits determined by the integer exponent bits IE3[6:0] is '6', and the MSB M[15] is '1' in the mantissa bits M3[15:0] of the floating-point format first multiplication result data M0_FLT will be described as an example. In this case, as indicated by the arrows in FIG. 38, the left shifter 1216 may perform a shifting operation to the left by 6 bits for the mantissa bits M3[15:0] to generate fixed-point format left shifted first multiplication result data bit M0_FIX_SHIFL [23:0]. As a result, the remaining 15 bits M[14:0] excluding the MSB M[15] in the mantissa bits M3[15:0] of the floating-point format first multiplication result data M0_FLT may constitute 7 bits of the fixed-point format integer part F[22:16] and 8 bits of high order of fraction part F[15:8]. However, the MSB M[15] in the mantissa bits M3[15:0] exceeds the range of the fixed-point format. Therefore, overflow occurs in this case.

Figure 39:
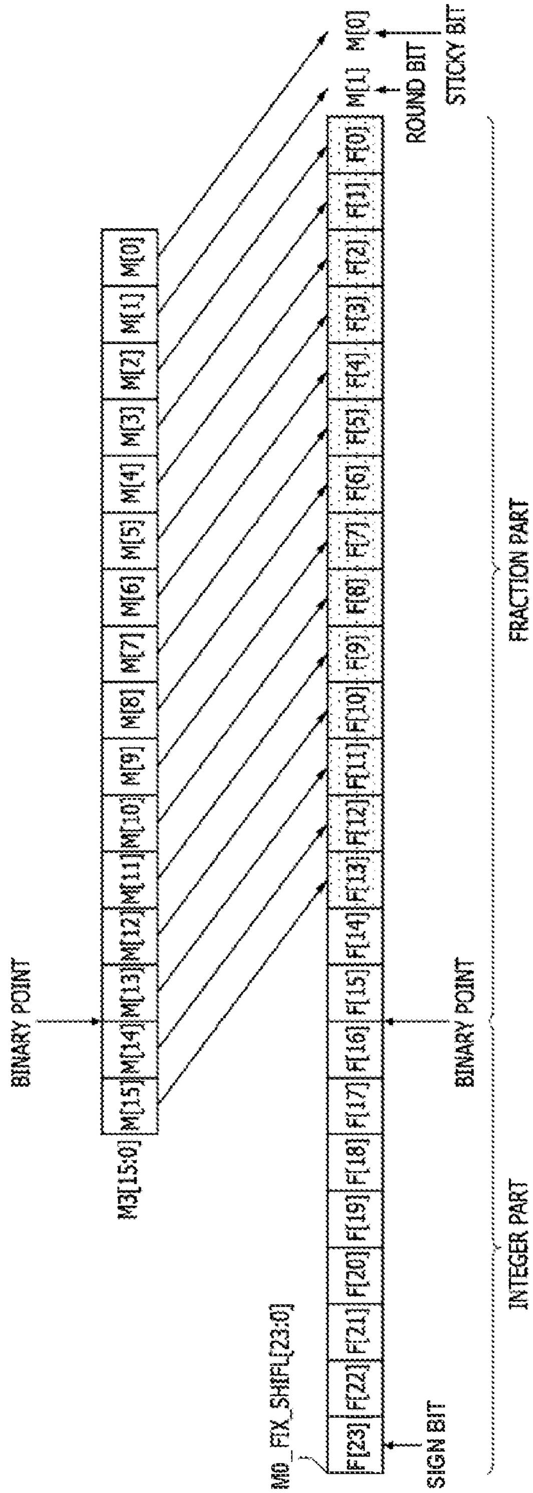
FIG. 39 illustrates an embodiment of a right shifting operation of a right shifter of the shift circuit of FIG. 36.

FIG. 39 illustrates an embodiment of a right shifting operation of the right shifter 1217 of the shift circuit 1210 of FIG. 36. Referring to FIG. 39, a case where the number of shift bits determined by the integer exponent bits IE3[6:0] is 4 bits will be described as an example. The right shifter 1217 may perform a shifting operation to the right by 4 bits on the mantissa bits M3[15:0] of the floating-point format first multiplication result data M0_FLT, as indicated by arrows in FIG. 39, to generate fixed-point format right-shifted first multiplication result data M0_FIX_SHIFR[23:0]. The remaining 14 bits M[15:2] except for the two low-order bits M[1:0], with the LSB M[0] of the mantissa bits M3[15:0] may constitute 14 bits F[13:0] of the fixed-point format fraction part. However, 2 bits of lower order M[1:0] with the LSB M[0] of the mantissa bits M3[15:0] exceeds the range of the fixed-point format. In this case, the right shifter 1217 may provide the second bit M[1] of the mantissa bits M3[15:0] positioned adjacent to the fixed-point format LSB F[0] as a round bit RB. In addition, the right shifter 1217 may provide the LSB M[0] adjacent to the second bit M[1] of the mantissa bits M3[15:0] as a sticky bit SB to the round circuit 1220. The round operation by using the round bit RB and the sticky bit SB may be the same as described with reference to FIG. 35.

Figure 40:
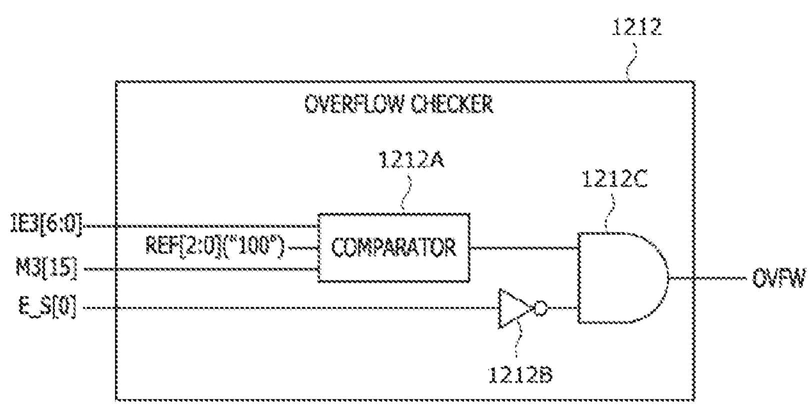
FIG. 40 illustrates an embodiment of an overflow checker of the shift circuit of FIG. 36.

FIG. 40 illustrates an embodiment of a configuration of the overflow checker 1212 of the shift circuit 1210 of FIG. 36. As shown in FIG. 40, the overflow checker 1212 may include a comparator 1212A, an inverter 1212B, and an AND gate 1212C. The comparator 1212A may receive integer exponent bits IE[6:0] that are output from the subtractor (1211 in FIG. 36) and the MSB M[15] of the mantissa M3 of the floating-point format first multiplication result data M0_FLT. Further, the comparator 1212A may receive a preset reference bits REF[2:0]. When the MSB M[15] of the third mantissa M3 is '1', the reference bits REF[2:0] may be set to a maximum value of a shift bit in which overflow does not occur. Accordingly, when the MSB M[15] of the mantissa M3 of the floating-point format first multiplication result data M0_FLT is '0', the maximum value of the shift bit in which overflow does not occur is REF[2:0]+1.

The comparator 1212A may compare the integer exponent bits IE[6:0] and the reference bits REF[2:0] to output a signal of '0' or '1'. The MSB M[15] of the mantissa M3 of the floating-point format first multiplication result data M0_FLT is '1', and the integer exponent bits IE[6:0] are less than or equal to the reference bits REF[2:0], the comparator 1212A may output a signal of '0'. On the other hand, the MSB M[15] of the mantissa M3 of the floating-point format first multiplication result data M0_FLT is '1', and the integer exponent bits IE[6:0] are greater than the reference bits REF[2:0], the comparator 1212A may output a signal of '1'. The MSB M[15] of the mantissa M3 of the floating-point format first multiplication result data M0_FLT is '0', and the integer exponent bits IE[6:0] are equal to or less than the (reference bit+1) REF[2:0]+1, the comparator 1212A may output a signal of '0'. On the other hand, the MSB M[15] of the mantissa M3 of the floating-point format first multiplication result data M0_FLT is '0', and the integer exponent bits IE[6:0] are greater than (reference bit+1) REF[2:0]+1, the comparator 1212A may output a signal of '1'. The output signal from the comparator 1212A may be transmitted to a first input terminal of the AND gate 1212C.

The inverter 1212B may receive an exponent sign bit E_S[0] that is output from the subtractor (1211 of FIG. 36). The inverter 1212B may invert and output the exponent sign bit E_S[0]. When the exponent sign bit E_S[0] is '0' representing a positive number, the inverter 1212B may output '1'. When the exponent sign bit E_S[0] Is '1' representing a negative number, the inverter 1212B may output '0'. The output signal from the inverter 1212B may be transmitted to a second input terminal of the AND gate 1212C. The AND gate 1212C may perform an AND operation on the output signal of the comparator 1212A inputted to the first input terminal and the output signal of the inverter 1212B inputted to the second input terminal, and output an operation result as an overflow signal OVFW.

If overflow occurs, that is, when the overflow signal OVFW of '1' is output from the overflow checker 1212, a signal of '1' is output from the comparator 1212A because the exponent bits IE[6:0] are greater than the reference bits REF[2:0] or (reference bit+1) REF[2:0]+1 and the exponent sign bit E_S[0] is '0' representing a positive number, thus the inverter 1212B outputs '1'. On the other hand, when no overflow occurs, that is, when the overflow signal OVFW of '0' is output from the overflow checker 1212, the signal of '0' is output from the comparator 1212A because the exponent bits IE[6:0] are less than or equal to the reference bit REF[2:0] or (reference bit+1) REF[2:0]+1. In addition, even when the exponent sign bit E_S[0] is '1' representing a negative number and the inverter 1212B outputs '0', an overflow signal OVFW of '0' may be output.

In this embodiment, when the exponent sign bit E_S[0] that is output from the subtractor 1211 is '0', that is, when the exponent sign bit E_S[0] represents a positive number, as described with reference to FIGS. 36 to 38, left shifting may be performed on the mantissa bits M3[15:0] of the floating-point format first multiplication result data M0_FLT. As described with reference to FIG. 32, the 16-bit mantissa bits M3[15:0] in the floating-point format first multiplication result data M0_FLT may have a format in which 2 bits M[15:14] with MSB are positioned to the left of the binary point. On the other hand, as described with reference to FIG. 34, in the fixed-point format, the integer part INT may be composed of 8 bits (including a sign bit). In this case, when the shift bit includes 5 bits, that is, when the mantissa bits M3[15:0] of the floating-point format first multiplication result data M0_FLT is shifted to the left by 5 bits, the MSB M[15] of the mantissa bits M3[15:0] constitutes the 7th bit F[22] of the fixed-point format integer part INT, so overflow does not occur. However, when the shift bit includes 6 bits, the MSB M[15] of the mantissa bits M3[15:0] constitutes the MSB F[23], which is a sign bit of the fixed-point format. Even if the MSB F[23] of the fixed-point format is a sign bit, overflow does not occur when the MSB M[15] is '0'. However, when the MSB M[15] of the mantissa bits M3[15:0] is '1', overflow may occur. Meanwhile, when the shift bit includes more than 7 bits, overflow may occur regardless of the bit value of the MSB M[15] of the mantissa bits M[15:0].

As mentioned above, when the MSB M[15] of the mantissa bits M3[15:0] of the floating-point format first multiplication result data M0_FLT is '1', the reference bits REF[2:0] inputted to the comparator 1212A may be set to a maximum value of a shift bit in which overflow does not occur. According to this embodiment, when the MSB M[15] of the mantissa bits M3[15:0] is '1', the maximum value of the shift bit in which overflow does not occur is 5, and thus, the reference bits REF[2:0] inputted to the comparator 1212A may be set to '100'. That is, when the MSB M[15] of the mantissa bits M3[15:0] is '1' and the integer exponent bits IE[6:0] are less than or equal to the reference bits REF[2:0], '100', which is, the comparator 1212A may output a signal of '0', and when the MSB M[15] of the third mantissa bits M3[15:0] is '1' and the exponent bits IE[6:0] are greater than the reference bits REF[2:0], '100', the comparator 1212A may output a signal of '1'. In addition, the MSB M[15] of the mantissa bits M3[15:0] is '0' and the integer exponent bits IE[6:0] are greater than the reference bits REF[2:0], '101', the comparator 1212A may output a signal of '0'. Further, when the MSB M[15] of the mantissa bits M3[15:0] is '0' and the exponent bits IE[6:0] are greater than the reference bits REF[2:0], '101', the comparator 1212A may output a signal of '1'.

Meanwhile, the exponent sign bit E_S[0] that is output from the subtractor 1211 is '1', that is, represents a negative number, right shifting may be performed on the mantissa bits M3[15:0] of the floating-point format first multiplication result data M0_FLT. As described with reference to FIG. 34, when the fixed-point format is composed of an 8-bit integer part INT and a 16-bit fraction part FRAC, if right shifting by 18 bits is performed, the MSB M[15] of the mantissa bits M3[15:0] may exceed the range of the fixed-point format. However, as described with reference to FIG. 39, in this case, round processing is possible. Therefore, even if the exponent sign bit E_S[0] is '1' and the shift bit determined by the integer exponent bits IE[6:0] is greater than 17 bits, the overflow checker 1212 may generate an overflow signal OVFW of '0'.

As described so far, in the MAC operator 1000 according to the present embodiment, a normalization process may be omitted in the multiplier MUL. Accordingly, the mantissa M of the floating-point format multiplication result data M_FLT that is output from the multiplier MUL may be configured in a format different from the normalized floating-point format. That is, the number of bits of the mantissa M becomes twice the number of input data bits with an implicit bit, and the position of the binary point might not be moved. However, as described with reference to FIGS. 36 to 39, data may be normally converted to fixed-point format data through a conversion operation in the in floating-point-to-fixed-point converter (FFC), particularly, through a left shift operation or a right shift operation. Accordingly, the adder tree (1300 in FIG. 31) may be configured with fixed-point adders.

Figure 41:
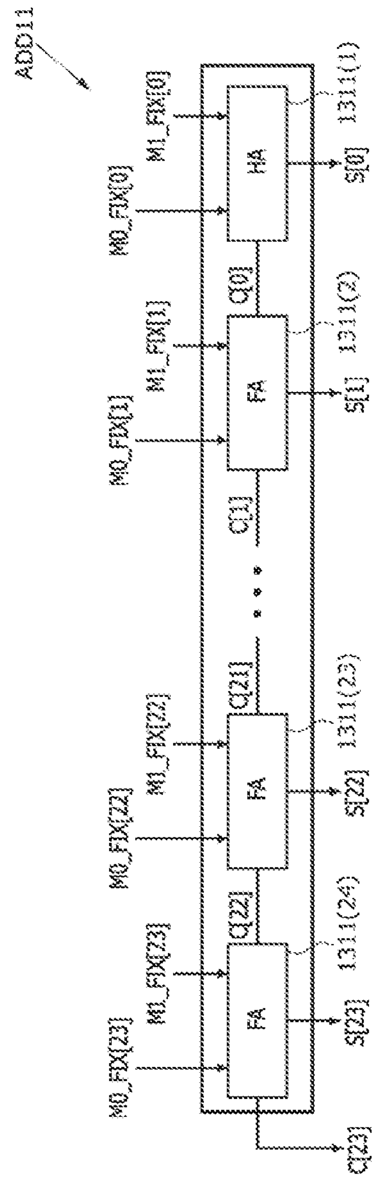
FIG. 41 illustrates an embodiment of a first adder of a first stage constituting an adder tree of FIG. 31.

FIG. 41 illustrates an embodiment of the first adder ADD11 of the first stage constituting the adder tree 1300 of FIG. 31. The following description may be applied equally to each of the remaining adders ADD12-ADD14, ADD21-ADD22, and ADD3 constituting the adder tree 1300 of FIG. 31. Also, the same can be applied to the accumulator 1410 constituting the accumulator 1400 of FIG. 31.

Referring to FIG. 41, the first adder ADD11 may include a half adder (HA) 1311(1) and a plurality of full adders FAs, for example, first to 23rd full adders 1311(2)-1311(24). The number of the full adders 1311(2)-1311(24) is one less than the number of bits of the fixed-point format. The half adder 1311(1) may receive the LSB M0_FIX[0] of the fixed-point format first multiplication result data M0_FIX and the LSB M1_FIX[0] of the fixed-point format second multiplication result data M1_FIX. The half adder 1311(1) may perform an addition operation on the two input data, and output a first carry bit C[0] and a first sum bit S[0]. The first carry bit C[0] may be inputted to the first full adder 1311(2).

The full adders 1311(2)-1311(24) may be arranged in series with each other so that the carry bit C that is output from the previous full adder is inputted to the next full adder. For example, a second carry bit C[1] that is output from the first full adder 1311(2) may be inputted to the next second full adder. Similarly, a 23rd carry bit C[22] that is output from the 22nd full adder 1311(23) may be inputted to the 23rd full adder 1311(24). The 1st to 23rd full adders 1311(2)-1311(24) may perform an addition operation on each of the 2nd to 24th bits M1_FIX[23:1] excluding the LSB among the bits of the first multiplication result data M0_FIX, each of the 2nd to 24th bits M1_FIX[23:1] excluding the LSB among the bits of the second multiplication result data M1_FIX, and the carry bit C to output sum bits S and carry bits C. The sum bits S[23:0]) and the carry bits C[23] that are output from the half adder 1311(1) and the full adders 1311(2)-1311(24), and the carry bit C[23] that are output from the 23rd full carrier 1311(24) may constitute the output data of the first adder ADD11.

Figure 42:
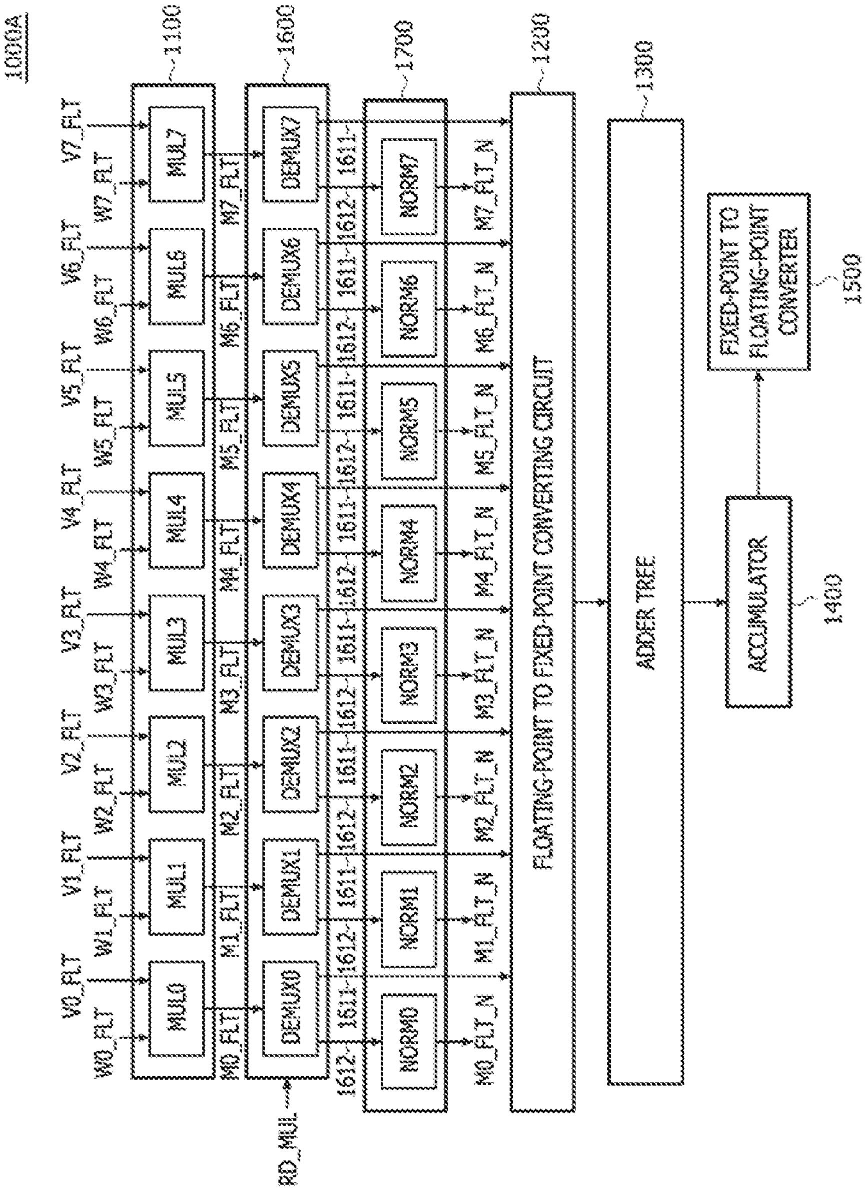
FIG. 42 illustrates a MAC operator according to another embodiment of the present disclosure.

FIG. 42 illustrates a MAC operator 1000A according to another embodiment of the present disclosure. In FIG. 42, the same reference numerals as in FIG. 31 denote the same components. The MAC operator 1000A according to the present embodiment may be applied to the PIM devices 10, 100, and 400 described with reference to FIGS. 1, 2, and 20. The MAC operator 1000A according to the present embodiment may differ from the MAC operator 1000A described with reference to FIG. 31 in that the MAC operator 1000A according to the present embodiment is configured to perform both the MAC arithmetic operation and an element-wise multiplication (EWM) operation. Because in the MAC arithmetic operation, all of the multiplication, addition, and accumulation is performed, in order for the MAC operator 1000A according to the present embodiment to perform the MAC arithmetic operation, the multiplying circuit 1100, the floating-point-to-fixed-point converting circuit 1200, the adder tree 1300, the accumulator 1400, and the fixed-point-to-floating-point converter 1500 all operate. On the other hand, because in the EWM operation, only multiplication is performed, in the process of the MAC operator 1000A performing the EWM operation according to the present embodiment, only the multiplying circuit 1100 operates, and the floating-point-to-fixed-point converting circuit 1200, the adder tree 1300, the accumulator 1400, and the fixed-point-to-floating-point converter 1500 does not operate.

When the MAC operator 1000A according to the present embodiment performs the EWM operation, the multiplication result data M_FLTs that is output from the multiplying circuit 1100 may be data to which normalization has not been performed, as described with reference to FIG. 32. In order for the multiplication result data M_FLTs to which normalization processing has been omitted, as described above to be output from the MAC operator 1000A and used for other operations, the normalization processing is preceded. Accordingly, when the floating-point format multiplication result data M_FLT that is output from the multiplier is to be output from the MAC operator 1000A, in the MAC operator 1000A according to the present embodiment, the multiplication result data M_FLTs may be transmitted to the normalizing circuit 1700 by the data output selecting circuit 1600, normalization processing may be performed by the normalizing circuit 1700, and then, normalized multiplication result data M_FLT_N may be output.

Referring to FIG. 42, the MAC operator 1000A according to the present embodiment may include the multiplying circuit 1100, a floating-point-to-fixed-point converting circuit 1200, an adder tree 1300, an accumulator 1400, a fixed-point-to-floating-point converter 1500, a data output selecting circuit 1600, and a normalizing circuit 1700. The multiplying circuit 1100, the floating-point-to-fixed-point converting circuit 1200, the adder tree 1300, the accumulator 1400, and the fixed-point-to-floating-point converter 1500 are the same as those described with reference to FIG. 31, so that redundant descriptions will be omitted.

The data output selecting circuit 1600 may output the multiplication result data M0_FLT-M7_FLT that is output from the multiplying circuit 1100 through selected one of first output lines 1611 and second output lines 1612. The data output selecting circuit 1600 may be configured by arranging a plurality of demultiplexers each with one input terminal and two output terminals, for example, first to eighth demultiplexers DEMUX0-DEMUX7 in parallel with each other. The input terminal of each of the demultiplexers DEMUX0-DEMUX7 may be coupled to the output terminal of each of the multipliers MUL0-MUL7. For example, the input terminal of the first demultiplexer DEMUX0 may be coupled to the output terminal of the first multiplier MUL0. The input terminal of the second demultiplexer DEMUX1 may be coupled to the output terminal of the second multiplier MULL. The same coupling method may be applied to the remaining third to eighth demultiplexers DEMUX2-DEMUX7.

The first output lines 1611 of each of the first to eighth demultiplexers DEMUX0-DEMUX7 may be coupled to the floating-point-to-fixed-point converting circuit 1200. The second output lines 1612 of each of the first to eighth demultiplexers DEMUX0-DEMUX7 may be coupled to the normalizing circuit 1700. The selection of an output line in the first to eighth demultiplexers DEMUX0-DEMUX7 may be performed by a multiplication result read signal RD_MUL. For example, if a multiplication result read signal RD_MUL of a first logic level, for example, logic low is transmitted to the first to eighth demultiplexers DEMUX0-DEMUX7, the first to eighth demultiplexers DEMUX0-DEMUX7 may transmit the multiplication result data M0_FLT-M7_FLT to the floating-point-to-fixed-point converting circuit 1200 through the first output lines 1611. On the other hand, if a multiplication result read signal RD_MUL of a second level, for example, logic high is transmitted to the first to eighth demultiplexers DEMUX0-DEMUX7, the first to eighth demultiplexers DEMUX0-DEMUX7 may transmit the multiplication result data M0_FLT-M7_FLT to the normalizing circuit 1700 through the second output lines 1612.

The normalizing circuit 1700 may include a plurality of normalizers, for example, first to eighth normalizers NORM0-NORM7. The first to eighth normalizers NORM0-NORM7 may receive the multiplication result data M0_FLT-M7_FLT from the first to eighth multipliers MUL0-MUL7 of the multiplying circuit 1100 through the second output lines 1612 of the data output selecting circuit 1600. The first to eighth normalizers NORM0-NORM7 may perform a normalizing process on the floating-point format multiplication result data M0_FLT-M7_FLT transmitted from each of the first to eighth first to eighth multipliers MUL0-MUL7 through the data output selecting circuit 1600. The first to eighth normalizers NORM0-NORM7 may output normalized multiplication result data M0_FLT_N-M7_FLT_N as a result of the normalizing process. For example, the first normalizer NORM0 may perform a normalizing process on the floating-point format first multiplication result data M1_FLT transmitted from the first multiplier MUL0 through the first demultiplexer DEMUX0 in response to a multiplication result read data RD_MUL of logic high, and output normalized first multiplication result data M1_FLT_N as a result. The same operation may be applied to the remaining second to eighth normalizers NORM1-NORM7.

Figure 43:
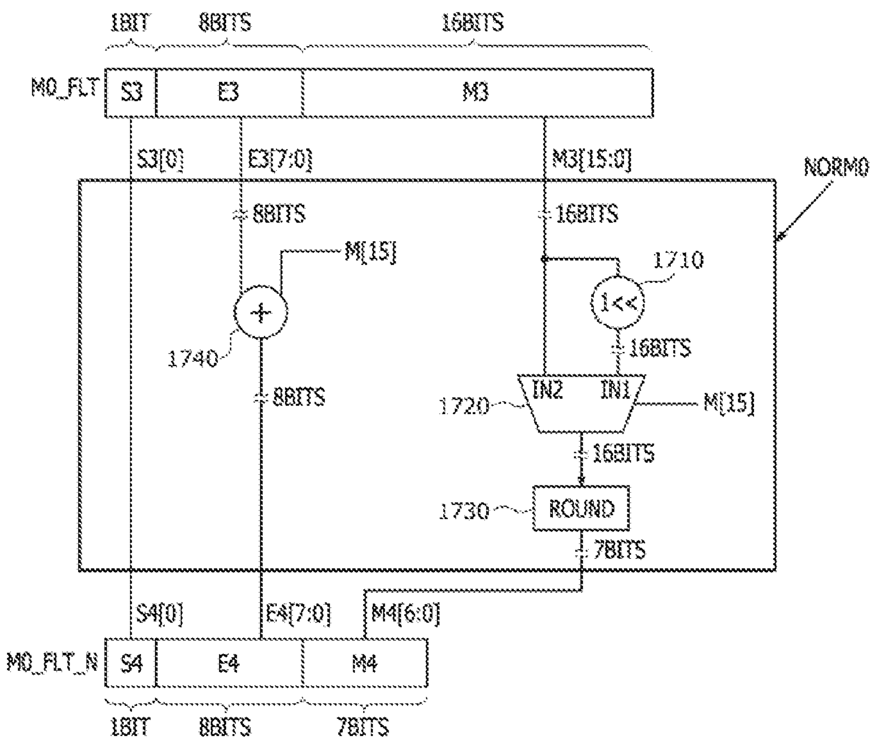
FIG. 43 illustrates an embodiment of a first normalizer of a normalizing circuit of FIG. 42.

FIG. 43 illustrates a configuration and an operation of the first normalizer NORM of the normalizing circuit of FIG. 42. The description of the configuration and operation of the first normalizer NORM0 below may be equally applied to the remaining second to eighth normalizers NORM1-NORM7.

Referring to FIG. 43, the first normalizer NORM0 may include a floating-point moving unit 1710, a multiplexer 1720, a round processing unit 1730, and an adder 1740. A sign bit S3[0] of the floating-point format first multiplication result data M0_FLT may be excluded from the object of the normalizing process. Accordingly, the sign bit S3[0] of the first multiplication result data M0_FLT may be output from the first normalizer NORM0 as it is. That is, a sign bit S4[0] that is output from the first normalizer NORM0 is always the same as the sign bit S3[0] inputted to the first normalizer NORM0. The sign bit S4[0] that is output from the first normalizer NORM0 may constitute the sign S4 of the floating-point format normalized first multiplication result data M0_FLT_N.

The floating-point moving unit 1710 may receive a mantissa M3 of the first multiplication result data M0_FLT, move a binary point toward the MSB of the mantissa M3 by 1 bit, and output a result. As described with reference to FIG. 32, the binary point of the mantissa M3 of the first multiplication result data M0_FLT may be positioned between the 14th bit M[13] and the 15th bit M[14]. Therefore, two bits with the MSB, namely, the 15th bit M[14] and the MSB M[15] may be positioned at the left of the binary point. The floating-point moving unit 1710 may move the binary point to be positioned between the 15th bit M[14] and the MSB M[15]. When the MSB M[15] of the mantissa M3 is ‘1’, the data generated by the floating-point moving unit 1710 may have a normalized form (including implicit bit). However, when the MSB M[15] of the mantissa M3 is ‘0’, the data generated by the floating-point moving unit 1710 may still have a non-normalized format. Accordingly, when the MSB M[15] of the mantissa M3 is ‘0’, the data generated by the floating-point moving unit 1710 may be discarded by the multiplexer 1720. Data whose binary point has been moved by the floating-point moving unit 1710 may be transmitted to a first input terminal IN1 of the multiplexer 1720.

The multiplexer 1720 may receive the data whose binary point has been moved by the floating-point moving unit 1710 through the first input terminal IN1. The multiplexer 1720 may receive a mantissa M3 of the first multiplication result data M0_FLT through a second input terminal IN2. The multiplexer 1720 may receive the MSB M[15] of the mantissa M3 through a control terminal. When the MSB M[15] is ‘1’, the multiplexer 1720 may output data with a format (including implicit bit) in which the binary point has been moved and normalized by the floating-point moving unit 1710, transmitted through the first input terminal IN1. When the MSB M[15] is ‘0’, the multiplexer 1720 may output the mantissa M3 inputted through the second input terminal IN2. Because the MSB M[15] is ‘0’, the mantissa M3 that is output from the multiplexer 1720 may also have a normalized format (including implicit bit).

The round processing unit 1730 may receive the data with a normalized format (including implicit bit), output from the multiplexer 1720. The round processing unit 1730 may remove 9 bits (including an implicit bit) from the transmitted 16-bit data so that the data size becomes '7'. In this process, the round processing unit 1730 may perform round processing. During the round processing, '+1' addition may be performed. The 7-bit mantissa bits M4[6:0] that are output from the round processing unit 1730 may constitute the mantissa M4 of the floating-point format normalized first multiplication result data M0_FLT_N.

The adder 1740 may receive an 8-bit exponent E3 of the first multiplication result data M0_FLT and an MSB M[15] of the mantissa M3. The adder 1740 may perform an addition operation on the received exponent E3 and MSB M[15]. When the MSB M[15] of the mantissa M3 is '0', the 8-bit data E4[7:0] that is output from the adder 1740 may be the same as the exponent bits E3[7:0]. When the MSB M[15] of the mantissa M3 is '1', the 8-bit data E4[7:0] that is output from the adder 1740 may be configured by performing a '+1' operation on the exponent bits E3[7:0] inputted to the adder 1740. As described above, when the MSB M[15] of the mantissa M3 is '1', data in which the binary point has been moved to the left by 1 bit by the floating-point moving unit 1710 may be output from the multiplexer 1720. Therefore, in this case, by performing a '+1' operation on the exponent bits E3[7:0] inputted to the adder 1740, the exponent change according to the movement of the binary point in the mantissa M may be reflected in the exponent bits E3[7:0].

Figure 44:
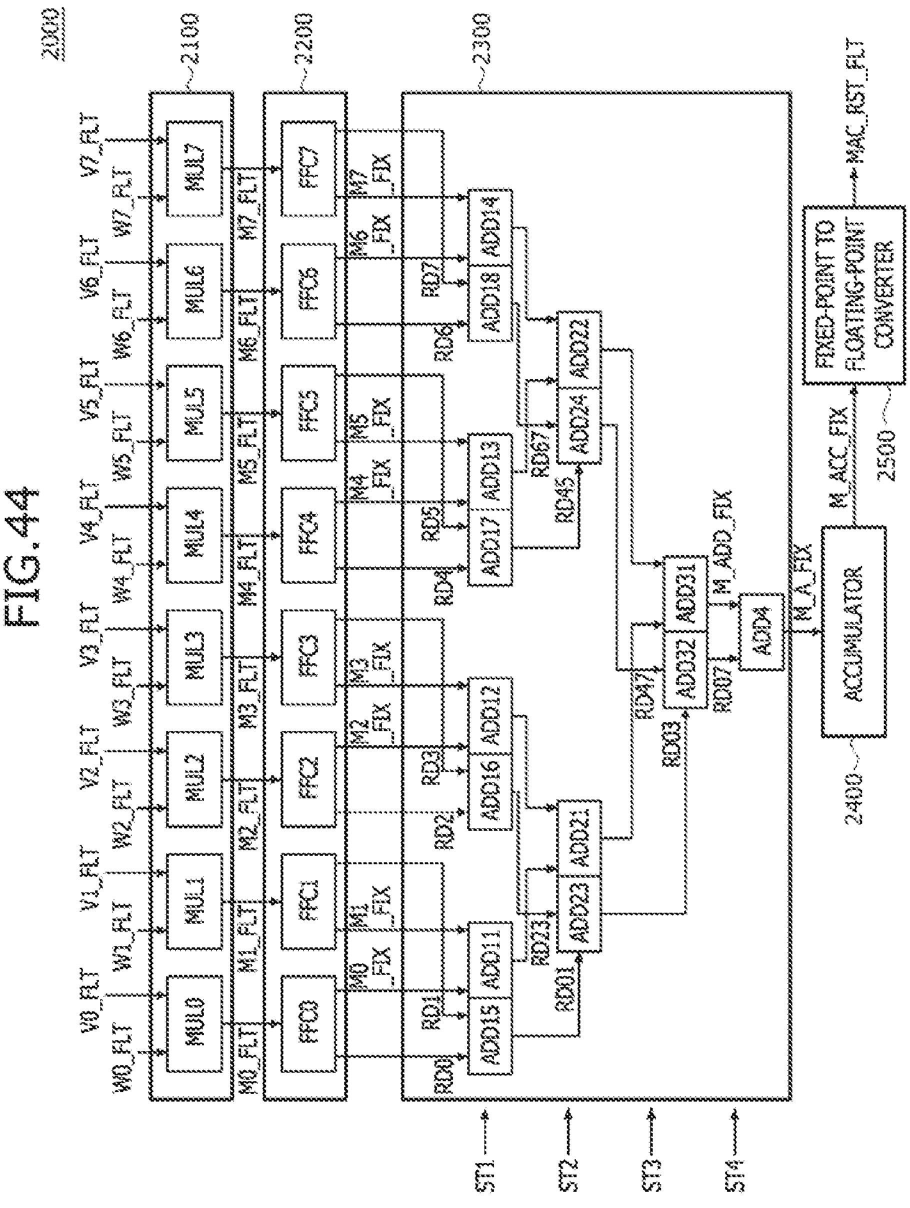
FIG. 44 illustrates a MAC operator according to another embodiment of the present disclosure.

FIG. 44 illustrates a MAC operator 2000 according to another embodiment of the present disclosure. The MAC operator 2000 according to the present embodiment may be applied to the PIM devices 10, 100, and 400 described with reference to FIGS. 1, 2, and 20. Referring to FIG. 44, the MAC operator 2000 according to the present embodiment may include a multiplying circuit 2100, a floating-point-to-fixed-point converting circuit 2200, an adder tree 2300, an accumulator 2400, and a fixed-point-to-floating-point converter 2500.

The multiplying circuit 2100 may include a plurality of multipliers, for example, first to eighth multipliers MUL0-MUL7. Each of the first to eighth multipliers MUL0-MUL7 may receive each of floating-point format weight data W0_FLT-W7_FLT, and each of floating-point format vector data V0_FLT-V7_FLT. Each of the first to eighth multipliers MUL0-MUL7 may perform a multiplication operation on the each of the weight data W0_FLT-W7_FLT and each of the vector data V0_FLT-V7_FLT, and output multiplication result data M0_FLT-M7_FLT as a result. In the MAC operator 2000 according to the present embodiment, each of the floating-point format multiplication result data M0_FLT-M7_FLT that is output from each of the first to eighth multipliers MUL0-MUL7 may be output in a normalized state.

The floating-point-to-fixed-point converting circuit 2200 may include a plurality of a floating-point-to-fixed-point converters, for example, first to eighth floating-point-to-fixed-point converters FFC0-FFC7. Each of the first to eighth floating-point-to-fixed-point converters FFC0-FFC7 may receive each of the floating-point format first to eighth multiplication result data M0_FLT-M7_FLT from the first to eighth multipliers MUL0-MUL7. Each of the first to eighth floating-point-to-fixed-point converters FFC0-FFC7 may output each of the fixed-point format first to eighth multiplication result data M0_FIX-M7_FIX and each of first to eighth round bits RD0-RD7.

The fixed-point format first to eighth multiplication result data M0_FIX-M7_FIX may be data generated by performing data format converting into a fixed-point format on the floating-point first to eighth multiplication result data M0_FLT-M7_FLT. As described with reference FIG. 34, in the process of data format conversion from the floating-point format to the fixed-point format, round processing and 2's complement processing may be performed. In the round processing, when roundup is performed, a '+1' operation may be performed, and when a sign bit represents a negative number, a '+1' operation may be performed according to the 2's complement processing. However, each of the first to eighth floating-point-to-fixed-point converters FFC0-FFC7 according to the present embodiment might not perform both the '+1' operation of the case of roundup, and the '+1' operation according to the 2's complement processing of the case where the sign bit is negative in the conversion process from the floating-point format to the fixed-point format. Accordingly, each of the fixed-point format first to eighth multiplication result data M0_FIX-M7_FIX may correspond to the data before '+1' operation is performed even when roundup and when the sign bit is negative.

Each of the first to eighth round bits RD0-RD7 that is output from each of the first to eighth floating-point-to-fixed-point converters FFC0-FFC7 may represent a bit value that has not been added by the '+1' operation omitted in the conversion process from the floating-point format to the fixed-point format. In an embodiment, each of the first to eighth round bits RD0-RD7 may have a value of '0' or '1'. The bit value of each of the first to eighth round bits RD0-RD7 that is output from each of the first to eighth floating-point-to-fixed-point converters FFC0-FFC7 may be determined according to whether a sign bit is a negative number or a positive number and according to whether to correspond to roundup as a result of round processing.

The adder tree 2300 may perform a first addition operation on the fixed-point format first to eighth multiplication result data M0_FIX-M7_FIX that are output from the first to eight floating-point-to-fixed-point converters FFC0-FFC7. In addition, the adder tree 2300 may perform a second addition operation on the first to eight round bits RD0-RD7 that are output from the first to eighth floating-point-to-fixed-point converters FFC0-FFC7. Further, the adder tree 2300 may perform third addition on a first addition result and a second addition result.

In an embodiment, the adder tree 2300 may include adders ADD11-ADD14, ADD21-ADD22, and ADD31 (hereinafter, a first group of adders) performing the first addition, adders ADD15-ADD18, ADD23-ADD24, and ADD32 (hereinafter, a second group of adders) performing the second addition, and an adder ADD4 performing the third addition. Each of the first to eighth multiplication result data M0_FIX-M7_FIX transmitted to the adder tree 2300 has a fixed-point format, and each of the first to eighth round bits RD0-RD7 has a binary value of '1', so that the adder tree 2300 may be composed of fixed-point adders.

The adder tree 2300 may be configured in a tree structure with a plurality of stages. When 8 multiplication result data M0_FIX-M7_FIX and round bits RD0-RD7 are transmitted to the adder tree 2300 as in this embodiment, the adder tree 2300 may have first to fourth stages ST1 to ST4. In the uppermost stage of the adder tree 2300, that is, the first stage ST1, four first adders ADD11-ADD14 of the first group may be disposed in parallel with each other. Also, in the first stage ST1, four first adders ADD15-ADD18 of the second group may be disposed in parallel with each other. In the second stage ST2 of the adder tree 2300, two second adders ADD21-ADD22 of the first group may be disposed in parallel with each other. In addition, in the second stage ST2, two second adders ADD23-ADD24 of the second group may be disposed in parallel with each other. In the third stage ST3 of the adder tree 2300, one third adder ADD31 of the first group may be disposed. In addition, in the third stage ST3, one third adder ADD32 of the second group may be disposed. One fourth adder ADD4 may be disposed in the fourth stage ST4, which is the lowermost stage of the adder tree 2300.

Each of the first adders ADD11-ADD14 of the first group of the first stage ST1 may perform an addition operation on two floating-point format multiplication result data M_FIXs transmitted through the two floating-point-to-fixed-point converters FFCs, and output fix-point format result data. As an example, the first adder ADD11 among the first adders ADD11-ADD14 of the first group may receive fixed-point format first multiplication result data M0-FIX and fixed-point format second multiplication result data M1-FIX from the first floating-point-to-fixed-point converter FFC0 and the second floating-point-to-fixed-point converter FFC1, respectively. The first adder ADD11 may perform an addition operation on the fixed-point format first multiplication result data M0-FIX and fixed-point format second multiplication result data M1-FIX, and transmit a calculation result to the second adder ADD21 of the first group of the second stage ST2. The remaining first adders ADD12-ADD14 of the first group may operate in the same manner.

Each of the first adders ADD15-ADD18 of the second group of the first stage ST1 may perform an addition operation on two round bits RDs transmitted through the two floating-point-to-fixed-point converters FFCs, and output result data RD01, RD23, RD45, and RD67, respectively. As an example, the first adder ADD15 among the first adders ADD15-ADD18 of the second group may receive the first round bit RD0 and the second round bit RD1 from the first floating-point-to-fixed-point converter FFC1 and the second floating-point-to-fixed-point converter FFC2, respectively. The first adder ADD15 may perform an addition operation on the first round bit RD0 and the second round bit RD1, and output result data RD01 to the second adder ADD23 of the second group of the second stage ST2. The remaining first adders ADD16-ADD18 of the second group may operate in the same manner.

Each of the second adders ADD21-ADD22 of the first group of the second stage ST2 may perform an addition operation on the output data of the first adders of the first group of the first stage ST1, and output fixed-point format result data. For example, the second adder ADD21 of the first group may perform an addition operation on the output data that is output from the first adders ADD11 and ADD12 of the first group of the first stage ST1, and transmit result data to the third adder ADD31 of the first group of the third stage ST3. The remaining second adder ADD22 of the first group may operate in the same manner.

Each of the second adders ADD23-ADD24 of the second group of the second stage ST2 may perform an addition operation on the output data of the first adders of the second group of the first stage ST1, and output result data RD03 and RD047, respectively. For example, the second adder ADD23 of the second group may perform an addition operation on the output data RD01 and RD23 that are output from the first adders ADD15 and ADD16 of the second group of the first stage ST1, and transmit result data RD03 to the third adder ADD32 of the second group of the third stage ST3. In a similar manner, the second adder ADD24 of the second group may perform an addition operation on the output data RD45 and RD67 that are output from the first adders ADD17 and ADD18 of the second group, and transmit result data RD47 to the third adder ADD32 of the second group of the third stage ST3.

The third adder ADD31 of the first group of the third stage ST3 may perform an addition operation on the output data of the second adders ADD21-ADD22 of the first group of the second stage ST2, and output result data. The third adder ADD32 of the second group of the third stage ST3 may perform an addition operation on the output data RD03 and RD47 of the second adders ADD23-ADD24 of the second group of the second stage ST2, and transmit result data RD07 to the fourth adder ADD4 of the fourth stage ST4.

The fourth adder ADD4 of the fourth stage ST4 may perform an addition operation on the fixed-point format output data M_ADD_FIX from the third adder ADD31 of the first group of the third stage ST3 and the output data RD07 from the third adder ADD32 of the second group of the third stage ST3. The fourth adder ADD4 may transmit multiplication data M_A_FIX generated as a result of the addition to the accumulator 2400.

The result data M_A_FIX that is output from the fourth adder ADD4 may be data in which data that is obtained by summing round bits RD0-RD7 to data that is obtained by summing the fixed-point format first to eighth multiplication result data M0_FLT-M7_FLT that are output from the first to eighth floating-point-to-fixed-point converters FFC0-FFC7. That is, in the process of generating the fixed-point format first to eighth multiplication result data M0_FLT-M7_FLT by the first to eighth floating-point-to-fixed-point converters FFC0-FFC7, the '+1' operation, which was omitted in the roundup and 2's complement processing, may be performed by the third addition by the fourth adder ADD4 of the fourth stage ST4.

The accumulator 2400 may perform an accumulating addition operation on the fixed-point format multiplication-addition data M_A_FIX that is output from the fourth adder ADD4 of the fourth stage ST4, which is the lowermost state of the adder tree 2300, and output fixed-point format multiplication-accumulation data M_ACC_FIX. After the accumulation in the MAC operator 2000 is completed, the fixed-point format multiplication-accumulation data M_ACC_FIX that is output from the accumulator 2400 may be transmitted to the fixed-point-to-floating-point converter 2500. The fixed-point-to-floating-point converter 2500 may convert the fixed-point format multiplication-accumulation data M_ACC_FIX transmitted from the accumulator 2400 into the floating-point format data to output the floating-point format MAC result data MAC_RST_FLT. The accumulator 2400 and the fixed-point-to-floating-point converter 2500 may have the same configuration as the accumulator 1400 and the fixed-point-to-floating-point converter 1500 described with reference to FIG. 31.

Figure 45:
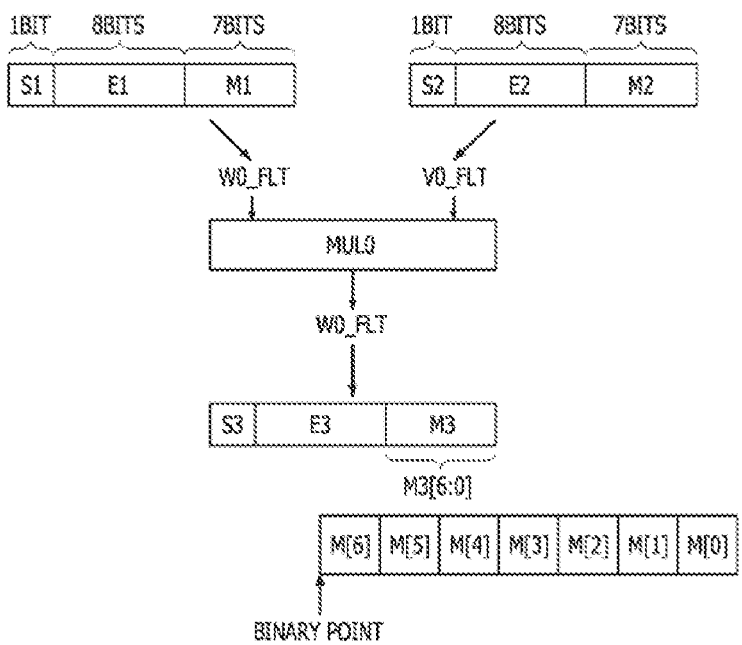
FIG. 45 illustrates an embodiment of data formats of input data and output data of a first multiplier in a MAC operator of FIG. 44.

FIG. 45 illustrates an embodiment of data formats of the input data and the output data of the first multiplier MUL0 in the MAC operator 2000 of FIG. 44. The following description may be applied equally to the remaining multipliers MUL1-MUL7 constituting the multiplication circuit 2100 in the MAC operator 2000 of FIG. 44. In this embodiment, it is premised that the input data, that is, the first weight data W0_FLT and the first vector data V0_FLT are in a 16-bit brain floating point BF16 type.

Referring to FIG. 45, the floating-point format first weight data W0_FLT inputted to the first multiplier MUL0 may be composed of a 1-bit sign S1, an 8-bit exponent E1, and a 7-bit mantissa M1. Similarly, the floating-point format first vector data V0_FLT inputted to the first multiplier MUL0 may be composed of a 1-bit signal S2, an 8-bit exponent E2, and a 7-bit mantissa M2. The multiplier MUL0 may generate a sign S3 of the first multiplication result data M0_FLT that is output from the first multiplier MUL0 through an XOR operation on the sign S1 of the first weight data W0_FLT and the sign S2 of the first vector data V0_FLT.

The first multiplier MUL0 may perform a multiplication operation on the first weight data W0_FLT and the first vector data V0_FLT. In the multiplication performed by the first multiplier MUL0, addition 'E1+E2' on the exponent E2 of the first weight data W0_FLT and the exponent E2 of the first vector data V0_FLT may be performed, and the result may constitute the exponent E3 of the floating-point format first multiplication result data M0_FLT that is output from the first multiplier MUL0. In addition, multiplication 'M1*M2' may be performed on the mantissa M1 of the first weight data W0_FLT and the mantissa M2 of the first vector data W0_FLT, and the result may constitute the mantissa M3 of the floating-point format first multiplication result data M0_FLT that is output from the first multiplier MUL0.

The multiplication on the mantissa M1 of the first weight data W0_FLT and the mantissa M2 of the first vector data W0_FLT may be performed in a state in which a 1-bit implicit bit has been included in each of the mantissa M1 of the first weight data W0_FLT and the mantissa M2 of the first vector data W0_FLT. Accordingly, 16-bit data may be generated as a result of the multiplication on the mantissa 1.M1 of the first weight data W0_FLT and the mantissa 1.M2 of the first vector data W0_FLT. The 16-bit data may be normalized and the implicit bit may be removed to form the mantissa M3 of the 7-bit first multiplication result data M0_FLT. Because the implicit bit has been removed, the binary point in the mantissa M3 of the first multiplication result data M0_FLT may be positioned to the left of the MSB M[6].

Figure 46:
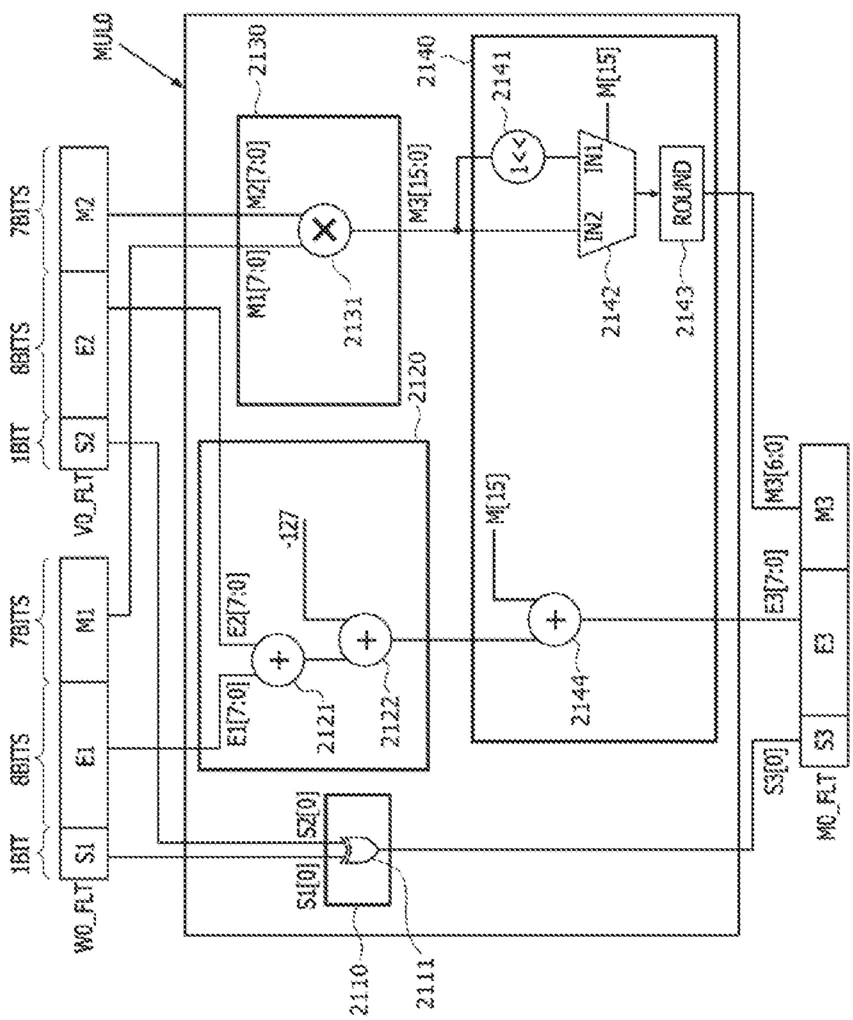
FIG. 46 illustrates an embodiment of the first multiplier of the multiplying circuit of FIG. 44.

FIG. 46 illustrates an embodiment of the first multiplier MUL0 of the multiplication circuit 2100 of FIG. 44. In the present embodiment, it is premised that the first weight data W0_FLT and the first vector data V0_FLT are in a 16-bit brain floating-point BF16 format. The description for a configuration and an operation of the first multiplier MUL0 according to the present embodiment may be equally applied to the remaining multipliers MUL1-MUL7 constituting the multiplying circuit 2100.

Referring to FIG. 46, the first multiplier MUL0 may include a sign processing circuit 2110, an exponent processing circuit 2120, a mantissa processing circuit 2130, and a normalizer 2140. The sign processing circuit 2110 may include an XOR gate 2111. The XOR gate 2111 may perform an XOR operation on the sign bit S1[0] of the first weight data W0_FLT and the sign bit S2[0] of the first vector data V0_FLT. The XOR gate 2111 may output a 1-bit sign bit S3[0] constituting the sign S3 of the floating-point format first multiplication result data M0_FLT.

The exponent processing circuit 2120 may include a first exponent adder 2121 and a second exponent adder 2122. The first exponent adder 2121 may perform an addition operation on exponent bits E1[7:0] of the first weight data W0_FLT and the exponent bits E2[7:0] of the first vector data V0_FLT, and output result data. The second exponent adder 2122 may perform an addition operation on the result data and '−127' in order to subtract the exponential bias value, for example, '127' from the result data that is output from the first adder 2121. The output data from the second exponent adder 2122 may be transmitted to the normalizer 2140.

The mantissa processing circuit 2130 may include a mantissa multiplier 2131. The mantissa multiplier 2131 may perform a multiplication operation on the mantissa bits M1[7:0] of the first weight data W0_FLT with an explicit bit and the mantissa bits M2[7:0] of the first vector data V0_FLT with an explicit data. The mantissa multiplier 2131 may output 16-bit mantissa bits M3[15:0] as a multiplication result data. The mantissa bits M3[15:0] that are output from the mantissa multiplier 2131 may be transmitted to the normalizer 2140.

The normalizer 2140 may include a floating-point moving unit 2141, a multiplexer 2142, a round processing unit 2143, and a third exponent adder 2144. The floating-point moving unit 2141 may receive 16-bit mantissa bits M3[15:0] transmitted from the mantissa multiplier 2131, and output the mantissa bits M3[15:0] after shifting the binary point toward the MSB of the mantissa bit M3[15:0] by 1-bit. Accordingly, the binary point of the mantissa bits M3[15:0] may be positioned between the 15th bit M[14] and the MSB M[15] of the mantissa bit M3[15:0]. The data of which binary point has been moved by the floating-point moving unit 2141 may be transmitted to a first input terminal IN1 of the multiplexer 2142.

The multiplexer 2142 may receive the data of which binary point has been moved by the floating-point moving unit 2141 through first input terminal IN1, and receive mantissa bits M4[15:0] that are output from the mantissa multiplier 2131 through a second input terminal IN2. The multiplexer 2142 may determine output data in response to the MSB M[15] of the mantissa bits M3[15:0]. When the MSB M[15] of the mantissa bits M3[15:0] is '1', the multiplexer 2142 may output the data of which binary point has been moved by the floating-point moving unit 2141, transmitted through the first input terminal IN1. When the MSB M[15] of the mantissa bits M3[15:0] is '0', the multiplexer 2142 may output the mantissa data M3[15:0] inputted through the second input terminal IN2.

The round processing unit 2143 may remove 9 bits (including an implicit bit) from the 16-bit data that is output from the multiplexer 2142 so that the data size becomes '7'. In this process, the round processing unit 2143 may perform round processing. During round processing, '+1' addition according to roundup may be performed. The round processing unit 2143 may output the round-processed 7-bit mantissa bits M3[6:0]. The mantissa bits M3[6:0] that are output from the round processing unit 2143 may constitute the mantissa M3 of the floating point format first multiplication result data M0_FLT.

The third exponent adder 2144 may perform an addition operation on the 8-bit data that is transmitted from the second exponent adder 2144 and the MSB M[15] of the mantissa bits M3[15:0] from the mantissa multiplier 2131. When the MSB M[15] of the mantissa bits M3[15:0] is '0', the 8-bit exponent E3[7:0] that is output from the third exponent adder 2144 may be the same as the data that is transmitted from the second exponent adder 2142. When the MSB M[15] of the mantissa bits M3[15:0] is '1', the 8-bit exponent E3[7:0] that is output from the second exponent adder 2122 may have a value greater by '1' than the data that is output from the second exponent adder 2122. The exponent bits that are output from the third exponent adder 2144 may constitute the exponent E3 of the floating-point format first multiplication result data M0_FLT.

Figure 47:
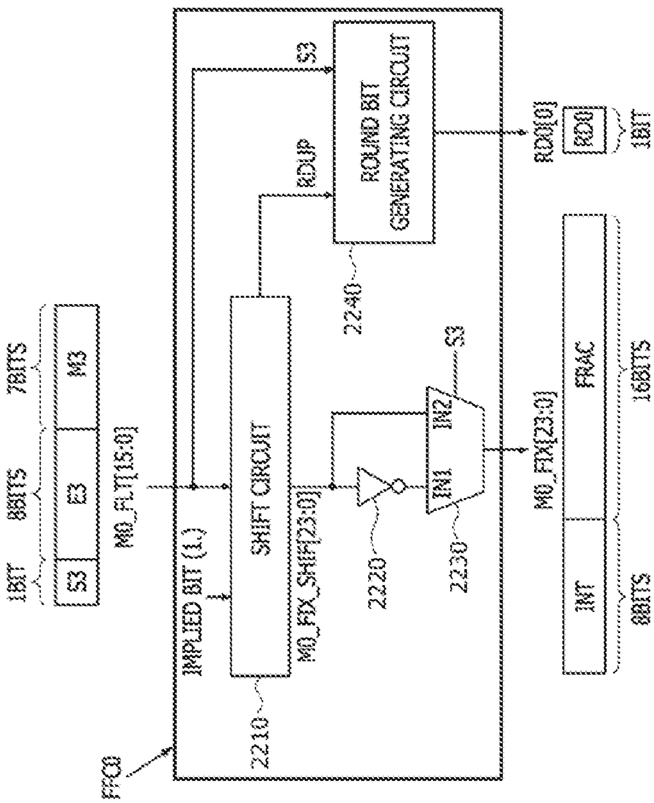
FIG. 47 illustrates an embodiment of a first floating-point-to-fixed-point converter of the floating-point-to-fixed-point converting circuit of FIG. 44.

FIG. 47 illustrates an embodiment of the first floating-point-to-fixed-point converter FFC0 of the floating-point-to-fixed-point converting circuit 2200 of FIG. 44. As described with reference to FIG. 44, the first floating-pointto-fixed-point converter FFC0 may receive the floating-point format first multiplication result data M0_FLT [15:0] from the first multiplier MUL0. The floating-point format first multiplication result data M0_FLT may have a format of BF16 type, and thus be composed of a 1-bit sign S3, an 8-bit exponent E3, and a 7-bit mantissa M3. Hereinafter, it is premised that the fixed-point format first multiplication result data M0_FIX[23:0] that is output from the first floating-point-to-fixed-point converter FFC0 is configured in a 24-bit signed fixed-point format. Accordingly, the fixed-point format first multiplication result data M0_FIX [23:0] may be composed of an 8-bit integer part INT and a 16-bit fraction part FRA1. The MSB of the fixed-point format first multiplication result data M0_FIX[23:0] may represent a sign bit. Hereinafter, a description of the first floating-point-to-fixed-point converter FFC0 may be equally applied to the remaining second to eighth floating-point-to-fixed-point converters FFC1-FFC7 constituting the floating-point-to-fixed-point converting circuit 2200.

Referring to FIG. 47, the first floating-point-to-fixed-point converter FFC0 of the floating-point-to-fixed-point converting circuit 2200 may include a shift circuit 2210, an inverter 2220, a multiplexer 2230, and a round bit generating circuit 2240. The shift circuit 2210 may perform a shifting operation of the third mantissa M3 of the floating-point format first multiplication result data M0_FLT[15:0] transmitted from the first multiplier MUL0 to generate fixed-point format output data. The configuration and operation of the shift circuit 2210 according to the present embodiment may be similar to the configuration and operation of the shift circuit 1210 described with reference to FIG. 35. However, there is a difference in that the shift circuit 1210 described with reference to FIG. 35 receives 25-bit first multiplication result data from which the normalization process has been omitted from the first multiplier MUL0, whereas the shift circuit 2210 according to the present embodiment receives the BF16 type first multiplication result data M0_FLT[15:0] from the first multiplier MUL0. Accordingly, in the shift circuit 2210 according to the present embodiment, the mantissa bits M3[7:0] with an implicit bit may become a shift target.

The shift circuit 2210 may shift the mantissa bits M3[7:0] to the left or right by a shift bit determined as a result of subtraction on the exponent E3 of the first multiplication result data M0_FLT[15:0] and a bias value to output fixed-point format shifted first multiplication result data M0_FIXT_SHIFT[15:0]. The shifted first multiplication result data M0_FIXT_SHIFT[15:0] that is output from the shift circuit 2210 may be transmitted to an input terminal of the inverter 2220 and the first input terminal IN1 of the multiplexer 2230. When performing a right shift operation on the mantissa bits M3[7:0], the shift circuit 2210 according to the present embodiment may generate and output a roundup signal RDUP according to whether a roundup occurs according to round processing. In an embodiment, the shift circuit 2210 may output a roundup signal RDUP of '1' when roundup occurs. When no roundup occurs, the shift circuit 2210 may output a roundup signal RDUP of '0'. The roundup signal RDUP that is output from the shift circuit 2210 may be transmitted to the round bit generating circuit 2240.

The inverter 2220 may invert the fixed-point format shifted first multiplication result data M0_FIX_SHIF[23:0] transmitted from the shift circuit 2210, and transmit the inverted first data to the second input terminal IN2 of the multiplexer 2230. The data that is transmitted from the inverter 2220 to the second input terminal IN2 of the multiplexer 2230 may be correspond to 1's complement of the fixed-point format shifted first multiplication result data M0_FIX_SHIF[23:0].

The multiplexer 2230 may receive the fixed-point format shifted first multiplication result data M0_FIX_SHIF[23:0] through the first input terminal IN1. The multiplexer 2230 may receive the 1's complement of the fixed-point format shifted first multiplication result data M0_FIX_SHIF[23:0] through the second input terminal IN2. The multiplexer 2230 may receive a sign S3 of the floating-point format first multiplication result data M0_FLT[15:0] through a control terminal. When the sign S3 has a bit value of '0' representing a positive number, the multiplexer 2230 may output the fixed-point format shifted first multiplication result data M0_FIX_SHIF[23:0] inputted to the first input terminal IN1. When the sign S3 has a bit value of '1' representing a negative number, the multiplexer 2230 may output the 1's complement of the shifted first multiplication result data M0_FIX_SHIF inputted to the second input terminal IN2. In the fixed-point format first multiplication result data M0_FIX[23:0] that is output from the multiplexer 2230, the '+1' operation according to roundup and the '+1' operation according to the 2's complement processing in negative number processing have been skipped. The first multiplication result data M0_FIX[23:0] as described above may be transmitted to the first adder ADD11 of the first group of the first stage ST1 of the adder tree 2300 as described with reference to FIG. 44.

The round bit generating circuit 2240 may receive the sign S3 of the floating-point format first multiplication result data M0_FLT[15:0] from the first multiplier MUL0. In addition, the round bit generating circuit 2240 may receive a roundup signal RDUP from the shift circuit 2210. The round bit generating circuit 2240 may perform a logic operation by using the sign S3 and the roundup signal RDUP to generate a first round bit RD0[0]. The first round bit RD0[0] generated from the round bit generating circuit 2240 may be transmitted to the first adder ADD15 of the second group of the first stage ST1 of the adder tree 2300, as described with reference to FIG. 44.

Figure 48:
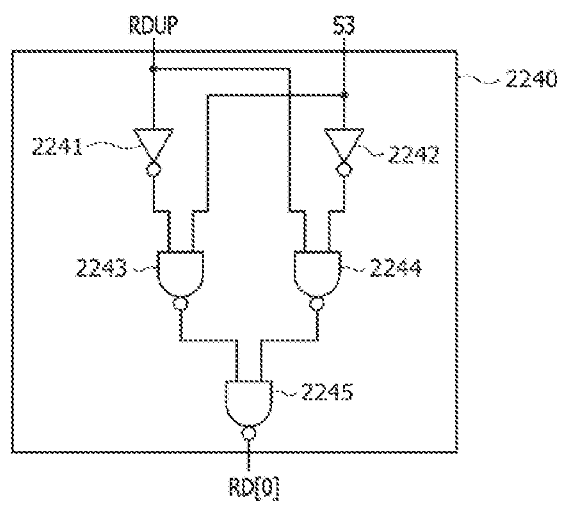
FIG. 48 illustrates an embodiment of a round bit generating circuit of the first floating-point-to-fixed-point converter of FIG. 47.

FIG. 48 illustrates an embodiment of the round bit generating circuit 2240 of the first floating-point-to-fixed-point converter FFC0 of FIG. 47. FIG. 49 is a table illustrating an operation of the round bit generating circuit 2240 of FIG. 48. Referring to FIGS. 48 and 49, the round bit generating circuit 2240 may include a first inverter 2241, a second inverter 2242, a first NAND gate 2243, a second NAND gate 2244, and a third NAND gate 2245. The first inverter 2241 may receive a roundup signal RDUP. The second inverter 2242 may receive a sign S3. The first NAND gate 2243 may receive an output signal of the first inverter 2241 and the roundup signal RDUP. The second NAND gate 2244 may receive an output signal of the second inverter 2242 and the roundup signal RDUP. The third NAND gate 2245 may receive an output signal of the first NAND gate 2243 and an output signal of the second NAND gate 2244, and output a round bit RD[0].

When the sign S3 is '1' representing a negative number and the roundup signal RDUP is '0', the first NAND gate 2243 and the second NAND gate 2244 of the round bit generating circuit 2240 may output '0' and '1', respectively. Accordingly, the round bit RD[0] that is output from the third NAND gate 2245 may have a value of '1. When the sign S3 is '1' representing a negative number, as described with reference to FIG. 47, a 1's complement of the shifted first multiplication result data M0_FIX_SHIFT[23:0] may be output from the multiplexer 2230. That is, the fixed-point format first multiplication result data M0_FIX_SHIFT[23:0] that is output form the first floating-point-to-fixed-point converter FFC0 may be data in a state in which the '+1' operation has been skipped. If the roundup signal RDUP is '0', the roundup does not occur during the rounding process and thus the '+1' operation does not occur. As a result, when the sign S3 is '1' representing a negative number and the roundup signal RDUP is "0", a '+1' operation is additionally performed on the first multiplication result data M0_FIX[23:0] that is output from the first floating-point-to-fixed-point converter FFC0. Such an additional '+1' operation may be performed through addition in the adder tree 2300 for the first round bit RD0[0] with a value of '1'.

When the sign S3 is '1' representing a negative number and the roundup signal RDUP is '1', the first NAND gate 2243 and the second NAND gate 2244 of the round bit generating circuit 2240 may respectively output '1'. Accordingly, the round bit RD[0] that is output from the third NAND gate 2245 may have a value of '0'. As described above, when the sign S3 is '1' representing a negative number, the fixed-point format first multiplication result data M0_FIX[23:0] that is output from the first floating-point-to-fixed-point converter FFC0 may be data in a state in which the '+1' operation in the 2's complement process has been skipped. If the roundup signal RDUP is '1', the roundup has occurred during the rounding process, so that the first multiplication result data M0_FIX[23:0] may be in a state in which the '+1' operation in the roundup process has been skipped. As a result, if the sign S3 is '1' representing a negative number and the roundup signal RDUP is '1', two '+1' operations are additionally performed on the first multiplication result data M0_FIX[23:0] that is output from the first floating-point-to-fixed-point converter FFC0.

However, the 2's complement of the result data that is obtained by performing a '+1' operation due to roundup on the shifted first multiplication result data M0_FIX_SHIFT[23:0] may be the same as the 1's complement of the shifted first multiplication result data M0_FIX_SHIFT[23:0]. This may mean that when the sign S3 is '1' representing a negative number and the roundup signal RDUP is '1', the result data that is obtained by additionally performing a '+1' operation for a 2's complement process and a '+1' operation according to a roundup process to the shifted first multiplication result data M0_FIX_SHIF[23:0] may be the same as the 1's complement of the shifted first multiplication result data M0_FIX_SHIF[23:0]. As described with reference to FIG. 47, the first multiplication result data M0_FIX[23:0] that is output from the first floating-point-to-fixed-point converter FFC0 may be the 1's complement of the shifted first multiplication result data M0_FIX_SHIF[23:0]. Accordingly, in this case, an additional '+1' operation by the first round bit RD0[0] may be unnecessary, and therefore, the first round bit RD0[0] has a value of '0'.

When the sign S3 is '0' representing a positive number, the 2's complement process is not performed, so that whether to perform an additional '+1' operation may be determined by the roundup signal RDUP. First, when the roundup signal RDUP is "0", the first NAND gate 2243 and the second NAND gate 2244 of the round bit generating circuit 2240 may each output '1'. Accordingly, the round bit RD[0] that is output from the third NAND gate 2245 may have a value of '0'. When the roundup signal RDUP is '0', the roundup has not occurred during the round process, so that an additional '+1' operation on the first multiplication result data M0_FIX[23:0] that is output from the first floating-point-to-fixed-point converter FFC0 is unnecessary, and therefore, the first round bit RD0[0] has a value of "0".

Next, when the roundup signal RDUP is '1', the first NAND gate 2243 and the second NAND gate 2244 of the round bit generating circuit 2240 may output '1' and '0', respectively. Accordingly, the round bit RD[0] that is output from the third NAND gate 2245 may have a value of "1". When the roundup signal RDUP is 1, because the roundup has occurred during the round process, a '+1' operation is additionally performed on the first multiplication result data M0_FIX[23:0] that is output from the first floating-point-to-fixed-point converter FFC0. Such an additional '+1' operation may be performed through an addition in the adder tree 2300 for the first round bit RD0[0] with a value of "1".

Figure 50:
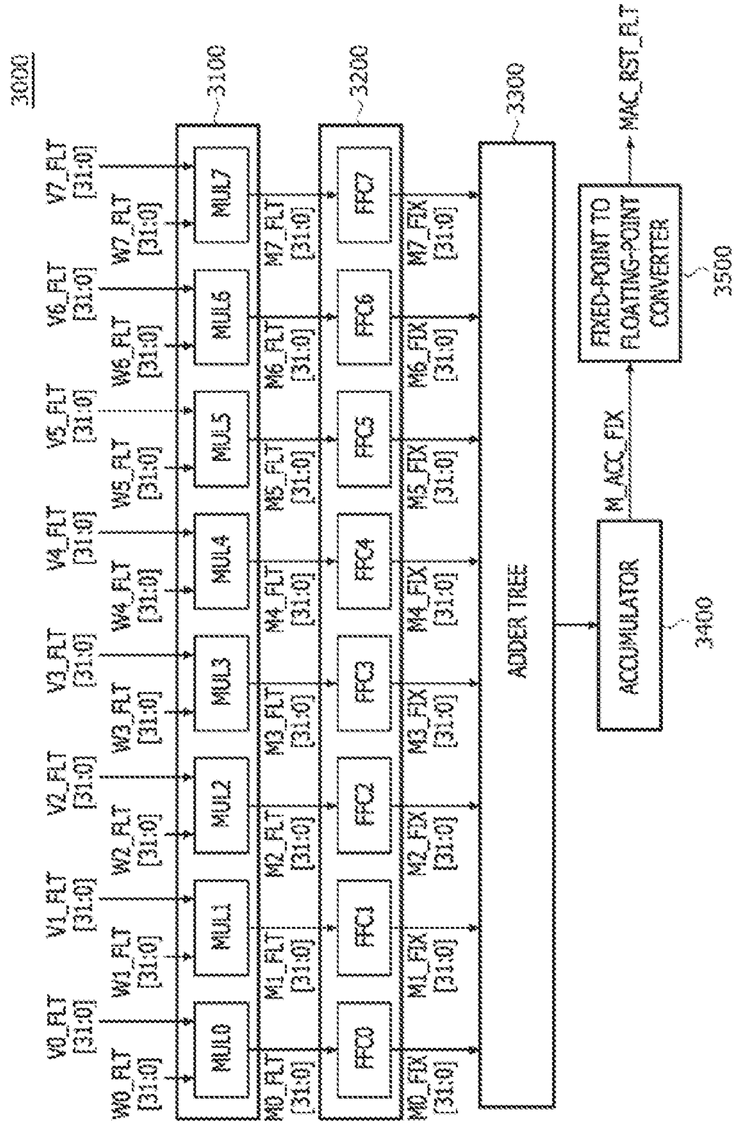
FIG. 50 illustrates a MAC operator according to another embodiment of the present disclosure.

FIG. 50 illustrates a MAC operator 3000 according to another embodiment of the present disclosure. The MAC operator 3000 according to the present embodiment may be applied to the PIM devices 10, 100, and 400 described with reference to FIGS. 1, 2, and 20. Referring to FIG. 50, the MAC operator 3000 according to the present embodiment may include a multiplying circuit 3100 with a plurality of multipliers, for example, first to eighth multipliers MUL0-MUL7, a floating-point-to-fixed-point converting circuit 3200 with a plurality of floating-point-to-fixed-point converters, for example, first to eighth floating-point-to-fixed-point converters FFC0-FFC7, an adder tree 3300, an accumulator 3400, and a fixed-point-to-floating-point converter 3500. The multiplying circuit 3100 of the MAC operator 3000 according to the present embodiment may be substantially the same as the multiplying circuit 2100 described with reference to FIG. 44. In addition, the adder tree 3300 and the accumulator 3400 of the MAC operator 3000 according to the present embodiment may be substantially the same as the adder tree 1300 and the accumulator 1400 of the MAC operator 1000 described with reference to FIG. 31. Hereinafter, descriptions overlapping with those already described will be omitted.

Hereinafter, it is premised that each of the first to eighth weight data W0_FLT[31:0]-W7_FLT[31:0] and each of the first to eighth vector data V0_FLT[31:0]-V7_FLT[31:0] are in single-precision floating-point format determined in IEEE754, that is FP32. The first multiplier MUL0 may perform a multiplication operation on the floating-point format 32-bit first weight data W0_FLT[31:0] and the floating-point format 32-bit first vector data V0_FLT[31:0]. The first multiplier MUL0 may output floating-point format 32-bit first multiplication result data M0_FLT[31:0] generated by the multiplication. The first multiplication result data M0_FLT[31:0] that is output from the first multiplier MUL0 may be transmitted to the first floating-point-to-fixed-point converter FFC0. Each of the remaining multipliers MUL1-MUL7 constituting the multiplying circuit 3100 may perform a multiplication operation in the same manner.

The first floating-point-to-fixed-point converter FFC0 may convert the floating-point format first multiplication result data M0_FLT[31:0] into fixed-point format data and output the same. Hereinafter, it is premised that the first multiplication result data M0_FIX[31:0] that is output from the first floating-point-to-fixed-point converter FFC0 is fixed-point format 32-bit data. The fixed-point format first multiplication result data M0_FIX[31:0] that is output from the first floating-point-to-fixed-point converter FFC0 may be transmitted to the adder tree 3300. The first floating-point-to-fixed-point converter FFC0 may be configured in the same manner as the first floating-point-to-fixed-point converter described with reference to FIG. 35, and redundant descriptions will be omitted below. Each of the remaining first floating-point-to-fixed-point converters FFC0-FFC7 constituting the first floating-point-to-fixed-point converting circuit 3200 may perform a data format change operation in the same manner.

The fixed-point-to-floating-point converter 3500 may receive fixed-point format multiplication-accumulation data M_ACC_FIX from the accumulator 3400. The fixed-point-to-floating-point converter 3500 may convert the fixed-point format multiplication-accumulation data M_ACC_FIX into the floating-point format data to output floating-point format MAC result data MAC_RST_FLT.

Figure 51:
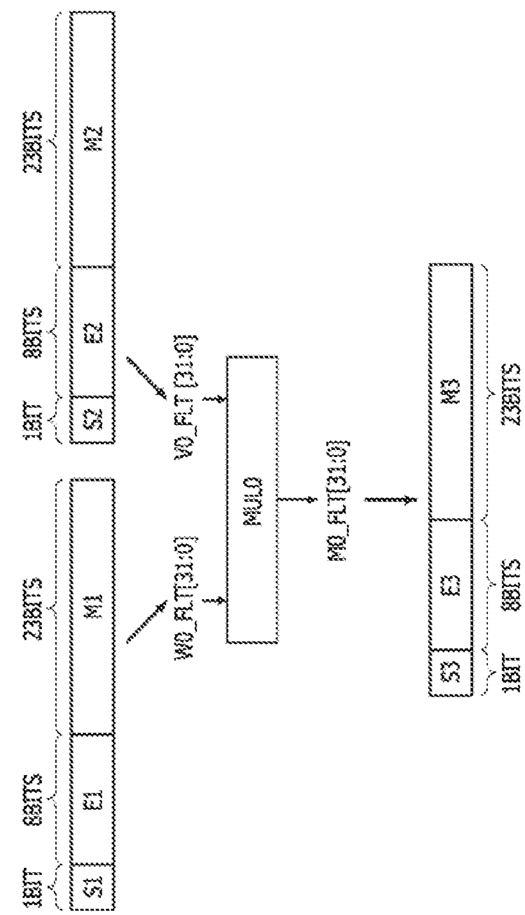
FIG. 51 illustrates an embodiment of data formats of input data and output data of a first multiplier in the MAC operator of FIG. 50.

FIG. 51 illustrates an embodiment of the data formats of the input data and output data of the first multiplier MUL0 in the MAC operator 3000 of FIG. 50. Referring to FIG. 51, each of the first to eighth weight data W0_FLT[31:0]-W7_FLT[31:0] and each of the first to eighth vector data V0_FLT[31:0]-V7_FLT[31:0] may have a format of FP32 type, as described with reference FIG. 50. Accordingly, the first weight data W0_FLT[31:0] may be composed of a 1-bit sign S1, an 8-bit exponent E1, and a 23-bit mantissa M1. The first vector data V0_FLT[31:0] may also be composed of a 1-bit sign S2, an 8-bit exponent E2, and a 23-bit mantissa M2. Each of the second to eighth weight data W1_FLT[31:0]-W7_FLT[31:0] and each of the second to eighth vector data V1_FLT[31:0]-V7_FLT[31:0] may have the same structured floating point format.

The floating-point format first multiplication result data M0_FLT[31:0] that is output from the first multiplier MUL0 may also be composed of a 1-bit sign S3, an 8-bit exponent E3, and a 23-bit mantissa M3. The multiplication performed by the first multiplier MUL0 may differ only in the floating-point format, and may be performed in the same manner as the multiplication method described with reference to FIG. 46. Accordingly, an XOR operation may be performed on the sign S1 of the first weight data W0_FLT[31:0] and the sign S2 of the first vector data V0_FLT[31:0], and a result of the XOR operation may constitute the sign S3 of the first multiplication result data M0_FLT[31:0].

For the exponent E1 of the first weight data W0_FLT[31:0] and the exponent E2 of the first vector data V0_FLT[31:0], addition for two data and an operation for subtracting an exponential bias may be performed, and then a normalization processing may be performed. The results of these operations and normalization processing may constitute the exponent E3 of the first multiplication result data M0_FLT[31:0]. For the mantissa M1 of the first weight data W0_FLT[31:0] and the mantissa M2 of the first vector data V0_FLT[31:0], multiplication on the two data with an implicit bit may be performed, and then a normalization processing may be performed. The results of these operations and normalization processing may constitute the mantissa M3 of the first multiplication result data M0_FLT[31:0].

Figure 52:
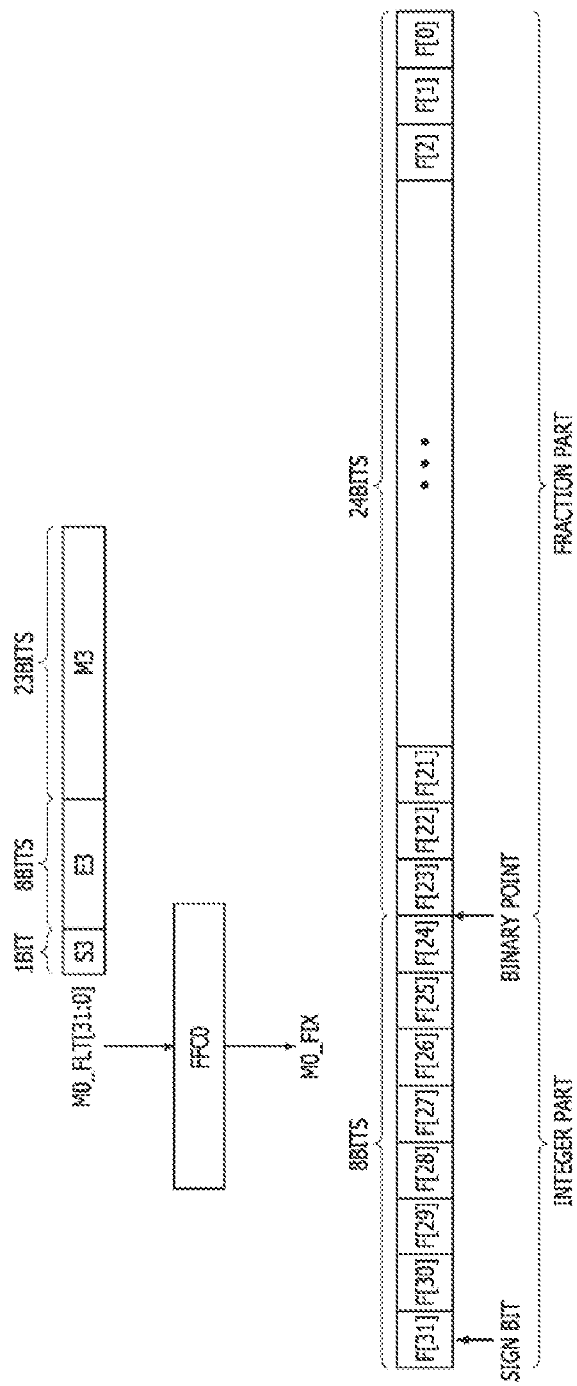
FIG. 52 illustrates an embodiment of data formats of the input data and output data of a first floating-point-to-fixed-point converter in the MAC operator of FIG. 50.

FIG. 52 illustrates an embodiment of data formats of the input data and the output data of the first floating-point-to-fixed-point converter FFC0 in the MAC operator 3000 of FIG. 50. Referring to FIG. 52, the first floating-point-to-fixed-point converter FFC0 may convert the floating-point format first multiplication result data M0_FLT[31:] into fixed-point format data to output the fixed-point format 32-bit first multiplication result data M0_FIX[31:0]. The fixed-point format first multiplication result data M0_FIX[31:0] may be composed of 8-bit integer part I[31:24] with a sign bit, and 24-bit fraction part F[23:0]. The MSB F[31] of the fixed-point format first multiplication result data M0_FIX[31:0] may constitute the sign bit. A binary point may be positioned between the 24th bit F[23] and the 25th bit F[24]. A process of converting the floating-point format first multiplication result data M0_FLT[31:0] to the fixed-point format first multiplication result data M0_FIX[31:0] will be described in detail below.

Figure 53:
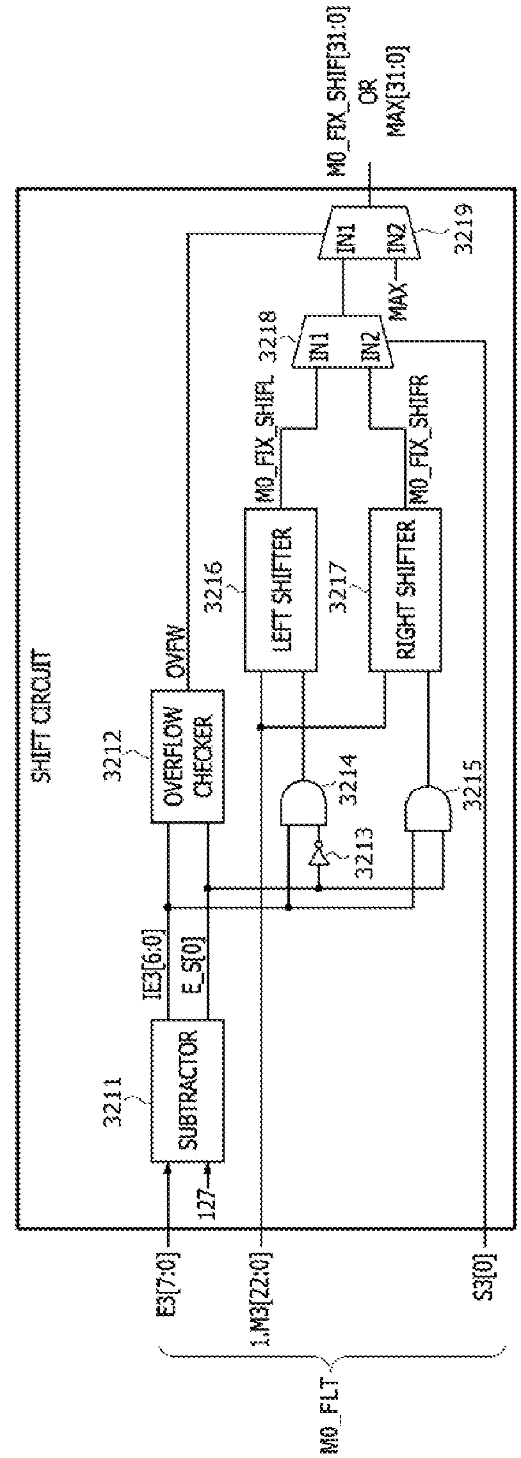
FIG. 53 illustrates an embodiment of a shift circuit constituting the first floating-point-to-fixed-point converter of FIG. 51.
Figure 54:
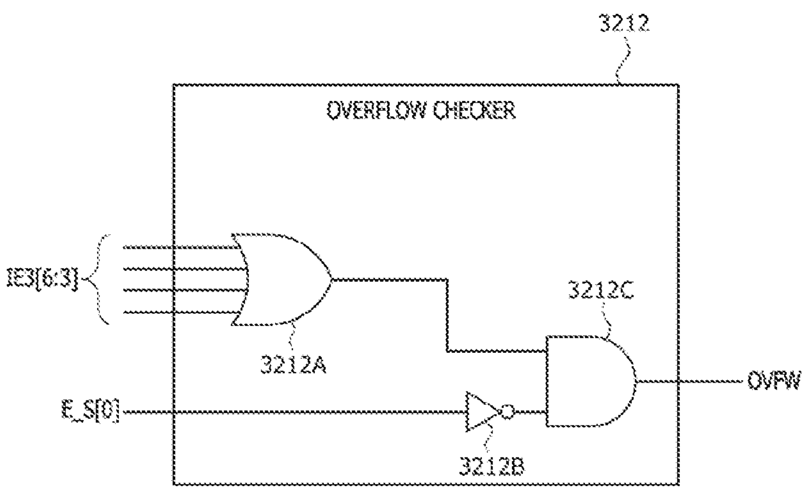
FIG. 54 illustrates an embodiment of an overflow checker of the shift circuit of FIG. 53.

FIG. 53 illustrates an embodiment of a shift circuit constituting the first floating-point-to-fixed-point converter FFC0 of FIG. 51. FIG. 54 illustrates an embodiment of an overflow checker 3212 of the shift circuit of FIG. 53. The first floating-point-to-fixed-point converter FFC0 according to the present embodiment may perform data format converting operation through a shifting operation in the shift circuit. Referring to FIG. 53, shift circuit may include a subtractor 3211, an overflow checker 3212, an inverter 3213, a first AND gate 3214, a second AND gate 3215, a left shifter 3216, a right shifter 3217, a first multiplexer 3218, and a second multiplexer 3219.

The subtractor 3211 may receive an exponent bias value, for example, '127' and exponent bits E3[7:0] of the floating-point format first multiplication result data M0_FLT. The subtractor 3211 may perform subtraction on the exponent bits E3[7:0] and '127', that is, an addition on the exponent bits E3[7:0] and '−127' to generate and output a 1-bit exponent sign bit E_S[0] and 7-bit integer bits IE[6:0]. The exponent sign bit E_S[0] is an MSB of result data of the subtraction on the exponent bits E3[7:0] and '127', and may represent a sign of the result data. When the result data is positive, the exponent sign bit E_S[0] may be '0', and when the result data is negative, the exponent sign bit E_S[0] may be '1'. The integer exponent bits IE[6:0] may be bits excluding the MSB from the result data of the subtracting operation for the exponent bits E3[7:0] and 127.

The overflow checker 3212 may determine whether overflow occurs by using some bits of the exponent sign bits E_S[0] and the integer exponent bits IE[6:0] that are output and transmitted from the subtractor 3211. When overflow occurs, that is, when the result of shifting the mantissa bits 1.M3[22:0](including an implicit bit) by shift bits is out of the range of the fixed-point format, the overflow checker 3212 may output an overflow signal OVFW of "1", for example. On the other hand, when no overflow occurs, that is, when the result of shifting the mantissa bits 1.M3[22:0] (including an implicit bit) by the shift bit does not exceed the range of the fixed-point format, the overflow checker 3212 may output an overflow signal OVFW of "0", for example.

When two conditions are satisfied, overflow occurs in this embodiment. First, because the integer part I[31:24] includes 8 bits with 1-bit of sign bit in the fixed-point format first multiplication result data M0_FIX[31:0] according to the present embodiment, if the value of the integer exponent bit IE[6:0] is greater than the integer value '127', overflow occurs. Second, because overflow occurs only when a left shift is made, the third sign bit S3[0] has a value of '0' representing a positive number. Therefore, the overflow checker 3212 may output an overflow signal OVFW of '1' when both of the above conditions are satisfied.

As shown in FIG. 54, the overflow checker 3212 may include an OR gate 3212A, an inverter 3212B, and an AND gate 3212C. The OR gate 3212A may perform an OR operation on four bits IE[6:3] of higher order among the integer exponent bits IE[6:0] that are output from the subtractor 3211 of the shift circuit. When at least one bit of the 4 bits IE[6:3] of higher order among the integer exponent bits IE[6:0] is '1', that is, when the integer value is greater than '127', the OR gate 3212A may output '1'. The inverter 3212B may invert and output the exponent sign bit E_S[0]. When the exponent sign bit E_S[0] is '0' representing a positive number, the inverter 3212B may output '1'. The AND gate 2212C may generate an overflow signal OVFW by performing an AND operation on the output value of the OR gate 2212A and the output value of the inverter 3212B. When the exponent sign bit E_S[0] is '0' representing positive and at least one of the 4 bits IE[6:3] of higher order among the integer exponent bits IE[6:0] is '1', the AND gate 3212C may output an overflow signal OVFW of '1' representing occurrence of overflow.

Returning to FIG. 53 again, the inverter 3213 may invert and output the exponent sign bit E_S[0] that is output from the subtractor 3211. The first AND gate 3214 may receive integer exponent bits IE[6:0] and an output signal of the inverter 3213, and perform an AND operation. The first AND gate 3214 may transmit the signal generated as a result of the AND operation to the left shifter 3216. The second AND gate 3215 may receive an integer exponent bit IE[6:0] and an exponent sign bit E_S[0], and perform an AND operation. The second AND gate 3215 may transmit the signal generated as a result of the AND operation to the right shifter 3217.

The left shifter 3216 may receive mantissa bits 1.M3[22:0](including an implicit bit) of the fixed-point format first multiplication result data M0_FLT and an output signal of the first AND gate 3214. The left shift 3216 may shift the mantissa bits 1.M3[22:0] to the left by the shift bit determined by the integer exponent bit IE[6:0] to output fixed-point format left-shifted 32-bit first multiplication result data M0_FIX_SHIFL. The fixed-point format left-shifted first multiplication result data M0_FIX_SHIFL may be transmitted to a first input terminal IN1 of the first multiplexer 3218.

The right shifter 3217 may receive the mantissa bits 1.M3[22:0] with the implicit bit of the floating-point format first multiplication result data M0_FLT and the output signal of the second AND gate 3215. The right shifter 3217 may shift the mantissa bits 1.M3[22:0] with the implicit bit to the right by the shift bit determined by the integer exponent bit IE[6:0] to output fixed-point format right-shifted first multiplication result data M0_FIX_SHIFR. The fixed-point format right-shifted first multiplication result data M0_FIX_SHIFR may be transmitted to a second input terminal IN2 of the first multiplexer 3218.

The first multiplexer 3218 may receive the fixed-point format left-shifted first multiplication result data M0_FIX_SHIFL and the fixed-point format right-shifted first multiplication result data M0_FIX_SHIFR through the first input terminal IN1 and the second input terminal IN2, respectively. The first multiplexer 3218 may an exponent bit S3[0] of the first multiplication result data M0_FIX of the fixed-point format through a control terminal. When the exponent bit is '0' representing positive, the first multiplexer 3218 may output the fixed-point format left-shifted first multiplication result data M0_FIX_SHIFL transmitted through the first input terminal IN1. On the other hand, when the exponent bit is '1' representing negative, the first multiplexer 3218 may output the fixed-point format right-shifted first multiplication result data M0_FIX_SHIFR transmitted through the second input terminal IN2.

The second multiplexer 3219 may receive the shifted first multiplication result data M0_FIX_SHIF transmitted from the first multiplexer 3218 through a first input terminal IN1. The second multiplexer 3219 may receive a maximum value MAX through a second input terminal IN2. Here, the maximum value may represent a positive maximum value or a negative maximum value that fixed-point format the first multiplication result data M0_FIX may have. The second multiplexer 3219 may receive the overflow signal OVFW that is output from the overflow checker 3212. When the overflow signal of '0' is inputted, the second multiplexer 3219 may output the fixed-point format shifted first multiplication result data M0_FIX_SHIF[31:0]. On the other hand, when the overflow signal of '1' is inputted, the second multiplexer 3219 may output the fixed-point format maximum value MAX[31:0].

Figure 55:
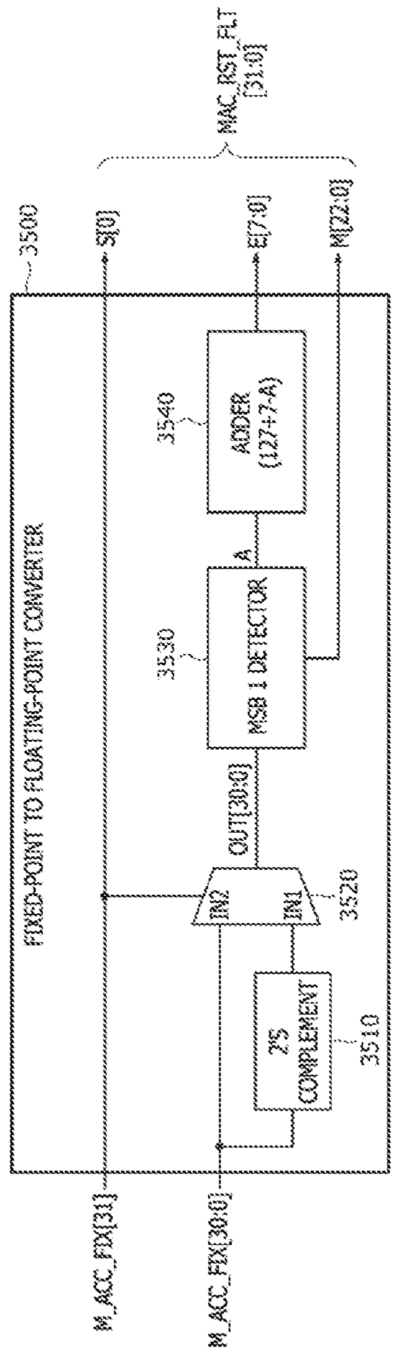
FIG. 55 illustrates an embodiment of a fixed-point-to-floating-point converter in the MAC operator of FIG. 50.

FIG. 55 illustrates an embodiment of the fixed-point-to-floating-point converter 3500 in the MAC operator 3000 of FIG. 50. As described with reference to FIG. 50, the fixed-point-to-floating-point converter 3500 may convert the fixed-point format first multiplication-accumulation data M_ACC_FIX[31:0] transmitted from 166) the accumulator (3400 of FIG. 50) into floating-point format to output floating-point format MAC result data MAC_RST_FLT[31:0]. To this end, the fixed-point-to-floating-point converter 3500 may include a 2's complement circuit 3510, a multiplexer 3520, an MSB 1 detector 3530, and an adder 3540, as shown in FIG. 55.

The fixed-point-to-floating-point converter 3500 may output an MSB M_ACC_FIX[31], which is a sign bit in the fixed-point format multiplication-accumulation data M_ACC_FIX[31:0] transmitted from the accumulator (3400 of FIG. 50) as it is. The MSB M_ACC_FIX[31] that is output from the fixed-point-to-floating-point converter 3500 may constitute a sign bit S[0] of the floating-point format MAC result data MAC_RST_FLT[31:0].

The 2's complement circuit 3510 may receive the remaining 31-bit data M_ACC_FIX[30:0] of the fixed-point format multiplication-accumulation data M_ACC_FIX[31:0] transmitted from the accumulator (3400 of FIG. 50) except for the MSB, which is the sign bit, and generate and output 2's complement of the 31-bit data M_ACC_FIX[30:0]. The 2's complement of the 31-bit data M_ACC_FIX[30:0] that is output from the 2's complement circuit 3510 may be transmitted to a first input terminal IN1 of the multiplexer 3520.

The multiplexer 3520 may receive the remaining 31-bit data M_ACC_FIX[30:0] excluding MSB, which is a sign bit, from the fixed-point format multiplication and accumulation data M_ACC_FIX[31:0] through the second input terminal IN2. The multiplexer 3520 may output 31-bit output data OUT[30:0] in response to the MSB M_ACC_FIX[31:0], which is a sign bit of the fixed-point format multiplication and accumulation data M_ACC_FIX[31:0]. When the MSB M_ACC_FIX[31:0], which is a sign bit, is '1' representing positive, the multiplexer 3520 may output 2's complement of the 31-bit data M_ACC_FIX[31:0] inputted to the first input terminal IN1 as the output data OUT[30:0]. When the MSB M_ACC_FIX[31:0], which is a sign bit, is '0' representing negative, the multiplexer 3520 may output the 31-bit data M_ACC_FIX[31:0] inputted to the second input terminal IN2 as the output data OUT[30:0].

The MSB 1 detector 3530 may detect a position of the MSB 1 in the output data OUT[30:0] transmitted from the multiplexer 3520. Here, "MSB 1" may be defined as a most significant bit among the bits with a binary value of "1" in the output data OUT[30:0]. "MSB 1" may opposed to the implicit bit of the floating point format. In an embodiment, "MSB 1" may be the MSB OUT[30] of the output data OUT[30:0] or the 30th bit OUT[29] of the output data OUT[30:0]. The MSB 1 detector 3530 may output 23 bits from the upper bit among the lower bits of the MSB 1. The 23-bit data that is output from the MSB 1 detector 3530 may constitute the 23-bit mantissa bits M[22:0] of the floating-point format MAC result data MAC_RST_FLT[31:0].

The MSB 1 detector 3530 may count from the MSB of the output data OUT[30:0], output a digit A where the MSB 1 is located, and transmit the digit A to the adder 3540. For example, the MSB 1 is the MSB OUT[39] of the output data OUT[30:0], the MSB 1 detector 3530 may output '1' as a digit A. As another example, in the case of the 30th bit OUT[29], the MSB 1 detector 3530 may output '2' as a digit (A). As another example, when MSB 1 is the 28th bit OUT[27] of the output data OUT[30:0], the MSB 1 detector 3530 may output '4' as a digit (A).

The adder 3540 may perform an addition on '127', (binary value '01111111'), which is an exponent bias, 7 (binary value '00000111'), which is the number of bits in the integer part excluding the sign bit in fixed-point format, and a negative number (−A) of digits transmitted from MSB 1 detector 3530 to output an operation result. The 8-bit data that is output from the adder 3540 may constitute the 8-bit exponent bit E[7:0] of the floating-point format MAC result data MAC_RST_FLT[31:0].

Figure 56:
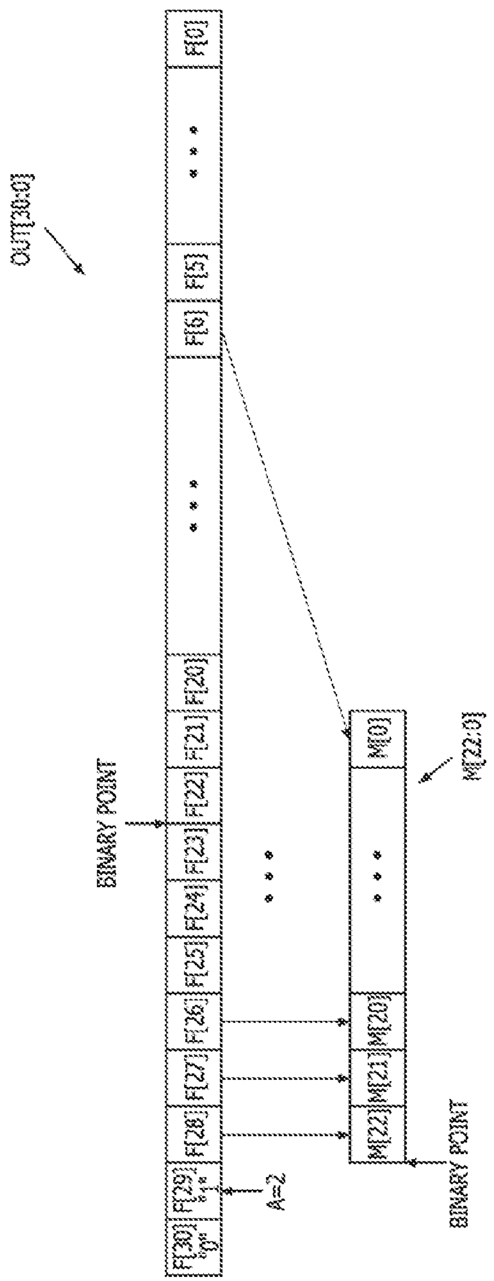
FIG. 56 illustrates a process of generating mantissa bits of floating-point format output data in the fixed-point-to-floating-point converter of FIG. 55.

FIG. 56 illustrates a process of generating mantissa bits of output data in a floating-point format in the fixed-point-to-floating-point converter 3500 of FIG. 55. In this embodiment, the MSB F[30] of the output data OUT[30:0] from the multiplexer 3520 is '0' and the 30th bit F[29] is '1', as an example. Referring to FIG. 56 together with FIG. 55, the MSB 1 detector 3530 may detect the position of MSB 1, that is, the 30th bit F[29] in the output data OUT[30:0] transmitted from the multiplexer 3520. Because a digit (A) of MSB 1 counted from the MSB is '2', the MSB 1 detector 3530 may transmit the digit A 2 to the adder 3540. In addition, the MSB 1 detector 3530 may output 23 bits F[28:6] from the upper bit among the lower bits F[28:0] of MSB 1. As indicated by the arrows in FIG. 56, each of the 23 bits F[28:6] may constitute each of the 23-bit mantissa bits M[22:0] of the floating-point format MAC result data MAC_RST_FLT[31:0].

Figure 57:
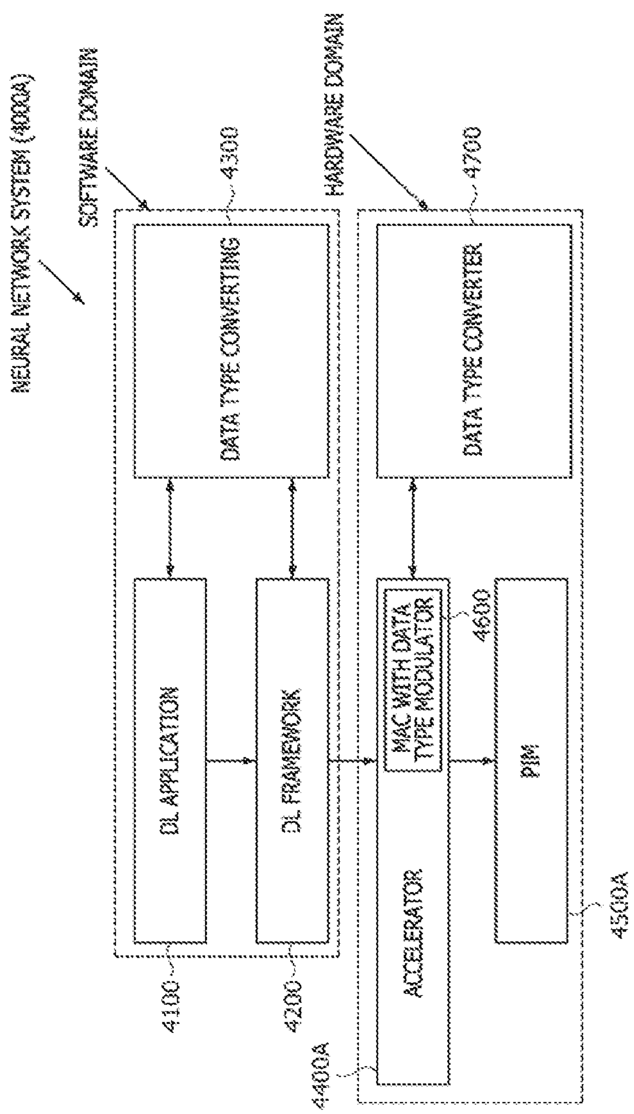
FIG. 57 illustrates an embodiment of a neural network system according to an embodiment of the present disclosure.

FIG. 57 illustrates an embodiment of a neural network system 4000A according to an embodiment of the present disclosure. Referring to FIG. 57, the neural network system 4000A according to the present embodiment may include a deep learning application 4100, a deep learning framework 4200, a data type converting 4300, an accelerator 4400A, a PIM 4500A, and a data type converter 4700. The deep learning application 4100, the deep learning framework 4200, and the data type converting 4300 may be included in a software domain. That is, the execution of the deep learning application 4100, the establishment of the deep learning framework 4200, and the data format conversion 4300 are performed by software. The accelerator 4400A, the PIM 4500A, and the data type converter 4700 may be included in a hardware domain. The accelerator 4400A or the PIM 4500A may use data that is transmitted from the data type converter 4700 during an operation for acceleration. Although both the data type converting 4300 and the data type converter 4700 are shown in FIG. 57, this is for convenience of description and any one may be removed or omitted. Specifically, the process of the data type converting 4300 performed by software may be the same as the operation of the data type converter 4700 which is hardware. That is, the data type converter 4700 may perform the same process as the data type converting 4300 process by hardware. Therefore, when the data type converting 4300 is performed by software, the data type converter 4700 may be removed. Conversely, when the data type converter 4700 is used, the data format converting 4300 performed by software may be omitted.

The deep learning application 4100 may correspond to a variety of software that is executed by applying deep learning. Deep learning may be described as performing machine learning by using an artificial neural network with multiple layers. As the deep learning technique, there are a deep neural network, a convolutional neural network, a recurrent neural network, and the like. In an embodiment, the deep learning application 4100 may be divided into training and inference. Training is a process of learning a model through input data. Inference is a process of performing services such as recognition with a learned model. The deep learning framework 4200 may correspond to a software establishment that provides a number of libraries that have already been verified and various deep learning algorithms that have been completed with prior learning. By establishing the deep learning framework 4200, developers may quickly and easily use libraries and deep learning algorithms. As the deep learning framework 4200, tensorflow, keras, theano, pytorch, and the like are known.

The data type converting 4300 may represent a software process for converting 32-bit floating-point format FP32 data into a 16-bit floating-point format data. In an embodiment, when a learning result is generated by using FP32 in a training process in the deep learning application 4100, the data type converting 4300 may be performed in the process of performing an inference in the deep learning application 4100. In another embodiment, the data format converting 4300 may be performed in the process of establishing the deep learning framework 4200.

The accelerator 4400A may correspond to hardware specialized for mathematical operations required in inference phase of deep learning. The mathematical operations may include convolutions, activations, pooling, and normalization. As an example of the accelerator 4400A, a graphics processing unit (GPU) with a general-purpose graphics processing unit (GPGPU) may be presented. In this embodiment, the accelerator 4400A may include a MAC operator 4600 with a data format modulator. The MAC operator 4600 according to this embodiment may be similar to the MAC operators 1000, 1000A, 2000, and 3000 described with reference to FIGS. 31, 42, 44, and 50.

In an embodiment, when the data format converting 4300 is performed by software, the MAC operator 4600 of the accelerator 4400A may perform a MAC operation on 16-bit floating-point data generated by the data format converting 4300. In another embodiment, when the data format converting 4300 is omitted by software, the MAC operator 4600 of the accelerator 4400A may perform a MAC operation on the 16-bit floating-point format data that is provided by the data type converter 4700. The PIM 4500A may include a data storage region and an arithmetic circuit performing operations by using data stored in the data storage region. The PIM 4500A in this embodiment may be configured in the same manner as the PIM devices 10, 100, and 400 described with reference to FIGS. 1, 2, 20, 29, and 30. Accordingly, the PIM 4500A may perform a memory mode operation and an MAC arithmetic mode operation.

The data type converter 4700 may perform of converting FP32 data into the 16-bit floating-point format data. As described above, when the data format is already converted by software, the operation of the data type converter 4700 might not be required. The data format converting operation performed by the data type converter 4700 may be substantially the same as the data type converting 4300 process above. However, when the data type converting is performed in hardware by the data type converter 4700, as the data size decreases from 32 bits to 16 bits, the address size may also be reduced by half. Hereinafter, it is premised that the address size is appropriately reduced according to the data size reduction. The data type converter 4700 may transmit the converted the 16-bit floating-point format data to the accelerator 4400A or PIM 4500A.

Figure 58:
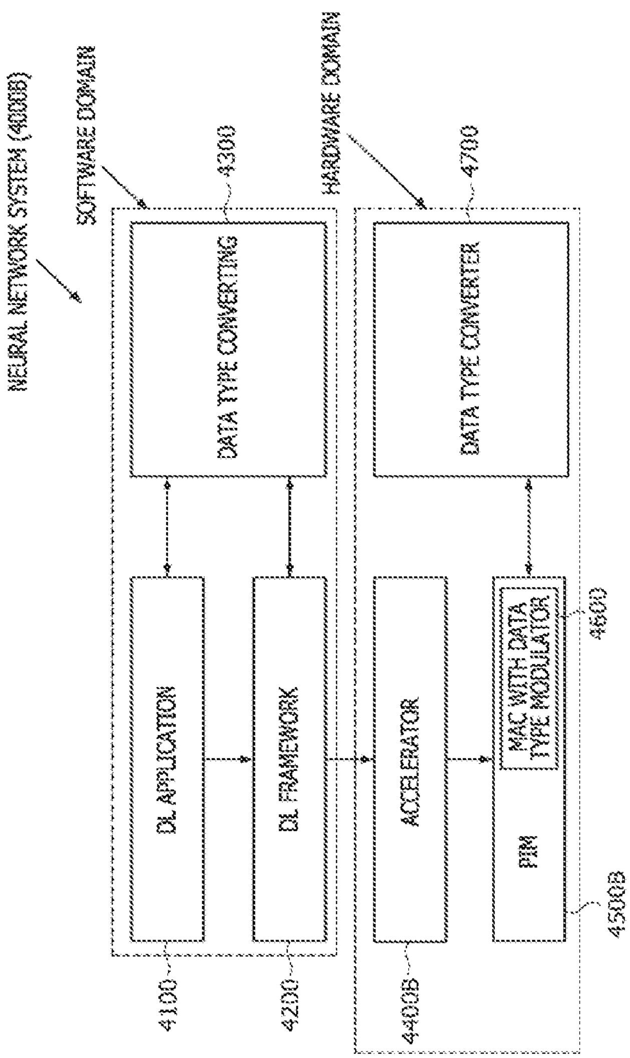
FIG. 58 illustrates another embodiment of a neural network system according to another embodiment of the present disclosure.

FIG. 58 illustrates another embodiment of a neural network system 4000B according to another embodiment of the present disclosure. In FIG. 58, the same reference numerals as in FIG. 57 denote the same elements. Hereinafter, descriptions overlapping with those described with reference to FIG. 57 will be omitted. Referring to FIG. 58, in the neural network system 4000B according to the present embodiment, an accelerator 4400B might not include a MAC operator 4600 with a data type modulator, unlike the accelerator 4400A described with reference to FIG. 57. In this case, the operation for the acceleration operation in the accelerator 4400B may be performed on the data in a state in which data type converting is not performed, for example, data of FP32.

A PIM 4500B may include the MAC operator 4600 with a data format modulator. The MAC operator 4600 according to the present embodiment may be the same as described with reference to FIG. 57. That is, when the data format conversion 4300 is performed by software, the MAC operator 4600 of the PIM 4500B may perform a MAC operation on data in a 16-bit floating point format generated by the data type converting 4300. In another embodiment, when the data type converting 4300 is omitted by software, the MAC operator 4600 of the PIM 4500B may perform a MAC operation on the 16-bit floating-point format data that is provided by the data type converter 4700.

FIG. 59 is a table illustrating four 16-bit floating-point data types in a neural network systems 4000A and 4000B according to various embodiments of the present disclosure. Referring to FIG. 59, the 16-bit floating-point formats used in the neural network systems 4000A and 4000B described with reference to FIGS. 57 and 58 may include first to fourth data types FP16, OF16-1, OF16-2, and BF16. The first data type FP16 is a 16-bit floating point format according to the IEEE754 standard, and may be composed of a 1-bit sign, a 5-bit exponent, and a 10-bit mantissa. The second data type OF16-1 may be composed of a 1-bit sign, a 6-bit exponent, and a 9-bit mantissa. The third data type OF16-2 may be composed of a 1-bit sign, a 7-bit exponent, and an 8-bit mantissa. The fourth data type BF16 may be composed of a 1-bit sign, an 8-bit exponent, and a 7-bit mantissa.

The first data type FP16 and the fourth data type BF16 may be well-known 16-bit floating-point data formats. On the other hand, the second data type OF16-1 and the third data type OF16-2 may be 16-bit floating-point data formats newly proposed in the present embodiment. In a floating-point format, it is well known that the more exponent bits, the wider the range of the number is, and the more gas bits, the higher the accuracy. Therefore, as for the representation range of numbers, the fourth data type BP16 may be the widest, followed by the third data type OF16-2, followed by the first data type OF16-1, and the first data type BF16 may be narrowest. On the other hand, the accuracy of the first data type FP16 may be highest, followed by the second data type OF16-1, followed by the third data type OF16-2, and the fourth data type BF16 may be the lowest. In the neural network system according to the present embodiment, one of four 16-bit floating-point data formats in which a number expression range and accuracy are variously distributed may be selected and applied to data for operation.

In the present embodiment, one of the four data types may be selected by a mode register setting signal MRS[1:0]. In an embodiment, the mode register setting signal MRS[1:0] may be generated by the mode register (MRS) 260 in PIM controllers 200A and 500A in the PIM systems 20 and 40 of FIGS. 29 and 30, respectively. In an embodiment, when the mode register setting signal MRS[1:0] is '00', the first data type FP16 may be selected. When the mode register setting signal MRS[1:0] is '01', the second data type OF16-1 may be selected. When the mode register setting signal MRS[1:0] is '10', the third data type OF16-2 may be selected. When the mode register setting signal MRS[1:0] is '11', the fourth data type BF16 may be selected. However, this is only an example, and the method of selecting one of the four data types may be variously set.

Figure 60:
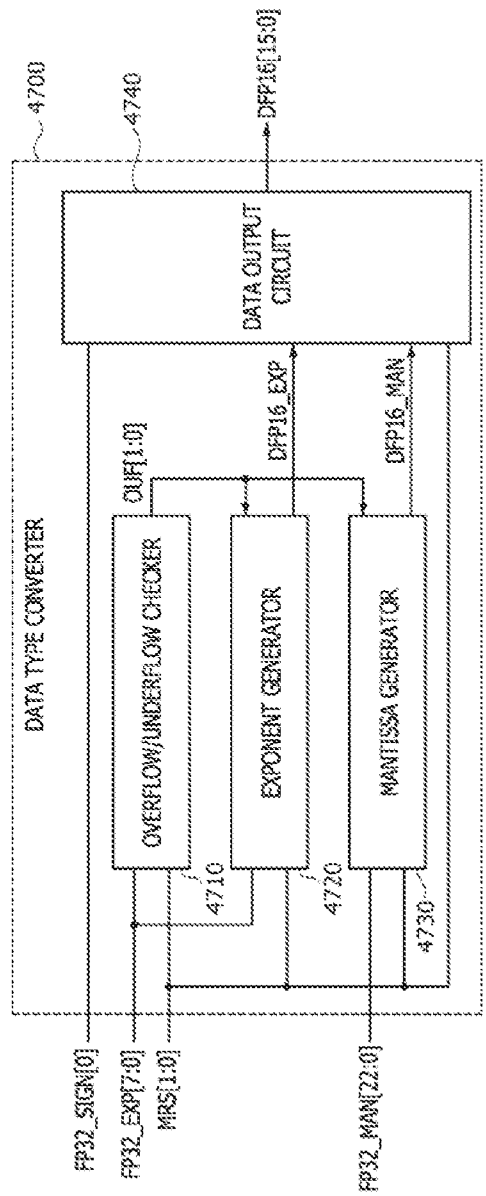
FIG. 60 illustrates an embodiment of a data type converter in neural network systems according to various embodiments of the present disclosure.

FIG. 60 illustrates an embodiment of a data type converter 4700 in neural network systems 4000A and 4000B according to various embodiments of the present disclosure. Referring to FIG. 60, the data type converter 4700 may receive 1-bit sign bit FP32_SIGN[0] of a 32-bit floating-point FP32 type, 8-bit exponent bits FP32_EXP[7:0], and 23-bit mantissa bits FP32_MAN[22:0]. In addition, the data type converter 4700 may receive 2-bit mode register setting signal MRS[1:0]. The data type converter 4700 may output 16-bit floating-point data DFP16[15:0]. The 16-bit floating-point data DFP16[15:0] that is output from the data type converter 4700 may correspond to one of the first to fourth data types FP16, OF16-1, OF16-2, and BF16 as long as overflow and underflow do not occur.

In an embodiment, the data type converter 4700 may include an overflow/underflow checker 4710, an exponent generator 4720, a mantissa generator 4730, and a data output circuit 4740. The overflow/underflow checker 4710 may receive 8-bit exponent bits FP32_EXP[7:0] of the 32-bit floating-point FP32 and the mode register setting signal MRS[1:0], and check whether overflow or underflow occurs. The overflow/underflow checker 4710 may output a 2-bit overflow/underflow signal OUF[1:0]. In an embodiment, when overflow and underflow do not occur, the overflow/underflow checker 4710 may output an overflow/underflow signal OUF[1:0] of '00'. When overflow occurs, the overflow/underflow checker 4710 may output an overflow/underflow signal OUF[1:0] of '01'. When underflow occurs, the overflow/underflow checker 4710 may output an overflow/underflow signal OUF[1:0] of '10'. The overflow/underflow signal OUF[1:0] that is output from the overflow/underflow checker 4710 may be transmitted to the exponent generator 4720 and the mantissa generator 4730.

The exponent generator 4720 may receive 32-bit floating-point (FP32) 8-bit exponent bits FP32_EXP[7:0] and a mode register setting signal MRS[1:0], and output a 16-bit floating-point exponent DFP16_EXP. In an embodiment, when a mode register setting signal MRS[1:0] of '00' is transmitted, the exponent generator 4720 may generate 5-bit exponents of the first data type FP16 to output as a 16-bit floating-point exponent DFP16_EXP. When a mode register setting signal MRS[1:0] of '01' is transmitted, the exponent generator 4720 may generate 6-bit exponents of the second data type OF16-1 to output as a 16-bit floating-point exponent DFP16_EXP. When a mode register setting signal MRS[1:0] of '10' is transmitted, the exponent generator 4720 may generate 7-bit exponents of the third data type OF16-2 to output as a 16-bit floating-point exponent DFP16_EXP. When a mode register setting signal MRS[1:0] of '11' is transmitted, the exponent generator 4720 may output 8-bit exponents FP32_EXP[7:0] of the 32-bit floating-point FP32 as a 16-bit floating-point exponent DFP16_EXP.

The mantissa generator 4730 may receive 23-bit mantissa bits FP32_MAN[22:0] of 32-bit floating-point FP32, and output a 16-bit floating-point mantissa DFP16_MAN. In an embodiment, when a mode register setting signal MRS[1:0] of '00' is transmitted, the mantissa generator 4730 may generate 10-bit mantissa bits of the first data type FP16 to output as a 16-bit floating-point mantissa DFP16_MAN.

When a mode register setting signal MRS[1:0] of '01' is transmitted, the mantissa generator 4730 may generate 9-bit mantissa bits of the second data type OF16-1 to output as a 16-bit floating-point mantissa DFP16_MAN. When a mode register setting signal MRS[1:0] of '10' is transmitted, the mantissa generator 4730 may generate 8-bit mantissa bits of the third data type OF16-2 to output as a 16-bit floating-point mantissa DFP16_MAN. When a mode register setting signal MRS[1:0] of '11' is transmitted, the mantissa generator 4730 may generate 7-bit mantissa bits of the fourth data type BF16 to output as a 16-bit floating-point mantissa DFP16_MAN.

The data output circuit 4740 may receive a 32-bit floating-point (FP32) 1-bit sign bit FP32_SIGN[0], the 16-bit floating-point exponent DFP16_EXP that is output from the exponent generator 4720, and the 16-bit floating-point mantissa DFP16_MAN that is output from the mantissa generator 4730. The data output circuit 4740 may combine the received data in an appropriate order and output them as 16-bit floating point data DFP16[15:9]. The 16-bit floating point data DFP16[15:9] that is output from the data output circuit 4740 may have any one of the first to fourth data types FP16, OF16-1, OF16-2, and BF16.

Figure 61:
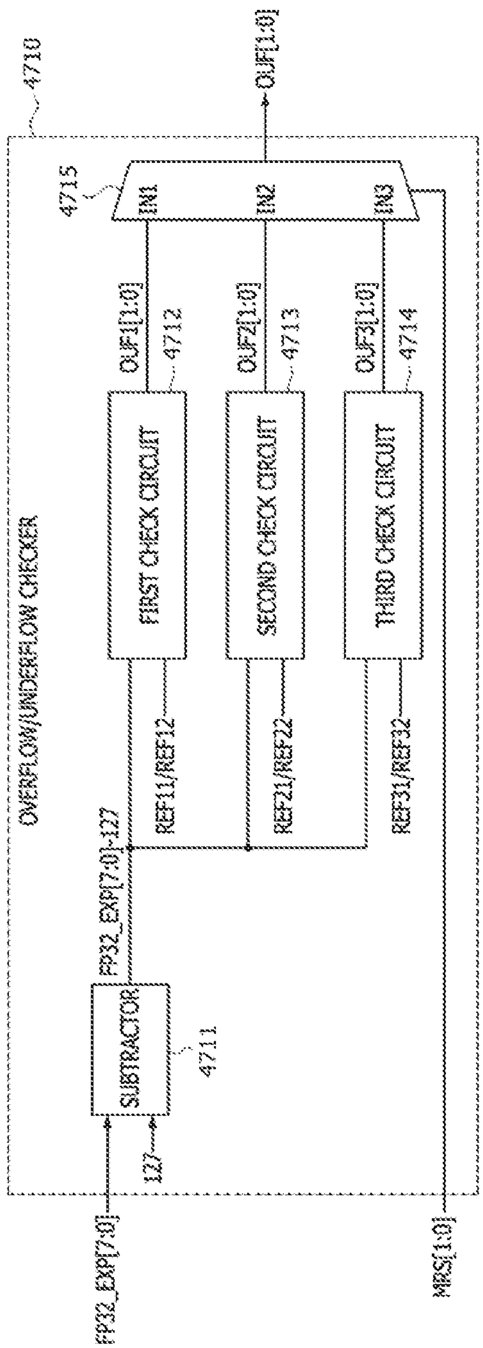
FIG. 61 illustrates an embodiment of an overflow/underflow checker of the data type converter of FIG. 60.
Figure 62:
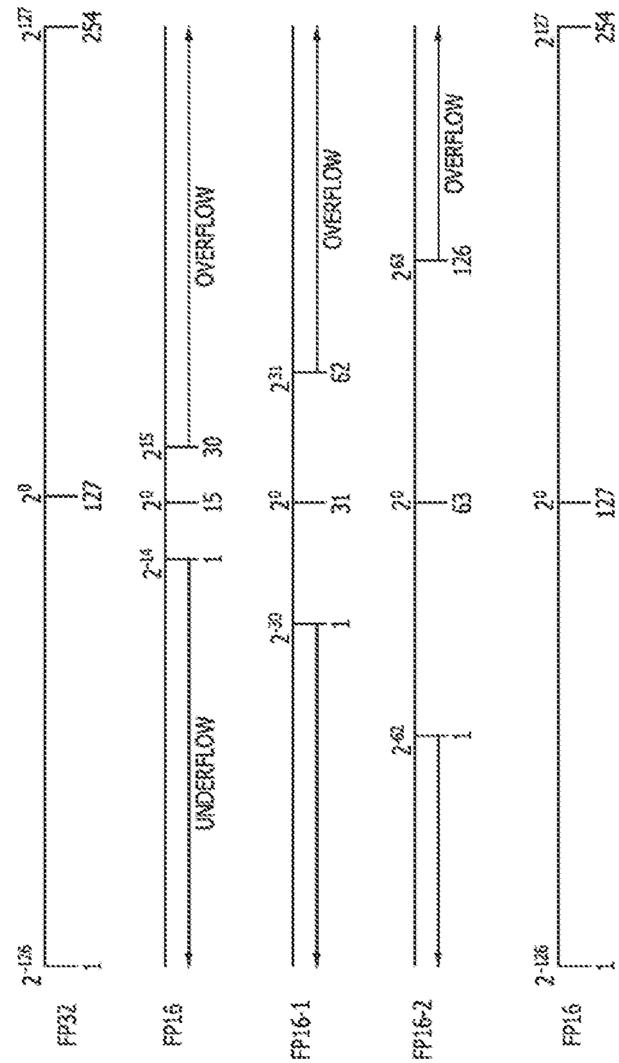
FIG. 62 illustrates setting reference values of the overflow/underflow checker of FIG. 61.

FIG. 61 illustrates an embodiment of the overflow/underflow checker 4710 of the data type converter 4700 of FIG. 60, and FIG. 62 illustrates setting reference values REF11/REF12, REF21/REF22, and REF31/REF32 of the overflow/underflow checker 4710 of FIG. 61. First, referring to FIG. 61, the overflow/underflow checker 4710 may include a subtractor 4711, a first check circuit 4712, a second check circuit 4713, a third check circuit 4714, and a multiplexer 4715. The subtractor 4711 may receive 32-bit floating-point FP32 8-bit exponent bits FP32_EXP[7:0] and an exponent bias '127'. The overflow/underflow checker 4710 may subtract the exponent bias '127' from the 8-bit exponent bits FP32_EXP[7:0], and output a subtraction result FP32_EXP[7:0]−127.

The first check circuit 4712, the second check circuit 4713, and the third check circuit 4714 may commonly receive the subtraction result FP32_EXP[7:0]−127 that is output from the subtractor 4711. The first check circuit 4712 may receive first reference values REF11 and REF12, and check whether overflow/underflow of the first data type FP16 occurs. The second check circuit 4713 may receive second reference values REF21 and REF22, and check whether overflow/underflow of the second data type OP16-1 occurs. The third check circuit 4714 may receive third reference values REF31 and REF32, and check whether overflow/underflow of the third data type OP16-2 occurs.

The 32-bit floating-point FP32 exponent bits FP32_EXP[7:0] transmitted from the overflow/underflow checker 4710 may have a size of 8-bits. Accordingly, as shown in FIG. 62, in the 32-bit floating point FP32 format, the number may be represented by an integer value of '−126' to '127', and the exponent bits FP32_EXP[7:0] to which the exponential bias '127' has been added may have an integer value of '1' to '254'.

In the first data type FP16, the exponent consists of 5 bits. Accordingly, in the first data type FP16, the number may be represented by an integer value of '−14' to '15', and the first data type FP16 5-bit exponent to which the exponential bias '15' has been added has an integer value of '1' to '30'. That is, if the subtraction result FP32_EXP[7:0]−127 obtained by subtracting the exponential bias '127' from the 8-bit exponent bits FP32_EXP[7:0] is greater than 15, overflow occurs, and the subtraction result FP32_EXP[7:0]−127 is less than '−14', underflow occurs. Therefore, in the case of the first data type FP16, the first reference values REF11 and REF12 may be set to '15' and '−14', respectively.

In the second data type OF16-1, the exponent consists of 6 bits. Accordingly, in the second data type OF16-1, the number may be represented by an integer value of '−30' to '31', and the second data type OF16-1 6-bit exponent to which the exponential bias '31' has been added has an integer value of '1' to '62'. That is, if the subtraction result FP32_EXP[7:0]−127 obtained by subtracting the exponential bias '127' from the 8-bit exponent bits FP32_EXP[7:0] is greater than '31', overflow occurs, and the subtraction result FP32_EXP[7:0]−127 is less than '−30', underflow occurs. Therefore, in the case of the second data type OF16-1, the second reference values REF21 and REF22 may be set to '31' and '−30', respectively.

In the third data type OF16-2, the exponent consists of 7 bits. Accordingly, in the third data type OF16-2, the number may be represented by an integer value of '−62' to '63', and the third data type OF16-2 exponent to which the exponential bias '63' has been added has an integer value of '1' to '126'. That is, if the subtraction result FP32_EXP[7:0]−127 obtained by subtracting the exponential bias '127' from the 8-bit exponent bits FP32_EXP[7:0] is greater than '63', overflow occurs, and the subtraction result FP32_EXP[7:0]−127 is less than '−62', underflow occurs. Therefore, in the case of the third data type OF16-2, the third reference values REF31 and REF32 may be set to '63' and '−62', respectively.

In the case of the fourth data type BF16, the size of the exponent bits is 8 bits, which is the same as the exponent bits FP32_EXP[7:0] of the 32-bit floating point FP32. Accordingly, the expression range of the number in the fourth data type BF16 is the same as that of the 32-bit floating point FP32. That is, in the case of the fourth data type BF16, neither overflow nor underflow occurs. Therefore, the overflow/underflow checker 4710 might not perform overflow and underflow checks in the fourth data type BF16.

Referring back to FIG. 61, the first check circuit 4712 may compare the subtraction result FP32_EXP[7:0]−127 transmitted from the subtractor 4711 with the first reference values REF11 and REF12. The first check circuit 4712 may output the comparison result as a 2-bit first overflow/underflow signal OUF1[1:0]. As a result of the comparison, when the subtraction result FP32_EXP[7:0]−127 is equal to or less than '15', which is the first reference value REF1, and is equal to or greater than '−14', which is the first reference value REF12, the first the check circuit 4712 may output a first overflow/underflow signal OUF1[1:0] of '00' representing no occurrence of overflow and underflow. As a result of the comparison, when the subtraction result FP32_EXP[7:0]−127 is greater than '15' which is the first reference value REF1, the first check circuit 4712 may output a first overflow/underflow signal OUF1[1:0] of '01' representing occurrence of overflow. As a result of the comparison, when the subtraction result FP32_EXP[7:0]−127 is less than '−14', which is the first reference value REF12, the first check circuit 4712 may output a first overflow/underflow signal OUF1[1:0] of '10' representing occurrence of underflow.

The second check circuit 4713 may compare the subtraction result FP32_EXP[7:0]−127 transmitted from the subtractor 4711 with the second reference values REF21 and REF22. The second check circuit 4713 may output the comparison result as a 2-bit second overflow/underflow signal OUF2[1:0]. As a result of the comparison, when the subtraction result FP32_EXP[7:0]−127 is equal to or less than '31', which is the second reference value REF21, and is equal to or greater than '−30', which is the second reference value REF22, the second the check circuit 4713 may output a second overflow/underflow signal OUF2[1:0] of '00' representing no occurrence of overflow and underflow. As a result of the comparison, when the subtraction result FP32_EXP[7:0]−127 is greater than '31' which is the second reference value REF21, the second check circuit 4713 may output a second overflow/underflow signal OUF2 [1:0] of '01' representing occurrence of overflow. As a result of the comparison, when the subtraction result FP32_EXP [7:0]−127 is less than '−30', which is the second reference value REF22, the second check circuit 4713 may output a second overflow/underflow signal OUF2[1:0] of '10' representing occurrence of underflow.

The third check circuit 4714 may compare the subtraction result FP32_EXP[7:0]−127 transmitted from the subtractor 4711 with the third reference values REF31 and REF32. The third check circuit 4714 may output the comparison result as a 2-bit third overflow/underflow signal OUF3[1:0]. As a result of the comparison, when the subtraction result FP32_EXP[7:0]−127 is equal to or less than '63', which is the third reference value REF31, and is equal to or greater than '−62', which is the third reference value REF32, the third the check circuit 4714 may output a third overflow/underflow signal OUF3[1:0] of '00' representing no occurrence of overflow and underflow. As a result of the comparison, when the subtraction result FP32_EXP[7:0]−127 is greater than '63', which is the third reference value REF31, the third check circuit 4714 may output a third overflow/underflow signal OUF3[1:0] of '01' representing occurrence of overflow. As a result of the comparison, when the subtraction result FP32_EXP[7:0]−127 is less than '−62', which is the third reference value REF32, the third check circuit 4714 may output a third overflow/underflow signal OUF3[1:0] of '10' representing occurrence of underflow.

The multiplexer 4715 may receive the first overflow/underflow signal OUF1[1:0] that is output from the first check circuit 4712 through a first input terminal IN1. The multiplexer 4715 may receive the second overflow/underflow signal OUF2[1:0] that is output from the second check circuit 4713 through a second input terminal IN2. The multiplexer 4715 may receive the third overflow/underflow signal OUF3[1:0] that is output from the third check circuit 4714 through a third input terminal IN3. The multiplexer 4715 may receive a mode register setting signal MRS[1:0] through a control terminal. When a register setting signal MRS[1:0] of '00' is transmitted, the multiplexer 4715 may output the first overflow/underflow signal OUF1[1:0]. When a register setting signal MRS[1:0] of '01' is transmitted, the multiplexer 4715 may output the second overflow/underflow signal OUF2[1:0]. When a register setting signal MRS[1:0] of '10' is transmitted, the multiplexer 4715 may output the third overflow/underflow signal OUF3[1:0].

Figure 63:
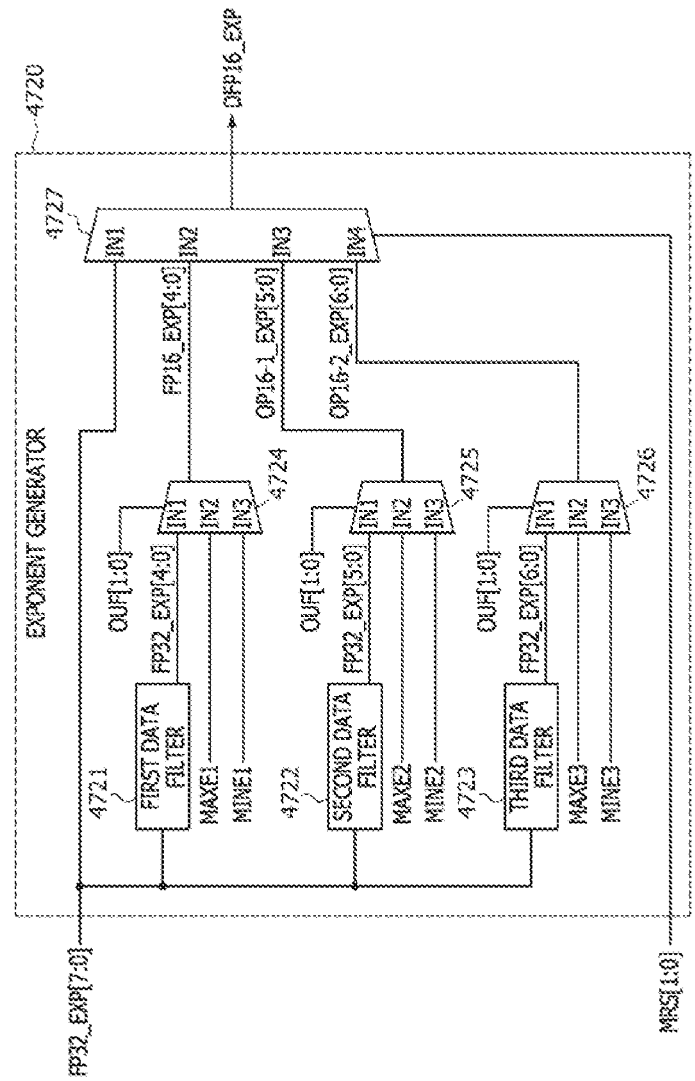
FIG. 63 illustrates an embodiment of an exponent generator of the data type converter of FIG. 60.

FIG. 63 illustrates an embodiment of the exponent generator 4720 of the data type converter 4700 of FIG. 60. Referring to FIG. 63, the exponent generator 4720 may include first to third data filters 4721, 4722, and 4723, and first to fourth multiplexers 4724, 4725, 4726, and 4727. The first to third data filters 4721, 4722, and 4723 may commonly receive the 32-bit floating-point exponent bits FP32_EXP[7:0]. The first data filter 4721 may output 5-bit exponent bits FP32_EXP[4:0] obtained by removing 3 higher order bits of the exponent bits FP32_EXP[7:0]. The 5-bit exponent bits FP32_EXP[4:0] that are output from the first data filter 4721 may be transmitted to a first input terminal IN1 of the first multiplexer 4724. The second data filter 4722 may output 6-bit exponent bits FP32_EXP[5:0] obtained by removing 2 higher order bits of the exponent bits FP32_EXP[7:0]. The 6-bit exponent bits FP32_EXP[5:0] that are output from the second data filter 4722 may be transmitted to a first input terminal IN1 of the second multiplexer 4725. The third data filter 4723 may output 7-bit exponent bits FP32_EXP[6:0] obtained by removing 2 higher order bits from the exponent bits FP32_EXP[7:0]. The 7-bit exponent bits FP32_EXP[6:0] that are output from the third data filter 4723 may be transmitted to a first input terminal IN1 of the third multiplexer 4726.

The first multiplexer 4724 may receive a first exponent maximum value MAXE1 and a first exponent minimum value MINE1 through a second input terminal IN2 and a third input terminal IN3, respectively. The first multiplexer 4724 may output the 5-bit exponent bits FP32_EXP[4:0] transmitted through the first input terminal IN1 in response to the overflow/underflow signal OUF[1:0] of '00'. The first multiplexer 4724 may output the first exponent maximum value MAXE1 transmitted through the second input terminal IN2 in response to the overflow/underflow signal OUF[1:0] of '01'. The first multiplexer 4724 may output the first exponent minimum value MINE1 transmitted through the third input terminal IN3 in response to the overflow/underflow signal OUF[1:0] of '10'.

The second multiplexer 4725 may receive a second exponent maximum value MAXE2 and a second exponent minimum value MINE2 through a second input terminal IN2 and a third input terminal IN3, respectively. The second multiplexer 4725 may output the 6-bit exponent bits FP32_EXP [5:0] transmitted through the first input terminal IN1 in response to the overflow/underflow signal OUF[1:0] of '00'. The second multiplexer 4725 may output the second exponent maximum value MAXE2 transmitted through the second input terminal IN2 in response to the overflow/underflow signal OUF[1:0] of '01'. The second multiplexer 4725 may output the second exponent minimum value MINE2 transmitted through the third input terminal IN3 in response to the overflow/underflow signal OUF[1:0] of '10'.

The third multiplexer 4726 may receive a third exponent maximum value MAXE3 and a third exponent minimum value MINE3 through a second input terminal IN2 and a third input terminal IN3, respectively. The third multiplexer 4726 may output the 7-bit exponent bits FP32_EXP[6:0] transmitted through the first input terminal IN1 in response to the overflow/underflow signal OUF[1:0] of '00'. The third multiplexer 4726 may output the third exponent maximum value MAXE3 transmitted through the second input terminal IN2 in response to the overflow/underflow signal OUF[1:0] of '01'. The third multiplexer 4726 may output the third exponent minimum value MINE3 transmitted through the third input terminal IN3 in response to the overflow/underflow signal OUF[1:0] of '10'.

The fourth multiplexer 4727 may receive 32-bit floating-point type FP32 exponent bits FP32_EXP[7:0] through a first input terminal IN1. The fourth multiplexer 4727 may receive first data type FP16 exponent bits FP32_EXP[4:0] that are output from the first multiplexer 4724 through a second input terminal IN2. The fourth multiplexer 4727 may receive second data type OF16-1 exponent bits FP32_EXP [5:0] transmitted from the second multiplexer 4725 through a third input terminal IN3. The fourth multiplexer 4727 may receive third data type OF16-2 exponent bits FP32_EXP[6:0] transmitted from the third multiplexer 4726 through a fourth input terminal IN4. The fourth multiplexer 4727 may receive a mode register setting signal MRS[1:0] through a control terminal.

If a mode register setting signal MRS[1:0] of '11' is transmitted, the fourth multiplexer 4727 may output 32-bit floating-point format exponent bits FP32_EXP[7:0], that is, fourth data type exponent bits BF16_EXP[7:0] as a 16-bit floating-point format exponent DFP16_EXP. If a mode register setting signal MRS[1:0] of '00' is transmitted, the fourth multiplexer 4727 may output first data type FP16 exponent bits FP16_EXP[4:0] inputted through the second input terminal IN2 as a 16-bit floating-point format exponent DFP16_EXP. If a mode register setting signal MRS[1:0] of '01' is transmitted, the fourth multiplexer 4727 may output second data type OF16-1 exponent bits OF16-1_EXP[5:0] inputted through the third input terminal IN3 as a 16-bit floating-point format exponent DFP16_EXP. In addition, if a mode register setting signal MRS[1:0] of '10' is transmitted, the fourth multiplexer 4727 may output third data type OF16-2 exponent bits OF16-2_EXP[6:0] inputted through the fourth input terminal IN4 as a 16-bit floating-point format exponent DFP16_EXP.

Figure 64:
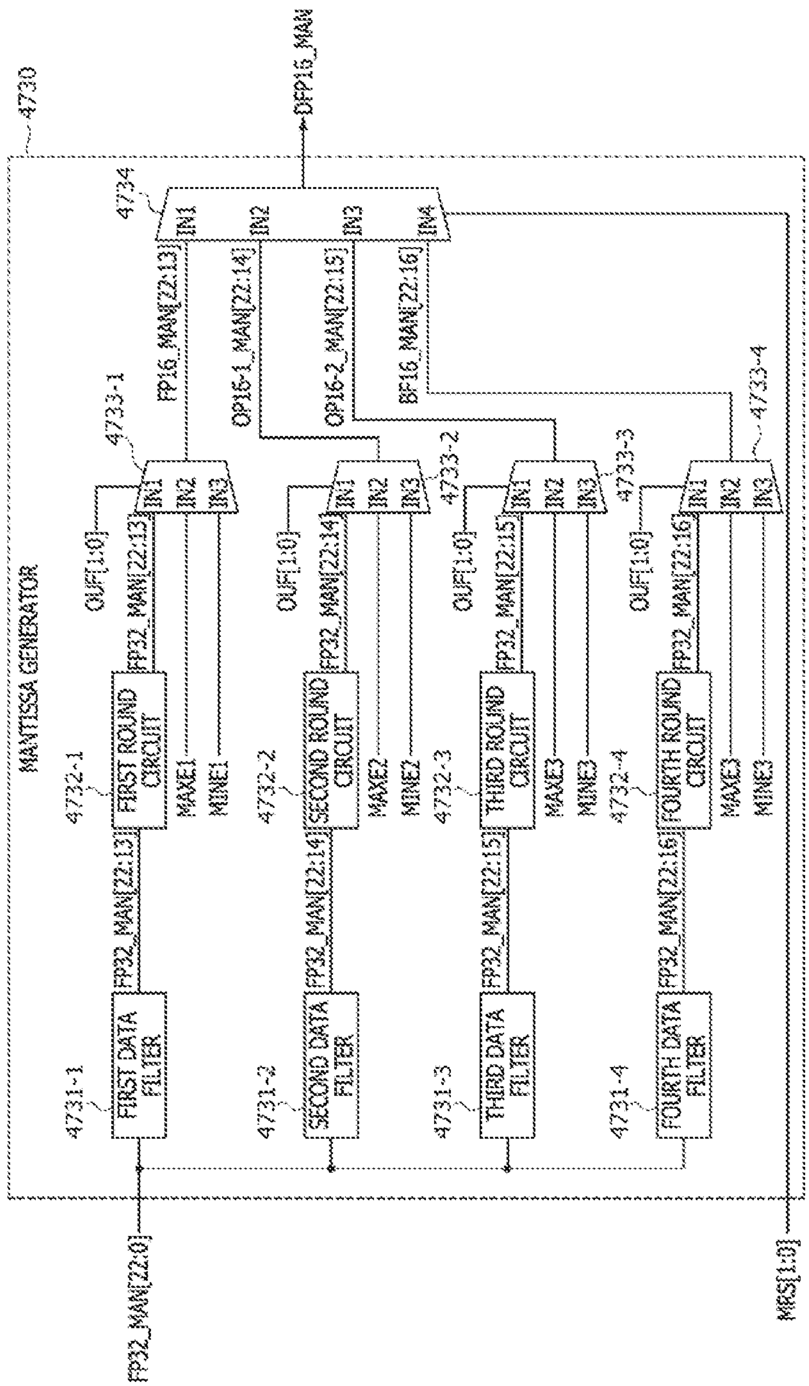
FIG. 64 illustrates an embodiment of a mantissa generator of the data type converter of FIG. 60.

FIG. 64 illustrates an embodiment of the mantissa generator 4730 of the data type converter 4700 of FIG. 60. Referring to FIG. 64, the mantissa generator 4730 may include first to fourth data filters 4731-1, 4731-2, 4731-3, and 4731-4, first to fourth round circuits 4732-1, 4732-2, 4732-3, and 4732-4, first to fourth multiplexers 4733-1, 4733-2, 4733-3, first to fourth 3:1 multiplexers 4733-1, 4733-2, 4733-3, and 4733-4, and 4733-4, and a 4:1 multiplexer 4734.

The first to fourth data filters 4731-1, 4731-2, 4731-3, and 4731-4 may commonly receive 32-bit floating-point format FP32 mantissa bits FP32_MAN[22:0]. The first data filter 4731-1 may output 10-bit mantissa bits FP32_MAN[22:13] obtained by removing 13 lower order bits of the 32-bit floating-point format FP32 mantissa bits FP32_MAN[22:0]. The 10-bit mantissa bits FP32_MAN[22:13] that are output from the first filter 4713-1 may be transmitted to the first round circuit 4732-1. The second data filter 4731-2 may output 9-bit mantissa bits FP32_MAN[22:14] obtained by removing 14 lower order bits of the 32-bit floating-point format FP32 mantissa bits FP32_MAN[22:0]. The 9-bit mantissa bits FP32_MAN[22:14] that are output from the second filter 4713-2 may be transmitted to the second round circuit 4732-2.

The third data filter 4731-3 may output 8-bit mantissa bits FP32_MAN[22:15] obtained by removing 15 lower order bits of the 32-bit floating-point format FP32 mantissa bits FP32_MAN[22:0]. The 8-bit mantissa bits FP32_MAN[22:15] that are output from the third filter 4713-3 may be transmitted to the third round circuit 4732-3. The fourth data filter 4731-4 may output 7-bit mantissa bits FP32_MAN[22:16] obtained by removing 16 lower order bits of the 32-bit floating-point format FP32 mantissa bits FP32_MAN[22:0]. The 7-bit mantissa bits FP32_MAN[22:16] that are output from the fourth filter 4713-4 may be transmitted to the fourth round circuit 4732-4. Although not shown in FIG. 64, a round bit and a sticky bit may be transmitted from each of the first to fourth data filters 4731-1, 4731-2, 4731-3, and 4731-4 to each of the round circuits 4732-1, 4732-2, 4732-3, and 4732-4. As the round bit and the sticky bit, the most significant bit and the next higher bit may be selected among bits removed from the 32-bit floating-point FP32 mantissa bits FP32_MAN[22:0], respectively.

The first round circuit 4732-1 may perform a rounding process on the 10-bit mantissa bits FP32_MAN[22:13] transmitted from the first data filter 4731-1 and output a result. The second round circuit 4732-2 may perform a rounding process on the 9-bit mantissa bits FP32_MAN[22:14] transmitted from the second data filter 4731-2 and output a result. The third round circuit 4732-3 may perform a rounding process on the 8-bit mantissa bits FP32_MAN[22:15] transmitted from the third data filter 4731-3 and output a result. The fourth round circuit 4732-4 may perform a rounding process on the 7-bit mantissa bits FP32_MAN[22:16] transmitted from the fourth data filter 4731-4 and output a result. Each of the first to fourth round circuits 4732-1, 4732-2, 4732-3, and 4732-4 may perform a '+1' operation in the event that a roundup occurs in the rounding process.

The first 3:1 multiplexer 4733-1 may receive a first maximum mantissa value MAXM1 and a first mantissa minimum value MINM1 through a second input terminal IN2 and a third input terminal IN3, respectively. The first maximum value MAXM1 and the first minimum value MINM1 may be set to a maximum value and a minimum value that can be represented by the first data type FP16 10-bit mantissas, respectively. The first 3:1 multiplexer 4733-1 may output the 10-bit mantissa bits FP32_MAN[22:13] inputted through a first input terminal IN1 as first data type FP16 10-bit mantissa bits FP16_MAN[22:13] in response to an overflow/underflow signal OUF[1:0] of '00'. The first 3:1 multiplexer 4733-1 may output the first maximum mantissa value MAXM1 inputted through the second input terminal IN2 as the first data type FP16 10-bit mantissa bits FP16_MAN[22:13] in response to an overflow/underflow signal OUF[1:0] of '01'. The first 3:1 multiplexer 4733-1 may output the first mantissa minimum value MINM1 inputted through the third input terminal IN3 as the first data type FP16 10-bit mantissa bits FP16_MAN[22:13] in response to an overflow/underflow signal OUF[1:0] of '10'.

The second 3:1 multiplexer 4733-2 may receive a second maximum mantissa value MAXM2 and a second mantissa minimum value MINM2 through a second input terminal IN2 and a third input terminal IN3, respectively. The second maximum value MAXM2 and the second minimum value MINM2 may be set to a maximum value and a minimum value that can be represented by the second data type OF16-1 9-bit mantissas, respectively. The second 3:1 multiplexer 4733-2 may output the 9-bit mantissa bits FP32_MAN[22:14] inputted through a first input terminal IN1 as second data type OF16-1 9-bit mantissa bits OF16-1_MAN[22:14] in response to an overflow/underflow signal OUF[1:0] of '00'. The second 3:1 multiplexer 4733-2 may output the second maximum mantissa value MAXM2 inputted through the second input terminal IN2 as the second data type OF16-1 9-bit mantissa bits FP16_MAN[22:14] In response to an overflow/underflow signal OUF[1:0] of '01'. The second 3:1 multiplexer 4733-2 may output the second mantissa minimum value MINM2 inputted through the third input terminal IN3 as the second data type OFP16-1 9-bit mantissa bits OF16-1_MAN[22:14] in response to an overflow/underflow signal OUF[1:0] of '10'.

The third 3:1 multiplexer 4733-3 may receive a third maximum mantissa value MAXM3 and a third mantissa minimum value MINM3 through a second input terminal IN2 and a third input terminal IN3, respectively. The third maximum value MAXM3 and the third minimum value MINM3 may be set to a maximum value and a minimum value that can be represented by the third data type OF16-2 8-bit mantissas, respectively. The third 3:1 multiplexer 4733-3 may output the 8-bit mantissa bits FP32_MAN[22:15] inputted through a first input terminal IN1 as third data type OF16-2 8-bit mantissa bits OF16-2_MAN[22:14] in response to an overflow/underflow signal OUF[1:0] of '00'. The third 3:1 multiplexer 4733-3 may output the third maximum mantissa value MAXM3 inputted through the second input terminal IN2 as the third data type OF16-2 8-bit mantissa bits FP16_MAN[22:15] in response to an overflow/underflow signal OUF[1:0] of '01'. The third 3:1 multiplexer 4733-3 may output the third mantissa minimum value MINM3 inputted through the third input terminal IN3 as the third data type OFP16-2 8-bit mantissa bits OF16-2_MAN[22:15] in response to an overflow/underflow signal OUF[1:0] of '10'.

The fourth 3:1 multiplexer 4733-4 may receive a fourth maximum mantissa value MAXM4 and a fourth mantissa minimum value MINM4 through a second input terminal IN2 and a third input terminal IN3, respectively. The fourth maximum value MAXM4 and the fourth minimum value MINM4 may be set to a maximum value and a minimum value that can be represented by the fourth data type BF16 7-bit mantissas, respectively. The fourth 3:1 multiplexer 4733-4 may output the 7-bit mantissa bits FP32_MAN[22:16] inputted through a first input terminal IN1 as fourth data type BF16 7-bit mantissa bits BF16_MAN[22:16] in response to an overflow/underflow signal OUF[1:0] of '00'. The fourth 3:1 multiplexer 4733-4 may output the fourth maximum mantissa value MAXM4 inputted through the second input terminal IN2 as the fourth data type BF16 7-bit mantissa bits BF16_MAN[22:16] in response to an overflow/underflow signal OUF[1:0] of '01'. The fourth 3:1 multiplexer 4733-4 may output the fourth mantissa minimum value MINM4 inputted through the third input terminal IN3 as the fourth data type BF16 7-bit mantissa bits BF16_MAN[22:16] in response to an overflow/underflow signal OUF[1:0] of '10'.

The fourth multiplexer 4734 may receive first data type FP16 10-bit mantissa bits FP16_MAN[22:13] that are output from the first 3:1 multiplexer 4733-1 through a first input terminal IN1. The fourth multiplexer 4734 may receive second type OF16-1 9-bit mantissa bits OF16-1_MAN[22:14] that are output from the second 3:1 multiplexer 4733-2 through a second input terminal IN2. The fourth multiplexer 4734 may receive third type OF16-2 8-bit mantissa bits OF16-2_MAN[22:15] that are output from the third 3:1 multiplexer 4733-3 through a third input terminal IN3. The fourth multiplexer 4734 may receive fourth type BF16 7-bit mantissa bits BF16_MAN[22:16] that are output from the fourth 3:1 multiplexer 4733-4 through a fourth input terminal IN4.

If a mode register setting signal MRS[1:0] of '00' is transmitted, the fourth multiplexer 4734 may output first data type FP16 10-bit mantissa bits FP16_MAN[22:13] inputted through the first input terminal IN1 as a 16-bit floating-point format FP16 exponent DFP16_EXP. If a mode register setting signal MRS[1:0] of '01' is transmitted, the fourth multiplexer 4734 may output second data type OF16-1 9-bit mantissa bits OF16-1_MAN[22:14] inputted through the second input terminal IN2 as a 16-bit floating-point format FP16 exponent DFP16_EXP. If a mode register setting signal MRS[1:0] of '10' is transmitted, the fourth multiplexer 4734 may output third data type OF16-2 8-bit mantissa bits OF16-2_MAN[22:15] inputted through the third input terminal IN3 as a 16-bit floating-point format FP16 exponent DFP16_EXP. In addition, if a mode register setting signal MRS[1:0] of '11' is transmitted, the fourth multiplexer 4734 may output fourth data type BF16 7-bit mantissa bits BF16_MAN[22:16] inputted through the fourth input terminal IN4 as a 16-bit floating-point format FP16 exponent DFP16_EXP.

Figure 65:
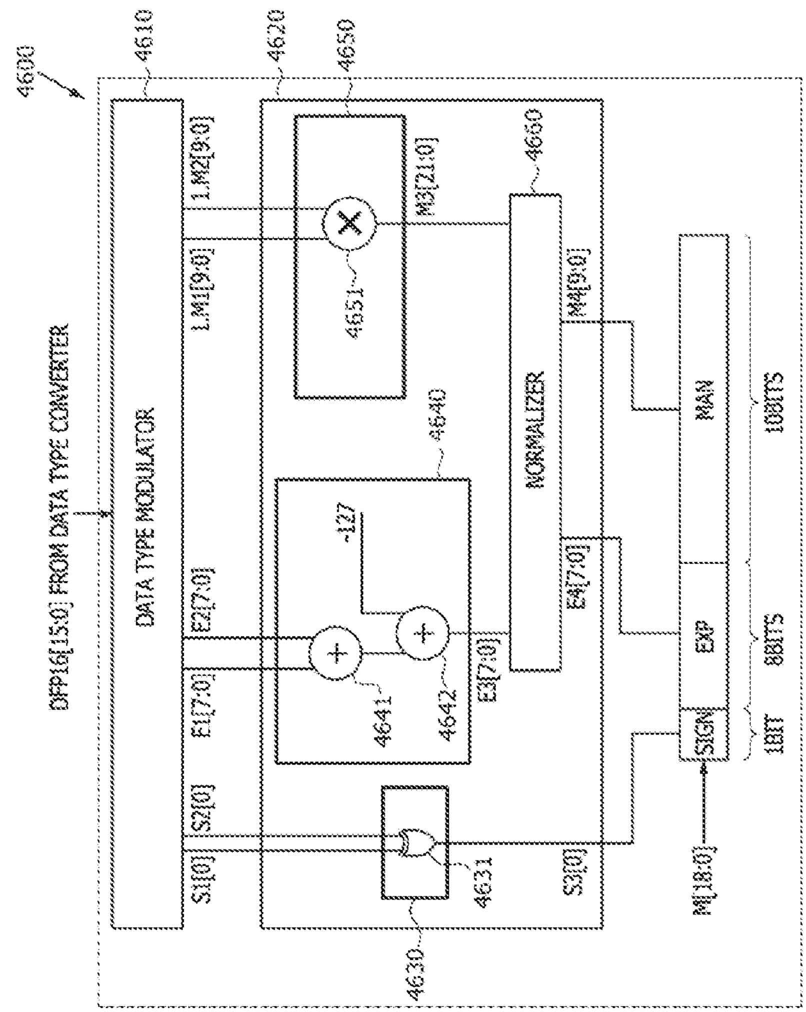
FIG. 65 illustrates an embodiment of a data type modulator and a multiplier in a neural network system according to various embodiments of the present disclosure.

FIG. 65 illustrates an embodiment of a MAC operator 4600 in a neural network circuits 4000A and 4000B according to various embodiments of the present disclosure. Although not shown in FIG. 65, the MAC operator 4600 may further include an adder tree and an accumulator. The adder tree and accumulator of the MAC operator 4600 may operate in the same manner as the adder tree 1300 and accumulator 1400 of the MAC operator 1000 described with reference to FIG. 31 except that the adder tree and accumulator of the MAC operator 4600 perform floating point operations.

Referring to FIG. 65, the MAC operator 4600 may include a data type modulator 4610 and a floating-point multiplier 4620. The data type modulator 4610 may receive 16-bit floating-point data DFP16[15:0] configured in any one of the first to fourth data types FP16, OF16-1, OF16-2, and BF16 from the data type converter 4700. The data format modulator 4610 may modulate the 16-bit floating-point data DFP16[15:0] and transmit the floating-point data whose number of bits is modulated to the multiplier 4620 so that the multiplication in the multiplier 4620 may be performed for all data types FP16, OF16-1, OF16-2, and BF16.

The number of modulated bits of the floating-point format generated by the data type modulator 4610 may be a number of bits obtained by adding all of the maximum number of bits of the exponent, the maximum number of bits of the mantissa bits, the number of sign bits, and the number of implicit bit among the first to fourth data types FP16, OF16-1, OF16-2, and BF16. In the present embodiment, among the first to fourth data types FP16, OF16-1, OF16-2, and BF16, the maximum number of bits of the exponent is 8 bits, the maximum number of mantissa bits is 10 bits, and the number of sign bits and implicit bit are 1 bit each, the floating-point format generated by the data type modulator 4610 consists of 20 bits. Accordingly, the data type modulator 4610 may transmit first data consisting of a 1-bit exponent bit S1[0], 8-bit exponent bits E1[7:0], 11-bit mantissa bits 1.M1[9:0](including 1-bit implicit bit), and second data consisting of a 1-bit exponent bit S2[0], 8-bit exponent bits E2[7:0], 11-bit mantissa bits 1.M2[9:0](including 1-bit implicit bit) to the multiplier 4620. The data type modulator 4610 will be described in more detail below.

The multiplier 4620 may include a sign processing circuit 4630, an exponent processing circuit 4640, a mantissa processing circuit 4650, and a normalizer 4660. The sign processing circuit 4630 may include an XOR gate 4631. The XOR gate 4631 may perform an XOR operation on the sign bit S1[0] of the first data and the sign bit S2[0] of the second data to output 1-bit signal bit S3[0]. The 1-bit signal bit S3[0] that is output from the XOR gate 4631 may constitute a sign SIGN of a 19-bit floating-point format multiplication data M[18:0] without an implicit bit.

The exponent processing circuit 4640 may include a first exponent adder 4641 and a second exponent adder 4642. The first exponent adder 4641 may perform an addition operation on the exponent bits E1[7:0] of the first data and the exponent bits E2[7:0] of the second data to output result data. The second exponent adder 4642 may perform an addition operation on the result data and '−127' in order to subtract an exponent bias value, for example, '127' from the result data that is output from the first exponent adder 4641 to output 8-bit exponent bits E3[7:0]. The 8-bit exponent bits E3[7:0] that are output from the second exponent adder 4642 may be transmitted to the normalizer 4660.

The mantissa processing circuit 4650 may include a mantissa multiplier 4651. In this embodiment, the mantissa multiplier 4651 may be configured to perform a multiplication operation on the sum of the maximum number of bits of the mantissa bits and the number of implicit bit among the first to fourth data types FP16, OF16-1, OF16-2, and BF16, that is, 11-bit data in the case of this embodiment. The mantissa multiplier 4651 may perform a multiplication operation on the mantissa bits 1.M1[9:0] with the implicit bit of the first data and the mantissa bits 1.M2[7:0] with the implicit bit of the second data. The mantissa multiplier 4651 may output 22-bit mantissa bits M3[21:0] as multiplication result data. The 22-bit mantissa bits M3[21:0] that are output from the mantissa multiplier 4651 may be transmitted to the normalizer 4660.

The normalizer 4660 may receive 8-bit exponent bits E3[7:0] from the second exponent 4642 of the exponent processing circuit 4640, and receive 22-bit mantissa bits M3[21:0] from the mantissa multiplier 4651 of the mantissa processing circuit 4650. If the MSB of the 22-bit mantissa bits M3[21:0] is '1', the normalizer 4660 may output data that is obtained by shifting a binary point in the 22-bit mantissa bits M3[21:0] toward the MSB by 1 bit. In addition, the normalizer 4660 may adjust the number of bits to output 10-bit mantissa bits M4[9:0] obtained by removing the implicit bit. If the MSB of the 22-bit mantissa bits M3[21:0] is '0', the normalizer 4660 may adjust the number of bits while maintaining the binary point in the 22-bit mantissa bits M3[21:0] to output 10-bit mantissa bits M4[9:0] obtained by removing the implicit bit. The normalizer 4660 may perform a rounding process in the process of adjusting the number of bits.

If an MSB of the 22-bit mantissa bits M3[21:0] is '1', the normalizer 4660 may perform an operation of adding the MSB of the 22-bit mantissa bits M3[21:0] to 8-bit exponent bits E3[7:0] transmitted from the second exponent adder 4462, that is, a '+1' operation. The normalizer 4660 may output the data that is obtained by performing the '+1' operation as 8-bit exponential bits E4[7:0]. If the MSB of the 22-bit mantissa bits M3[21:0] is '0', the normalizer 4660 may output the 8-bit exponent bits E3[7:0] transmitted from the second exponent adder 4462 as 8-bit exponent bits E4[7:0]. The 1-bit sign bit S3[0] that is output from the XOR gate 4631, an 8-bit exponent bit E4[7:0] and the 10-bit mantissa bits M4[9:0] that are output from the normalizer 4660 may constitute the 19-bit multiplication data M[18:0] that is output from the multiplier 4620. The 19-bit multiplication data M[18:0] may be transmitted to the adder tree.

Figure 66:
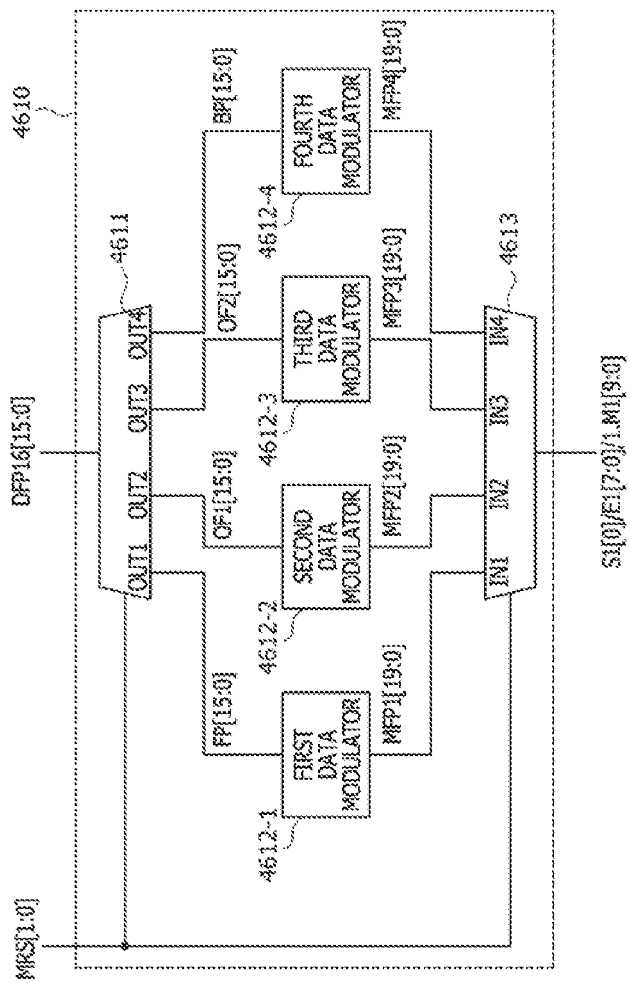
FIG. 66 illustrates an embodiment of the data type modulator of FIG. 65.

FIG. 66 illustrates an embodiment of the data type modulator 4610 of FIG. 65, and FIGS. 67 to 70 illustrate a data type modulation process in each of the first to fourth data modulators 4612-1, 4612-2, 4612-3, and 4612-4 of the data type modulator 4610 of FIG. 66. Referring to FIG. 66, the data type modulator 4610 may include a 1:4 demultiplexer 4611, and first to fourth data modulators 4612-1, 4612-2, 4612-3, and 4612-4. The 1:4 demultiplexer 4611 may receive 16-bit floating-point data DFP16[15:0] configured in any one of the first to fourth data formats FP16, OF16-1, OF16-2, and BF16 from the data type converter 4700. The 1:4 demultiplexer 4611 may output 16-bit floating-point data DFP16[15:0] to one of first to fourth output terminals OUT1, OUT2, OUT3, and OUT4 according to a mode register setting signal MRS[1:0] transmitted through a control terminal.

If a mode register setting signal MRS[1:0] of '00' is transmitted, that is, the 16-bit floating-point data DFP16[15:0] is first type FP16 data, the 1:4 demultiplexer 4611 may transmit 16-bit first floating-point data FP[15:0] to the first data modulator 4612-1 through the first output terminal OUT1. If a mode register setting signal MRS[1:0] of '01' is transmitted, that is, the 16-bit floating-point data DFP16[15:0] is second type OF16-1 data, the 1:4 demultiplexer 4611 may transmit 16-bit second floating-point data OF1[15:0] to the second data modulator 4612-2 through the second output terminal OUT2. If a mode register setting signal MRS[1:0] of '10' is transmitted, that is, the 16-bit floating-point data DFP16[15:0] is third type OF16-2 data, the 1:4 demultiplexer 4611 may transmit 16-bit third floating-point data OF2[15:0] to the third data modulator 4612-3 through the third output terminal OUT3. In addition, if a mode register setting signal MRS[1:0] of '11' is transmitted, that is, the 16-bit floating-point data DFP16[15:0] is fourth type BF16 data, the 1:4 demultiplexer 4611 may transmit 16-bit fourth floating-point data BF[15:0] to the fourth data modulator 4612-4 through the fourth output terminal OUT4.

The first data modulator 4612-1 may perform a modulation operation on the first data type FP16 16-bit floating-point data FP[15:0] transmitted from the 1:4 demultiplexer 4611 to output 20-bit first modulated floating-point data MFP1[19:0]. The 20-bit first modulated floating-point data MFP1[19:0] may be composed of a 1-bit sign bit S1[0], 8-bit exponent bits E1[7:0], and mantissa bits 1.M1[9:0] with 11-bit explicit bits.

Figure 67:
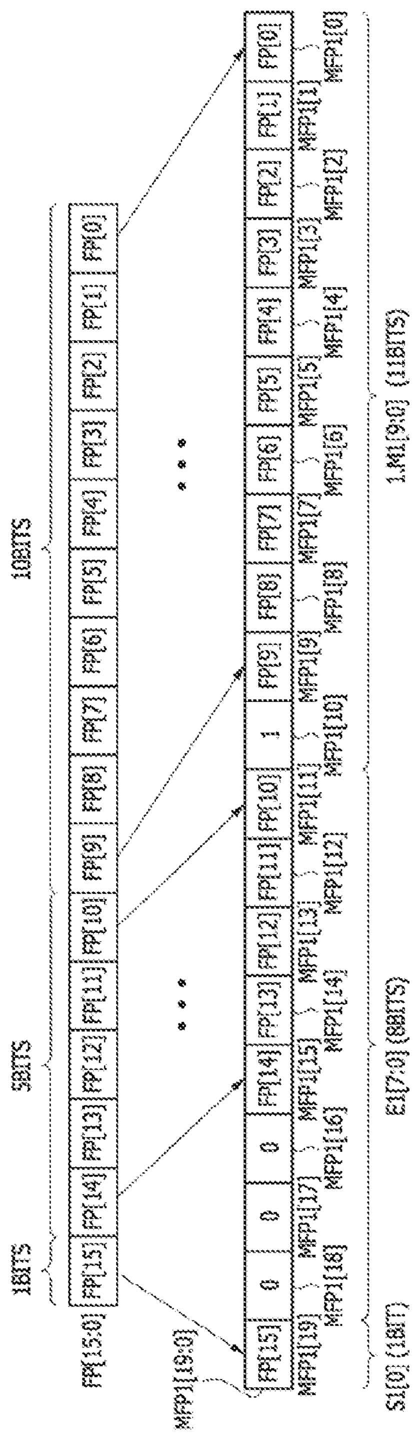
FIGS. 67 to 70 illustrate a data type modulating process in each of first to fourth data modulators of the data type modulator of FIG. 66.
Figure 68:
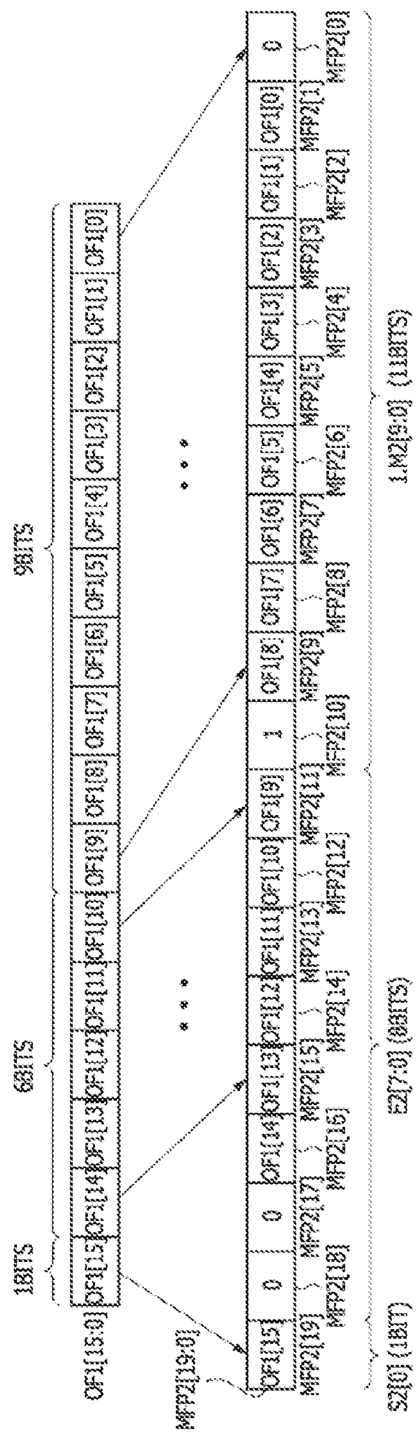

By the modulation operation by the first data modulator 4612-1, as shown in FIG. 67, an MSB MFP[19] of the 20-bit first modulated floating-point data MFP1[19:0], that is, the sign bit S1[0] may be composed of the MSB FP[15] which is the sign bit of the first data type FP16 16-bit floating point data FP[15:0]. The lower five bits MFP1[15:11] of the exponent bit E1[7:0] of the 20-bit first modulated floating-point data MFP1[19:0] may be composed of 5-bit exponential bits FP[14:10] in first data format FP16 16-bit floating-point data FP[15:0]. In the exponent bit E1[7:0] of the 20-bit first modulated floating point data MFP1[19:0], the remaining upper 3 bits MFP1[18:16] may all be filled with '0'. An uppermost mantissa bit MFP1[10] of the 20-bit first modulated floating point data MFP1[19:0] may be composed of an implicit bit '1'. In the 20-bit first modulated floating point data MFP1[19:0], the remaining 10 bits MFP1[9:0] may be composed of 10-bit mantissa bits FP[9:0] constituting a mantissa in the first data type FP16 16-bit floating-point data FP[15:0].

The second data modulator 4612-2 may perform a modulation operation on the second data type OF16-1 16-bit floating-point data OF1[15:0] transmitted from the 1:4 multiplexer 4611 to output 20-bit second modulated floating-point data MFP2[19:0]. The second modulated floating-point data MFP2[19:0] may be composed of a 1-bit sign bit S2[0], 8-bit exponent bits E2[7:0], and 11-bit mantissa bits 1.M2[9:0](including 1-bit implicit bit).

By the modulation operation by the second data modulator 4612-2, as shown in FIG. 63, an MSB MFP2[19] of the 20-bit second modulated floating-point data MFP2[19:0], that is, the sign bit S2[0] may be composed of an MSB OF1[15], which is a sign bit of the second data type OF16-1 16-bit floating-point data OF1[15:0]. Next, in the exponent bits E2[7:0] of the 20-bit second modulated floating-point data MFP2[19:0], the lower 6 bits MFP2[16:11] may be composed of 6-bit exponent bits OF1[14:9] in second data type OF16-1 16-bit floating-point data OF1[15:0]. In the exponent bits E2[7:0] of the 20-bit second modulated floating-point data MFP2[19:0], the remaining upper 2 bits MFP2[18:17] may all be filled with '0'. An uppermost mantissa bit MFP2[10] of the 20-bit second modulated floating-point data MFP2[19:0] may be composed of an implicit bit '1'. In the mantissa bits MFP2[10:0] of the 20-bit second modulated floating-point data MFP2[19:0], the remaining 9 bits MFP2[9:1] may be composed of 9-bit mantissa bits OF1[8:0] constituting a mantissa in the second data type OF16-1 16-bit floating-point data OF1[15:0]. An LSB MFP2[0] in the mantissa bit MFP2[10:0] of the 20-bit second modulated floating-point data MFP2[19:0] may be filled with '0'.

The third data modulator 4612-3 may perform a modulation operation on the third data type OF16-2 16-bit floating-point data OF2[15:0] transmitted from the 1:4 multiplexer 4611 to output 20-bit third modulated floating-point data MFP3[19:0]. The third modulated floating-point data MFP3[19:0] may be composed of a 1-bit sign bit S3[0], 8-bit exponent bits E3[7:0], and 11-bit mantissa bits 1.M3[9:0] (including 1-bit implicit bit).

Figure 69:
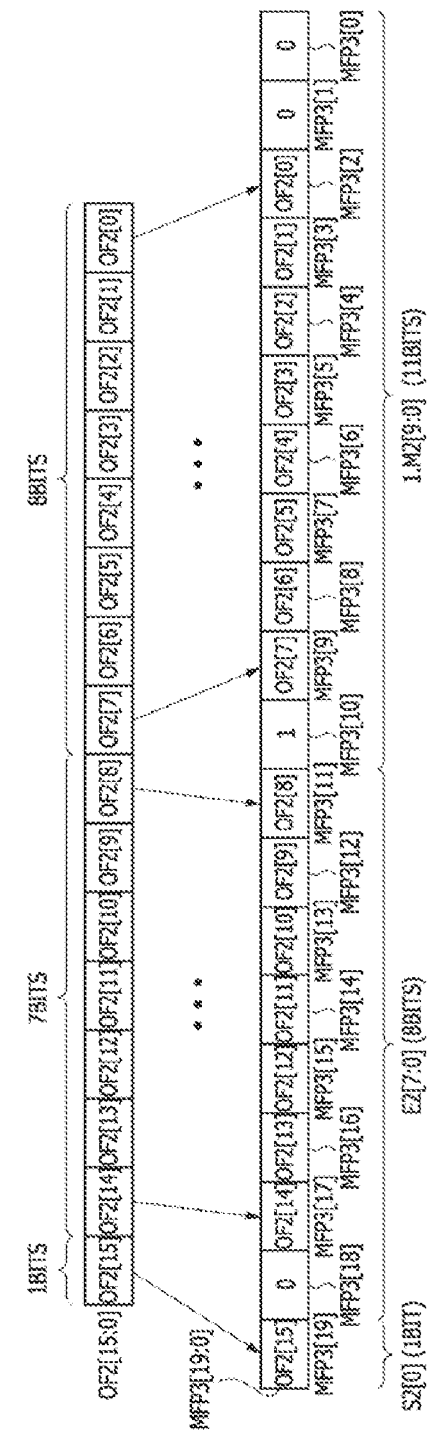

By the modulation operation by the third data modulator 4612-3, as shown in FIG. 69, an MSB MFP3[19] of the 20-bit third modulated floating-point data MFP3[19:0], that is, the sign bit S3[0] may be composed of an MSB OF2[15], which is a sign bit of the third data type OF16-2 16-bit floating-point data OF2[15:0]. Next, in the exponent bits E3[7:0] of the 20-bit third modulated floating-point data MFP3[19:0], the lower 7 bits MFP3[17:11] may be composed of 7-bit exponent bits OF2[14:8] in third data type OF16-2 16-bit floating-point data OF2[15:0]. In the exponent bits E3[7:0] of the 20-bit third modulated floating-point data MFP3[19:0], the remaining upper 1 bit MFP3[18] may be filled with '0'. An uppermost mantissa bit MFP3[10] of the 20-bit third modulated floating-point data MFP3[19:0] may be composed of an implicit bit '1'. In the mantissa bits MFP3[10:0] of the 20-bit third modulated floating-point data MFP3[19:0], the remaining 8 bits MFP3[9:2] may be composed of 8-bit mantissa bits OF2[7:0] constituting a mantissa in the third data type OF16-2 16-bit floating-point data OF2[15:0]. The lowermost 2 bits in the mantissa bits MFP3[10:0] of the 20-bit third modulated floating-point data MFP3[19:0] may all be filled with '0'.

The fourth data modulator 4612-4 may perform a modulation operation on the fourth data type BF16 16-bit floating-point data BF[15:0] transmitted from the 1:4 multiplexer 4611 to output 20-bit fourth modulated floating-point data MFP4[19:0]. The fourth modulated floating-point data MFP4[19:0] may be composed of a 1-bit sign bit S4[0], 8-bit exponent bits E4[7:0], and 11-bit mantissa bits 1.M4[9:0] (including 1-bit implicit bit).

Figure 70:
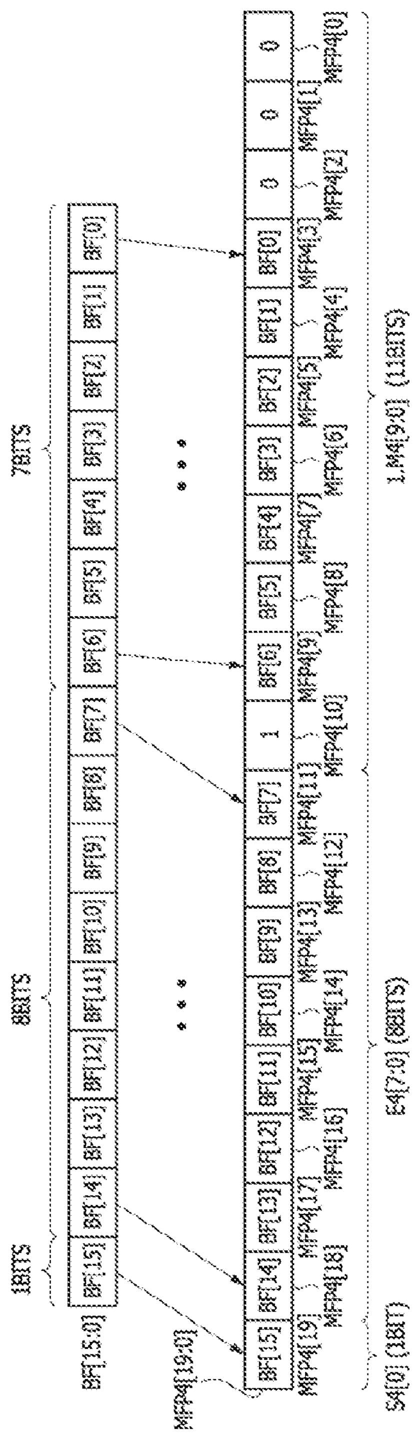

By the modulation operation by the fourth data modulator 4612-4, as shown in FIG. 70, an MSB MFP4[19] of the 20-bit fourth modulated floating-point data MFP4[19:0], that is, the sign bit S4[0] may be composed of an MSB BF[15], which is a sign bit of the fourth data type BF16 16-bit floating-point data BF[15:0]. Next, all bits MFP4[18:11] of the exponent bits E4[7:0] of the 20-bit fourth modulated floating-point data MFP4[19:0] may be composed of 8-bit exponent bits BF[14:7] in the fourth data type BF16 16-bit floating-point data BF[15:0]. An uppermost mantissa bit MFP4[10] of the 20-bit fourth modulated floating-point data MFP4[19:0] may be composed of an implicit bit '1'. In the mantissa bits MFP4[10:0] of the 20-bit fourth modulated floating-point data MFP4[19:0], the 7 bits MFP4[9:3] may be composed of 8-bit mantissa bits BF[6:0] constituting a mantissa in the fourth data type BF16 16-bit floating-point data BF[15:0]. The lowermost 3 bits in the mantissa bits MFP4[10:0] of the 20-bit fourth modulated floating-point data MFP4[19:0] may all be filled with '0'.

Figure 71:
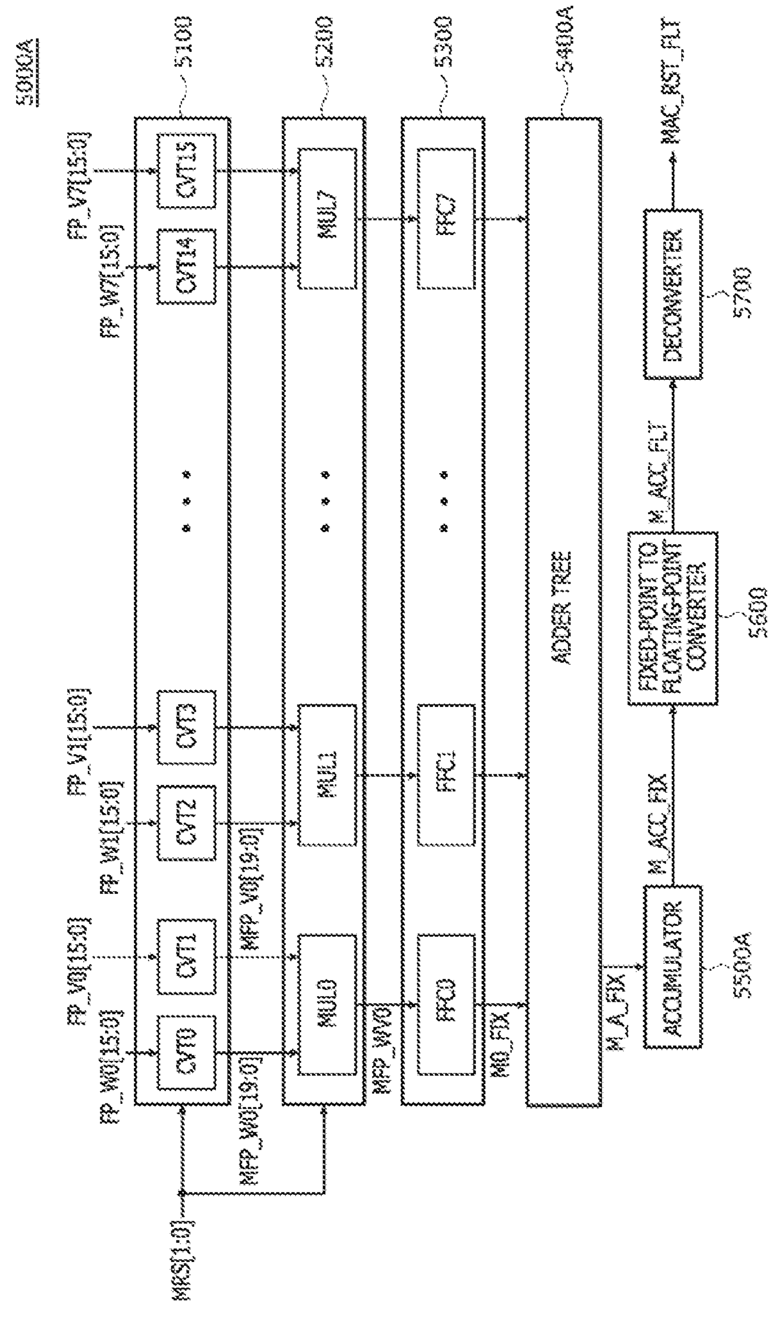
FIG. 71 illustrates a MAC operator according to another embodiment of the present disclosure.

FIG. 71 illustrates a MAC operator 5000A according to another embodiment of the present disclosure. The MAC operator 5000A according to the present embodiment may be applied to the PIM devices 10, 100, and 400 described with reference to FIGS. 1, 2, and 20. Referring to FIG. 71, the MAC operator 5000A according to the present embodiment may include a data type converting circuit 5100 with a plurality of data type converters, for example, first to sixth data type converters CVT0-CVT15, a multiplying circuit 5200 with plurality of multipliers, for example, first to eighth multipliers MUL0-MUL7, a floating-point-to-fixed-point converting circuit 5300 with a plurality of floating-point-to-fixed-point converters, for example, first to eighth floating-point-to-fixed-point converters FFC0-FFC7, an adder tree 5400A, an accumulator 5500A, a fixed-point-to-floating-point converter 5600, and a data type de-converter 5700.

The floating-point-to-fixed-point converting circuit 5300 of the MAC operator 5000A according to the present embodiment may be substantially the same as the floating-point-to-fixed-point converting circuit 1200 of the MAC operator 1000 described with reference to FIG. 31. The adder tree 5400A and the accumulator 5500A of the MAC operator 5000A according to the present embodiment may be substantially the same as the adder tree 1300 and the accumulator 1400 of the MAC operator 1000 described with reference to FIG. 31. The fixed-point-to-floating-point converter 5600 of the MAC operator 5000A according to the present embodiment may be substantially the same as the floating-point-to-fixed-point converter 3500 described with reference to FIG. 55. Hereinafter, descriptions of contents overlapping with those already described will be omitted.

A pair of adjacent data format converters among the first to sixteenth data format converters CVT0-CVT15 may each receive floating-point format first to eighth weight data FP_W0[15:0]-FP_W7[15:0] and floating-point format first to eighth vector data FP_V0[15:0]-FP_V7[15:0]. For example, the first data type converter CVT0 and the second data type converter CVT1 may receive the floating-point format first weight data FP_W0[15:0] and the floating-point format first vector data FP_V0[15:0], respectively. The third data type converter CVT2 and the fourth data type converter CVT3 may receive the floating-point format second weight data FP_W1[15:0] and the floating-point format second vector data FP_V1[15:0], respectively. Each of the pairs of the remaining data type converters may also receive weight data and vector data in the same manner.

In the present embodiment, each of the first to eighth weight data FP_W0[15:0]-FP_W7[15:0] and each of the first to eighth vector data FP_V0[15:0]-FP_V7[15:0] may have a plurality of floating-point format 16-bit data types. Hereinafter, Hereinafter, as described with reference to FIG. 59, the first to eighth weight data FP_W0[15:0]-FP_W7[15:0] and the first to eighth vector data FP_V0[15:0]-FP_V7[15:0] may each have a first data format FP16, a second data format OF16-1, a third data format OF16-2, and a fourth data format BF16, for example. As described with reference to FIG. 59, the first data format FP16 may be composed of a 1-bit sign, a 5-bit exponent, and a 10-bit mantissa. The second data format OF16-1 may be composed of a 1-bit sign, a 6-bit exponent, and a 9-bit mantissa. The third data format OF16-1 may be composed of a 1-bit sign, a 7-bit exponent, and an 8-bit mantissa. The fourth data format BF16 may be composed of a 1-bit sign, a 8-bit exponent, and a 7-bit mantissa. In addition, the first to fourth data types FP16, OF16-1, OF16-2, and BF16 may be identified by a mode register setting signal MRS[1:0].

Each of the first to sixteenth data type converters CVT0-CVT15 may perform a converting operation of converting a data type of inputted data into a modulated data type. The modulated data type may be variously set in consideration of computational performance or hardware area. Hereinafter, a case in which the modulated data type is a 20-bit floating-point format consisting of a 1-bit sign, an 8-bit exponent, and an 11-bit (including implicit bit) mantissa will be described as an example. Accordingly, the first data type converter CVT0 may convert a data type of the 16-bit weight data FP_W0[15:0] to output 20-bit first modulated weight data MFP_W0[19:0]. Similarly, the second data type converter CVT1 may convert a data type of the 16-bit first vector data FP_V0[15:0] to output 20-bit first modulated vector data MFP_V0[19:0]. The data type converting operation performed by each of the first to sixteenth data format converters CVT0-CVT15 may be performed in response to a mode register setting signal MRS[1:0].

Among the first to sixteenth data format converters CVT0 to CVT15, a pair of adjacent data format converters may be coupled with corresponding one of the first to eighth multipliers MUL0-MUL7. For example, the first and second data type converters CVT0 and CVT1 may be coupled to the first multiplier MUL0. Accordingly, the first modulated weight data MFP_W0[19:0] that is output from the first data type converter CVT0 and the first modulated vector data MFP_V0[19:0] that is output from the second data type converter CVT1 may be transmitted to the first multiplier MUL0.

Each of the first to eighth multipliers MUL0-MUL7 may perform a multiplication operation on the modulated weight data MFP_W[19:0] and the modulated vector data MFP_V[19:0] transmitted from a pair of data type converters and output the result, modulated multiplication result data MFP_WV. For example, the first multiplier mul0 may perform a multiplication operation on the first modulated weight data MFP_W0[19:0] transmitted from the first data type converter CVT0 and the first modulated vector data MFP_V0[19:0] transmitted from the second data type converter CVT1, and output the first modulated multiplication result data MFP_WV0, which is multiplication result. The remaining second to eighth multipliers MUL1-MUL7 may also operate in the same manner. Each of the first to eighth multipliers MUL0-MUL7 may perform a process of adjusting an exponential bias in response to a mode register setting signal MRS[1:0] in a process of performing multiplication. The modulated multiplication result data MFP_WV that is output from each of the first to eighth multipliers MUL0-MUL7 may have various data types based on the configuration of the multiplier MUL, which will be described in more detail below.

The first to eighth floating-point-to-fixed-point converters FFC0_FFC7 may perform a converting operation of converting a floating-point format to a fixed-point format for the modulated multiplication result data MFP_WV0 transmitted from each of the first to eighth multipliers MUL0-MUL7, respectively. Each of first to eighth floating-point-to-fixed-point converters FFC0_FFC7 may transmit the floating-point format multiplication result data M_FIX generated as a result of conversion to the adder tree 5400A. In an embodiment, each of the first to eighth floating-point-to-fixed-point converters FFC0_FFC7 may have substantially the same configuration as the first floating-point-to-fixed-point converter FFC0 included in the floating-point-to-fixed-point converting circuit 1200 described with reference to FIG. 35, and accordingly, a duplicate description will be omitted.

The data type deconverter 5700 may perform an operation of restoring the data type of the modulated floating-point multiplication-accumulation data M_ACC_FLT transmitted from the fixed-point-to-floating-point converter 5600 back to the original data type. For example, when the data type of the weight data and vector data inputted to the MAC operation is the fourth data type BF16 among the first to fourth data types FP16, OF16-1, OF16-2, and BF16, the data type deconverter 5700 may restore the data type of the floating-point type multiplication-accumulation data M_ACC_FLT to the fourth data type BF16. The data type deconverter 5700 may output floating-point type data restored in the fourth data type BF16 as MAC result data MAC_RST_FLT. Although the fixed-point-to-floating-point converter 5600 and the data type deconverter 5700 are classified in this embodiment, this is only for convenience of explanation. The data type deconverter 5700 may be disposed in the fixed-point-to-floating-point converter 5600 to operate in a process of converting from a fixed-point format to a floating-point format.

Figure 72:
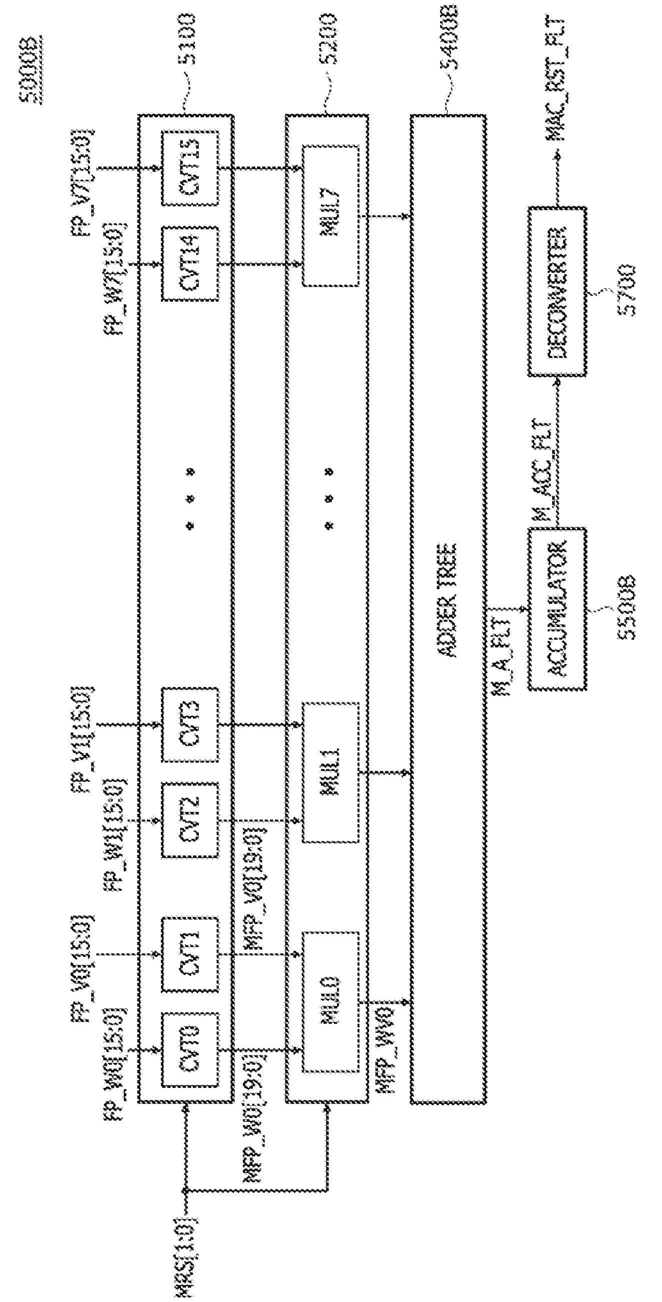
FIG. 72 illustrates a MAC operator according to another embodiment of the present disclosure.

FIG. 72 illustrates a MAC operator 5000B according to another embodiment of the present disclosure. The MAC operator 5000B according to the present embodiment may be applied to the PIM devices 10, 100, and 400 described with reference to FIGS. 1, 2, and 20. Referring to FIG. 72, the MAC operator 5000B according to the present embodiment may include a data type converting circuit 5100 with a plurality of data type converters, for example, first to sixteenth data type converters CVT0-CVT15, a multiplying circuit 5200 with a plurality of multipliers, for example, first to eighth multipliers MUL0-MUL7, an adder tree 5400B, an accumulator 5500B, and a data type deconverter 5700.

The data type converting circuit 5100 of the MAC operator 5000B according to the present embodiment and the first to sixteenth data type converters CVT0-CVT15 included therein may be configured in the same manner as described with reference to FIG. 71. The multiplying circuit 5200, and the first to eighth multipliers MUL0-MUL7 included therein may also be configured in the same manner as described with reference to FIG. 71. The MAC operator 5000A described with reference to FIG. 71 includes the floating-point-to-fixed-point converting circuit 5300, and accordingly, the adder tree 5400A and the accumulator 5500A are configured to be able to perform multiplying and accumulating operations on the fixed-point format. On the other hand, in the case of the MAC operator 5000B according to the present embodiment, the floating-point format modulated multiplication result data MFP_WVs that is output from the first to eighth multipliers MUL0-MUL7 are transmitted to the adder tree 5400B. Except for performing addition and accumulation on the floating-point format data as described above, the adder tree 5400B and the accumulator 5500B may be configured in substantially the same manner as the adder tree 1300 and the accumulator 1400 of the MAC operator 1000 described with reference to FIG. 31.

The MAC operator 5000B according to the present embodiment might not include the floating-point multiplying circuit 5300 included in the MAC operator 5000A described with reference to FIG. 71. Accordingly, as described above, the adder tree 5400B and the accumulator 5500B may perform an addition operation and accumulation on the floating-point format data. Accordingly, the MAC operator 5000B according to the present embodiment might not require the converting process from the floating-point format to the fixed-point format during data output. That is, the floating point multiplication-accumulation data M_ACC_FLT transmitted from the accumulator 5500B may be restored to the original data type by the data type deconverter 5700, and then output from the MAC operator 5000B as MAC result data MAC_RST_FLT.

Figure 73:
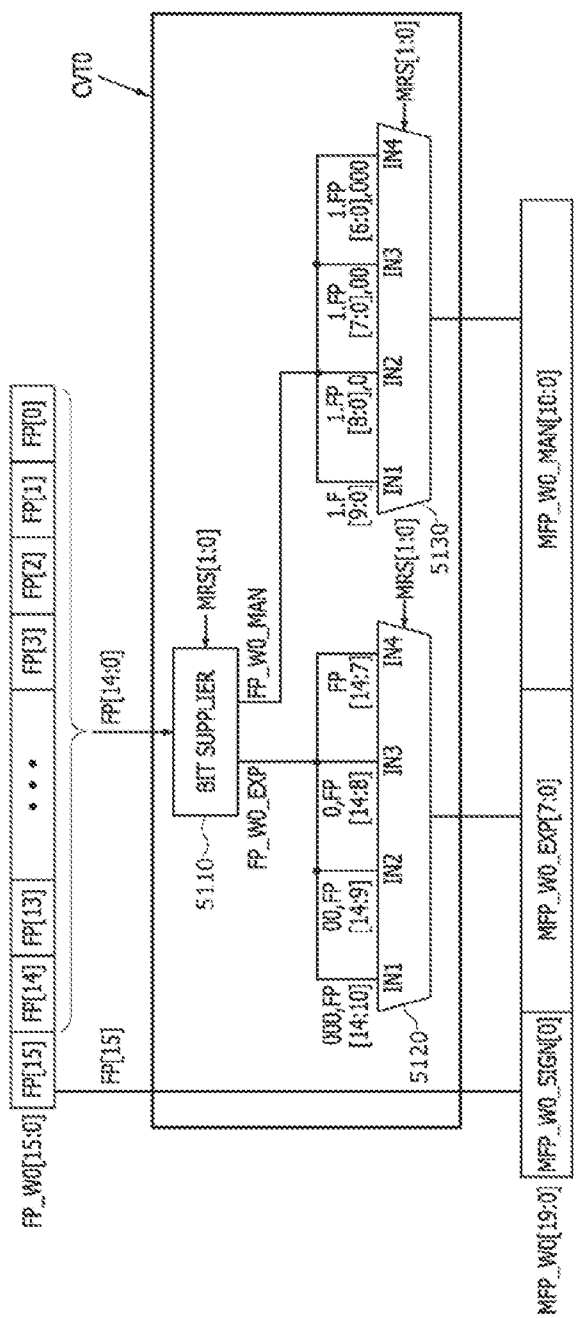
FIG. 73 illustrates an embodiment of a first data type converter of the MAC operators of FIGS. 71 and 72.

FIG. 73 illustrates an embodiment of a first data type converter CVT0 of the MAC operators 5000A and 5000B of FIGS. 71 and 72. The description of the first data type converter CVT0 below may also be applied to the second to sixteenth data type converters CVT1-CVT15 of the MAC operators 5000A and 5000B of FIGS. 71 and 72. Referring to FIG. 73, the first data type converter CVT0 may perform data type converting on the transmitted 16-bit floating-point format first weight data FP_W0[15:0] to output 20-bit floating-point format first modulated weight data MFP_W0[19:0]. All of the first to fourth data types FP16, OF16-1, OF16-2, and BF16 that the first weight data FP_W0[15:0] may have include a 1-bit sign bit. The first modulated weight data MFP_W0[19:0] that is output from the first data type converter CVT0 may also include a 1-bit sign bit. Accordingly, the MSB FP[15] that is the sign bit of the first weight data FP_W0[15:0] may constitute the sign bit MFP_W0_SIGN[0] of the first modulated weight data MFP_W0[19:0] without converting in the first data type converter CVT0.

In an embodiment, the first data type converter CVT0 may include a bit supplier 5110, a first 4:1 demultiplexer 5120, and a second 4:1 demultiplexer 5130. The first 4:1 demultiplexer 5120 may have first to fourth input terminal IN1-IN4, a control terminal, and an output terminal. The second 4:1 demultiplexer 5130 may also include first to fourth input terminals IN1-IN4, a control terminal, and an output terminal. The bit supplier 5110 may supply an exponent FP_W0_EXP and a mantissa FP_W0_MAN in the received floating-point format 16-bit first weight data FP_W0[15:0] to the first 4:1 demultiplexer 5120 and the second 4:1 demultiplexer 5130, respectively.

As described with reference to FIG. 59, in the first to fourth data types FP16, OF16-1, OF16-2, and BF16, the number of bits constituting the exponent and the number of bits constituting the mantissa may be different. Accordingly, the exponent FP_W0_EXP that is output from the bit supplier 5110 may have a different number of bits according to the data type of the first weight data FP_W0[15:0]. Similarly, the mantissa FP_W0_MAN that is output from the bit supplier 5110 may also have a different number of bits according to the data type of the first weight data FP_W0[15:0]. The bit supply 5110 may transmit the exponent FP_W0_EXP of the first weight data FP_W0[15:0] to an input terminal selected by a mode register setting signal MRS[1:0] among the first to fourth input terminals IN1-IN4 of the first 4:1 demultiplexer 5120. In addition, the bit supply 5110 may transmit the mantissa FP_W0_MAN of the first weight data FP_W0[15:0] to an input terminal selected by the mode register setting signal MRS[1:0] among the first to fourth input terminals IN1-IN4 of the second 4:1 demultiplexer 5130.

If the first weight data FP_W0[15:0] is in the first data type FP16, the first weight data FP_W0[15:0] may include a 5-bit exponent FP_W0_EXP and a 10-bit mantissa FP_W0_MAN. The bit supply 5110 may transmit 5 bits FP[14:10] in the first weight data FP_W0[15:0] constituting the exponent FP_W0_EXP to the first input terminal IN1 of the first 4:1 demultiplexer 5120 in response to the mode register setting signal MRS[1:0] of "00". In addition, the bit supplier 5110 may transmit 10 bits FP[9:0] constituting the mantissa FP_W0_MAN in the first weight data FP_W0[15:0] to the first input IN1 of the second 4:1 demultiplexer 5130.

If the first weight data FP_W0[15:0] Is in the second data type OP16-1, the first weight data FP_W0[15:0] may include a 6-bit exponent FP_W0_EXP and a 9-bit mantissa FP_W0_MAN. The bit supply 5110 may transmit 6 bits FP[14:9] constituting the exponent FP_W0_EXP in the first weight data FP_W0[15:0] to the first input terminal IN1 of the first 4:1 demultiplexer 5120 in response to the mode register setting signal MRS[1:0] of "01". In addition, the bit supplier 5110 may transmit 9 bits FP[8:0] constituting the mantissa FP_W0_MAN in the first weight data FP_W0[15:0] to the first input IN1 of the second 4:1 demultiplexer 5130.

If the first weight data FP_W0[15:0] is in the third data type OP16-2, the first weight data FP_W0[15:0] may include a 7-bit exponent FP_W0_EXP and an 8-bit mantissa FP_W0_MAN. The bit supply 5110 may transmit 7 bits FP[14:8] constituting the exponent FP_W0_EXP in the first weight data FP_W0[15:0] to the first input terminal IN1 of the first 4:1 demultiplexer 5120 in response to the mode register setting signal MRS[1:0] of "10". In addition, the bit supplier 5110 may transmit 8 bits FP[7:0] constituting the mantissa FP_W0_MAN in the first weight data FP_W0[15:0] to the first input IN1 of the second 4:1 demultiplexer 5130.

If the first weight data FP_W0[15:0] is in the fourth data type BP16, the first weight data FP_W0[15:0] may include an 8-bit exponent FP_W0_EXP and a 7-bit mantissa FP_W0_MAN. The bit supply 5110 may transmit 8 bits FP[14:7] constituting the exponent FP_W0_EXP in the first weight data FP_W0[15:0] to the first input terminal IN1 of the first 4:1 demultiplexer 5120 in response to the mode register setting signal MRS[1:0] of "11". In addition, the bit supplier 5110 may transmit 7 bits FP[6:0] constituting the mantissa FP_W0_MAN in the first weight data FP_W0[15:0] to the first input IN1 of the second 4:1 demultiplexer 5130.

The first 4:1 demultiplexer 5120 may output data of one input terminal selected among the first to fourth input terminals IN1-IN4 in response to the mode register setting signal MRS[1:0]. To match the 8-bit exponent MFP_W0_EXP[7:0] of the first modulated weight data MFP_W0[19:0], the first 4:1 demultiplexer 5120 may be configured to include an appropriate number of "0s" in the exponents FP_W0_EXP transmitted to each of the first to third input terminals IN1-IN3. The second 4:1 demultiplexer 5130 may output data of an input terminal selected among the first to fourth input terminals IN1-IN4 in response to the mode register setting signal MRS[1:0]. To match the 11-bit exponent MFP_W0_EXP[10:0] of the first modulated weight data MFP_W0[19:0], the second 4:1 demultiplexer 5130 may be configured to include an implicit bit in an exponent FP_W0_EXP transmitted to each of the first to fourth input terminals IN1-IN4, and so that in the exponent FP_W0_EXP transmitted to each of the second to fourth input terminals IN2-IN4, an appropriate number of "0s" is included in the lower bits.

If the first weight data FP_W0[15:0] is in the first data type FP1, the first 4:1 demultiplexer 5120 may output 8-bit data 000,FP[14:10] in which "000" is added to the upper 5 bits FP[14:10] of the first weight data FP_W0[15:0] transmitted to the first input terminal IN1 in response to the mode register setting signal MRS[1:0] of "00". The second 4:1 demultiplexer 5130 may output 11-bit data 1.FP[9:0] in which an implicit bit is added to 10 bits FP[9:0] of the first weight data FP_W0[15:0] transmitted to the first input terminal IN1 in response to the mode register setting signal MRS[1:0] of "00". The 8-bit data 000,FP[14:10] and the 11-bit data 1.FP[9:0] that is output from the first 4:1 demultiplexer 5120 and the second 4:1 demultiplexer 5130, respectively, may constitute 8-bit exponent bits MFP_W0_EXP[7:0] and 11-bit mantissa bits MFP_W0_MAN[10:0] of the first modulated weight data MFP_W0[19:0], respectively.

If the first weight data FP_W0[15:0] is in the second data type OF16-1, the first 4:1 demultiplexer 5120 may output 8-bit data 000,FP[14:9] in which "00" is added to the upper 6 bits FP[14:9] of the first weight data FP_W0[15:0] transmitted to the second input terminal IN2 in response to the mode register setting signal MRS[1:0] of "01". The second 4:1 demultiplexer 5130 may output 11-bit data 1.FP[8:0],0 in which an implicit bit and '0' are added to 9 bits FP[8:0] of the first weight data FP_W0[15:0] transmitted to the second input terminal IN2 in response to the mode register setting signal MRS[1:0] of "01". The 8-bit data 00,FP[14:9] and the 11-bit data 1.FP[8:0],0 that are output from the first 4:1 demultiplexer 5120 and the second 4:1 demultiplexer 5130, respectively, may constitute 8-bit exponent bits MFP_W0_EXP[7:0] and 11-bit mantissa bits MFP_W0_MAN[10:0] of the first modulated weight data MFP_W0[19:0], respectively.

If the first weight data FP_W0[15:0] is in the third data type OF16-2, the first 4:1 demultiplexer 5120 may output 8-bit data 000,FP[14:8] in which "0" is added to the upper 7 bits FP[14:8] of the first weight data FP_W0[15:0] transmitted to the third input terminal IN3 in response to the mode register setting signal MRS[1:0] of "10". The second 4:1 demultiplexer 5130 may output 11-bit data 1.FP[7:0] in which an implicit bit and '00' are added to 8 bits FP[7:0] of the first weight data FP_W0[15:0] transmitted to the third input terminal IN3 in response to the mode register setting signal MRS[1:0] of "10". The 8-bit data 0,FP[14:8] and the 11-bit data 1.FP[7:0],00 that are output from the first 4:1 demultiplexer 5120 and the second 4:1 demultiplexer 5130, respectively, may constitute 8-bit exponent bits MFP_W0_EXP[7:0] and 11-bit mantissa bits MFP_W0_MAN[10:0] of the first modulated weight data MFP_W0[19:0], respectively.

If the first weight data FP_W0[15:0] is in the fourth data type BF16, the first 4:1 demultiplexer 5120 may output 8 bits FP[14:7] transmitted to the fourth input terminal IN4 as it is in response to the mode register setting signal MRS[1:0] of "11". The second 4:1 demultiplexer 5130 may output 11-bit data 1.FP[6:0],000 in which an implicit bit and '000' are added to 7 bits FP[6:0] of the first weight data FP_W0[15:0] transmitted to the fourth input terminal IN4 in response to the mode register setting signal MRS[1:0] of "11". The 8-bit data FP[14:7] and the 11-bit data 1.FP[6:0], 000 that are output from the first 4:1 demultiplexer 5120 and the second 4:1 demultiplexer 5130, respectively, may constitute 8-bit exponent bits MFP_W0_EXP[7:0] and 11-bit mantissa bits MFP_W0_MAN[10:0] of the first modulated weight data MFP_W0[19:0], respectively.

Figure 74:
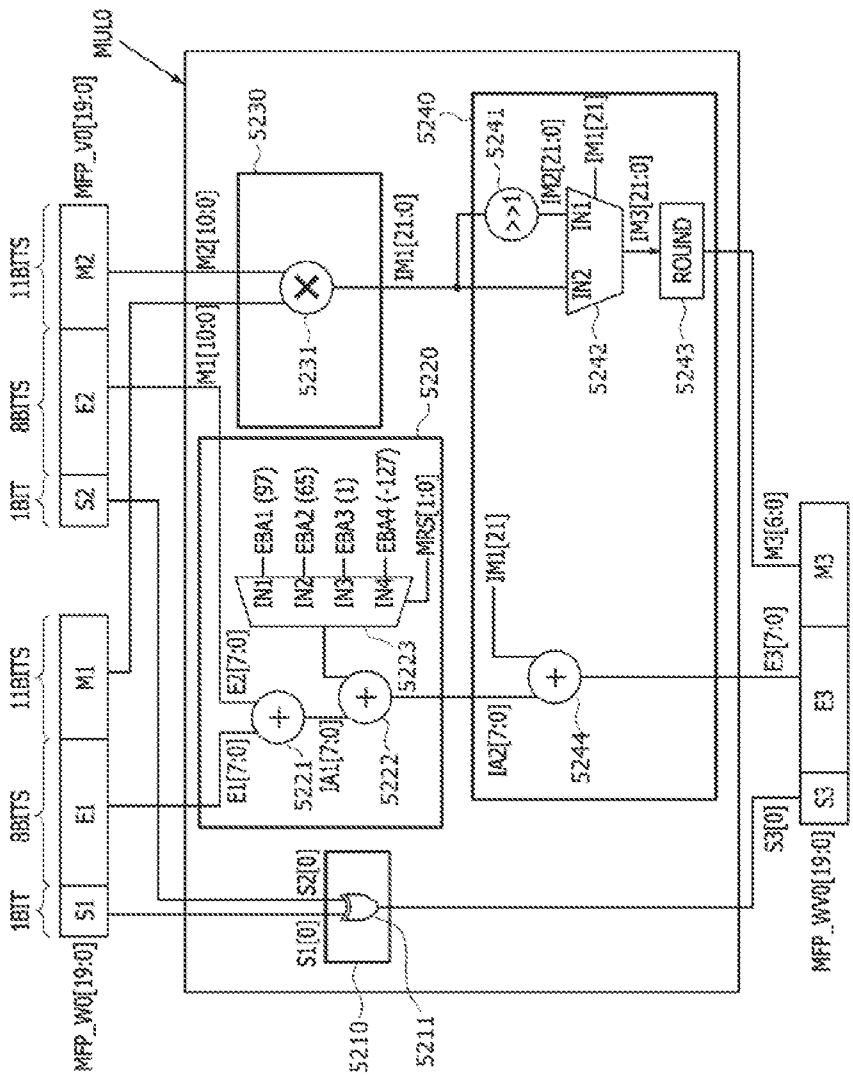
FIG. 74 illustrates an embodiment of a first multiplier of the MAC operators of FIGS. 71 and 72.

FIG. 74 illustrates an embodiment of the first multiplier MUL0 of the MAC operators 5000A and 5000B of FIGS. 71 and 72. The description of the configuration and operation of the first multiplier MUL0 according to the present embodiment may be equally applied to the remaining second to eighth multipliers MUL1-MUL7 constituting the multiplication circuit 5200. Referring to FIG. 74, the first multiplier MUL0 may include a code processing circuit 5210, an exponent processing circuit 5220, a mantissa processing circuit 5230, and a normalizer 5240.

The code processing circuit 5210 includes an XOR gate 5211. The XOR gate 5211 may perform an XOR operation on a sign bit S1[0] of the first modulated weight data MFP_W0[19:0] and a sign bit S2[0] of the first modulated vector data MFP_V0[19:0] to output a result. The sign bit S3[0] that is output from the XOR gate 5211 may constitute a sign S3 of the first modulated multiplication result data MFP_WV0[19:0].

The exponent processing circuit 5220 may include a first exponent adder 5221, a second exponent adder 5222, and a 4:1 multiplexer 5223. The first exponent adder 5221 may perform an addition operation on exponent bits E1[7:0] of the first modulated weight data MFP_W0[19:0] and exponent bits E2[7:0] of the first modulated vector data MFP_V0[19:0], and output 8-bit first intermediate addition data IA1[7:0] as an addition result. The second exponential adder 5222 may perform an addition operation on the 8-bit intermediate addition data IA1[7:0] that is output from the first exponent adder 5221 and an exponent bias adjust value that is output from the 4:1 multiplexer 5223, and output 8-bit second intermediate addition data IA2[7:0] as addition result. The 8-bit second intermediate addition data IA2[7:0] that is output from the second exponent adder 5222 may be transmitted to the normalizer 5240.

The first weight data FP_W0[15:0] and the first vector data FP_V0[15:0] inputted to the MAC operators 5000A and 5000B according to the present embodiment may include an exponent obtained by adding an exponential bias. Accordingly, both of the exponent bits E1[7:0] of the first modulated weight data MFP_W0[19:0] and exponent bits E2[7:0] of the first modulated vector data MFP_V0[19:0] include an exponential bias. Further, the first intermediate addition data IA1 that is output from the first exponent adder 5221 may include an exponent obtained by adding (exponential bias*2). However, the exponential bias may represent different values based on the data type.

As described with reference to FIG. 62, the first to fourth data types FP16, OF16-1, OF16-2, and BF16 may have exponential biases of '15,' '31,' '63,' and '127', respectively. According to this, if the first weight data FP_W0[15:0] and the first vector data FP_V0[15:0] are in the first data type FP16, the exponent of the first intermediate addition data IA1[7:0] that is output from the first exponent adder 5221 may be in a state in which an exponential bias of '30' has been added. If the first weight data FP_W0[15:0] and the first vector data FP_V0[15:0] are in the second data type OF16-1, the exponent of the first intermediate addition data IA1[7:0] that is output from the first exponent adder 5221 may be in a state in which an exponential bias of '62' has been added. If the first weight data FP_W0[15:0] and the first vector data FP_V0[15:0] are in the third data type OF16-1, the exponent of the first intermediate addition data IA1[7:0] that is output from the first exponent adder 5221 may be in a state in which an exponential bias of '126' has been added. Further, if the first weight data FP_W0[15:0] and the first vector data FP_V0[15:0] are in the fourth data type BF16, the exponent of the first intermediate addition data IA1[7:0] that is output from the first exponent adder 5221 may be in a state in which an exponential bias of '254' has been added.

As described above, if the state in which exponential biases of different values are applied according to the data type is maintained, it may be a cumbersome to consider this in several subsequent calculation processes. Accordingly, in this embodiment, in order to use the largest number that can be expressed regardless of the data format when performing the addition operation in the second exponent adder 5222, the exponential bias of the fourth data type BF16 with the largest value may be applied to other data types FP16, OF16-1, and OF16-2. To this end, the 4:1 multiplexer 5223 may be configured so that each of the first to fourth exponential bias adjustment values EBA1-EBA4 is inputted to each of the first to fourth input terminals IN1-IN4. For example, if the mode register setting signal MRS[1:0] of '00' is transmitted, the 4:1 multiplexer 5223 may transmit a first exponential bias adjustment value EBA1 to the second exponential adder 5222. If the mode register setting signal MRS[1:0] of '01' is transmitted, the 4:1 multiplexer 5223 may transmit a second exponential bias adjustment value EBA2 to the second exponential adder 5222. If the mode register setting signal MRS[1:0] of '10' is transmitted, the 4:1 multiplexer 5223 may transmit a third exponential bias adjustment value EBA3 to the second exponential adder 5222. If the mode register setting signal MRS[1:0] of '11' is transmitted, the 4:1 multiplexer 5223 may transmit a fourth exponential bias adjustment value EBA4 to the second exponential adder 5222.

In the case of the first data type FP16, because the first intermediate data IA1[7:0] is in a state to which the exponential bias of '30' has been added, in order to have an exponential bias of '127', '97' is added. That is, the first exponential bias adjusting value EBA1 may be set to '97'. In the case of the second data type OF16-1, because the first intermediate data IA1[7:0] is in a state to which the exponential bias of '62' has been added, in order to have an exponential bias of '127', '65' is added. That is, the second exponential bias adjusting value EBA2 may be set to '65'. In the case of the third data type OF16-2, because the first intermediate data IA1[7:0] is in a state to which the exponential bias of '127' has been added, in order to have an exponential bias of '127', '1' is added. That is, the third exponential bias adjusting value EBA3 may be set to '1'. In the case of the fourth data type BF16, because the first intermediate data IA1[7:0] is in a state to which the exponential bias of '254' has been added, in order to have an exponential bias of '127', '−127' is added. That is, the fourth exponential bias adjusting value EBA4 may be set to '−127'. The second intermediate addition data IA2[7:0] that is output from the second exponential adder 5222 has a state to which the exponential bias '127' has been added regardless of the data type.

The mantissa processing circuit 5230 may include a mantissa multiplier 5231. The mantissa multiplier 5231 may perform a multiplication operation on mantissa bits M1[10:0] of the first modulated weight data MFP_W0[19:0] and mantissa bits M2[7:0] of the first modulated vector data MFP_V0[19:0]. As described with reference to FIG. 73, because the mantissa bits of the first modulated weight data MFP_W0[19:0] and the first modulated vector data MFP_V0[19:0] already contain an implicit bit, the mantissa bits M1[10:0] and M2[10:0] may be inputted to the mantissa multiplier 5231 as it is without adding implicit bits. The mantissa multiplier 5231 may output 22-bit first intermediate multiplication data IM1[21:0] as multiplication result data. The first intermediate multiplication data IM1[21:0] that is output from the mantissa multiplier 5231 may be transmitted to the normalizer 5240.

The normalizer 5240 may include a floating-point moving unit 5241, a multiplexer 5242, a round processing unit 5443, and a third exponential adder 5244. The floating-point moving unit 5241 may receive 22-bit first intermediate multiplication data IM1[21:0] transmitted from the mantissa multiplier 5231, and output second intermediate multiplication data IM2[21:0] in which the binary point has been shifted by one bit toward the MSB of the first intermediate multiplication data IM1[21:0]. Accordingly, the binary point of the second intermediate multiplication data IM2[21:0] may be positioned between a 22nd bit IM2[20] and an MSB IM2[21] of the second intermediate multiplication data IM2[21:0]. The second intermediate multiplication data IM2[21:0] that is output from the floating-point moving unit 5241 may be transmitted to a first input terminal IN1 of the multiplexer 5242.

The multiplexer 5242 may receive the second intermediate multiplication data IM2[21:0] by the floating-point moving unit 5241 through the first input terminal IN1, and receive the first intermediate multiplication data IM1[21:0] that is output from the mantissa multiplier 5231 through a second input terminal IN2. The multiplexer 5242 may output third intermediate multiplication data IM3[21:0] in response to the MSB IM1[21] of the first intermediate multiplication data IM1[21:0]. If the MSB IM1[21] of the first intermediate multiplication data IM1[21:0] is '1', the multiplexer 5242 may output the second intermediate multiplication data IM2[21:0] inputted through the first input terminal IN1 as the third intermediate multiplication data IM3[21:0]. If the MSB IM1[21] of the first intermediate multiplication data IM1[21:0] is '0', the multiplexer 5242 may output the first intermediate multiplication data IM1[21:0] inputted through the second input terminal IN2 as the third intermediate multiplication data IM3[21:0].

The round processing unit 5243 may remove an implicit bit and lower 10 bits from the 22-bit third intermediate multiplication data IM3[21:0] that is output from the multiplexer 5242 to make the data size become 11 bits. In this process, the round processing unit 5443 may perform round processing. During round processing, a '+1' adding operation according to roundup may be performed. The round processing unit 5443 may output 11-bit mantissa bits M3[10:0]. The mantissa bits M3[10:0] that are output from the round processing unit 5443 may constitute the mantissa M3 of the first modulated multiplication result data MFP_WV0[19:0].

The third exponent adder 5244 may perform an addition operation on the 8-bit second intermediate multiplication data IM2[7:0] that is output from the second exponent adder 5222 and the MSB IM1[21] of the first intermediate multiplication data IM1[21:0] that is output from the mantissa multiplier 5231. If the MSB IM1[21] of the first intermediate multiplication data IM1[21:0] is '0', the 8-bit exponent bits E3[7:0] that are output from the third exponent adder 5244 may be the same as the second intermediate multiplication data IM2[7:0] that is output from the second exponent adder 5222. If the MSB IM1[21] of the first intermediate multiplication data IM1[21:0] is '1', the 8-bit exponent bits E3[7:0] that are output from the third exponent adder 5244 may have a value greater by '1' than the second intermediate addition data IM2[7:0] that is output from the second exponent adder 5222. The exponent bits E3[7:0] that are output from the third exponent adder 5244 may constitute the exponent E3 of the first modulated multiplication result data MFP_WV0[19:0].

Figure 75:
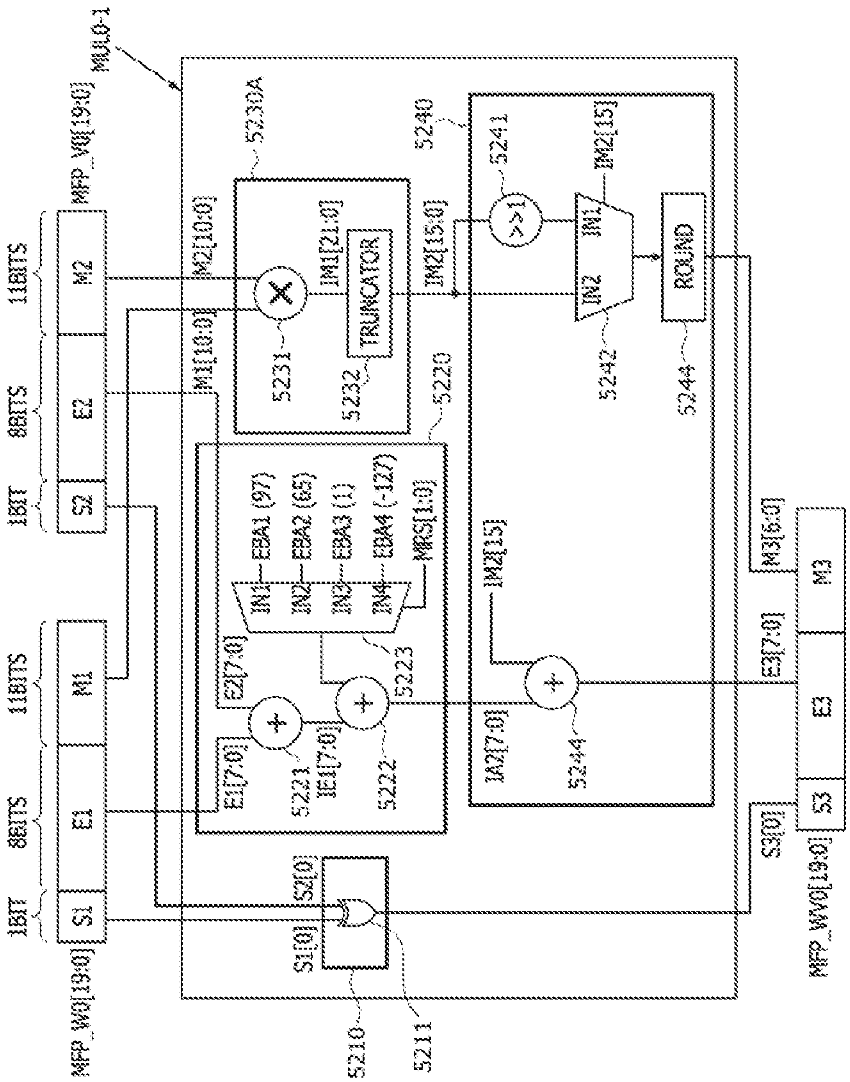
FIG. 75 illustrates another embodiment of the first multiplier of the MAC operators of FIGS. 71 and 72.

FIG. 75 illustrates another embodiment of the first multiplier MUL0 of the MAC operators 5000A and 5000B of FIGS. 71 and 72. In FIG. 75, the same reference numerals as in FIG. 74 denote the same components, and redundant descriptions will be omitted below. Referring to FIG. 75, a first multiplier MUL0-1 according to this embodiment may differ from the first multiplier MUL0 of FIG. 74 in that the mantissa processing circuit 5230A further includes a bit truncator 5232. The bit truncator 5232 may perform an operation of removing the lower bits of the first intermediate multiplication data IM1[21:0] that is output from the mantissa multiplier 5231. In an embodiment, the bit truncator 5322 may truncate the lower 6 bits of the 22-bit first intermediate multiplication data IM1[21:0] to output 16-bit second intermediate multiplication data IM2[15:0]. The 16-bit second intermediate multiplication data IM2[15:0] that is output from the bit truncator 5232 may be transmitted to the floating=point moving unit 5241 and a second input terminal IN2 of the multiplexer 5242 of the normalizer 5240. The data processing process in the normalizer 5240 may be the same as described with reference to FIG. 74.

Figure 76:
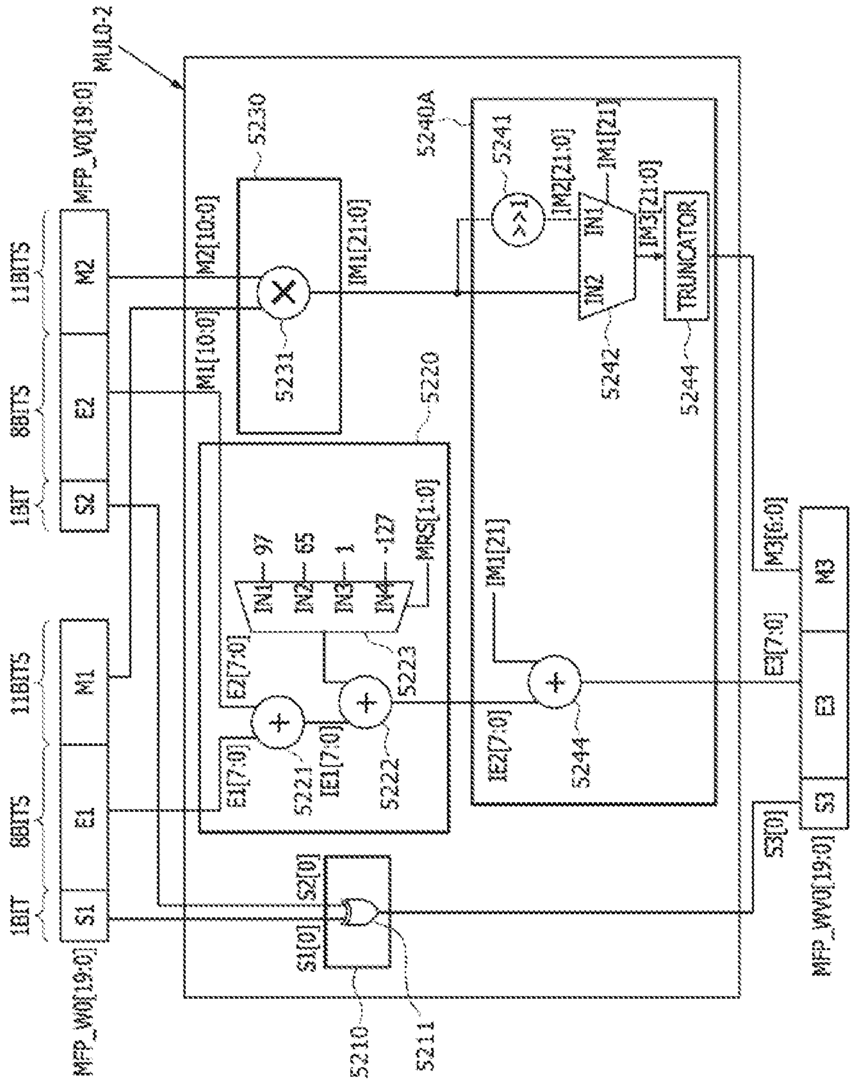
FIG. 76 illustrates yet another embodiment of the first multiplier of the MAC operators of FIGS. 71 and 72.

FIG. 76 illustrates yet another embodiment of a first multiplier MUL0 of the MAC operators 5000A and 5000B of FIGS. 71 and 72. In FIG. 76, the same reference numerals as in FIG. 74 denote the same components, and redundant descriptions will be omitted below. Referring to FIG. 76, the first multiplier MUL0-2 according to the present embodiment may differ from the first multiplier MUL0 of FIG. 74 in that a normalizer 5240A further includes a bit truncator 5244. The bit truncator 5244 may perform an operation of removing lower bits of the third intermediate multiplication data IM3[21:0] that is output from the multiplexer 5242 of the normalizer 5240A. In an embodiment, the bit truncator 5244 may truncate 6 lower bits of the 22-bit third intermediate multiplication data IM3[21:0] to output 11-bit mantissa bits M3[10:0]. The mantissa bits M3[10:0] may constitute a mantissa M3 of the first modulated multiplication data MFP_WV0[19:0].

Figure 77:
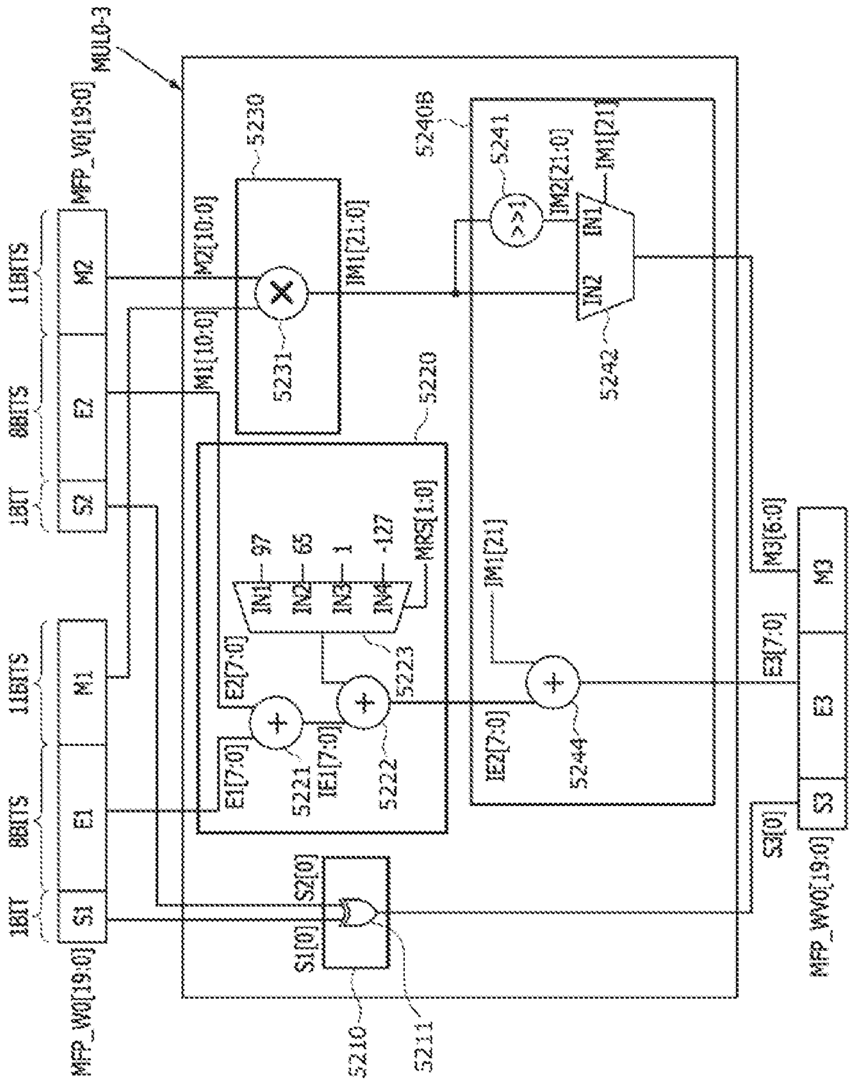
FIG. 77 illustrates still yet another embodiment of the first multiplier of the MAC operators of FIGS. 71 and 72.

FIG. 77 illustrates still yet another embodiment of the first multiplier MUL0 of the MAC operators 5000A and 5000B of FIGS. 71 and 72. In FIG. 77, the same reference numerals as in FIG. 74 denote the same components, and redundant descriptions will be omitted below. Referring to FIG. 77, the first multiplier MUL0-3 according to the present embodiment may differ from the first multiplier MUL0 of FIG. 74 in that a normalizer 5240B does not include a round processing unit (5243 of FIG. 74). Accordingly, the 22-bit mantissa bit M3[21:0] that is output from the multiplexer 5242 of the normalizer 5240B may constitute the mantissa M3 of the first modulated multiplication result data MFP_WV0[19:0]. That is, when the first multiplier MUL0-3 according to this embodiment is applied, the 31-bit floating-point format first modulated multiplication result data MFP_WV0[30:0] may be output. In addition, because the mantissa M3 of the first modulated multiplication result data MFP_WV0[19:0] is composed of 22 bits, the adder tree (5400A in FIG. 71, 5400B in FIG. 72) and the accumulator (5500A in FIG. 71, 5500B in FIG. 72) may be required to be composed of adders with increased computational capability.

Figure 78:
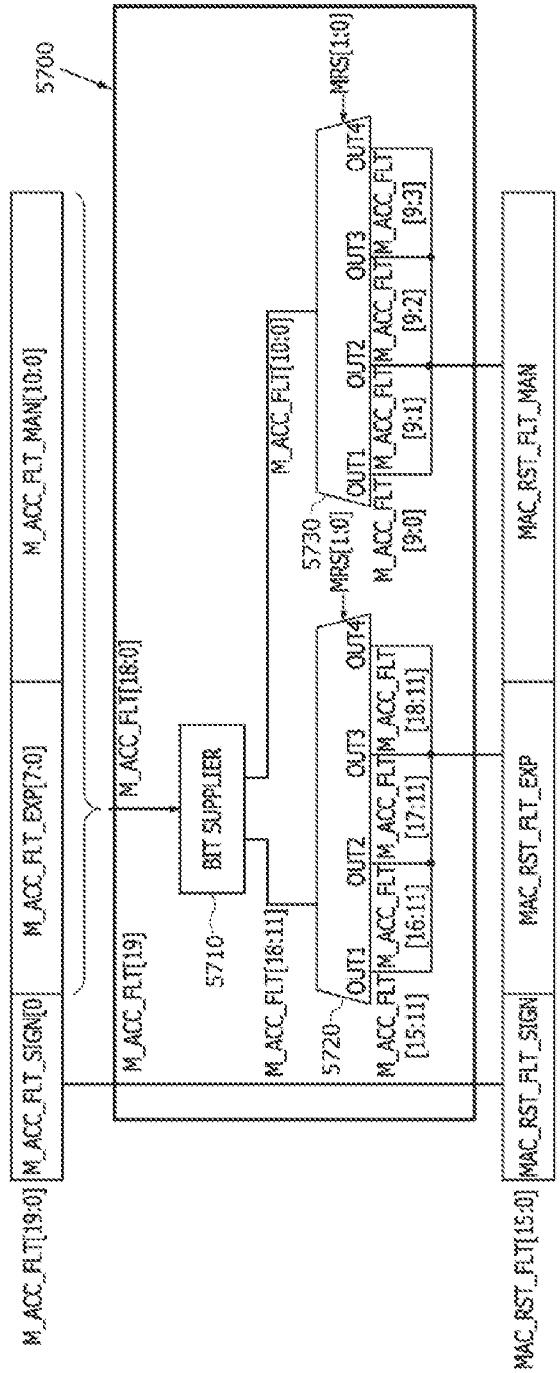
FIG. 78 illustrates an embodiment of a data type deconverter of the MAC operators of FIGS. 71 and 72.

FIG. 78 illustrates an embodiment of a data type deconverter 5700 of the MAC operators 5000A and 5000B of FIGS. 71 and 72. Referring to FIG. 78, the data type deconverter 5700 may perform an operation of restoring a data type of the 20-bit floating-point format multiplication-accumulation data M_ACC_FLT[19:0] transmitted from the fixed-point-to-floating-point converter (5600 of FIGS. 71 and 72) back to the original data type to output 16-bit floating-point format MAC result data MAC_RST_FLT[15:0]. All of the first to fourth data types FP16, OF16-1, OF16-2, and BF16 may include a 1-bit sign bit, and the MAC result data MAC_RST_FLT[15:0] that is output from the data type deconverter 5700 may include 1-bit sign bit M_ACC_FLT_SIGN[0]. Accordingly, an MSB M_ACC_FLT[19], which is a sign bit, in the multiplication-accumulation data MAC_ACC_FLT[19:0] in 20-bit floating-point format transmitted to the data format deconverter 5700 may constitute a sign bit MAC_RST_FLT[0] of the 16-bit MAC result data MAC_RST_FLT[15:0] as it is without deconverting in the data type deconverter 5700.

The data type deconverter 5700 may include a bit supplier 5710, a first 1:4 multiplexer 5720, and a second 1:4 multiplexer 5730. The first 1:4 multiplexer 5720 may have one input terminal and control terminal, and first to fourth output terminals OUT1-OUT4. The second 1:4 multiplexer 5730 may also have one input terminal and control terminal, and first to fourth output terminals OUT1-OUT4. The bit supplier 5710 may receive 19-bit data M_ACC_FLT[18:0] constituting an exponent M_ACC_FLT_EXP[7:0] and a mantissa M_ACC_FLT_MAN[10:0] in the 20-bit floating-point format multiplication-accumulation data MAC_ACC_FLT[19:0]. The bit supplier 5710 may supply the exponent M_ACC_FLT_EXP[7:0] and the mantissa M_ACC_FLT_MAN[10:0] to the first 1:4 multiplexer 5720 and the second 1:4 multiplexer 5730, respectively.

The first 1:4 multiplexer 5720 may output exponent bits M_ACC_FLT[18:11] of the multiplication-accumulation data MAC_ACC_FLT[19:0] inputted to an input terminal through a selected output terminal among the first to fourth output terminals OUT1-OUT4 in response to a mode register setting signal MRS[1:0]. To match the number of bits of the exponent of the original data type before being modulated, the first 1:4 multiplexer 5720 may be configured to remove '0' bits artificially added in a conversion operation for modulation to the exponent bit M_ACC_FLT[18:11] inputted to the input terminal. The second 1:4 multiplexer 5730 may output mantissa bits M_ACC_FLT[10:0] of the multiplication-accumulation data MAC_ACC_FLT[19:0] through a selected output terminal among the first to fourth output terminals OUT1-OUT4 in response to the mode register setting signal MRS[1:0]. To match the number of bits of the exponent of the original data type before being modulated, the second 1:4 multiplexer 5730 may be configured to remove bits artificially added in a conversion operation for modulation to the mantissa bit M_ACC_FLT[10:0] inputted to the input terminal.

If the data type before being modulated is the first data type FP1, the first 1:4 multiplexer 5720 may output 5-bit exponent bit M_ACC_FLT[15:11] obtained by removing upper 3 bits M_ACC_FLT[18:16] from the 8-bit exponent bit M_ACC_FLT[18:11], in response to the mode register setting signal MRS[1:0] of '00'. The second 1:4 multiplexer 5730 may output 10-bit mantissa bits M_ACC_FLT[9:0] obtained by removing an implicit bit M_ACC_FLT[10] from the 11-bit mantissa bit M_ACC_FLT[10:0] inputted through the input terminal, in response to the mode register setting signal MRS[1:0] of '00'. The 5-bit exponent bits M_ACC_FLT[15:11] that are output from the first 1:4 multiplexer 5720 and the 10-bit mantissa bits M_ACC_FLT[9:0] that are output from the second 1:4 multiplexer 5730 may constitute 5-bit exponent bits MAC_RST_FLT_EXP and 10-bit mantissa bits MAC_RST_FLT_MAN of the MAC result data MAC_RST_FLT[15:0], respectively.

If the data type before being modulated is the second data type OF16-1, the first 1:4 multiplexer 5720 may output 6-bit exponent bit M_ACC_FLT[16:11] obtained by removing upper 2 bits M_ACC_FLT[18:17] from the 8-bit exponent bit M_ACC_FLT[18:11], in response to the mode register setting signal MRS[1:0] of '01'. The second 1:4 multiplexer 5730 may output 9-bit mantissa bits M_ACC_FLT[9:1] obtained by removing an implicit bit M_ACC_FLT[10] and lower 1 bit M_ACC_FLT[0] from the 11-bit mantissa bit M_ACC_FLT[10:0], in response to the mode register setting signal MRS[1:0] of '01'. The 6-bit exponent bits M_ACC_FLT[16:11] that are output from the first 1:4 multiplexer 5720 and the 9-bit mantissa bits M_ACC_FLT[9:1] that are output from the second 1:4 multiplexer 5730 may constitute 6-bit exponent bits MAC_RST_FLT_EXP and 9-bit mantissa bits MAC_RST_FLT_MAN of the MAC result data MAC_RST_FLT[15:0], respectively.

If the data type before being modulated is the third data type OF16-2, the first 1:4 multiplexer 5720 may output 7-bit exponent bit M_ACC_FLT[17:11] obtained by removing upper 1 bit M_ACC_FLT[18] from the 8-bit exponent bit M_ACC_FLT[18:11], in response to the mode register setting signal MRS[1:0] of '10'. The second 1:4 multiplexer 5730 may output 8-bit mantissa bits M_ACC_FLT[9:2] obtained by removing an implicit bit M_ACC_FLT[10] and lower 2 bits M_ACC_FLT[1:0] from the 11-bit mantissa bit M_ACC_FLT[10:0], in response to the mode register setting signal MRS[1:0] of '10'. The 7-bit exponent bits M_ACC_FLT[17:11] that are output from the first 1:4 multiplexer 5720 and the 8-bit mantissa bits M_ACC_FLT[9:2] that are output from the second 1:4 multiplexer 5730 may constitute 7-bit exponent bits MAC_RST_FLT_EXP and 8-bit mantissa bits MAC_RST_FLT_MAN of the MAC result data MAC_RST_FLT[15:0], respectively.

If the data type before being modulated is the fourth data type BF16, the first 1:4 multiplexer 5720 may output 8-bit exponent bit M_ACC_FLT[18:11] as it is, in response to the mode register setting signal MRS[1:0] of '11'. The second 1:4 multiplexer 5730 may output 7-bit mantissa bits M_ACC_FLT[9:3] obtained by removing an implicit bit M_ACC_FLT[10] and lower 3 bits M_ACC_FLT[2:0] from the 11-bit mantissa bit M_ACC_FLT[10:0], in response to the mode register setting signal MRS[1:0] of '11'. The 8-bit exponent bits M_ACC_FLT[18:11] that are output from the first 1:4 multiplexer 5720 and the 7-bit mantissa bits M_ACC_FLT[9:3] that are output from the second 1:4 multiplexer 5730 may constitute 8-bit exponent bits MAC_RST_FLT_EXP and 7-bit mantissa bits MAC_RST_FLT_MAN of the MAC result data MAC_RST_FLT[15:0], respectively.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A multiplication and accumulation (MAC) operator comprising:

a plurality of multipliers, each of the plurality of multipliers being configured to perform a multiplication operation on a floating-point format first data and a floating-point format second data to output a floating-point format multiplication result data;

a plurality of floating-point-to-fixed-point converters, each of the plurality of floating-point-to-fixed-point converters being configured to receive the floating-point format multiplication result data from a corresponding one of the plurality of multipliers and convert into a fixed-point format multiplication result data to be output; and an adder tree configured to perform an addition operation on the fixed-point format multiplication result data that is output from the plurality of floating-point-to-fixed-point converters, wherein, a first mantissa of the first data and a second mantissa of the second data are composed of 'M'-bit ('M' being a natural number), each of the plurality of multipliers is configured to perform the multiplication operation so that the floating-point format multiplication result data includes a mantissa of 2*(M+1) bits, and wherein the mantissa of 2*(M+1) bits included in the floating-point format multiplication result data has a floating-point positioned between 2*M bit and (2*M+1) bit.

2. The MAC operator of claim 1, wherein each of the plurality of multipliers includes a mantissa multiplier configured to perform a multiplication operation on data that is obtained by adding an implicit bit to the first mantissa of the first data and data that is obtained by adding an implicit bit to the second mantissa of the second data to output a result data, and wherein the result data that is output from the mantissa multiplier constitutes a mantissa of the floating-point format multiplication result data that is output from each of the plurality of multipliers.

3. The MAC operator of claim 1, wherein each of the floating-point-to-fixed-point converters includes a shift circuit configured to perform left shift or right shift on the mantissa of 2*(M+1) bits included in the floating-point multiplication result data to convert a data type from the floating-point format into a fixed-point format.

4. The MAC operator of claim 3, wherein the shift circuit includes:

a subtractor configured to subtract an exponent bias from the floating-point multiplication result data to output an integer exponent bit and an exponent sign bit;

a left shifter configured to perform left shift on the mantissa of the floating-point multiplication result data by a shift bit determined by the integer exponent bit to output fixed-point format left shifted multiplication result data, if the exponential sign bit represents positive; and a right shifter configured to perform left shift on the mantissa of the floating-point multiplication result data by a shift bit determined by the integer exponent bit to output fixed-point format right shifted multiplication result data, if the exponential sign bit represents negative.

5. The MAC operator of claim 4, wherein the left shifter is configured to perform the left shift in a state in which a position of a binary point in the mantissa of the floating-point format multiplication result data and a position of a binary point of the fixed-point format match.

6. The MAC operator of claim 4, wherein the right shifter is configured to perform the right shift in a state in which a position of a binary point in the mantissa of the floating-point format multiplication result data and a position of a binary point of the fixed-point format match.

7. The MAC operator of claim 4, wherein the shift circuit further includes:

an inverter configured to invert the integer exponent bit and output an inverted integer exponent bit;

a first AND gate configured to perform an AND operation on the integer exponent bit and the inverted integer exponent bit from the inverter; and a second AND gate configured to an AND operation on the integer exponent bit and the exponential sign bit.

8. The MAC operator of claim 7, wherein an output signal of the first AND gate is transmitted to the left shifter; and wherein an output signal of the second AND gate is transmitted to the right shifter.

9. The MAC operator of claim 4, wherein the shift circuit further includes a first multiplexer with a first input terminal, a second input terminal, a control terminal, and an output terminal; and wherein the first multiplexer is configured to:

receive fixed-point left shifted multiplication result data that is output from the left shifter through the first input terminal;

receive fixed-point right shifted multiplication result data that is output from the right shifter through the second input terminal;

receive a sign bit of the floating-point multiplication result data through the control terminal; and output fixed-point format shifted multiplication result data through the output terminal.

10. The MAC operator of claim 9, wherein the first multiplexer is configured to output the fixed-point format left shifted multiplication result data or the fixed-point format right shifted multiplication result data as the shifted multiplication result data in response to the sign bit.

11. The MAC operator of claim 10, wherein the first multiplexer is configured to:

output the fixed-point format left shifted multiplication result data as the shifted multiplication result data if the sign bit represents positive; and output the fixed-point format right shifted multiplication result data as the shifted multiplication result data if the sign bit represents negative.

12. The MAC operator of claim 9, wherein the shift circuit further includes a second multiplexer with a first input terminal, a second input terminal, a control terminal, and an output terminal; and wherein the second multiplexer is configured to:

receive fixed-point left shifted multiplication result data that is output from the first multiplexer through the first input terminal;

receive a fixed-point maximum value through the second input terminal;

receive an overflow signal through the control terminal; and output the shifted multiplication result data or the fixed-point format maximum value through the output terminal.

13. The MAC operator of claim 12, wherein the second multiplexer is configured to:

output the shifted multiplication result data, if the overflow signal represents that no overflow has occurred, and output the fixed-point format maximum value, if the overflow signal represents that overflow has occurred.

14. The MAC operator of claim 4, wherein the shift circuit further includes an overflow checker configured to check whether an overflow has occurred, and wherein the overflow checker is configured to receive a most significant bit (MSB) of the mantissa of the floating-point format multiplication result data, and the integer exponent bit and the exponential sign bit from the subtractor, and output an overflow signal of '1' if the overflow has occurred, and output an overflow signal of '0' if the overflow has not occurred.

15. The MAC operator of claim 14, wherein the overflow checker includes:

a comparator configured to receive the MSB of the mantissa of the floating-point format multiplication result data, a reference bit, and an integer exponent bit from the subtractor to perform a comparison operation;

an inverter configured to invert the exponential sign bit from the subtractor and output an inverted exponential sign bit; and an AND gate configured to perform an AND operation on an output signal from the comparator and the inverted exponential sign bit from the inverter to output an operation result.

16. The MAC operator of claim 15, wherein the reference bit is determined to a maximum value of the shift bit in which overflow does not occur when the MSB of the mantissa of the floating-point format multiplication result data is "1".

17. The MAC operator of claim 16, wherein when the MSB of the mantissa of the floating-point format multiplication result data is '1', the comparator is configured to output a signal of '0' if the integer exponent bit is equal to or less than the reference bit and output a signal of '1' if the integer exponent bit is greater than the reference bit, and wherein when the MSB of the mantissa of the floating-point format multiplication result data is '0', the comparator is configured to output a signal of '0' if the integer exponent bit is equal to or less than (reference bit+1) and output signal of '1' if the integer exponent bit greater than the (reference bit+1).

18. The MAC operator of claim 3, wherein each of the floating-point-to-fixed-point converters further includes:

a round circuit configured to perform a rounding process for the fixed-point format shifted multiplication result data that is output from the shift circuit;

a 2's complement circuit configured to generate and output 2's complement of the data that is output from the round circuit; and a multiplexer configured to selectively output the output data from the round circuit or the output data from the 2's complement circuit based on the sign bit of the floating-point format multiplication result data.

19. The MAC operator of claim 1, wherein the adder tree includes a plurality of fixed-point adders.

20. The MAC operator of claim 19, further comprising an accumulator configured to perform an accumulating operation on the data that is output from the adder tree, wherein the accumulator includes:

an accumulative adder configured to perform an addition operation on data that is transmitted from the adder tree and feedback data; and a latch circuit configured to latch data that is output from the accumulative adder to transmit the data to the accumulative adder as the feedback data.

21. The MAC operator of claim 20, further comprising a fixed-point-to-floating-point converter configured to convert the fixed-point format data that is output from the accumulator into a floating-point format data to output a conversion result.

22. The MAC operator of claim 1, further comprising:

a plurality of demultiplexers; and a plurality of normalizers configured to output floating-point format normalized multiplication result data, wherein each of the demultiplexers has a first output line that is connected to the adder tree and a second output line that is connected to each of the plurality of normalizers, and wherein each of the demultiplexers is configured to output the floating-point format multiplication result data that is output from each of the plurality of multipliers through the first output line or the second output line.

23. The MAC operator of claim 22, wherein each of the demultiplexers is configured to:

transmit the floating-point format multiplication result data to the adder tree through the first output line in response to a first logic level of a multiplication result read signal, and transmit the floating-point format multiplication result data to each of the plurality of normalizers through the second output line in response to a second logic level of the multiplication result read signal.

24. The MAC operator of claim 23, wherein each of the plurality of normalizers comprises:

a floating-point shifter configured to receive the mantissa of the floating-point format multiplication result data, shift the binary point by 1 bit toward the MSB of the mantissa, and output the mantissa;

a multiplexer configured to selectively output a mantissa of the floating-point format multiplication result data or output data from the floating-point shifter based on the MSB of the mantissa of the floating-point format multiplication result data;

a round processing unit configured to remove bits with an implicit bit and perform a round processing on the data that is output from the multiplexer to output a mantissa of the floating-point format normalized multiplication result data; and an adder configured to perform an addition operation on an exponent of the floating-point format multiplication result data and an MSB of the mantissa of the floating-point format multiplication result data to output an exponent of the floating-point format normalized multiplication result data.

25. A process-in-memory (PIM) device comprising:

a data storage region; and a multiplication and accumulation (MAC) operator configured to perform a MAC arithmetic operation on a floating-point format first data and a floating-point format second data from the data storage region, wherein the MAC operator comprises:

a plurality of multipliers, each of the plurality of multipliers being configured to perform a multiplication operation on the floating-point format first data and the floating-point format second data to output a floating-point format multiplication result data;

a plurality of floating-point-to-fixed-point converters, each of the plurality of floating-point-to-fixed-point converters being configured to receive the floating-point format multiplication result data from a corresponding one of the plurality of multipliers and convert into a fixed-point format multiplication result data to be output; and an adder tree configured to perform an addition operation on the fixed-point format multiplication result data that is output from the plurality of floating-point-to-fixed-point converters, wherein, a first mantissa of the first data and a second mantissa of the second data are composed of 'M'-bit ('M' being a natural number), each of the plurality of multipliers is configured to perform the multiplication operation so that the floating-point format multiplication result data includes a mantissa of 2*(M+1) bits, and wherein the mantissa of 2*(M+1) bits included in the floating-point format multiplication result data has a floating-point positioned between 2*M bit and (2*M+1) bit.

26. A multiplication and accumulation (MAC) operator comprising:

a plurality of multipliers, each of the plurality of multipliers being configured to perform a multiplication operation on a floating-point format first data and a floating-point format second data to output a floating-point format multiplication result data; and a plurality of floating-point-to-fixed-point converters, each of the plurality of floating-point-to-fixed-point converters being configured to receive the floating-point format multiplication result data from a corresponding one of the plurality of multipliers and convert into a fixed-point format multiplication result data to be output, wherein wherein, a first mantissa of the first data and a second mantissa of the second data are composed of 'M'-bit ('M' being a natural number), each of the plurality of multipliers is configured to perform the multiplication operation so that the floating-point format multiplication result data includes a mantissa of 2*(M+1) bits, and wherein the mantissa of 2*(M+1) bits included in the floating-point format multiplication result data has a floating-point positioned between 2*M bit and (2*M+1) bit.

27. The MAC operator of claim 26 further comprising an adder tree configured to perform an addition operation on the fixed-point format multiplication result data that is output from the plurality of floating-point-to-fixed-point converters.

* * * * *